US007529655B2

(12) United States Patent
Gabele et al.

(10) Patent No.: US 7,529,655 B2
(45) **Date of Patent: *May 5, 2009**

(54) PROGRAM PRODUCT FOR DEFINING AND RECORDING MINIMUM AND MAXIMUM EVENT COUNTS OF A SIMULATION UTILIZING A HIGH LEVEL LANGUAGE

(75) Inventors: Carol Ivash Gabele, Austin, TX (US); Wolfgang Roesner, Austin, TX (US); Derek Edward Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/106,416

(22) Filed: Apr. 21, 2008

(65) Prior Publication Data

US 2008/0249758 A1 Oct. 9, 2008

Related U.S. Application Data

(63) Continuation of application No. 10/970,469, filed on Oct. 21, 2004, now Pat. No. 7,392,169.

(51) Int. Cl.
*G06F 17/50* (2006.01)

(52) U.S. Cl. ............................... 703/16; 703/17; 716/4; 716/12; 716/18

(58) Field of Classification Search .................. 703/13, 703/17; 716/4, 12, 18
See application file for complete search history.

(56) References Cited

U.S. PATENT DOCUMENTS

| | | | | |
|---|---|---|---|---|
| 5,604,895 | A * | 2/1997 | Raimi | 703/13 |
| 6,195,627 | B1 * | 2/2001 | Bargh et al. | 703/14 |
| 6,618,839 | B1 * | 9/2003 | Beardslee et al. | 716/4 |
| 2002/0123874 | A1 * | 9/2002 | Roesner et al. | 703/17 |
| 2002/0128809 | A1 * | 9/2002 | Roesner et al. | 703/17 |
| 2003/0018945 | A1 * | 1/2003 | Foster et al. | 716/5 |
| 2003/0121011 | A1 * | 6/2003 | Carter | 716/4 |
| 2003/0191869 | A1 * | 10/2003 | Williams et al. | 709/328 |
| 2003/0192032 | A1 * | 10/2003 | Andrade et al. | 717/124 |

OTHER PUBLICATIONS

Texas Instruments: "Code Coverage and Multi-event Profiler for Code Composer Studio v2.3 User's Guide" Apr. 2004.*
Rao et al. "Hierarchical Test Generation for VHDL Behavioral Models." IEEE 1993.*

* cited by examiner

*Primary Examiner*—Kamini S Shah
*Assistant Examiner*—Shambhavi Patel
(74) *Attorney, Agent, or Firm*—Dillon & Yudell LLP

(57) ABSTRACT

According to one method of simulation processing, instrumentation code, such as an runtime executive (rtx), receives one or more statements describing an count event and identifying the count event as an outlying count event. While simulating a design utilizing the HDL simulation model, occurrences of the outlying count event are counted to obtain a count event value. Simulation result data obtained from simulating the design is then received and processed. In the processing, the count event value is recorded within a data storage subsystem responsive to a determination of whether or not the count event value of the outlying count event exceeds a previously recorded count event value.

10 Claims, 75 Drawing Sheets

```
ENTITY FXUCHK IS                                                        } 450, 440

   PORT(   S_IN       :     IN std_ulogic;
           Q_IN       :     IN std_ulogic;
           R_IN       :     IN std_ulogic;
           clock      :     IN std_ulogic;
           fails      :     OUT std_ulogic_vector(0 to 1);
           counts     :     OUT std_ulogic_vector(0 to 2);
           harvests   :     OUT std_ulogic_vector(0 to 1);
         );

452 { --!! BEGIN                                                        } 451
      --!! Design Entity: FXU;

453 { --!! Inputs
      --!! S_IN        =>     B.C.S;
      --!! Q_IN        =>     A.Q;
      --!! R_IN        =>     R;
      --!! CLOCK       =>     clock;
      --!! End Inputs

454 { --!! Fail Outputs;
      --!! 0 : "Fail message for failure event 0";
      --!! 1 : "Fail message for failure event 1";
      --!! End Fail Outputs;

455 { --!! Count Outputs;
      --!! 0 : <event0> clock;
      --!! 1 : <event1> clock;
      --!! 2 : <event2> clock;
      --!! End Count Outputs;

456 { --!! Harvest Outputs;
      --!! 0 : "Message for harvest event 0";
      --!! 1 : "Message for harvest event 1";
      --!! End Harvest Outputs;

457 { --!! End;

ARCHITECTURE example of FXUCHK IS

BEGIN                                                                   } 458

     ... HDL code for entity body section ...

END;
```

```
ENTITY FSM IS

    PORT(
            ....ports for entity fsm....
        );

ARCHITECTURE FSM OF FSM IS

BEGIN

        ... HDL code for FSM and rest of the entity ...

        fsm_state(0 to 2) <= ... Signal 801 ...
```

853 —{ --!! Embedded FSM   : examplefsm;
859 —{ --!! clock          : (fsm_clock);
854 —{ --!! state_vector   : (fsm_state(0 to 2));
855 —{ --!! states         : (S0, S1, S2, S3, S4);
856 —{ --!! state_encoding : ('000', '001', '010', '011', '100');
       ⎡ --!! arcs          : (S0 => S0, S0 => S1, S0 => S2,
857 —⎨ --!!                    (S1 => S2, S1 => S3, S2 => S2,
       ⎣ --!!                    (S2 => S3, S3 => S4, S4 => S0);
858 —{ --!! End FSM;

}852 }860

```
                ,
                ,
                ,
                ,
                ,
                ,

    END;
```

```
--!! Inputs
--!! event_1108_in <= C.[B2.count.event_1108];
--!! event_1124_in <= A.B.[B1.count.event_1124];
--!! End Inputs
```

```
--!! Inputs
--!! event_1108_in <= C.[count.event_1108];
--!! event_1124_in <= B.[count.event_1124];
--!! End Inputs
```

```
ENTITY X IS

    PORT(  :
              :
              :
         );

ARCHITECTURE example of X IS

BEGIN
    .
    .
    .
    ... HDL code for X ...
    .
    .
    .
```

1221 { Y:Y
       PORT MAP( :
                 :
               );

1222 { A <= ....
       B <= ....
       C <= ....

1223 { --!! [count, countname0, clock] <= Y.P;   — 1230
       --!! Q <= Y. [B1.count.count1] AND A;   — 1232
       --!! [fail, failname0, "fail msg"] <= Q XOR B;   — 1234
       --!! [harvest, harvestname0, "harvest msg"] <= B AND C;

END;   — 1236

}—1220

```
ENTITY OVR IS                                   1364

     PORT(    R_IN       :     IN.std_ulogic_vector(0 .. 4);
                .
                .
                .
              ... other ports as required ...
                .
                .                                        1362
                .
              R_OV       :     OUT std_ulogic_vector(0 .. 4);
              RT         :     OUT std_ulogic
          );                                    1363

--!! BEGIN
--!! Design Entity: FOO;

--!! Inputs (0 to 4)                  1360
--!! R_IN => {R(0 .. 4)};
--!! :
... other ports as needed ...                                1351         1340
--!! :
--!! End Inputs
                                      1361
      --!! Outputs
1356  --!! <R_OVRRIDE> : R_OV(0 .. 4) => R(0 .. 4) [RT];
      --!! End Outputs

--!! End

ARCHITECTURE example of OVR IS

BEGIN

     ... HDL code for entity body section ...      1358

END;
```

*Fig. 13C*

```
ENTITY FOO IS

      PORT(     :
                :
                :
             );

ARCHITECTURE example of FOO IS

BEGIN

      .
      .
      .
      .
      .
      R <= ......
      .
      .
      .
      .
      .
      --!! R_IN <= {R};
      --!!
      --!!
      --!! R_OV(0 to 4) <= ......;
      --!! RT <= ......;
      --!! [override, R_OVRRIDE, R(0 .. 4), RT] <= R_OV(0 to 4);
```

1380 (the six --!! lines); 1381 (R_IN <= {R}); 1382 (R_OV(0 to 4)); 1383 (RT <= ......;); 1384 ([override, R_OVRRIDE, R(0 .. 4), RT] <= R_OV(0 to 4);)

*Fig. 13D*

```
ENTITY DET IS

     PORT(   A           :     IN std_ulogic;
             B           :     IN std_ulogic_vector(0 to 5);
             C           :     IN std_ulogic;
             D           :     IN std_ulogic;
                         :
                         :
             event_x     :     OUT std_ulogic_vector(0 to 2);
             x_here      :     OUT std_ulogic;
          );

--!! BEGIN
--!! Design Entity: LM;

--!! Inputs
--!! A     =>    A;
--!! B     =>    P.Q.B;
--!! C     =>    P.C;
--!! D     =>    D;
--!! End Inputs

--!! Detections
--!! <event_x>:event_x(0 to 2) [x_here];
--!! End Detections

--!! End;

ARCHITECTURE example of DET IS

BEGIN

     ... HDL code ...

END;
```

1480 (entire listing); 1491 (--!! BEGIN through --!! End;); 1493 (--!! Inputs through --!! End Inputs); 1494 (--!! Detections through --!! End Detections); 1495 (event_x); 1492 (ARCHITECTURE through END;)

| | | | | |
|---|---|---|---|---|
| 1: | X1 | B3 | X | COUNT1 |
| 2: | X1.Z | B1 | Z | COUNT1 |
| 3: | X1.Z | B2 | Z | COUNT1 |
| 4: | X2 | B3 | X | COUNT1 |
| 5: | X2.Z | B1 | Z | COUNT1 |
| 6: | X2.Z | B2 | Z | COUNT1 |
| 7: | Y | B4 | Y | COUNT1 |
| 8: | Y.Z | B1 | Z | COUNT1 |
| 9: | Y.Z | B2 | Z | COUNT1 |

2062 {
<X1.Z>.<B1>.<Z>.<count1>    57
<X1.Z>.<B2>.<Z>.<count1>   102
<X2.Z>.<B1>.<Z>.<count1>  1092
<X2.Z>.<B2>.<Z>.<count1>    16
<Y.Z>.<B1>.<Z>.<count1>   2921
<Y.Z>.<B2>.<Z>.<count1>    701

2063         2064

2065

8914

<B1>.<Z>.<count1>    4070
<B2>.<Z>.<count1>     819

2066

2402 2400 2409 2410 2411 2412 2413

```
p = create_event (type, instance, inst code, design, event)
```

2401 2403

```
trigger_event (p)
```

2405 2406

```
set_rtxname(s)
```

2407

```
write_eventlists()
```

TOP:TOP

FPU:FPU0
FPUCHK 2500
2501
TOP
TOP.FXU0
TOP.FXU1
TOP.FXU0.A
TOP.FXU1.A
TOP.FXU0.B
TOP.FXU1.B
TOP.FXU0.B.C
TOP.FXU1.B.C
TOP.FPU0

2502
TOP
FXU
FXU
A
A
B
B
C
C
FPU 2503a
2503b
2503c
2503d
2503e
2503f
2503g
2503h
2503i
2503j

FXU:FXU1(b)
A:A
B:B
C:C
FXUCHK

FXU:FXU0(a)
A:A
B:B
C:C
FXUCHK

```
ENTITY FXUCHK IS

     PORT(  S_IN      :     IN std_ulogic;
            Q_IN      :     IN std_ulogic;
            R_IN      :     IN std_ulogic;
            clock     :     IN std_ulogic;                          450
            fails     :     OUT std_ulogic_vector(0 to 1);
            counts    :     OUT std_ulogic_vector(0 to 2);
            harvests  :     OUT std_ulogic_vector(0 to 1);
     );

452 { --!! BEGIN
      --!! Design Entity: FXU;

    { --!! Inputs
      --!! S_IN        =>     B.C.S;
      --!! Q_IN        =>     A.Q;
453   --!! R_IN        =>     R;
      --!! CLOCK       =>     clock;
      --!! End Inputs

    { --!! Fail Outputs;
454   --!! 0 : "Fail message for failure event 0";
      --!! 1 : "Fail message for failure event 1";
      --!! End Fail Outputs;                                  451        440'

    { --!! Count Outputs;
      --!! 0 : <event0> clock  MIN;
455   --!! 1 : <event1> clock  MAX;
      --!! 2 : <event2> clock;
      --!! End Count Outputs;

    { --!! Harvest Outputs;
456   --!! 0 : "Message for harvest event 0";
      --!! 1 : "Message for harvest event 1";
      --!! End Harvest Outputs;

457 { --!! End;

ARCHITECTURE example of FXUCHK IS

BEGIN

     ... HDL code for entity body section ...                 458

END;
```

*Fig. 26A*

```
ENTITY X IS
      PORT(    :
               :
               :
          );
ARCHITECTURE example of X IS
BEGIN
      .
      .
      .
      .
      .
   ... HDL code for X ...
      .
      .
      .
      .
      .
   Y:Y
   PORT MAP(    :
                :
            );
   A <= ....
   B <= ....
   C <= ....
   --!! [count, countname0, clock , MIN]<=Y.P;
   --!! Q <= Y. [B1.count.count1] AND A;
   --!! [fail, failname0, "fail msg"] <= Q XOR B;
   --!! [harvest, harvestname0, "harvest msg"] <= B AND C;
END;
```

1220 (entire listing); 1221 (Y:Y PORT MAP block); 1222 (A/B/C assignments); 1223 (--!! statements); 1230; 1232; 1234; 1236

*Fig. 26B*

2600{ MIN: 2 MAX: 3

1661 — 1662

| | 1661 | | 1662 | |
|---|---|---|---|---|
| 1: | X1 | B3 | X | COUNT1 |
| 2: | X1.Z | B1 | Z | COUNT1 |
| 3: | X1.Z | B2 | Z | COUNT1 |
| 4: | X2 | B3 | X | COUNT1 |
| 5: | X2.Z | B1 | Z | COUNT1 |
| 6: | X2.Z | B2 | Z | COUNT1 |
| 7: | Y | B4 | Y | COUNT1 |
| 8: | Y.Z | B1 | Z | COUNT1 |
| 9: | Y.Z | B2 | Z | COUNT1 |

1663 brackets rows 1–9

1660

PROGRAM PRODUCT FOR DEFINING AND RECORDING MINIMUM AND MAXIMUM EVENT COUNTS OF A SIMULATION UTILIZING A HIGH LEVEL LANGUAGE

CROSS-REFERENCE TO RELATED APPLICATIONS

The present application is a continuation of patent application Ser. No. 10/970,469, filed on Oct. 21, 2004, now U.S. Pat. No. 7,392,169 entitled "Method, System and Program Product for Defining and Recording Minimum and Maximum Event Counts of a Simulation Utilizing a High Level Language", which is also related to the following co-pending U.S. patent applications:

(1) U.S. patent application Ser. No. 10/116,524, filed Apr. 4, 2002; and (2) U.S. patent application Ser. No. 10/970,468, filed Oct. 21, 2004, filed concurrently herewith.

The above-mentioned patent applications are assigned to the assignee of the present invention and incorporated herein by reference in their entireties.

BACKGROUND OF THE INVENTION

1. Technical Field

The present invention relates in general to designing and simulating digital devices, modules and systems, and in particular, to a method and system for computer simulation of digital devices, modules and systems utilizing a hardware description language (HDL) model. More particularly, the present invention relates to methods, systems, and program products for recording minimum and maximum events counts of a simulation.

2. Description of the Related Art

Verifying the logical correctness of a digital design and debugging the design, if necessary, are very important steps in most digital design processes. Logic networks are tested either by actually building networks or by simulating networks on a computer. As logic networks become highly complex, it becomes necessary to simulate a design before the design is actually built. This is especially true when the design is implemented as an integrated circuit, since the fabrication of integrated circuits requires considerable time and correction of mistakes is quite costly. The goal of digital design simulation is the verification of the logical correctness of the design.

In a typical automated design process that is supported by a conventional electronic computer-aided design (ECAD) system, a designer enters a high-level description utilizing a hardware description language (HDL), such as VHDL, producing a representation of the various circuit blocks and their interconnections. The ECAD system compiles the design description into a format that is best suited for simulation. A simulator is then utilized to verify the logical correctness of the design prior to developing a circuit layout.

A simulator is typically a software tool that operates on a digital representation, or simulation model of a circuit, and a list of input stimuli representing inputs of the digital system. A simulator generates a numerical representation of the response of the circuit, which may then either be viewed on the display screen as a list of values or further interpreted, often by a separate software program, and presented on the display screen in graphical form. The simulator may be run either on a general-purpose computer or on another piece of electronic apparatus, typically attached to a general purpose computer, specially designed for simulation. Simulators that run entirely in software on a general-purpose computer will hereinafter be referred to as "software simulators". Simulators that are run with the assistance of specially designed electronic apparatus will hereinafter be referred to as "hardware simulators".

Usually, software simulators perform a very large number of calculations and operate slowly from the user's point of view. In order to optimize performance, the format of the simulation model is designed for very efficient use by the simulator. Hardware simulators, by nature, require that the simulation model comprising the circuit description be communicated in a specially designed format. In either case, a translation from an HDL description to a simulation format, hereinafter referred to as a simulation executable model, is required.

The results obtained from running a simulation testcase against a simulation model may vary depending upon not only factors within the simulation model, but also factors outside of the simulation model. These external factors may include, for example, those controlling the set up of the simulation model or characteristics of the testcase.

A particular example of an external factor that influences simulation results is testcase strategy. In order to exercise complex simulation models, such as those simulating the logical behavior of microprocessors, testcases are commonly generated by testcase generation software having hundreds or thousands of different input parameters. Each set of testcases created from a menu of common input parameter values is called a testcase strategy. In order to achieve sufficient test coverage, the testcase generation software may generate testcases representing tens of thousands of different testcase strategies.

Understandably, simulation engineers are very interested in determining which testcase strategies provide the most useful simulation results so that the less helpful strategies can be eliminated and the bulk of simulation jobs can be performed utilizing testcases generated utilizing the better testcase strategies. In order to determine which testcase strategies are preferred, it is helpful if simulation engineers can view simulation results, such as event counts, by testcase strategy.

The present invention also recognizes that it would be useful and desirable for a simulation engineer or designer to know not only the aggregate number of occurrences of events in a simulation model, but also the maximum and minimum number of occurrences of selected events during a simulation run.

SUMMARY OF THE INVENTION

According to one embodiment of the present invention, a file describing a hardware description language (HDL) simulation model of a design includes one or more statements describing a count event and identifying the count event as an outlying count event. While simulating the design utilizing the HDL simulation model, occurrences of the outlying count event are counted to obtain a count event value. Simulation result data obtained from simulating the design is then received and processed. In the processing, the count event value is recorded within a data storage subsystem responsive to a determination of whether or not the count event value of the outlying count event exceeds a previously recorded count event value.

According to a second embodiment, instrumentation code, such as an runtime executive (rtx), receives one or more statements describing an count event and identifying the count event as an outlying count event. While simulating a design utilizing the HDL simulation model, occurrences of the outlying count event are counted to obtain a count event value. Simulation result data obtained from simulating the design is then received and processed. In the processing, the count event value is recorded within a data storage subsystem responsive to a determination of whether or not the count event value of the outlying count event exceeds a previously recorded count event value.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 4C illustrates exemplary sections of HDL syntax that maybe utilized in accordance with the teachings of the present invention;

FIG. 8C illustrates a hardware description language file including embedded instrumentation in accordance with the teachings of the present invention;

FIG. 11B depicts a set of input port mapping comments for performing hierarchical processing of simulation model events in accordance with a first embodiment of the present invention;

FIG. 11C illustrates a set of input port mapping comments for performing hierarchical processing of simulation model events in accordance with a second embodiment of the present invention;

FIG. 13C depicts an exemplary HDL source file that describes instrumentation entity in accordance with the teachings of the present invention;

FIG. 13D illustrates an HDL design entity source code file wherein a set of random instrumentation comments implement the logic necessary for selectively overriding a simulation signal in accordance with the teachings of the present invention;

FIG. 14C depicts an exemplary HDL source code file that describes an instrumentation entity in accordance with the teachings of the present invention;

FIG. 15 illustrates an eventlist file 1660 for the count events of simulation model 1000 shown in FIG. 10A;

FIG. 24A depicts data structure representations of API entry points designed to support the generation and operation of RTX instrumentation events in accordance with a preferred embodiment of the present invention;

FIG. 26A depicts an exemplary section of HDL syntax that maybe utilized to enumerate maximum and minimum counters in accordance with the present invention;

FIG. 26B illustrates an exemplary HDL file for implementing instrumentation logic including a minimum counter within an HDL design entity in accordance with the present invention;

DETAILED DESCRIPTION OF A PREFERRED EMBODIMENT

The present invention provides for accurate and comprehensive monitoring of a digital circuit design in which a designer creates instrumentation modules utilizing the same hardware description language (HDL) as utilized for the design itself. HDLs, while suited to the needs of digital designers can also be effectively utilized for a number of checking functions. In accordance with the Method and System of the present invention, instrumentation modules are utilized to monitor specified design parameters while not becoming compiled as an integral part of the design itself. Furthermore, since the instrumentation modules are written in the same HDL as utilized in the actual design, such modules are platform and simulator independent. Unlike checking done with C or C++ programs, HDL instrumentation can be compiled and run directly without loss of performance on hardware simulators.

Figure 1:
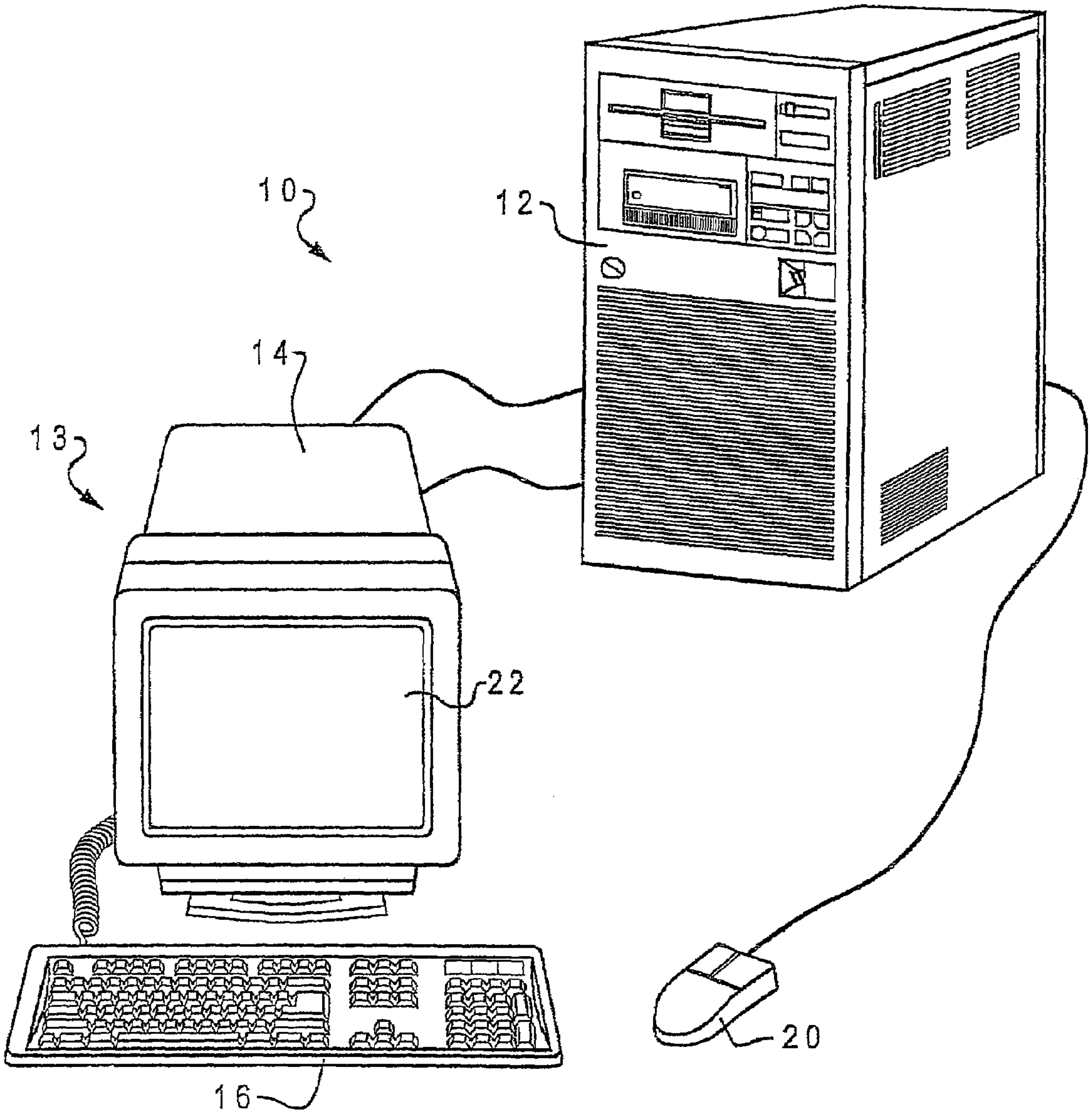
FIG. 1 is a pictorial representation of a data processing system.

With reference now to the figures, and in particular with reference to FIG. 1, there is depicted a pictorial representation of a data processing system 10 with which the present invention may be advantageously utilized. As illustrated, data processing system 10 comprises a workstation 12 to which one or more nodes 13 are connected. Workstation 12 preferably comprises a high performance multiprocessor computer, such as the RISC System/6000 or AS/400 computer systems available from International Business Machines Corporation (IBM). Workstation 12 preferably includes nonvolatile and volatile internal storage for storing software applications comprising an ECAD system, which can be utilized to develop and verify a digital circuit design in accordance with the method and system of the present invention. As depicted, nodes 13 are comprised of a display device 14, a keyboard 16, and a mouse 20. The ECAD software applications executed within workstation 12 preferably display a graphic user interface (GUI) within display screen 22 of display device 14 with which a digital circuit designer can interact using a keyboard 16 and mouse 20. Thus, by entering appropriate inputs utilizing keyboard 16 and mouse 20, the digital circuit designer is able to develop and verify a digital circuit design according to the method described further hereinbelow.

Figure 2:
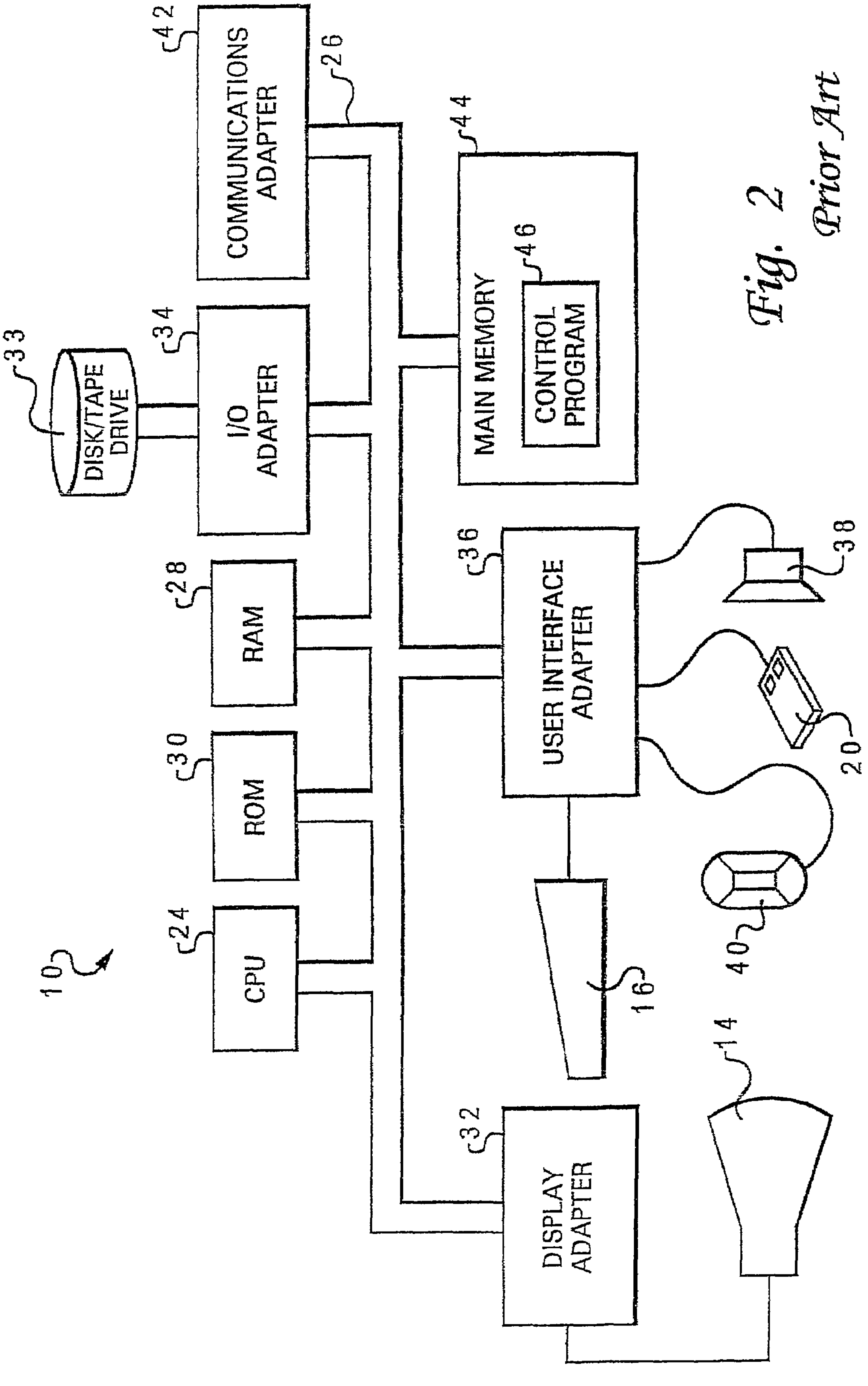
FIG. 2 depicts a representative hardware environment of the data processing system illustrated in FIG. 1.

FIG. 2 depicts a representative hardware environment of data processing system 10. Data processing system 10 is configured to include all functional components of a computer and its associated hardware. Data processing system 10 includes a Central Processing Unit ("CPU") 24, such as a conventional microprocessor, and a number of other units interconnected via system bus 26. CPU 24 includes a portion of data processing system 10 that controls the operation of the entire computer system, including executing the arithmetical and logical functions contained in a particular computer program. Although not depicted in FIG. 2, CPUs such as CPU 24 typically include a control unit that organizes data and program storage in a computer memory and transfers the data and other information between the various parts of the computer system. Such CPUs also generally include an arithmetic unit that executes the arithmetical and logical operations, such as addition, comparison, multiplications and so forth. Such components and units of data processing system 10 can be implemented in a system unit such as workstation 12 of FIG. 1.

Data processing system 10 further includes random-access memory (RAM) 28, read-only memory (ROM) 30, display adapter 32 for connecting system bus 26 to display device 14, and I/O adapter 34 for connecting peripheral devices (e.g., disk and tape drives 33) to system bus 26. RAM 28 is a type of memory designed such that the location of data stored in it is independent of the content. Also, any location in RAM 28 can be accessed directly without having to work through from the beginning. ROM 30 is a type of memory that retains information permanently and in which the stored information cannot be altered by a program or normal operation of a computer.

Display device 14 provides the visual output of data processing system 10. Display device 14 can be a cathode-ray tube (CRT) based video display well known in the art of computer hardware. However, with a portable or notebook-based computer, display device 14 can be replaced with a liquid crystal display (LCD) based or gas plasma-based flat-panel display. Data processing system 10 further includes user interface adapter 36 for connecting keyboard 16, mouse 20, speaker 38, microphone 40, and/or other user interface devices, such as a touch-screen device (not shown), to system bus 26. Speaker 38 is one type of audio device that may be utilized in association with the method and system provided herein to assist diagnosticians or computer users in analyzing data processing system 10 for system failures, errors, and discrepancies. Communications adapter 42 connects data processing system 10 to a computer network. Although data processing system 10 is shown to contain only a single CPU and a single system bus, it should be understood that the present invention applies equally to computer systems that have multiple CPUs and to computer systems that have multiple buses that each perform different functions in different ways.

Data processing system 10 also includes an interface that resides within a machine-readable media to direct the operation of data processing system 10. Any suitable machine-readable media may retain the interface, such as RAM 28, ROM 30, a magnetic disk, magnetic tape, or optical disk (the last three being located in disk and tape drives 33). Any suitable operating system and associated interface (e.g., Microsoft Windows) may direct CPU 24. For example, the AIX operating system and AIX Windows windowing system can direct CPU 24. The AIX operating system is IBM's implementation of the UNIX™ operating system. Other technologies also can be utilized in conjunction with CPU 24, such as touch-screen technology or human voice control.

Those skilled in the art will appreciate that the hardware depicted in FIG. 2 may vary for specific design and simulation applications. For example, other peripheral devices such as optical disk media, audio adapters, or chip programming devices, such as PAL or EPROM programming devices well-known in the art of computer hardware and the like, may be utilized in addition to or in place of the hardware already depicted. In addition, main memory 44 is connected to system bus 26, and includes a control program 46. Control program 46 resides within main memory 44, and contains instructions that, when executed on CPU 24, carries out the operations depicted in FIG. 4D and FIG. 4E described herein.

Figure 3A:
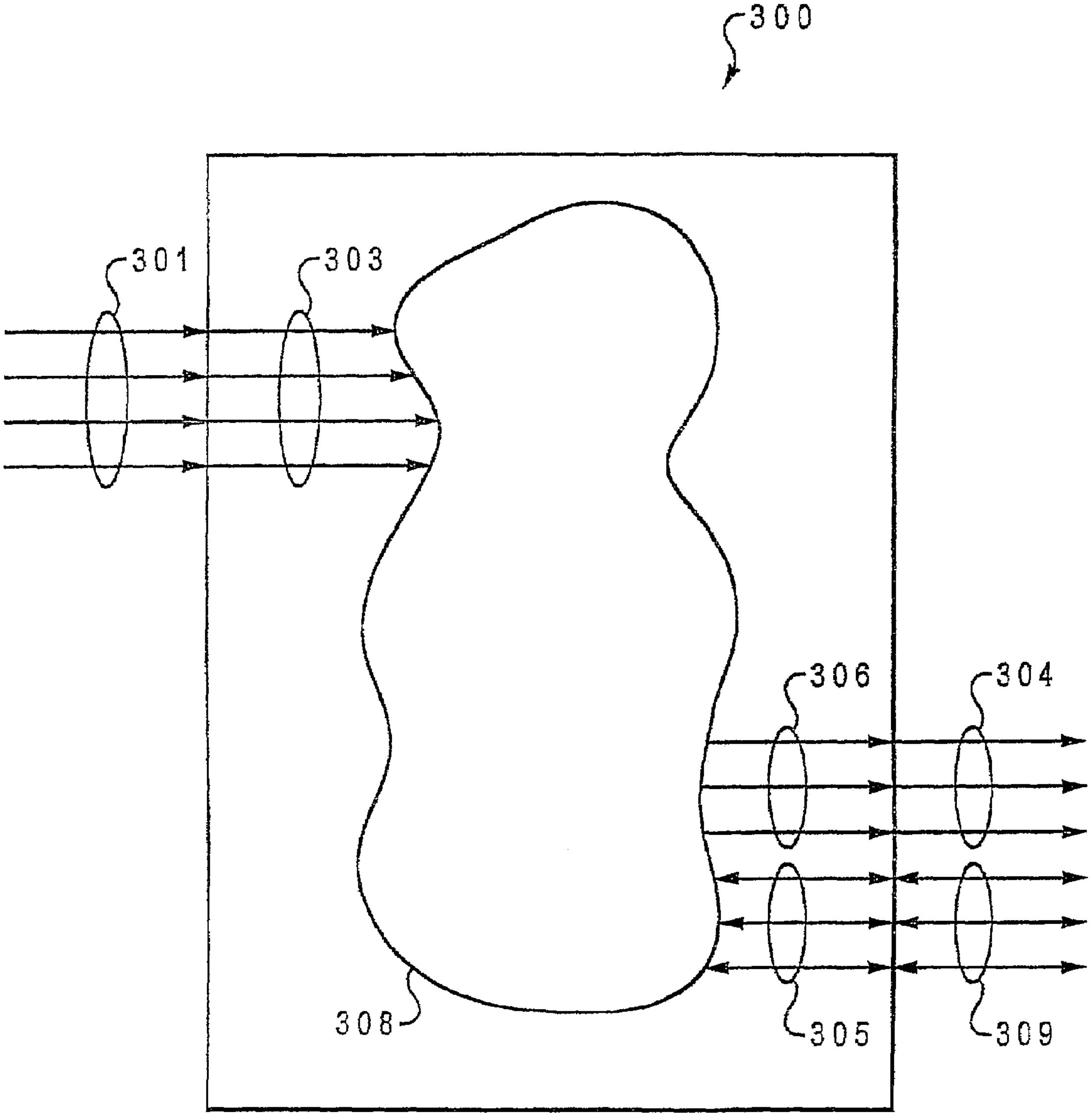
FIG. 3A is a simplified block diagram illustrating a digital design entity that may be instrumented in accordance with the teachings of the present invention.

Simulated digital circuit design models are comprised of at least one and usually many sub-units referred to hereinafter as design entities. FIG. 3A is a block diagram representation of an exemplary design entity 300 in which the method and system of the present invention may be implemented. Design entity 300 is defined by a number of components: an entity name, entity ports, and a representation of the function performed by design entity 300. Each entity within a given model has a unique name (not explicitly shown in FIG. 3A) that is declared in the HDL description of each entity. Furthermore, each entity typically contains a number of signal interconnections, known as ports, to signals outside the entity. These outside signals may be primary input/outputs (I/Os) of an overall design or signals connecting to other entities within an overall design.

Typically, ports are categorized as belonging to one of three distinct types: input ports, output ports, and bi-directional ports. Design entity 300 is depicted in as having a number of input ports 303 that convey signals into design entity 300. Input ports 303 are connected to input signals 301. In addition, design entity 300 includes a number of output ports 306 that convey signals out of design entity 300. Output ports 306 are connected to a set of output signals 304. Bi-directional ports 305 are utilized to convey signals into and out of design entity 300. Bi-directional ports 305 are in turn connected to a set of bi-directional signals 309. An entity, such as design entity 300, need not contain ports of all three types, and in the degenerate case, contains no ports at all. To accomplish the connection of entity ports to external signals, a mapping technique, known as a "port map", is utilized. A port map (not explicitly depicted in FIG. 3A) consists of a specified correspondence between entity port names and external signals to which the entity is connected. When building a simulation model, ECAD software is utilized to connect external signals to appropriate ports of the entity according to a port map specification.

Finally, design entity 300 contains a body section 308 that describes one or more functions performed by design entity 300. In the case of a digital design, body section 308 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Figure 3B:
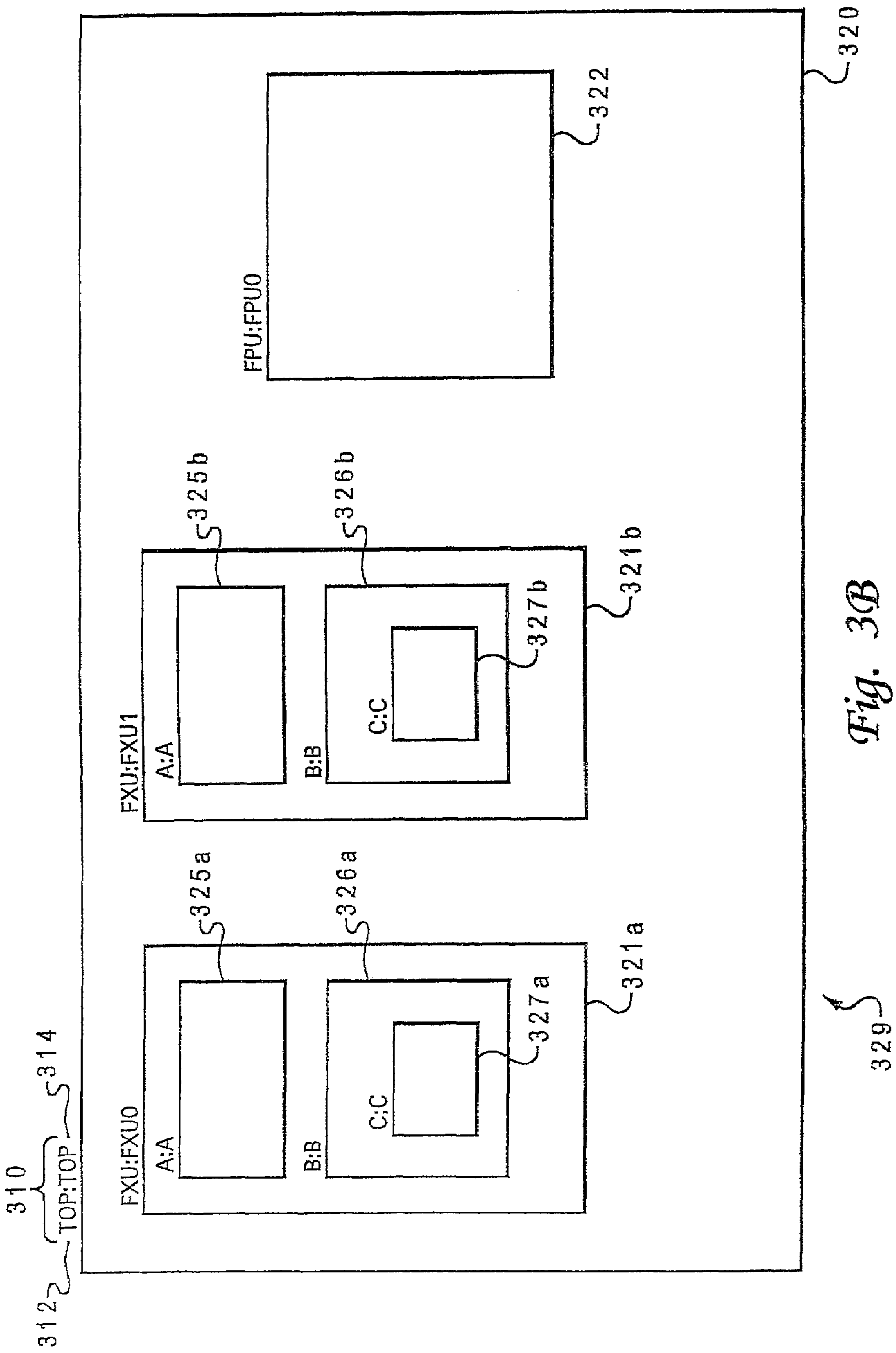
FIG. 3B is a diagrammatic representation depicting a simulation model that may be instrumented in accordance with the teachings of the present invention.

Referring now to FIG. 3B, there is illustrated a diagrammatic representation of an exemplary simulation model 329 that may be utilized in a preferred embodiment of the present invention. Simulation model 329 consists of multiple hierarchical entities. For visual simplicity and clarity, the ports and signals interconnecting the entities within simulation model 329 have not been explicitly shown. In any model, one and only one entity is the so-called "top-level entity". A top-level entity 320 is that entity which encompasses all other entities within simulation model 329. That is to say, top-level entity 320 instantiates, either directly or indirectly, all descendant entities within a design. Simulation model 329 consists of top-level entity 320 which directly instantiates two instances, 321*a* and 321*b*, of an FXU entity 321 and a single instance of an FPU entity 322. Each instantiation has an associated description, which contains an entity name and a unique instantiation name. For top-level entity 320, description 310 is labeled "TOP:TOP". Description 310 includes an entity name 312, labeled as the "TOP" preceding the colon, and also includes an instantiation name 314, labeled as the "TOP" following the colon.

It is possible for a particular entity to be instantiated multiple times as is depicted with instantiations 321*a* and 321*b* of FXU entity 321. Instantiations 321*a* and 321*b* are distinct instantiations of FXU entity 321 with instantiation names FXU0 and FXU1 respectively. Top-level entity 320 is at the highest level within the hierarchy of simulation model 329. An entity that instantiates a descendant entity will be referred to hereinafter as an "ancestor" of the descendant entity. Top-level entity 320 is therefore the ancestor that directly instantiates FXU entity instantiations 321*a* and 321*b*. At any given level of a simulation model hierarchy, the instantiation names of all instantiations must be unique.

In addition to FXU entity instantiations 321*a* and 321*b*, top-level entity 320 directly instantiates a single instance of a FPU entity 322 having an entity name FPU and instantiation name FPU0. Within an entity description, it is common for the entity name to match the instantiation name when only one instance of that particular entity is placed at a given level of a simulation model hierarchy. However, this is not required as shown by entity 322 (instantiation name FPU0, entity name FPU).

Within instantiation 321*a* of FXU entity 321, single instance entities 325*a* and 326*a* of entity A 325 and entity B 326 respectively, are directly instantiated. Similarly, instantiation 321*b* of the same FXU entity contains instantiations 325*b* and 326*b* of entity A 325 and entity B 326 respectively. In a similar manner, instantiation 326*a* and instantiation 326*b* each directly instantiate a single instance of entity C 327 as entities 327*a* and 327*b* respectively. The nesting of entities within other entities can continue to an arbitrary level of complexity provided that all entities instantiated, whether singly or multiply, have unique entity names and the instantiation names at any given level of the hierarchy are unique with respect to one another. Each entity is constructed from one or more HDL files that contain the information necessary to describe the entity.

Associated with each entity instantiation is a so called "instantiation identifier". The instantiation identifier for a given instantiation is a string consisting of the enclosing entity instantiation names proceeding from the top-level entity instantiation name. For example, the instantiation identifier of instantiation 327*a* of entity C 327 within instantiation

321*a* of FXU entity 321 is "TOP.FXU0.B.C". This identifier serves to uniquely identify each instantiation within a simulation model.

Figure 3C:
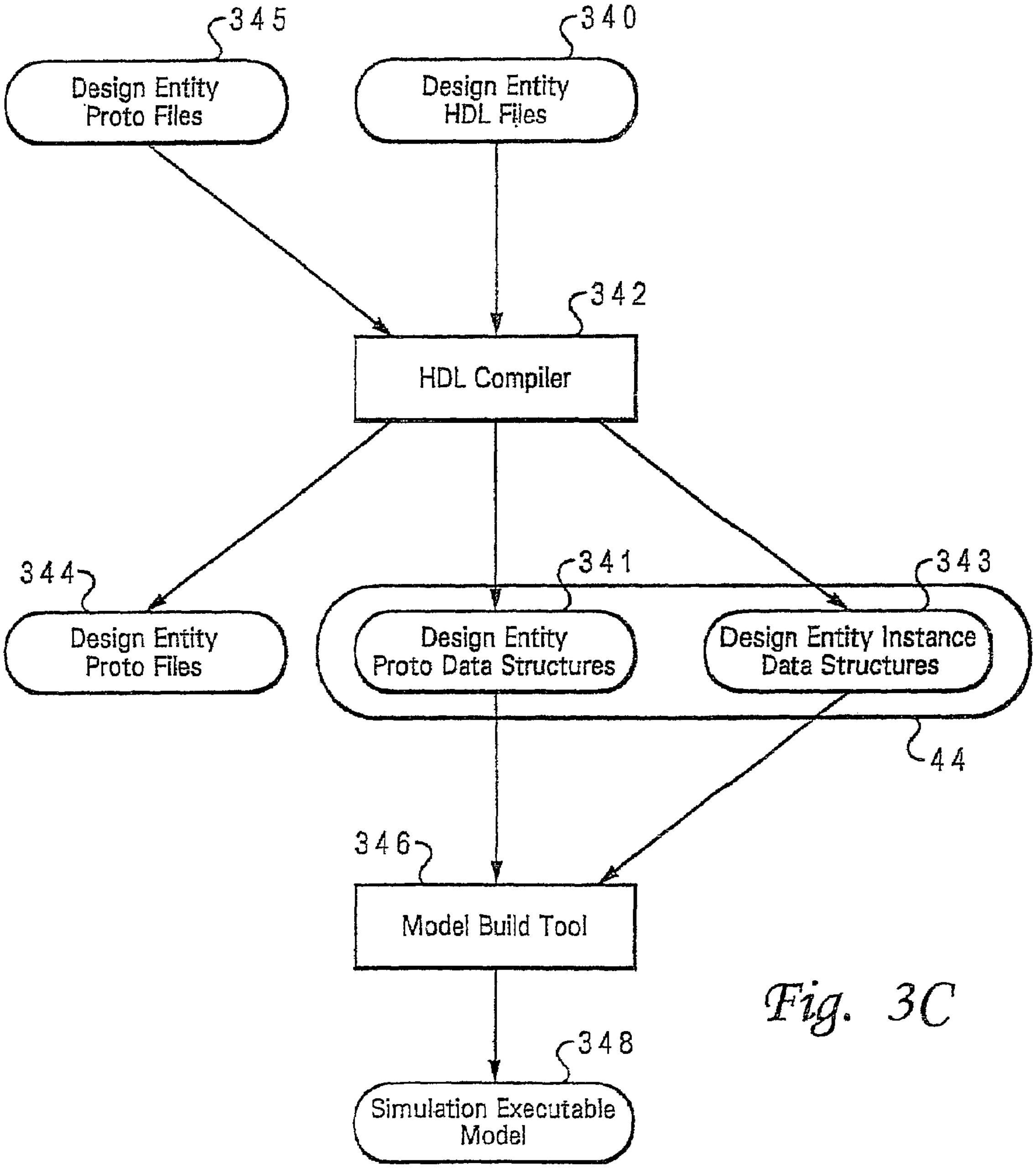
FIG. 3C is a flow diagram illustrating of a model build process that may be implemented in accordance with the teachings of the present invention.

Referring now to FIG. 3C, there is depicted a flow diagram of a model build process which may be implemented in a preferred embodiment of the present invention. The process begins with one or more design entity HDL source code files 340 and, potentially, one or more design entity intermediate format files 345, hereinafter referred to as "proto files" 345, available from a previous run of an HDL compiler 342. HDL compiler 342 processes HDL file(s) 340 beginning with the top level entity of a simulation model and proceeding in a recursive fashion through all HDL or proto file(s) describing a complete simulation model. For each of HDL files 340 during the compilation process, HDL compiler 342, examines proto files 345 to determine if a previously compiled proto file is available and consistent. If such a file is available and consistent, HDL compiler 342 will not recompile that particular file, but will rather refer to an extant proto file. If no such proto file is available or the proto file is not consistent, HDL compiler 342 explicitly recompiles the HDL file 340 in question and creates a proto file 344, for use in subsequent compilations. Such a process will be referred to hereinafter as "incremental compilation" and can greatly speed the process of creating a simulation executable model 348. Incremental compilation is described in further detail hereinbelow. Once created by HDL compiler 342, Proto files 344 are available to serve as proto files 345 in subsequent compilations.

In addition to proto files 344, HDL compiler 342 also creates two sets of data structures, design entity proto data structures 341 and design entity instance data structures 343, in memory 44 of computer system 10. Design entity proto data structures 341 and design entity instance data structures 343, serve as a memory image of the contents of a simulation executable model 348. Data structures 341 and 343 are passed, via memory 44, to a model build tool 346 that processes data structures 341 and 343 into simulation executable model 348.

It will be assumed hereinafter that each entity is described by a single HDL file. Depending on convention or the particular HDL in which the current invention is practiced, this restriction may be required. However, in certain circumstances or for certain HDLs it is possible to describe an entity by utilizing more than one HDL file. Those skilled in the art will appreciate and understand the extensions necessary to practice the present invention if entities are permitted to be described by multiple HDL files. Furthermore, it will be assumed that there is a direct correspondence, for each entity, between the entity name and both of the following: the name of the HDL file representing the entity, and the name of the proto file for the entity.

In the following description, an HDL source code file corresponding to a given entity will be referred to by an entity name followed by ".vhdl". For example, the HDL source code file that describes top-level entity 320 will be referred to as TOP.vhdl. This labeling convention serves as a notational convenience only and should not be construed as limiting the applicability of the present invention to HDLs other than VHDL.

Returning to FIG. 3B, it can be seen that each entity may instantiate, either directly or indirectly, one or more other entities. For example, the FXU entity directly instantiates A entity 325 and B entity 326. Furthermore, B entity 326 directly instantiates C entity 327. Therefore, FXU entity 321 instantiates, directly or indirectly, A entity 325, B entity 326 and C entity 327. Those entities, that are directly or indirectly instantiated by another entity, will be referred to hereinafter as "descendants". The descendants of top level entity 320 are FXU entity 321, FPU entity 322, A entity 325, B entity 326, and C entity 327. It can be seen that each entity has a unique set of descendants and that each time an entity is instantiated, a unique instance of the entity and its descendants is created. Within simulation model 329, FXU entity 321 is instantiated twice, FXU:FXU0 321*a* and FXU:FXU1 321*b*, by top-level entity 320. Each instantiation of FXU entity 321 creates a unique set of instances of the FXU, A, B, and C entities.

For each entity, it is possible to define what is referred to as a "bill-of-materials" or BOM. A BOM is a list of HDL files having date and time stamps of the entity itself and the entity's descendants. Referring again to FIG. 3C, the BOM for an entity is stored in proto file 344 after compilation of the entity. Therefore, when HDL compiler 342 compiles a particular HDL source code file among HDL files 340, a proto file 344 is generated that includes a BOM listing the HDL files 340 that constitute the entity and the entity's descendants, if any. The BOM also contains the date and time stamp for each of the HDL files referenced as each appeared on disk/tape 33 of computer system 10 when the HDL file was being compiled.

If any of the HDL files constituting an entity or the entity's descendants is subsequently changed, proto file 344 will be flagged as inconsistent and HDL compiler 342 will recompile HDL file 340 on a subsequent re-compilation as will be described in further detail below. For example, going back to FIG. 3B, the HDL files referenced by the BOM of FXU entity 321 are FXU.vhdl, A.vhdl, B.vhdl and C.vhdl, each with appropriate date and time stamps. The files referenced by the BOM of top-level entity 320 are TOP.vhdl, FXU.vhdl, A.vhdl, B.vhdl, C.vhdl, and FPU.vhdl with appropriate date and time stamps.

Returning to FIG. 3C, HDL compiler 342 creates an image of the structure of a simulation model in main memory 44 of computer system 10. This memory image is comprised of the following components: "proto" data structures 341 and "instance" data structures 343. A proto is a data structure that, for each entity in the model, contains information about the ports of the entity, the body contents of the entity, and a list of references to other entities directly instantiated by the entity (in what follows, the term "proto" will be utilized to refer to the in-memory data structure described above and the term "proto file" will be utilized to describe intermediate format file(s) 344). Proto files 344 are therefore on-disk representations of the in-memory proto data structure produced by HDL compiler 342.

An instance data structure is a data structure that, for each instance of an entity within a model, contains the instance name for the instance, the name of the entity the instance refers to, and the port map information necessary to interconnect the entity with external signals. During compilation, each entity will have only one proto data structure, while, in the case of multiple instantiations of an entity, each entity may have one or more instance data structures.

In order to incrementally compile a model efficiently, HDL compiler 342 follows a recursive method of compilation in which successive entities of the model are considered and loaded from proto files 345 if such files are available and are consistent with the HDL source files constituting those entities and their descendants. For each entity that cannot be loaded from existing proto files 345, HDL compiler 342 recursively examines the descendants of the entity, loads those descendant entities available from proto file(s) 345 and creates, as needed, proto files 344 for those descendants that are inconsistent with proto files 345. Pseudocode for the main control loop of HDL compiler 342 is shown below (the line numbers to the right of the pseudocode are not a part of the pseudocode, but merely serve as a notational convenience).

```
process_HDL_file(file)                                          5
{                                                               10
    if (NOT proto_loaded(file)) {                               15
        if (exists_proto_file(file) AND check_bom(file)) {      20
            load_proto(file);                                   25
        } else {                                                30
            parse_HDL_file(file)                                35
            for (all instances in file) {                       40
                process_HDL_file(instance);                     45
            }                                                   50
            create_proto(file);                                 55
            write_proto_file(file);                             60
        }                                                       65
    }                                                           70
    create_instance(file):                                      75
}                                                               80
```

When compiler 342 is initially invoked, no proto data structures 341 or instance data structures 343 are present in memory 44 of computer system 10. The main control loop, routine process_HDL_file( ) (line 5), is invoked and passed the name of the top level entity by means of parameter "file". The algorithm first determines if a proto data structure for the current entity is present in memory 44 by means of routine proto_loaded( ) (line 15). Note that the proto data structure for the top level entity will never be present in memory because the process starts without any proto data structures loaded into memory 44. If a matching proto data structure is present in memory 44, instance data structures for the current entity and the current entity's descendants, if any, are created as necessary in memory 44 by routine create_instance( ) (line 75).

However, if a matching proto data structure is not present in memory 44, control passes to line 20 where routine exists_proto_file( ) examines proto files 345 to determine if a proto file exists for the entity. If and only if a matching proto file exists, routine check_bom( ) is called to determine whether proto file 345 is consistent. In order to determine whether the proto file is consistent, the BOM for the proto file is examined. Routine check_bom( ) examines each HDL source code file listed in the BOM to determine if the date or time stamps for the HDL source code file have changed or if the HDL source code file has been deleted. If either condition occurs for any file in the BOM, the proto file is inconsistent and routine check_bom( ) fails. However, if check_bom( ) is successful, control is passed to line 25 where routine load_proto( ) loads the proto file and any descendant proto files into memory 44, thus creating proto data structures 341 for the current entity and the current entity's descendants, if any. The construction of process_HDL_file( ) ensures that once a proto file has been verified as consistent, all of its descendant proto files, if any, are also consistent.

If the proto file is either non-existent or is not consistent, control passes to line 35 where routine parse_HDL_file( ) loads the HDL source code file for the current entity. Routine parse_HDL_file( ) (line 35) examines the HDL source code file for syntactic correctness and determines which descendant entities, if any, are instantiated by the current entity. Lines 40, 45, and 50 constitute a loop in which the routine process_HDL_file( ) is recursively called to process the descendent entities that are called by the current entity. This process repeats recursively traversing all the descendants of the current entity in a depth-first fashion creating proto data structures 341 and proto data files 344 of all descendants of the current entity. Once the descendant entities are processed, control passes to line 55 where a new proto data structure is created for the current entity in memory 44 by routine create_proto( ). Control then passes to line 60 where a new proto file 344, including an associated BOM, is written to disk 33 by routine write_proto_file( ). Finally, control passes to line 75 where routine create_instance( ) creates instance data structures 343 for the current entity and any descendant entities as necessary. In this manner, process_HDL_file( ) (line 5) recursively processes the entire simulation model creating an in-memory image of the model consisting of proto data structures 341 and instance data structures 343.

Figure 3D:
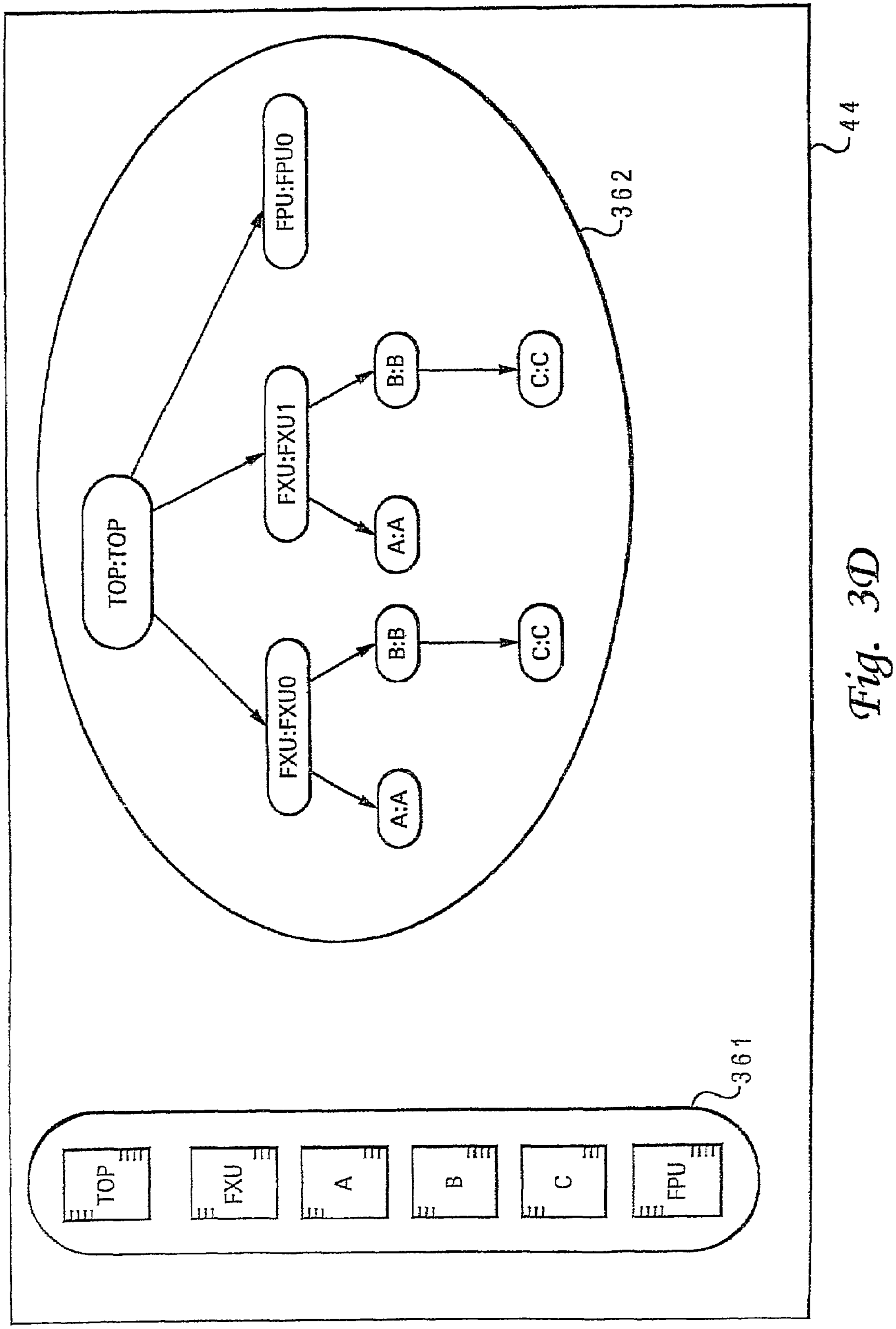
FIG. 3D is a block diagram depicting data structures that maybe instrumented in accordance with the teachings of the present invention.

With reference now to FIG. 3D there is depicted a block diagram representing compiled data structures, which may be implemented in a preferred embodiment of the present invention. Memory 44 contains proto data structures 361, one for each of the entities referred to in simulation model 329. In addition, instantiations in simulation model 329 are represented by instance data structures 362. Instance data structures 362 are connected by means of pointers indicating the hierarchical nature of the instantiations of the entities within simulation model 329. Model build tool 346 in FIG. 3C processes the contents of memory 44 into memory data structures in order to produce simulation executable model 348.

In order to instrument simulation models, the present invention makes use of entities known as "instrumentation entities," which are in contrast to the entities constituting a design which are referred to herein as "design entities". As with design entities, instrumentation entities are described by one or more HDL source code files and consist of a number of signal ports, a body section, and an entity name. In what follows, it will be assumed that an instrumentation entity is described by a single HDL file. Those skilled in the art will appreciate and understand extensions necessary to practice the current invention for an instrumentation entity that is described by multiple HDL files. Each instrumentation entity is associated with a specific design entity referred to hereinafter as the "target entity".

Figure 4A:
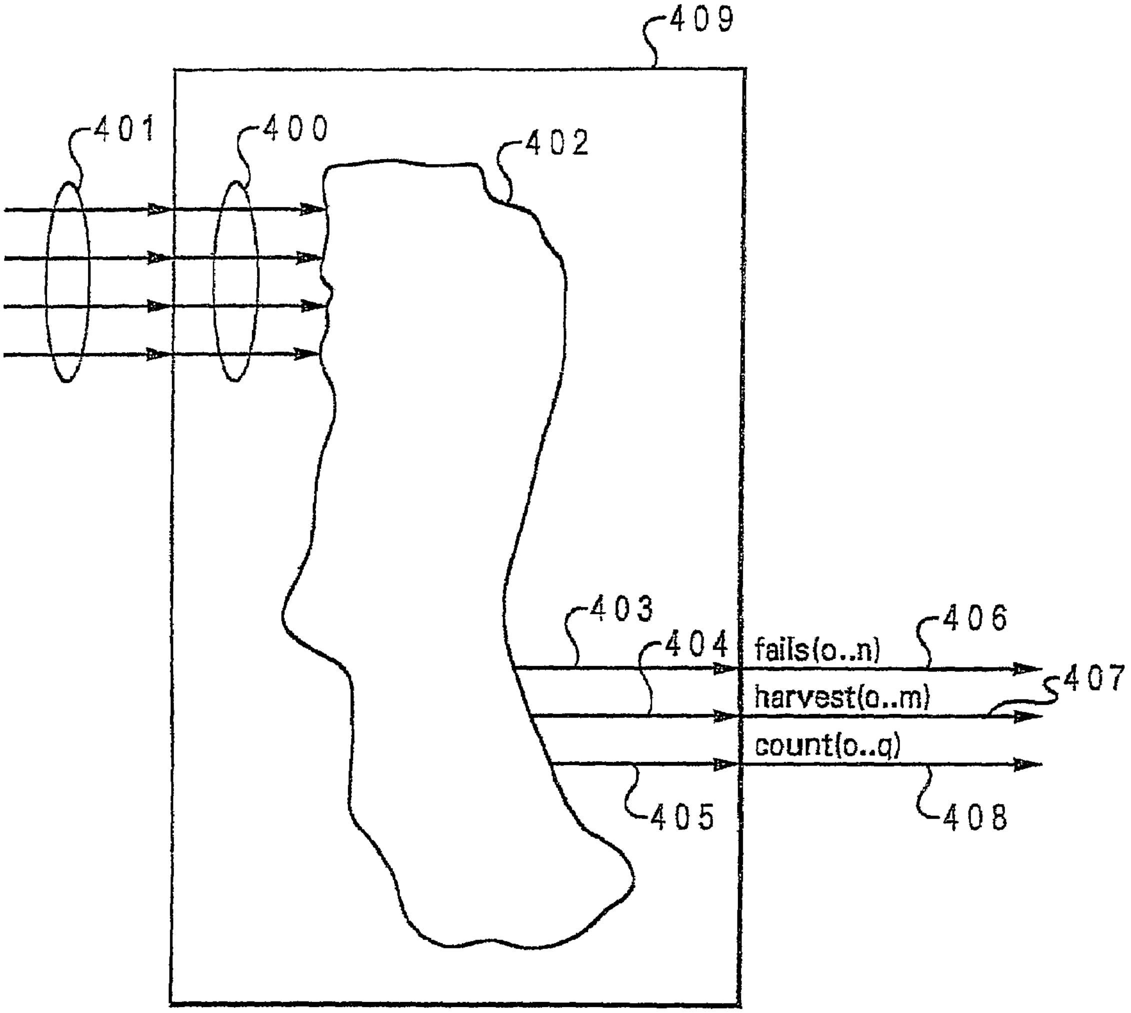
FIG. 4A is a simplified block diagram representative of an instrumentation entity.

With reference now to FIG. 4A, there is illustrated a block diagram representation of an instrumentation entity 409. Instrumentation entity 409 includes a number of input ports 400 that are connected to signals 401 within a target entity (not depicted in FIG. 4A). A body section 402 contains logic necessary to detect occurrences of specified conditions within the target entity and generate simulation model "events" with respect to signals 401. Three distinct types of events may be generated: "count" events, "fail" events, and "harvest" events, each described below in turn. Body section 402 contains internal logic for detecting occurrences of conditions precipitating generation of these events. A set of multi-bit output ports 403, 404, and 405 are connected to external instrumentation logic (depicted in FIG. 4B) by means of external signals 406, 407, and 408. Output ports 403, 404, and 405 thus provide the connection from the internal logic in body section 402 to the external instrumentation logic which is utilized to indicate the occurrence of count, failure and harvest events.

A failure event is a sequence of signal values that indicate a failure in the correct operation of the simulation model. Each instrumentation entity monitors the target entity for any desired number of failure events. Each occurrence of a failure event is assigned to a particular signal bit on output port 403. Logic within body section 402 produces an active high pulse on a specified bit of signal 403 when a failure condition is detected. Such activation of signal 403 is defined as a failure event. This error indication is conveyed by means of external signal 406 to external instrumentation logic (depicted in FIG.

4B as external instrumentation logic block 420), which flags the occurrence of the failure event.

A count event is a sequence of signal values that indicate the occurrence of an event within a simulation model for which it would be advantageous to maintain a count. Count events are utilized to monitor the frequency of occurrence of specific sequences within a simulation model. Each instrumentation entity can monitor the target entity for any desired number of count events. Each count event is assigned to a particular signal bit on output port 405. Logic block 402 contains the logic necessary to detect the occurrence of the desired count events and produces an active high pulse on the specified bit of signal 405 when a count event is detected. This count indication is conveyed by means of external signal 408 to instrumentation logic, which contains counters utilized to record the number of occurrences of each count event.

The third event type, a harvest event, is a sequence of signal values that indicate the occurrence of a specific operative circumstance, which would be advantageous to be able to reproduce. When a harvest event occurs, a register within an external instrumentation logic block is loaded to indicate at what point within a simulation run the event occurred, and a flag is set to indicate the occurrence of the specific circumstance. The details of the simulation run can thus be saved in order to recreate the specific circumstance monitored by the harvest event. Logic block 402 contains the logic necessary to detect the harvest events.

Each instrumentation entity can detect any desired number of harvest events that are each assigned to a particular signal bit on output port 404. Logic within block 402 produces an active high pulse on the specified bit of signal 404 when a harvest event is detected. This harvest event detection is conveyed by means of external signal 407 to external instrumentation logic that contains a register and flag for each harvest event. The register is utilized to record at which point in the simulation run the harvest event occurred, and the flag is utilized to indicate the occurrence.

Figure 4B:
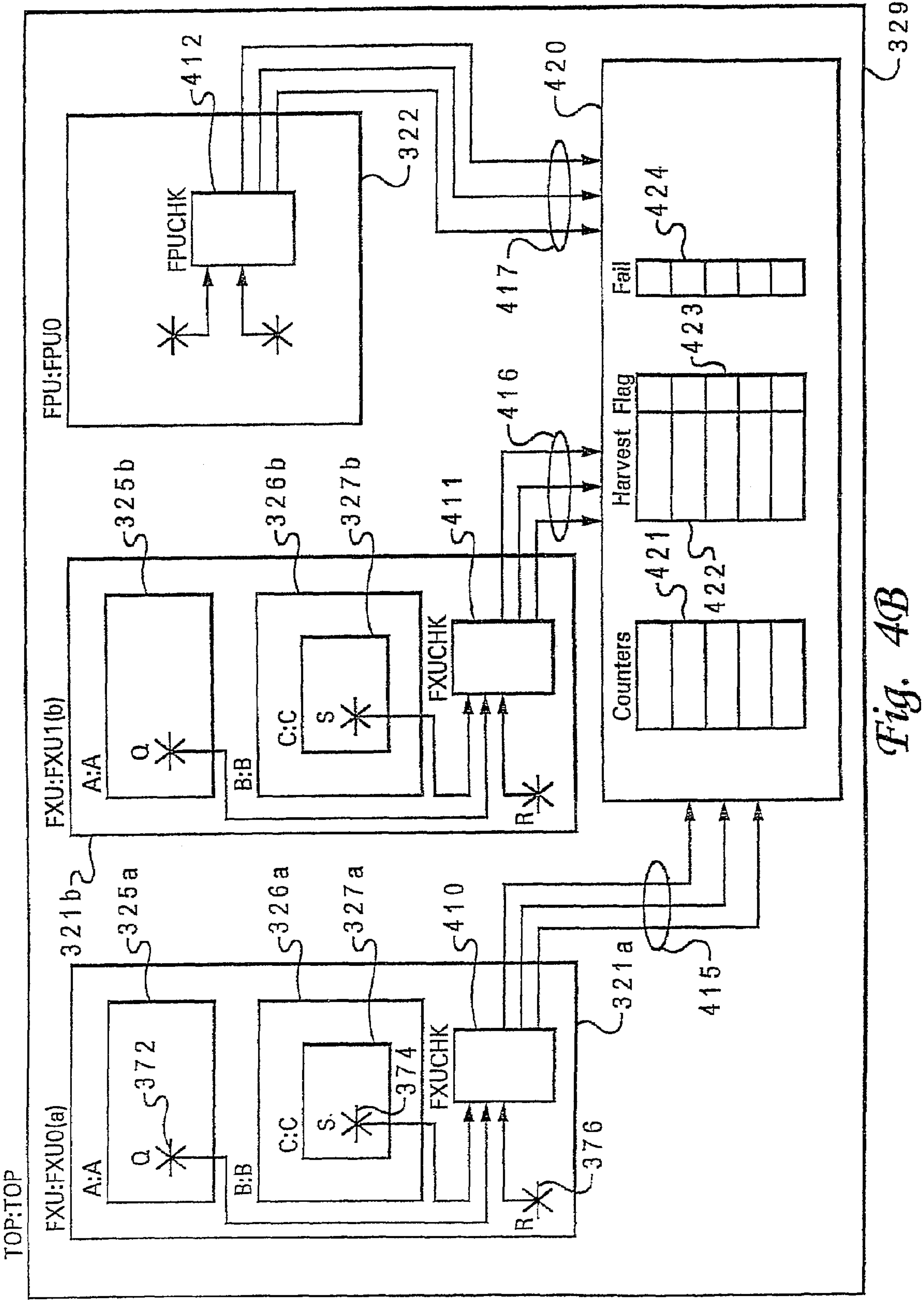
FIG. 4B is a simplified block diagram of a simulation model instrumented in accordance with the teachings of the present invention.

With reference now to FIG. 4B, there is depicted a block diagram representation of simulation model 329 instrumented in accordance with the teachings of the present invention. As can be seen in FIG. 4B, an instance 410 and an instance 411 of an instrumentation entity FXUCHK are utilized to monitor instances 321*a* and 321*b* of an FXU entity. For each FXU instantiations of 321*a* and 321*b*, an FXUCHK instantiation, 410 and 411 respectively, is automatically generated by the mechanism of the present invention. In a similar fashion, instrumentation entity FPUCHK 412 is instantiated to monitor FPU entity 322.

As depicted in FIG. 4B, entity FXUCHK monitors a signals Q 372, a signal R 376, and a signal S 374 within each of instances 321*a* and 321*b* of the FXU entity. Signal Q 372, is a signal within the instances 325*a* and 325*b* of descendant entity A. Likewise, signal S 374 is a signal within descendant entity C that resides within descendant entity B. Finally, signal R 376 occurs directly within FXU entity 321. Although an instrumentation entity may monitor any signal within a target entity or the target entity's descendent entities, signals outside the target entity cannot be monitored.

Each instrumentation entity is connected by means of fail, count, and harvest signals to instrumentation logic block 420 containing logic for recording occurrences of each of the three event types. For the count events monitored in simulation model 329, a set of counters 421 is utilized to count the number of occurrences of each count event. In a similar manner, a set of flags 424 is utilized to record the occurrence of failure events. Finally, a set of counters 422 and flags 423 are combined and utilized to record the point at which a harvest event occurs and its occurrence, respectively. In one embodiment of the present invention, a cycle number is captured and stored utilizing counters 422 and flags 423 to record a harvest event.

To facilitate instantiation and connection of instrumentation entities, instrumentation entity HDL source code files include a specialized comment section, hereinafter referred to as "instrumentation entity description", that indicates the target entity, the signals within the target entity to be monitored, and information specifying types of events to be monitored.

With reference now to FIG. 4C, there is illustrated an exemplary HDL file 440 that describes instrumentation entity FXUCHK depicted in FIG. 4B. HDL file 440 utilizes the syntax of the VHDL hardware description language. In the VHDL language, lines beginning with two dashes ("--") are recognized by a compiler as being comments. The method and system of the present invention utilize comments of a non-conventional form to indicate information about an instrumentation entity. FIG. 4C depicts one embodiment of the present invention in which comments begin with two exclamation points in order to distinguish these comments from conventional comments in instrumentation HDL file 440. It will be appreciated by those skilled in the art that the exemplary syntax utilized in FIG. 4C for the provision of unconventional comments is but one of many possible formats.

Within HDL file 440, the I/O ports of a FXUCHK entity are declared in entity declaration 450. Within entity declaration 450, three input ports, S_IN, Q_IN, and R_IN, respectively, are declared. Input ports, S_IN, Q_IN, and R_IN, will be attached to signal S, 374, signal Q, 372, and signal R, 376 respectively as described below. Input port, CLOCK, is also declared and will be connected to a signal, CLOCK, within the FXU entity. In addition, three output ports: fails (0 to 1), counts(0 to 2), and harvests(0 to 1), are declared. These output ports provide failure, count, and harvest signals for two failure events, three count events, and two harvest events. The names of the output ports are fixed by convention in order to provide an efficient means for automatically connecting these signals to instrumentation logic block 420.

A set of instrumentation entity descriptors 451 is utilized to provide information about the instrumentation entity. As illustrated in FIG. 4C, descriptor comments 451 may be categorized in a number of distinct sections: prologue and entity name declaration 452, an input port map 453, a set of failure message declarations 454, a set of counter declarations 455, a set of harvest declarations 456, and an epilogue 457.

The prologue and entity name 452 serve to indicate the name of the particular target entity that the instrumentation entity will monitor. Prologue and entity name declaration 452 also serves as an indication that the instrumentation entity description has begun. Specifically, the comment "--!! Begin" within prologue and entity name 452, indicates that the description of an instrumentation entity has begun. The comment "--!! Design Entity: FXU" identifies the target entity which, in HDL file 440, is design entity FXU. This declaration serves to bind the instrumentation entity to the target entity.

Input port map 453 serves as a connection between the input ports of an instrumentation entity and the signals to be monitored within the target entity. The comments begin with comment "--!! Inputs" and end with comment "--!! End Inputs". Between these comments, comments of the form "--!! inst_ent_port_name=>trgt_ent_signal_name" are utilized, one for each input port of the instrumentation entity, to indicate connections between the instrumentation entity ports and the target entity signals. The inst_ent_port_name is the name of the instrumentation entity port to be connected to the target entity signal. The trgt_ent_signal_name is the name of the signal within the target entity that will be connected to the instrumentation entity port.

In some cases a signal to be monitored lies within a descendant of a target entity. This is the case for signal S 374, which is embedded within entity C which is a descendant of entity B 326 and target FXU entity 321. Input port map 453 includes an identification string for signal S 374, which consists of the instance names of the entities within the target entity each separated by periods ("."). This identification string is pre-pended to the signal name. The signal mapping comment within input port map 453 for signal S 374 is therefore as follows:

--!!S_IN=>B.C.S;

This syntax allows an instrumentation entity to connect to any signal within the target entity or the target entity; s descendant entities. A signal appearing on the top level of the target design entity, has no pre-pended entity names; and therefore, has the following signal mapping comment:

--!!R_IN=>R;

For signals on the top level of the target entity, a special connection method is provided. If the signal to be connected to has the same name as its corresponding signal in the port map of the instrumentation entity, no input port mapping comment is required and the signal will be automatically connected if no such comment is present. In other words, if the input port mapping comment is of the form:

--!! signal=>signal;

where signal is a legal signal name without periods ("."), then the input port mapping comment is not required and the system of the present invention will automatically make the connect. It is also possible to provide comments of the form given above to explicitly denote the signal connection. This mechanism is only operative for signals on the top level of the target entity.

Failure message declarations 454 begin with a comment of the form "--!! Fail Outputs;", and end with a comment of the form "--!! End Fail Outputs;". Each failure event output is associated with a unique event name and a failure message. This message may be output by the simulation run-time environment upon detecting a failure event. The unique failure event name is utilized to identify the specific failure event within the model. Each failure event signal may be declared by a comment of the form "--!! n: <eventname> "failure message";" where n is an integer denoting the failure event to which the message is associated, <eventname> is the unique failure event name, and "failure message" is the message associated with the particular failure event. One and only one failure message declaration comment must be provided for each failure event monitored by the instrumentation entity.

Counter declaration comments 455 begin with a comment of the form "--!! Count Outputs;" and end with a comment of the form "--!! End Count Outputs;". Each count event output is associated with a unique variable name. This name is associated with a counter in counter logic 421 FIG. 4B. The variable name provides a means to identify and reference the particular counter associated with a particular count event. Thus, a comment of the form "--!! n: <varname> qualifying_ signal [+/−];" is associated with each counter event output. Within this convention, n is an integer denoting which counter event in the instrumentation module is to be associated with a variable name "varname," and qualifying signal is the name of a signal within a target design entity utilized to determine when to sample the count event pulse, as will be further described hereinbelow. The parameter "qualifying_signal" is followed by A+/−A to specify whether the qualifying signal will be a high active qualifying signal or a low active qualifying signal.

Harvest declarations 456 begin with a prologue comment of the form "--!! Harvest Outputs;" and end with a comment of the form "--!! End Harvest Outputs;". Each harvest event output is associated with a unique event name and a message that may be output by the simulation runtime environment when a harvest event has occurred during a simulation run. Each harvest event signal is declared in the form "--!! n: <eventname> "harvest message";" where n is an integer denoting which harvest event the message is to be associated with, <eventname> is the unique harvest event name and "harvest message" is the message to be associated with the particular harvest event. One, and only one, harvest message declaration comment must be provided for each harvest event monitored by the instrumentation entity.

Harvest messages and event names, fail messages and event names, and counter variable names for a simulation model are included in a simulation executable model and lists of all the events within the model are produced in separate files at model build time. In this manner, each simulation model includes the information for each event monitored and a separate file containing this information for each event is available. Furthermore, as will be described below, the model build process names each event within the model (count, fail and harvest) model in such a manner as to insure that each event has a unique name with certain useful properties.

Finally, epilogue comment 457 consists of a single comment of the form "--!! End;", indicating the end of descriptor comments 451. The remainder of instrumentation entity HDL file 440 that follows the I/O declarations described above is an entity body section 458. In entity body section 458, conventional HDL syntax is utilized to define internal instrumentation logic necessary to detect the various events on the input port signals and convey these events to the output port signals.

In addition to descriptor comments 451, that are located in the HDL source code file for an instrumentation entity, an additional comment line is required in the target entity HDL file. A comment of the form "--!! Instrumentation: name.vhdl", where name.vhdl is the name of the instrumentation entity HDL file, is added to the target entity HDL source code file. This comment provides a linkage between the instrumentation entity and its target entity. It is possible to have more than one such comment in a target entity when more than one instrumentation entity is associated with the target entity. These HDL file comments will hereinafter be referred to as "instrumentation entity instantiations".

Figure 4D:
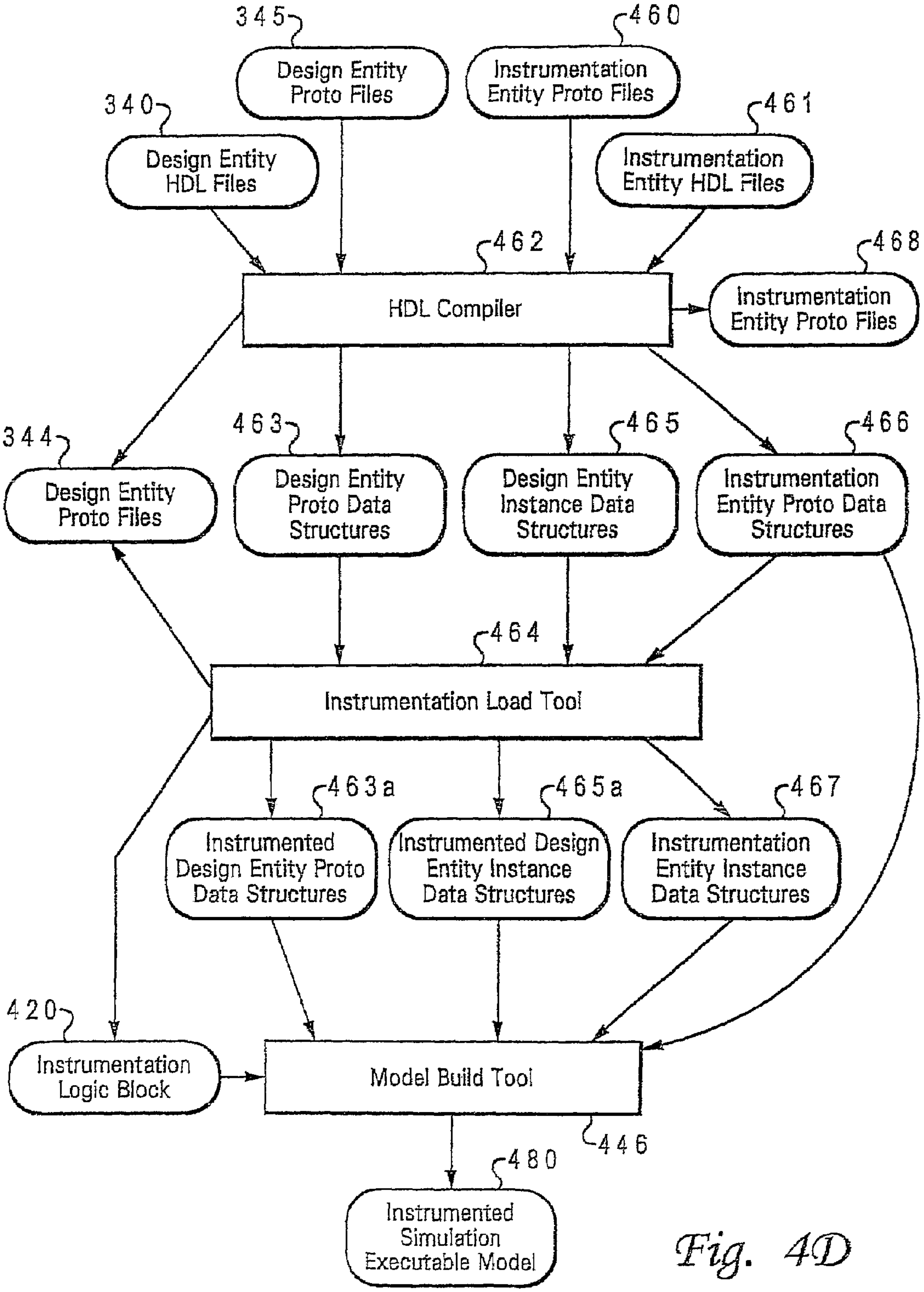
FIG. 4D is a flow diagram depicting a model build process in accordance with the teachings of the present invention.

With reference now to FIG. 4D, there is depicted a model build process in accordance with the teachings of the present invention. In this model build process, instrumentation load tool 464 is utilized to alter the in-memory proto and instance data structures of a simulation model thereby adding instrumentation entities to the simulation model. Instrumentation load tool 464 utilizes descriptor comments 451 within instrumentation HDL files 461 to create instance data structures for the instrumentation entities within a simulation model.

The model build process of FIG. 4D begins with design entity HDL files 340 and, potentially, one or more design entity proto files 345 (available from a previous run of HDL compiler 462), instrumentation entity HDL files 460, and potentially, one or more instrumentation entity proto files 461 (available from a previous run of HDL compiler 462). HDL compiler 462, processes design entity HDL files 340, and instrumentation entity HDL files 460 following an augmentation of algorithm process_HDL_file( ) that provides for efficient incremental compilation of the design and instrumentation entities comprising a simulation model. HDL compiler 462 loads proto data structures from design entity proto files 345 and instrumentation entity protos files 460, if such proto files are available and consistent. If such proto files are not available or are not consistent, HDL compiler 462 compiles design entity HDL files 340 and instrumentation entity HDL files 460 in order to produce design entity proto files 344 and instrumentation entity proto files 468. (Design entity proto files 344 and instrumentation entity proto files 468 are available to serve as design entity proto files 345 and instrumentation entity proto files 460 respectively for a subsequent run of HDL compiler 462.)

In addition, HDL compiler 462 creates in-memory design proto data structures 463 and design instance data structures 465 for the design entities of a simulation model. HDL compiler 462 also creates in-memory instrumentation proto data structures 466 for the instrumentation entities of a simulation model.

In order to minimize processing overhead HDL compiler 462 neither reads nor processes descriptor comments 451. However, HDL compiler 462 does recognize instrumentation entity instantiation comments within target entity HDL files. As such, HDL compiler 462 cannot create instance data structures instrumentation entity data structures 467. The creation of instance data structures requires interconnection information contained within descriptor comments 451 not processed by HDL compiler 462. HDL compiler 462 does, however, create instrumentation proto data structures 466.

The in-memory design proto data structures 463, design instance data structures 465, and instrumentation entity proto data structures 466, are processed by instrumentation load tool 464. Instrumentation load tool 464 examines design entity proto data structures 463 and design entity instance data structures 465 to determine those design entities that are target entities. This examination is accomplished by utilizing a particular comment format as previously described.

All target entities that are loaded from design entity proto files 345 contain an instantiation for any associated instrumentation entity. Therefore, instrumentation load tool 464 merely creates an instance data structure 467 for any such instrumentation entity and passes, the unaltered design proto data structure 463 to instrumented design proto data structure 463*a*, and passes design instance data structure 465 to instrumented design instance data structure 465*a*.

If however, a target entity is loaded from design entity HDL files 340, rather than from design entity proto files 345, instrumentation load tool 464 must alter its design proto data structure 463 and its design instance data structure 465 to instantiate an associated instrumentation entity. An instrumented design proto data structure 463*a* and instrumented design instance data structure 465*a* are thereby produced. In addition, instrumentation load tool 464 creates an instrumentation instance data structure 467 for each instrumentation entity associated with the current design entity.

The design entity proto data structures 463 that are altered by instrumentation load tool 464 are saved to disk 33 of computer system 10 as design entity proto files 344. Design entity proto files 344, which may include references to instrumentation entities, are directly loaded by a subsequent compilation of a simulation model, thus saving processing by instrumentation load tool 464 on subsequent recompilations unless an alteration is made to a design entity or an associated instrumentation entity.

In order for HDL compiler 462 to determine if alterations were made to either a target design entity or the target design entity's associated instrumentation entities, the BOM of a target design entity is expanded to include the HDL files constituting the instrumentation entities. In this manner, HDL compiler 462 can determine, by inspection of the BOM for a given design entity, whether to recompile the design entity and the design entity's associated instrumentation entities or load these structures from proto files 345 and 461.

Finally, instrumentation load tool 464 creates a unique proto and instance data structure for instrumentation logic block 420 and connects the fail, harvest, and count event signals from each instrumentation entity instantiation to instrumentation logic block 420. Model build tool 446 processes in-memory proto and instance data structures 463*a*, 465*a*, 467, 466 to produce instrumented simulation executable model 480.

In HDL compiler 462, algorithm process_HDL_file( ) is augmented to allow for the incremental compilation of design and instrumentation entities. A pseudocode implementation of a main control loop of HDL compiler 462 is shown below:

```
process__HDL__file2(file,design__flag)                          5
{                                                               10
    if (NOT proto__loaded(file)) {                              15
        if (exists__proto__file(file) AND check__bom(file)) {   20
        load__proto(file);                                      25
    }else {                                                     30
        parse__HDL__file(file)                                  35
        for (all instances in file) {                           40
            process__HDL__file2(instance, design__flag);        45
        }                                                       50
        if (design__flag=TRUE) {                                55
                for (all instrumentation instances in file){    60
                process__HDL__file2(instance, FALSE);           65
            }                                                   70
        }                                                       75
        create__proto(file);                                    80
        write__proto__file(file);                               90
    }                                                           95
}                                                               100
if (design__flag=TRUE) {                                        105
create__instance(file);                                         110
    }                                                           115
}                                                               120
```

Algorithm process_HDL_file2( ) is an augmentation to process_HDL_file( ) of HDL compiler 342 in order to support the creation of instrumented simulation models. The algorithm is invoked with the name of the top level design entity passed through parameter file and a flag indicating whether the entity being processed is a design entity or an instrumentation entity passed through parameter design_flag (design_flag=TRUE for design entities and FALSE for instrumentation entities). Algorithm process_HDL_file2( ) (line 5) first checks, by means of routine proto_loaded( ) (line 15), if the proto for the current entity is already present in memory 44. If so, processing passes to line 105. Otherwise, control is passed to line 20 and 25 where disk 33 of computer system 10 is examined to determine if proto files for the entity and its descendants (including instrumentation entities, if any) exist and are consistent. If so, the appropriate proto files are loaded from disk 10 by routine load_proto( ) (line 25) creating proto data structures, as necessary, in memory 44 for the current entity and the current entity's descendants including instrumentation entities.

If the proto file is unavailable or inconsistent, control passes to line 35 where the current entity HDL file is parsed. For any entities instantiated within the current entity, lines 40 to 55 recursively call process_HDL_file2( ) (line 5) in order to process these descendants of the current entity. Control then passes to line 55 where the design_flag parameter is examined to determine if the current entity being processed is a design entity or an instrumentation entity. If the current entity is an instrumentation entity, control passes to line 80. Otherwise, the current entity is a design entity and lines 60 to 70 recursively call process-HDL_file2( ) (line 5) to process any instrumentation entities instantiated by means of instrumentation instantiation comments. It should be noted that algorithm process_HDL_file2( ) (line 5) does not allow for instrumentation entities to monitor instrumentation entities. Any instrumentation entity instantiation comments within an instrumentation entity are ignored. Control then passes to line 80 where proto data structures are created in memory 44 as needed for the current entity and any instrumentation entities. Control then passes to line 90 where the newly created proto data structures are written, as needed to disk 33 of computer system 10.

Control finally passes to line 105 and 110 where, if the current entity is a design entity, instance data structures are created as needed for the current entity and the current entity's descendants. If the current entity is an instrumentation entity, routine create_instance( ) (line 110) is not called. Instrumentation load tool 464 is utilized to create the in-memory instance data structures for instrumentation entities.

It will be apparent to those skilled in the art that HDL compiler 462 provides for an efficient incremental compilation of design and instrumentation entities. It should also be noted that the above description is but one of many possible means for accomplishing an incremental compilation of instrumentation entities. In particular, although many other options also exist, much, if not all, of the functionality of instrumentation load tool 464 can be merged into HDL compiler 462.

Figure 4E:
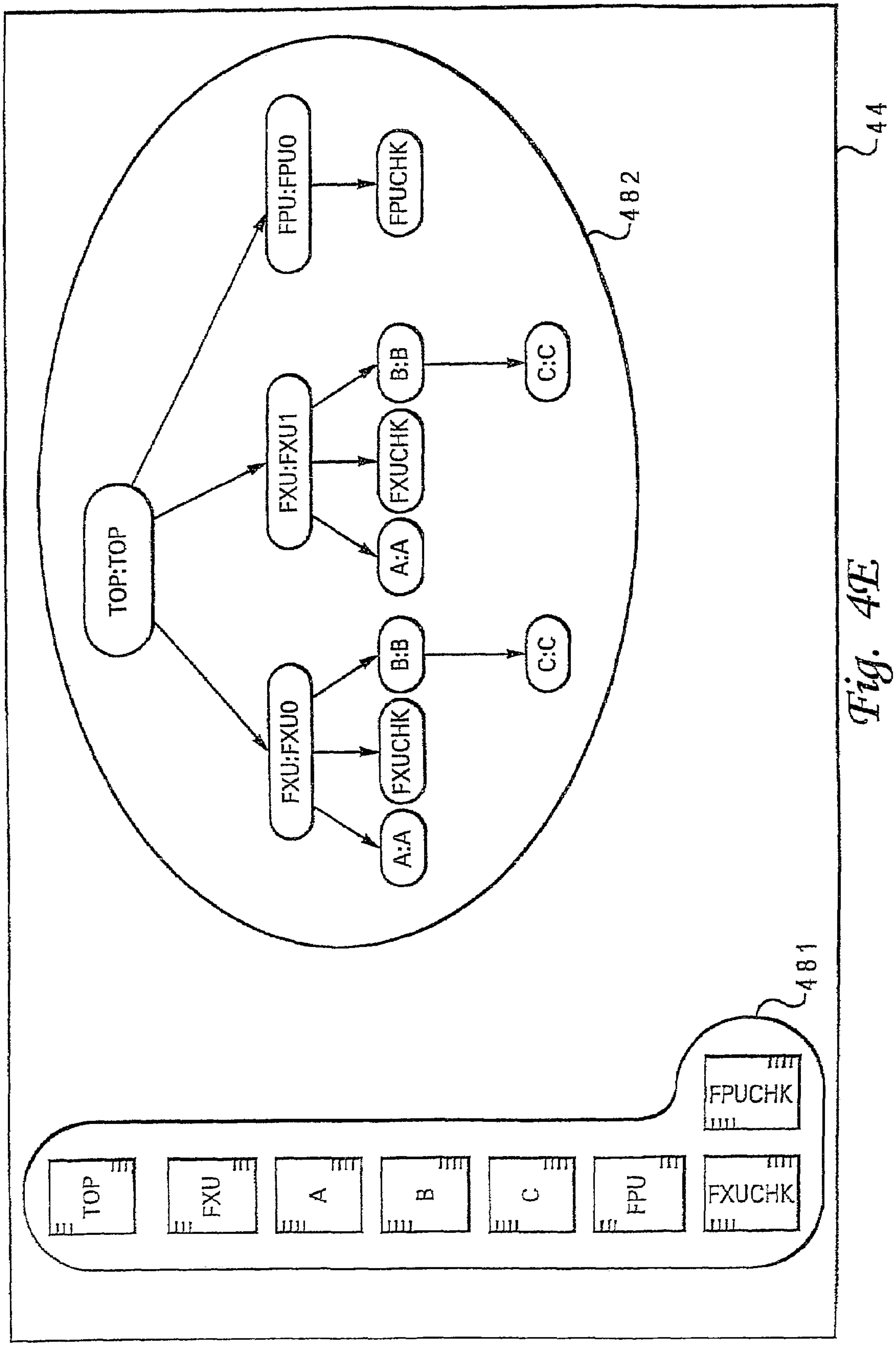
FIG. 4E is a block diagram representation of memory data structures constructed in accordance with the teachings of the present invention.

With reference now to FIG. 4E wherein is shown a depiction of memory 44 at the completion of compilation of simulation model 329 with instrumentation entities FXUCHK and FPUCHK. Memory 44 contains proto data structures 481, one for each of the design and instrumentation entities referred to in simulation model 329. In addition, design and instrumentation instances in simulation model 329 are represented by instance data structures 482. The instance data structures are connected by means of pointers indicating the hierarchical nature of the instantiations of the design and instrumentation entities within simulation model 329.

Figure 5A:
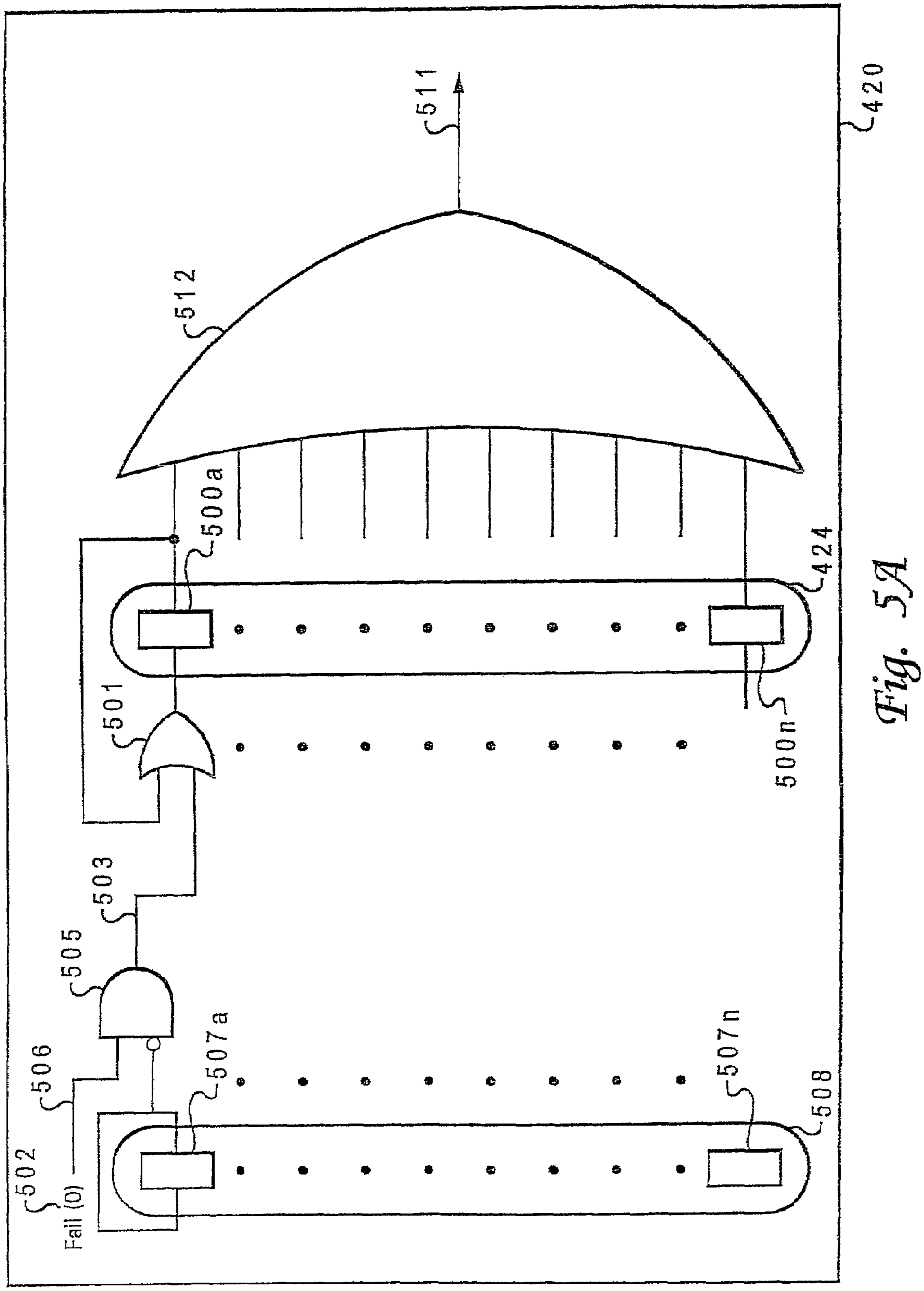
FIG. 5A is a logic diagram representation of a runtime disable mechanism in accordance with the teachings of the present invention.

With reference now to FIG. 5A, failure flags 424 of instrumentation logic block 420 are depicted in greater detail. Failure flags 424 consist of registers 500*a*-500*n* utilized to accept and store an indication of the occurrence of a failure event. In what follows, the operation of a single failure flag for a particular failure event 502 will be discussed. The operation of all failure flags is similar.

Register 500*a* holds a value that represents whether a failure event 502 has occurred or not. Register 500*a* is initially set to a value of '0' by the simulation run-time environment at the beginning of a simulation run. When failure event 502, if enabled at register 507*a*, occurs, register 500*a* is set to a value of a logical>1', thereby indicating the occurrence of a failure event. Register 500*a* is driven by logical OR gate 501. Logical OR gate 501 performs a logical OR of the output of register 500*a* and a qualified failure signal 503 to create the next cycle value for register 500*a*. In this manner, once register 500*a* is set to a logical >1' by the occurrence of an enabled failure event, register 500*a* maintains the value of a logical >1' until reset by the simulation runtime environment. Likewise, register 500*a* maintains a value of '0' from the beginning of the simulation run until the occurrence of the failure event, if enabled.

Qualified failure signal 503 is driven by logical AND gate 505. Logical AND gate 505 produces, on qualified failure signal 503, the logical AND of failure signal 506 and the logical NOT of register 507*a*. Register 507*a* serves as an enabling control for qualified failure signal 503. If register 507*a* contains a value of '0', logical AND gate 505 will pass failure event signal 506 unaltered to qualified failure signal 503. In this manner, the monitoring of the failure event is enabled. Registers 507*a*-507*n* are set, by default, to a value of '0'. However, if register 507*a* contains a value of a logical >1', qualified failure signal 503 will remain at a value of '0' irrespective of the value of failure event signal 506, thereby disabling the monitoring of failure event 502. In this manner, register 508, consisting of registers 507*a*-507*n*, can mask the occurrence of any subset of failure events in the overall simulation model from registers 500*a*-500*n*.

To efficiently implement the ability to selectively disable the monitoring of failure events, the simulation run-time environment includes a function that allows a user to disable monitoring of a specific failure event for a given instrumentation entity. This function will automatically set the appropriate registers among registers 507*a*-507*n* within register 508 to disable the monitoring of a particular failure event for every instance of the instrumentation entity within the overall simulation model. Instrumentation load tool 464 and model build tool 446 encode sufficient information within instrumented simulation executable model 480 to determine which failure bits within register 508 correspond to which instrumentation entities.

The ability to selectively disable monitoring of failure events is of particular use in large batch-simulation environments. Typically, in such an environment, a large number of general purpose computers, running software or hardware simulators, are dedicated to automatically running a large number of simulation runs. If a simulation model with a faulty instrumentation entity that incorrectly indicates failure events is run in such an environment, a large number of erroneous failures will be generated causing lost time. By selectively disabling failure events within instrumentation entities, the present invention allows simulation to continue while only disabling erroneous failure signals rather than having to disable all failure monitoring. This option is particularly useful when the process of correcting a faulty instrumentation entity and creating a new simulation model is substantially time consuming. The present invention also provides similar enabling and disabling structures for the harvest and count events within a model.

Logical OR gate 512 is utilized to produce a signal 511, which indicates whether any failure event within the model has occurred. This signal is utilized to allow hardware simulators to efficiently simulate simulation models that have been instrumented according to the teachings of the present invention.

Figure 5B:
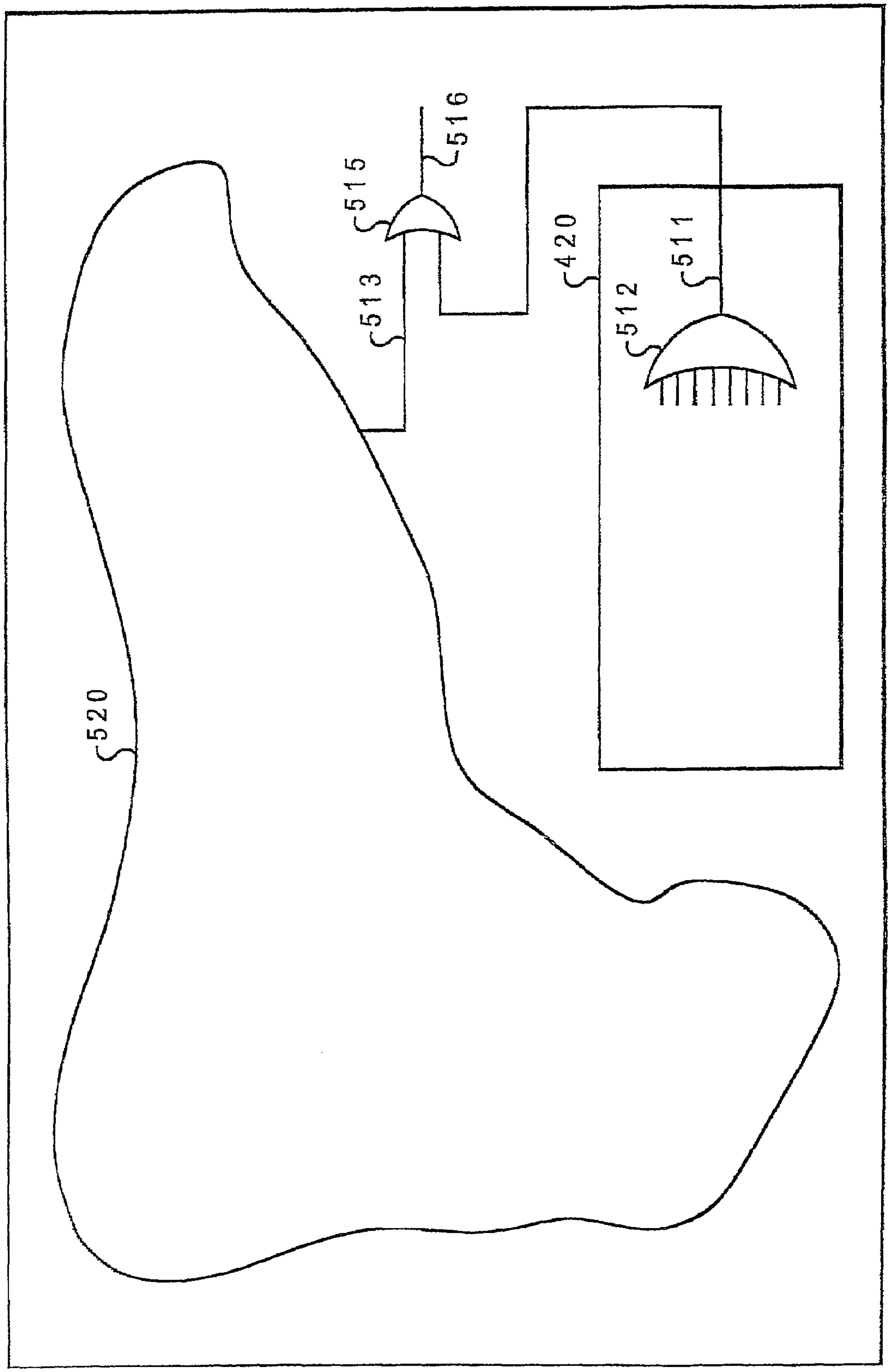
FIG. 5B is a block diagram representation of functional units utilized to execute the method and system of the present invention on a hardware simulator in accordance with the teachings of the present invention.

With reference now to FIG. 5B there is illustrated in greater detail, features of the present invention utilized to support efficient execution of an instrumented simulation model on a hardware simulator. It should be noted that for most hardware simulators, the operation of polling a facility within a simulation model during a simulation run is often a time consuming operation. In fact, if facilities must be polled every cycle, it is often the case that as much time, if not considerably more, is spent polling a simulation model for results rather than running the actual simulation. As such, it is advantageous when using a hardware simulator to avoid polling facilities within the model during a simulation run. In addition, many hardware simulators provide a facility that instructs the hardware simulator to run a simulation without interruption until a specific signal within the simulation model attains a specific value. This facility usually results in the highest performance for a simulation run on a hardware simulator.

In order to execute simulation model 520 on a hardware simulator, a termination signal 513, is typically utilized as a means to avoid having to poll the model after each cycle. Typically, a hardware simulator will cycle simulation model 520 until signal 513 is asserted to a logical >1'. The assertion of termination signal 513 to a logical >1' indicates that a simulation run has finished. Without termination signal 513, it would be necessary to directly poll facilities within simulation model 520 to determine when a simulation run is completed.

To efficiently locate and diagnose problems in simulation model 520, it is advantageous to allow a simulation run to be stopped immediately whenever a failure event occurs during simulation of simulation model 520 (harvest events and count events are typically only polled at the end of a simulation run). This allows a user to easily locate the failure event within the simulation run, thereby facilitating debugging of the failure. In order to allow simulation models that have been instrumented according to the teachings of the present invention to efficiently execute on a hardware simulator, a comment of the form "--!! Model Done: signalname" is placed within the HDL source code file for the top level entity of the simulation model where signalname is the name of termination signal 513 within the simulation model. This comment is only utilized if present in the HDL file for the top-level entity. If such a comment is present in the HDL source code file for the top level entity, a logical OR gate 515 will automatically be included within the simulation model. Logical OR gate 515 produces the logical OR of signals 511 and 513 on signal 516. Signal 516 is therefore asserted to a logical>1' whenever the simulation run has completed (signal 513 high) or a failure event has occurred (signal 511 high). Consequently, by executing simulation model 520 in a hardware simulator until signal 516 is asserted to a value of a logical >1', the instrumentation for simulation model 520 can be combined and utilized along with existing simulation termination techniques in a seamless manner. In the alternative, if the comment indicating the name of termination signal 513 is not present, logical OR gate 515 is not included in the model and signal 511 is directly connected to signal 516. The name of signal 516 is fixed to a particular name by convention.

In many simulators, the passage of time within the simulated model is modeled on a cycle-to-cycle basis. That is to say, time is considered to pass in units known as cycles. A cycle is delineated by the occurrence of a clock signal within a simulation model that regulates the updating of storage elements within the design. These simulators are commonly known as "cycle simulators". A cycle simulator models a digital design by repeatedly propagating the values contained within storage elements through interconnecting logic that lies between storage elements without specific regard for the physical timing of this propagation, to produce next cycle values within the storage elements. In such simulators, a primitive storage element, hereinafter referred to as a "simulator latch", is utilized to model the storage elements within a digital design. One simulator cycle therefore consists of propagating the current values of the simulator latches through the interconnecting logic between storage elements and updating the simulator latches with the next cycle value.

In many circumstances, however, it is not possible to utilize a single simulator latch to directly model the storage elements within a design. Many common storage elements utilized within digital designs often require more than one simulator latch. For example, so called master-slave flip-flops are generally modeled utilizing two simulator latches to accurately simulate the behavior of such storage elements. In order to efficiently model storage elements, a designer will typically refer to a library that contains storage element simulation models for use in a design. These design storage elements are modeled by one or more simulator latches. Storage elements comprised of one or more simulator latches that are implemented within a design will be referred to hereinbelow as "design latches".

As a consequence of utilizing multiple simulator latches to model a design latch, the process of propagating the input of a design latch to its output, which constitutes a design cycle, often requires more than one simulator cycle. A single design cycle is thus defined as comprising the number of simulator cycles required to propagate a set of values from one set of storage elements to the next.

In other circumstances, a simulation model may consist of distinct portions that are clocked at differing frequencies. For example, a microprocessor core connected to a bus interface unit, may operate at a higher frequency and than the bus interface unit. Under these circumstances, the higher frequency portion of the design will require one or more simulator cycles, say N cycles, to simulate a single design cycle. The lower frequency portion of the design will require a multiple of N simulator cycles in order to simulate a design cycle for the lower frequency portion. This multiple is equal to the ratio of the frequency of the higher speed design portion to the frequency of the lower speed design portion. It is often the case that certain portions of the logic can be run at a number of differing frequencies that are selectable at the beginning of a simulation run. Such logic, with a run-time selectable frequency of operation, presents unique challenges for monitoring count events.

Figure 6A:
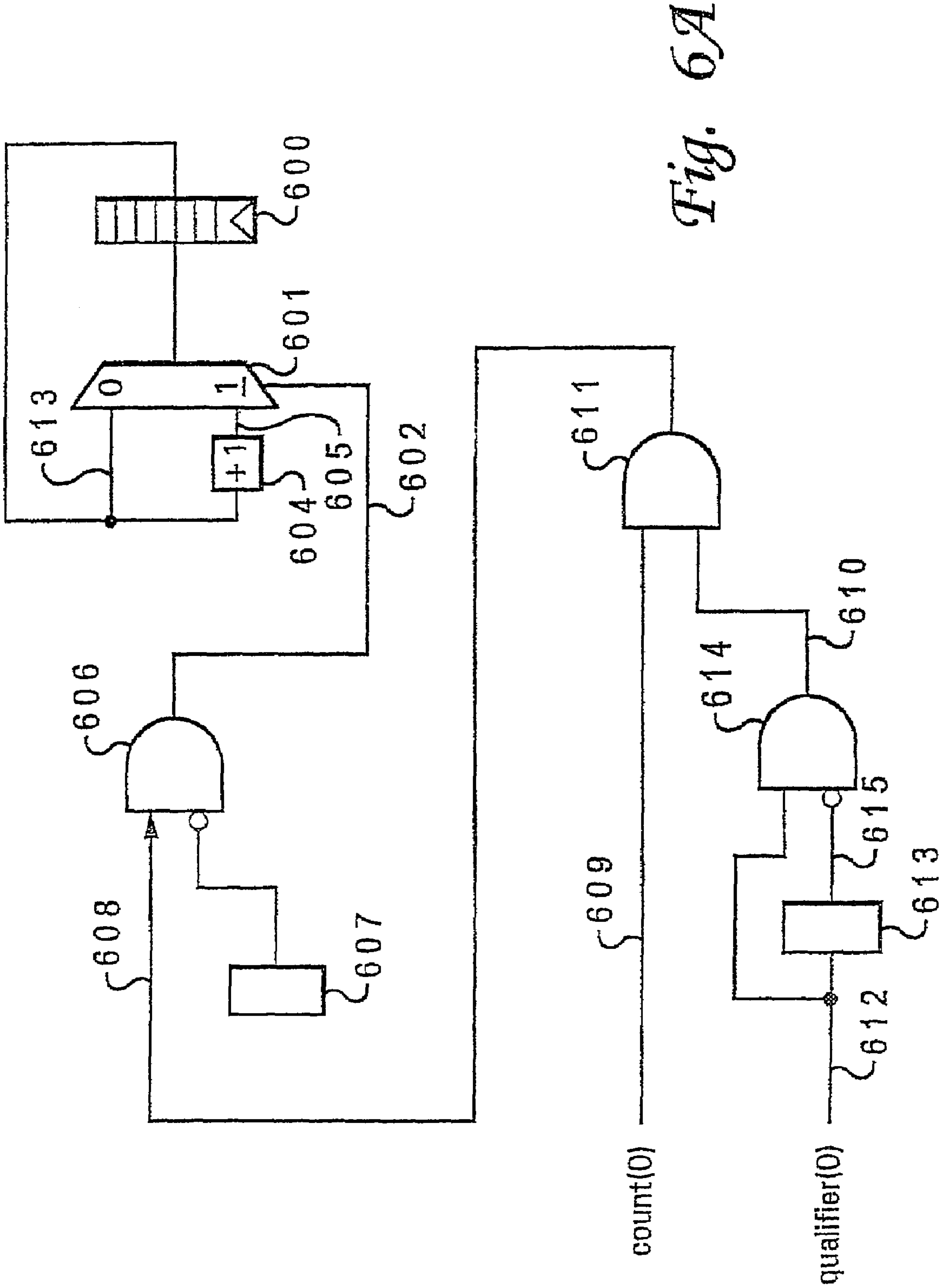
FIG. 6A is a simplified gate level representation of an exemplary counting instrument with a runtime disable feature and automatic clocking adjustment in accordance with the teachings of the present invention.

With reference now to FIG. 6A, there is depicted a gate level representation of exemplary logic for one counter of counters 421 within instrumentation logic block 420 depicted in FIG. 4B. Each counter of 421 is represented by a multi-bit simulator latch 600. Simulator latch 600 is initialized by the simulation runtime environment to a value of zero at the beginning of a simulation run. Simulator latch 600 is updated every simulator cycle and is driven by multiplexer 601. Multiplexer 601, controlled by selector signal 602, selects between signal 613, the current value of simulator latch 600, and signal 605, the current value of simulator latch 600 incremented by 1 by incrementer 604, to serve as the next cycle value for simulator latch 600. By selecting signal 605, multiplexer 601 causes the counter value within simulator latch 600 to be incremented when a count event occurs. It should be noted, however, that simulator latch 600 is updated every simulator cycle irrespective of the number of simulator cycles that correspond to a design cycle for the logic being monitored by a counting instrument. Logical AND gate 606 and simulator latch 607 serve to disable the monitoring of count event signal 609 in a manner similar to that described above for the disabling of failure events. Signal 608 is count event signal 609 further qualified by signal 610 by means of logical AND gate 611.

Signal 610 insures that simulator latch 600 will be incremented, if count event signal 609 is active, only once per design cycle for the logic being monitored by a counting instrument irrespective of the number of simulation cycles utilized to model the design cycle. This clocking normalization is necessary to ensure that the event counts recorded in counters 421 correspond directly to the number of design cycles the event occurred in and not the number of simulator cycles the event occurred in. For example if an event occurs in two design cycles where design cycle require four simulators cycles, it is preferable to have the event counter reflect a value of two rather than a value of eight as would occur if the counter were allowed to update in every simulator cycle.

Furthermore, if the count event being monitored is within a portion of the logic with a run-time selectable frequency of operation, it is useful to have the count registers reflect the number of occurrences of the event in terms of design cycles. For example, consider a circumstance where a count event occurs twice during two different simulation runs. In the first run, assume that four simulator cycles are needed to represent each design cycle. Further assume in the second run that twelve simulator cycles are necessary to represent each design cycle. Without a clocking normalization mechanism, the first run would indicate that the event occurred eight times (two occurrences times four simulator cycles per occurrence) and the second run would indicate that the event occurred twenty-four times (two occurrences times twelve simulator cycles per occurrence) when in fact the event actually only occurred twice in both simulation runs. Therefore, it would be advantageous to limit the updating of counters 421 such that each counter is only updated once per design cycle irrespective of the number of simulator cycles, possibly variable at run-time, needed to represent a design cycle.

In simulation models in which multiple simulator cycles are utilized to represent a single design cycle, explicit clocking signals are utilized within the model to control the updating of the various design storage elements. These clocking signals specify in which simulator cycles the simulator latches representing design storage elements are allowed to update. A clocking signal is asserted high for some contiguous number of simulator cycles at either the beginning or end of the design cycle and asserted low for the remaining simulator cycles within the design cycle. If the clocking signal is asserted high during the beginning of the design cycle, the clock is referred to as a "high-active" clock and, likewise, if the clocking signal is asserted low during the beginning of the design cycle, the clock is referred to as a "low-active" clock.

Each count event signal has an associated qualifying signal as specified by counter declaration comments 455 as described above. Typically, these qualifying signals are connected to the clocking signals within the design responsible for updating the storage elements within the portion of logic monitored by the count event. The qualifying signal for the count event for simulator latch 600, qualifying signal 612, is depicted as a high-active qualifier signal. Qualifying signal 612 is processed by simulator latch 613 and logical AND gate 614, to produce signal 610 which is active high for one and only one simulator cycle within the design cycle delineated by qualifying signal 612.

Figure 6B:
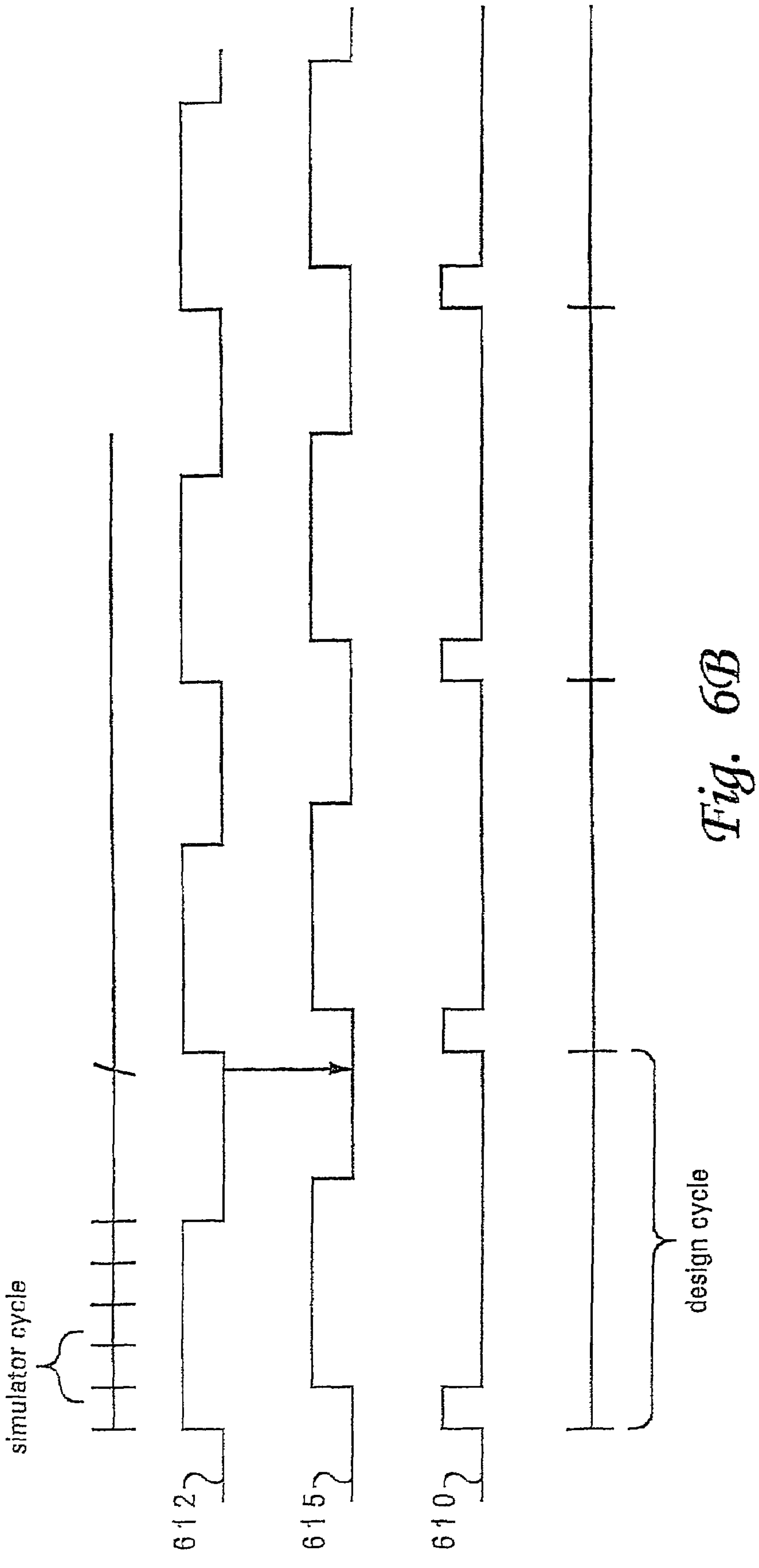
FIG. 6B is a simplified timing diagram illustrating automatic clocking adjustment of counting instrumentation.

Turning now to FIG. 6B there is illustrated a simplified timing diagram that demonstrates operation of simulator latch 613 and logical AND gate 614 assuming clocking qualifying signal 612 is a high active clocking signal of fifty percent duty cycle for a design cycle that occurs over a 10-simulation cycle period. Signal 615, the output of simulator latch 613, is qualifying signal 612 delayed by one simulator cycle. Signal 615 is inverted and logically ANDed with qualifying signal 612 to produce signal 610, a high-active pulse that is asserted for the first simulator cycle of the design cycle. In a similar fashion, if the qualifying clock signal is low active, qualifying signal 612 would be inverted and signal 615 would be uninverted by logical AND gate 614. This would produce a single simulator cycle active high pulse during the first simulator cycle of the design cycle. Qualifying signal 610, by qualifying count event signal 609 by means of logical AND gate 611, insures that counter 600 is incremented only once per design cycle irrespective of the number of simulator cycles utilized to represent a design cycle.

In contrast to cycle simulators, another class of simulators know as "event-driven" simulators is commonly utilized. In an event driven simulator, time is modeled in a more continuous manner. Each rising or falling edge of a signal or storage element within a design is modeled with specific regard to the physical time at which the signal transition occurred. In such simulators, the simulator latches operate in a slightly different manner than for a cycle based simulator. A simulator latch in an event driven simulator is controlled directly by a clocking signal. A new value is loaded into the simulator latch on either the rising or falling edge of the clocking signal (called a "positive-edge triggered" latch and a "negative-edge triggered" latch respectively). To practice the current invention within an event driven simulator, latch 613 and logical gates 614 and 611 are unnecessary. Rather, counter latch 600 is replaced by a positive or negative edge triggered simulator latch based on the polarity of qualifying signal 612. Qualifying signal 612 is connected directly to simulator latch 600 and directly controls the updates of counter latch 600 insuring that the latch is updated only once per design cycle.

Returning to FIG. 6A, incrementer 604 represents but one possible mechanism that may be utilized to implement the next logic state for a given counter within the present invention. As depicted in FIG. 6A, incrementer 604 ensures that counters 421 within a model are cycled through a series of values whose binary patterns correspond to the customary representation of non-negative integers. In one embodiment of the present invention, incrementer 604 is comprised of an adder that increments the current value of counter 600 by a unit value each time signal 605 is selected by selector signal 602. This exemplary implementation provides for convenience of decoding the value of counter 600 at the termination of a simulation run, but does so at a cost in overhead that is not acceptable in many simulators.

For software simulators, one of two basic approaches maybe utilized to model an incrementer, such as incrementer 604. In the first approach, the incrementer is modeled directly by an ADD or INCREMENT instruction in the simulation execution model. When incrementers are modeled directly as a single instruction within the simulation execution model, the use of incrementer 604 provides for efficient counters within a simulation execution model.

However, many software simulators and virtually all hardware simulators model incrementer functions as a set of gates that are replicated essentially without change at each bit position of the counter. Within a software simulator, these gates must be translated into a sequence of instructions. In a hardware simulator, these gates are explicitly replicated for each counter as individual gates. Due to implementation or structural limitations, many software simulators are incapable of modeling an incrementer in any other manner than as a set of gates. Clearly, for these software simulators that must model incrementers as a number of gates and therefore as a sequence of instructions, a performance loss will result over those software simulators that model incrementers as a single increment or add instruction. Likewise, for hardware simulators, the number of gates required for each adder, which must be modeled directly by gates within the hardware simulator, can prove to be a significant burden.

The method and system of the present invention alleviate these difficulties by implementing a linear feedback shift register as the counting means within counting instrumentation. As explained below, appropriate configuration and utilization of such a liner feedback shift register results in an efficient method of incrementing a counter that avoids the overhead associated with incrementer 604.

Figure 7:
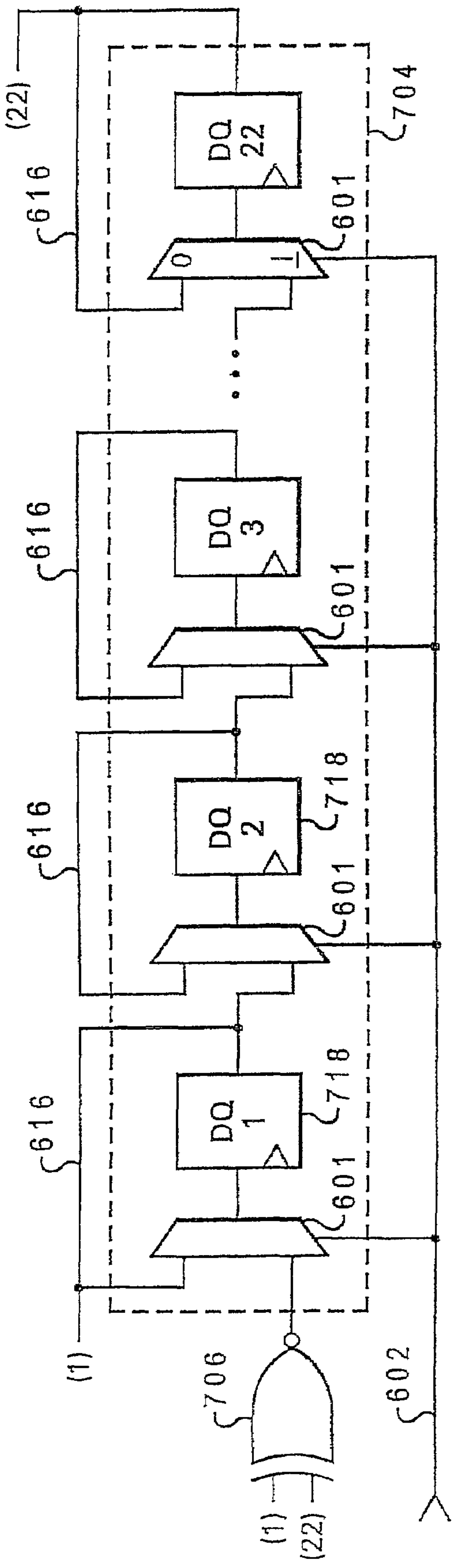
FIG. 7 depicts an alternative counting means that may be employed for counting events detected by instrumentation entities in accordance with the teachings of the present invention.

With reference now to FIG. 7, there is depicted a linear feedback shift register (LFSR) counter 700 consisting of a shift register 704 and "exclusive NOR" (XNOR) gate 706. Various methods of constructing LFSRs are known to those skilled in the art. As illustrated in FIG. 7, LFSR counter 700 includes a modified shift register 704 that may replace register 600 and incrementer 604 of FIG. 6A. LFSR counter 700 also includes multiplexer 601 (replicated bit-by-bit within LFSR 704), which provides feedback paths 616. Feedback path 616 provides a means for shift register 704 to maintain its current value during those simulator cycles in which no count pulse trigger (signal 602) is received. For hardware and software design simulators in which, for logistical or other reasons, incrementation of counters must be accomplished utilizing a set of gates for each counter, shift register 704 replaces register 600 within the counter logic depicted in FIG. 6A. The need for incrementer 604 is thus eliminated and is replaced by XNOR gate 706. In this manner, register 600 and incrementer 604 are replaced utilizing a more efficient logic structure having substantially reduced overhead. Counters 421 of FIG. 4B will therefore consist of LFSR-based configurations such as LFSR counter 700 whose values can be decoded at the end of a simulation run to reveal their corresponding integral values.

Shift register 704 can be of any desired length. In a preferred embodiment, shift register 704 is a 22 bit register, although larger or smaller registers may be employed. Shift register 704 consists of latches 718 arranged in a serial fashion such that a given latch's output is utilized as input to the next latch 718 within shift register 704. In addition, each of a select subset of latches 718 within shift register 704 has its output sourced to XNOR gate 706. XNOR gate 706 is utilized to provide an input for the first latch within shift register 704.

The LFSR is a logic structure that, when properly configured, will sequence through all possible bit patterns with the exception of the all-ones pattern (it is possible to construct LFSRs which exclude the all-zeros pattern or LFSRs that cycle through all possible bit patterns). For example, in a 22-bit LFSR, bits 1 and 22 may be selected for inputs to XNOR gate 706 to provide a sequence of bit patterns in shift register 704, which traverses every possible permutation with the exception of the all-ones pattern. Shift register 704 must be loaded with an initial value that is not the all ones pattern. This maybe accomplished automatically by initializing all latches to a binary zero value within the simulator, or by utilizing the control program that drives the simulator to explicitly set these latches to binary zeros.

After initialization, the numeric pattern held by bit positions 718 of shift register 704 will cycle through a specific and predictable pattern in a repeating fashion. That is to say, for any given bit pattern present in shift register 704, there is a specific, unique pattern the shift register will subsequently assume upon being shifted and therefore, the sequence of patterns through which the shift register cycles is fixed and repeats in a predictable manner. Due to these properties, LFSR counter 700 can be utilized as a counting means within for the instrumentation detection means previously described. By assigning the value of "zero" to a pre-selected starting value (say the all zeros pattern for shift register 704), the value of "one" to the next bit pattern formed by shifting the LFSR, and so on, the LFSR can serve as a counter. To be useful as a counter, the bit patterns within shift register 704 must be converted back to their corresponding integer values. This is easily accomplished for LFSRs with a small number of bits (less than 25 bits) by means of a lookup table consisting of an array of values, where the index of the array corresponds to the LFSR bit pattern value and the entry in the array is the decoded integer value for the LFSR. For LFSRs with a larger number of bits, software decoding techniques can be utilized to decode the LFSR value by simulating the operation of the LFSR.

As illustrated in FIG. 7, the logic necessary to implement LFSR counter 700 consists of the single XNOR gate 706 with two feedback inputs. While the number of required feedback gates and inputs thereto may vary in proportion to different possible lengths of an LFSR, in general, for typical LFSRs (less than 200 bits), only one XNOR gate with a relatively small number of inputs (less than 5 bits) is required. This is in marked contrast to the several logic gates per bit required for conventional incrementers. Therefore, significant savings in counter overhead can be achieved by substituting LFSR-based counter 700 for the incrementer structure depicted in FIG. 6A, especially for simulators that model incrementers utilizing logic gate based representations.

While the above described system and method provides a practical means of instrumenting simulation models, in certain circumstances additional techniques maybe used in order to enhance the ease with which a user may instrument a simulation model. In design, it often occurs that there are common design or instrumentation logic constructs that are often repeated and possess a regular structure.

By utilizing knowledge of the regular structure of these design and instrumentation logic constructs, it is often possible to define a syntax that describes the instrumentation logic with considerably greater efficiency than would be possible utilizing a conventional HDL construct. By utilizing this syntax as an unconventional HDL comment within a design VHDL file, it is possible to create instrumentation entities with considerably greater ease and efficiency.

Such comments within a design entity will be referred to hereinbelow as an embedded instrumentation entity comment while the instrumentation logic created by such a comment will be referred to as an embedded instrumentation entity.

A common logic design construct is the so-called "finite state machine". A finite state machine typically consists of a number of storage elements to maintain the "state" of the state machine and combinatorial logic that produces the next state of the state machine and its outputs. These constructs occur with great frequency in typical logic designs and it is advantageous to be able to efficiently instrument these constructs.

A typical set of count and failure events for a finite state machine includes counting the number of times a state machine cycles from a given current state to some next state, counting the number of functional cycles the state machine spends in each state, ensuring that the state machine does not enter an illegal state, and ensuring that the state machine does not proceed from a current given state to an illegal next state. This list of events is but one of many possible sets of events that can be used to characterize a finite state machine and is used in an illustrative manner only.

Figure 8A:
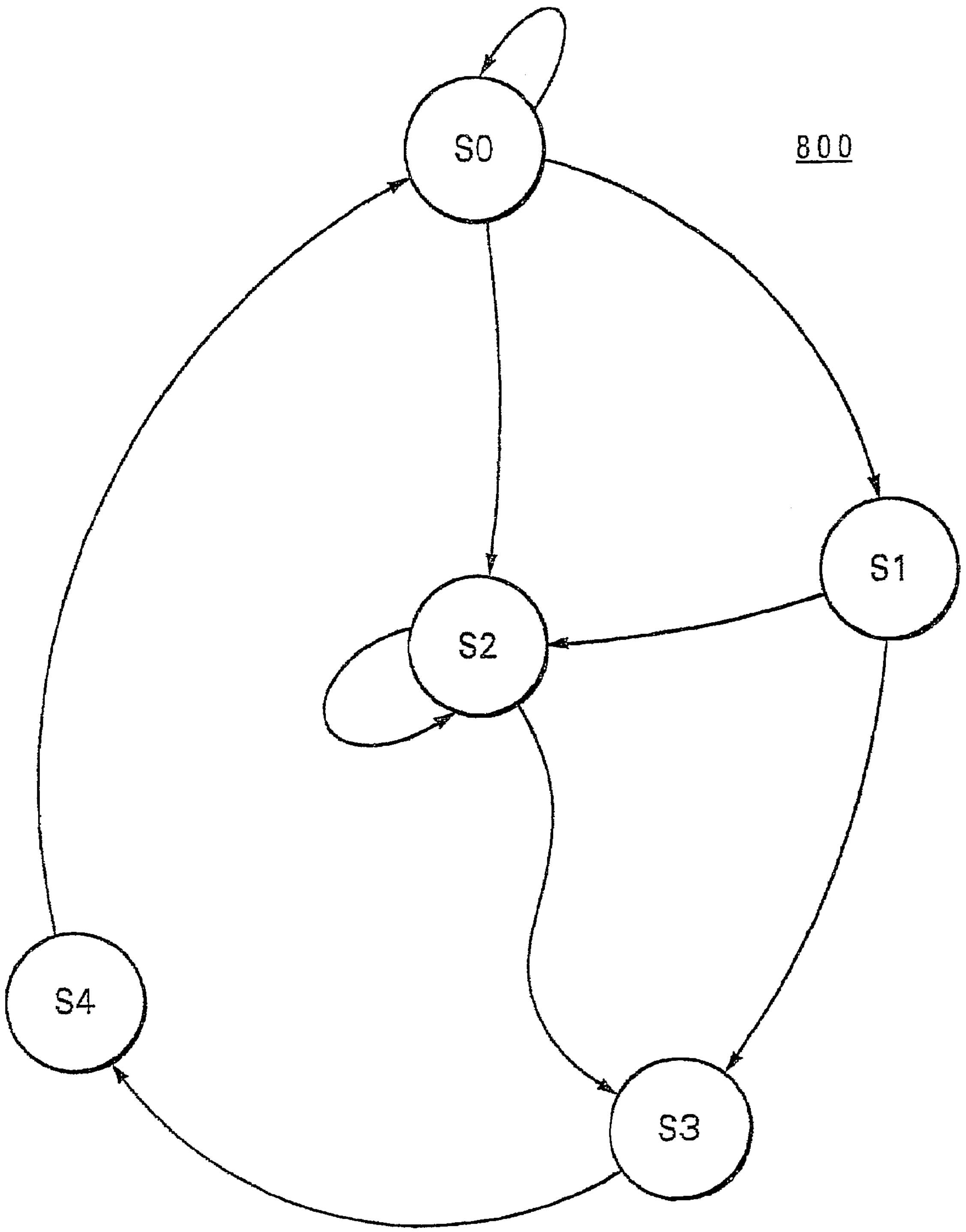
FIG. 8A illustrates a conventional finite state machine that may be instrumented with an embedded checker in accordance with the teachings of the present invention.

With reference now to FIG. 8A there is depicted a representation of an exemplary state machine 800. Exemplary state machine 800 consists of five states, labeled S0, S1, S2, S3, and S4 respectively, and nine legal state transitions between these states. In what follows, it is assumed that state machine 800 consists of three latches and a set of combinatorial logic to produce the next state function. It is further assumed that the states are encoded into the three latches following the usual and customary encoding for integers. That is to say, state S0 gets an encoding of $000_{bin}$, state S1 gets an encoding of $001_{bin}$, state S2 gets and encoding of $010_{bin}$, and so on.

Figure 8B:
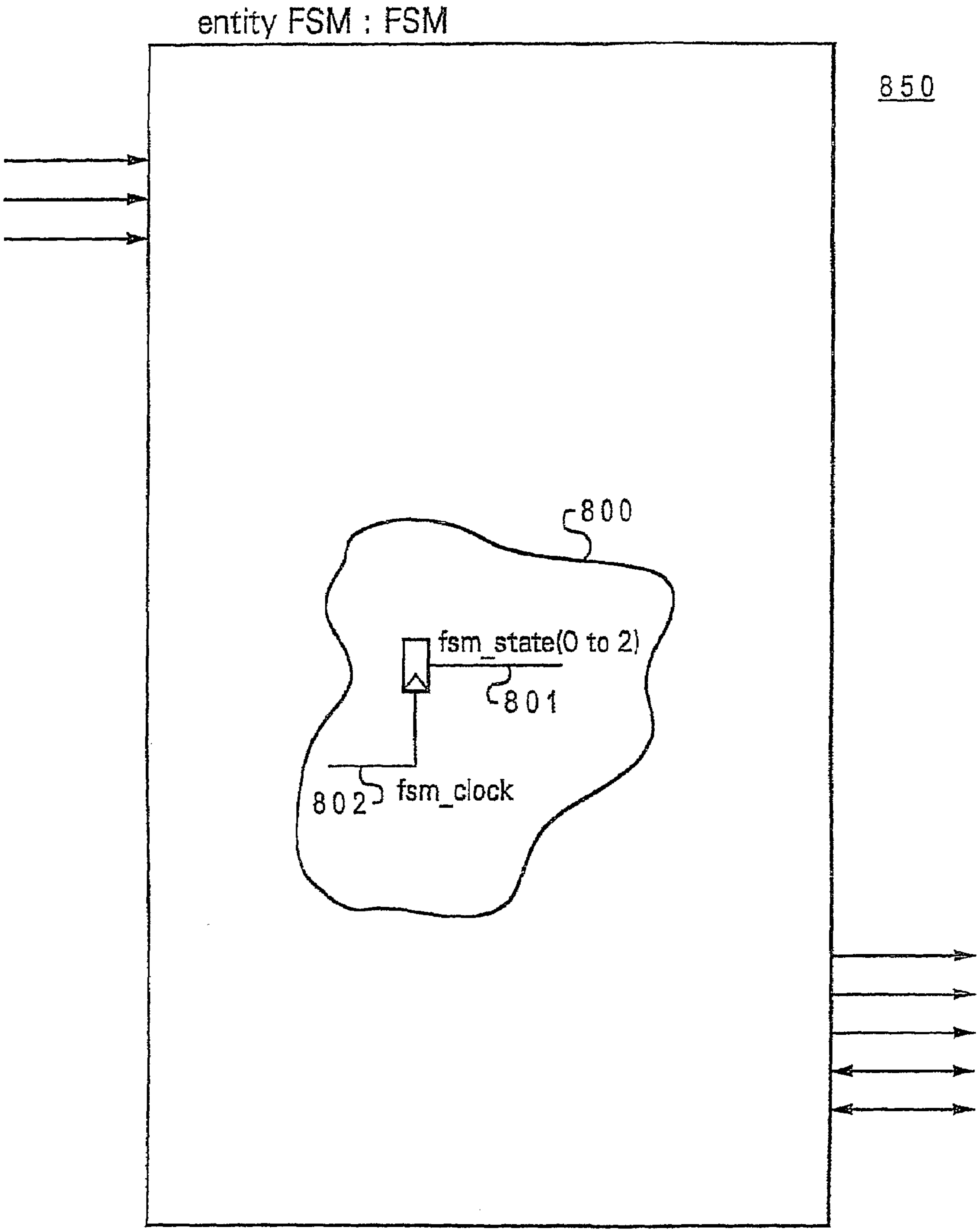
FIG. 8B depicts a conventional finite state machine design entity.

With reference now to FIG. 8B there is shown an exemplary design entity 850 referred to as entity FSM with instance name FSM, which contains one instance of state machine 800. Furthermore, a signal output 801, "fsm_state(0 to 2)" contains a three bit signal directly connected to the outputs of the three storage elements comprising the state elements of state machine 800. A signal input 802, fsm_clock, applies a clocking signal that controls the storage elements for state machine 800.

In order to instrument state machine 800, it would conventionally be necessary to create an instrumentation entity VHDL file containing the logic necessary to detect the desired state machine events and pass them through to count and fail events. Such an instrumentation entity file with appropriate instrumentation entity descriptor comments would typically require substantially more lines of code than the HDL description of the state machine itself. Such a circumstance is undesirable. However, in the case of a regular logic structure such as a finite state machine, it is possible to define a brief syntax that characterizes the finite state machine without resorting to a separate instrumentation VHDL entity.

With reference now to FIG. 8C there is illustrated an exemplary HDL file 860 for generating design entity 850 with an embedded instrumentation entity for monitoring the behavior of FSM 800. Specifically, an embedded instrumentation entity comment 852 is illustrated. As depicted in FIG. 8C, embedded instrumentation entity comment 852 comprises a number of distinct sections including: a prologue and embedded instrumentation name declaration 853, a state machine clock declaration 859, a state element declaration 854, a state naming declaration 855, a state element encoding declaration 856, a state machine arc declaration 857, and an epilogue 858.

Prologue and embedded instrumentation entity name declaration comment 853 serves to declare a name that is associated with this embedded instrumentation entity. This comment line also serves to delineate the beginning of an embedded instrumentation entity comment sequence.

As further depicted in FIG. 8C, declaration comment 853 assumes a non-conventional syntax of the form: "--!! Embedded TYPE: name", wherein "--!! Embedded" serves to declare an embedded instrumentation entity, "TYPE" declares the type of the embedded instrumentation entity B FSM in this case, and "name" is the name associated with this embedded instrumentation entity.

State machine clock declaration comment 859 is utilized to define a signal that is the clocking control for the finite state machine.

State element declaration comment 854 is utilized to specify the state-machine state storage elements. This comment declares the storage elements or signal names that constitute the state-machine state. In state machine 800, the signals fsm_state(0 to 2) constitute the state machine state information.

State naming declaration comment 855 is utilized to declare labels to associate with various states of the given state machine. These labels are utilized in state machine arc declaration comment 857 when defining the legal state transitions within the given state machine.

State element encoding declaration comment 856 is utilized to define a correspondence between the state machine labels defined by state naming declaration comment 855 and the facilities declared by state element declaration comment 854. In the example shown, the labels of comment 855 are associated by position with the encodings given in comment 856 (i.e., the state labeled "S0" has the encoding $000_{bin}$, the state labeled "S1" has the encoding $001_{bin}$, etc.).

State-machine arc declaration comment 857 defines the legal state transitions within the state machine. The various transitions of the state machine are given by terms of the form "X=>Y" where X and Y are state machine state labels given by comment 855 and X represents a previous state machine state and Y a subsequent state machine state.

Epilogue comment 858 serves to close the embedded instrumentation entity comment. The specific syntax and nature of the comments between the prologue and embedded instrumentation name declaration and the epilogue will vary with the specific needs of the type of embedded instrumentation entity being declared.

Embedded instrumentation entity comment 852 is inserted within the VHDL file of the design entity that contains the finite state machine in question. The embedding of instrumentation for finite state machine 800 is made possible by the non-conventional comment syntax illustrated in FIG. 8C and is substantially more concise than a conventional HDL instrumentation entity suitable for accomplishing the same function.

Utilizing such embedded non-conventional comments, the system of the present invention creates an instrumentation entity, as described below, for instrumenting the state machine without the need to resort to creating a separate HDL file instrumentation entity.

To support compilation and creation of embedded instrumentation entities, the previously described compilation process of FIG. 4D is enhanced as described herein. First, HDL compiler 462 is altered to recognize the presence of embedded instrumentation entity comments. If, during compilation of a design HDL file, and subject to the constraints described above for incremental compilation, HDL compiler 462 detects one or more embedded instrumentation entity comments within the source code file, HDL compiler 462 places a special marker into design entity proto data structure 463.

When instrumentation load tool 464 is passed control, proto data structures 463 are searched in order to locate the special marker placed by HDL compiler 462 indicating embedded instrumentation entity comments. Such protos represent the design HDL files with embedded instrumentation entities that have been re-compiled in the current compilation cycle.

When instrumentation load tool 464 locates a proto data structure 463 with the special marker, the corresponding VHDL source code file for the design entity is opened and parsed to locate the one or more embedded instrumentation entity comments. For each of these comments, instrumentation load tool 464 creates a specially named proto data structure 463*a*, and further generates a corresponding instance data structure 465*a* that is instantiated within the design entity. In addition, instrumentation load tool 464 removes the special marker inserted by HDL compiler 462 to prevent unnecessary re-instrumentation of the design proto on subsequent re-compiles.

Within these created embedded instrumentation entity protos, instrumentation load tool 464 directly creates the necessary instrumentation logic required by the embedded instrumentation entity without the need for a VHDL file to specify this instrumentation and connects this logic to instrumentation logic block 420 of FIG. 4D. The updated design proto along with the embedded instrumentation entity proto and instance data structure are saved to disk and serve as inputs to subsequent compiles, removing the need to produce embedded instrumentation entities on subsequent recompiles.

Figure 9:
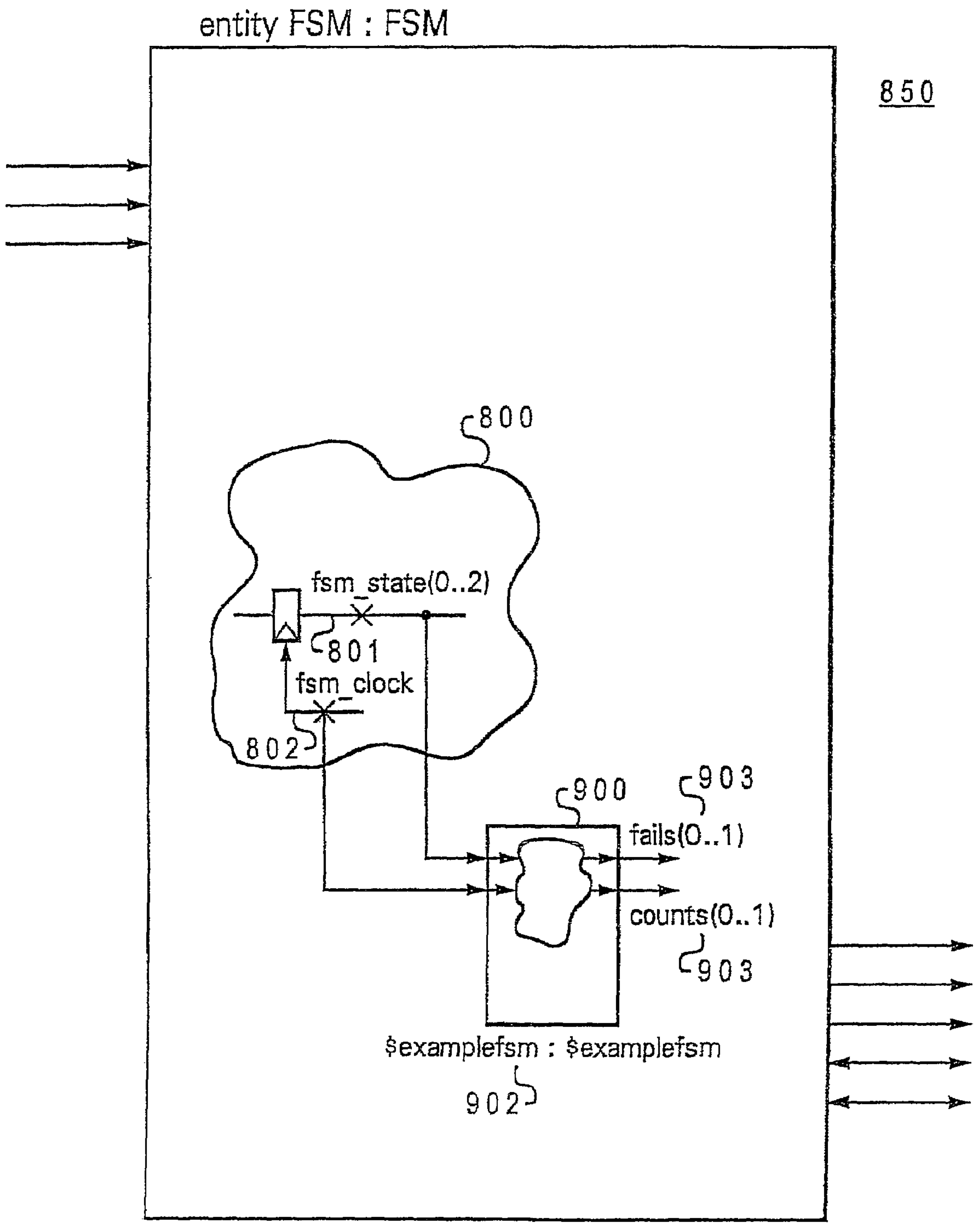
FIG. 9 depicts a hardware description language design entity included embedded instrumentation in accordance with the teachings of the present invention.

With reference now to FIG. 9, design entity 850 is shown instrumented with embedded instrumentation entity 900. Embedded instrumentation entity 900 is created as a proto instantiated within design entity 850 wherein the embedded non-conventional instrumentation entity comment occurs. The embedded instrumentation entity thus may be replicated automatically within an overall design wherever the specific design entity is instantiated.

Embedded instrumentation entity 900 is named in a unique manner based on the name associated with the embedded instrumentation entity by the prologue and embedded instrumentation name declaration comment. This name is prepended with a special character (shown as a "$" in FIG. 9) that is not a recognized naming convention for the platform HDL. In this manner, the names of the embedded instrumentation entities cannot conflict with the names of any other design or standard instrumentation entities.

Furthermore, the names associated with the various events defined by the embedded instrumentation entity (the "varname" for the count events, for example) are also derived in a fixed manner from the name associated with the embedded instrumentation entity. The user is required to ensure that the names of embedded instrumentation entity events do not conflict with the names of standard instrumentation entity events and further than the names of the embedded instrumentation entities within a given design do not themselves conflict.

It should also be noted that if a design entity contains more than one embedded instrumentation entity, the embedding process described with reference to FIG. 8B and FIG. 9 is simply repeated for each such instrumentation entity. In addition, since the protos for the embedded instrumentation entities are created at the same time as the design protos itself, no changes to the BOM mechanism used for incremental compiles are required. The protos for the embedded instrumentation entities can be considered, for purposes of incremental compilations, to be mere extensions to the design proto itself.

The present invention discloses a method and system for naming events within a simulation model that prevents name collisions between events in different instrumentation entities, allows for the arbitrary re-use of components of a model in models of arbitrarily increasing size, and furthermore allows for processing designated events in a hierarchical or non-hierarchical manner.

When all instances of an event are considered as a whole without regard to specific instances, the event is considered in a "non-hierarchical" sense. Likewise, when an event is considered with regard to each and every instance, it is considered in a "hierarchical" sense. When considering count events, for example, it is often convenient to track the number of times a particular count event occurred in the aggregate without concern to exactly how many times the count event occurred in each particular instance within a simulation model.

Each type of event: count, fail, and harvest, is given a separate event namespace by construction. Each event class is therefore an independent group preventing naming collisions between the event types. The data structure of the present invention is independently applied to each of the different event types to ensure correctness within each event class.

In the embodiments illustrated in FIGS. 10A, 10B, 10C, and 10D, the system and method of the present invention are described with respect to count events. One skilled in the art will appreciate and understand the extensions necessary to apply the same techniques to other event classes such as failures or harvests.

Figure 10A:
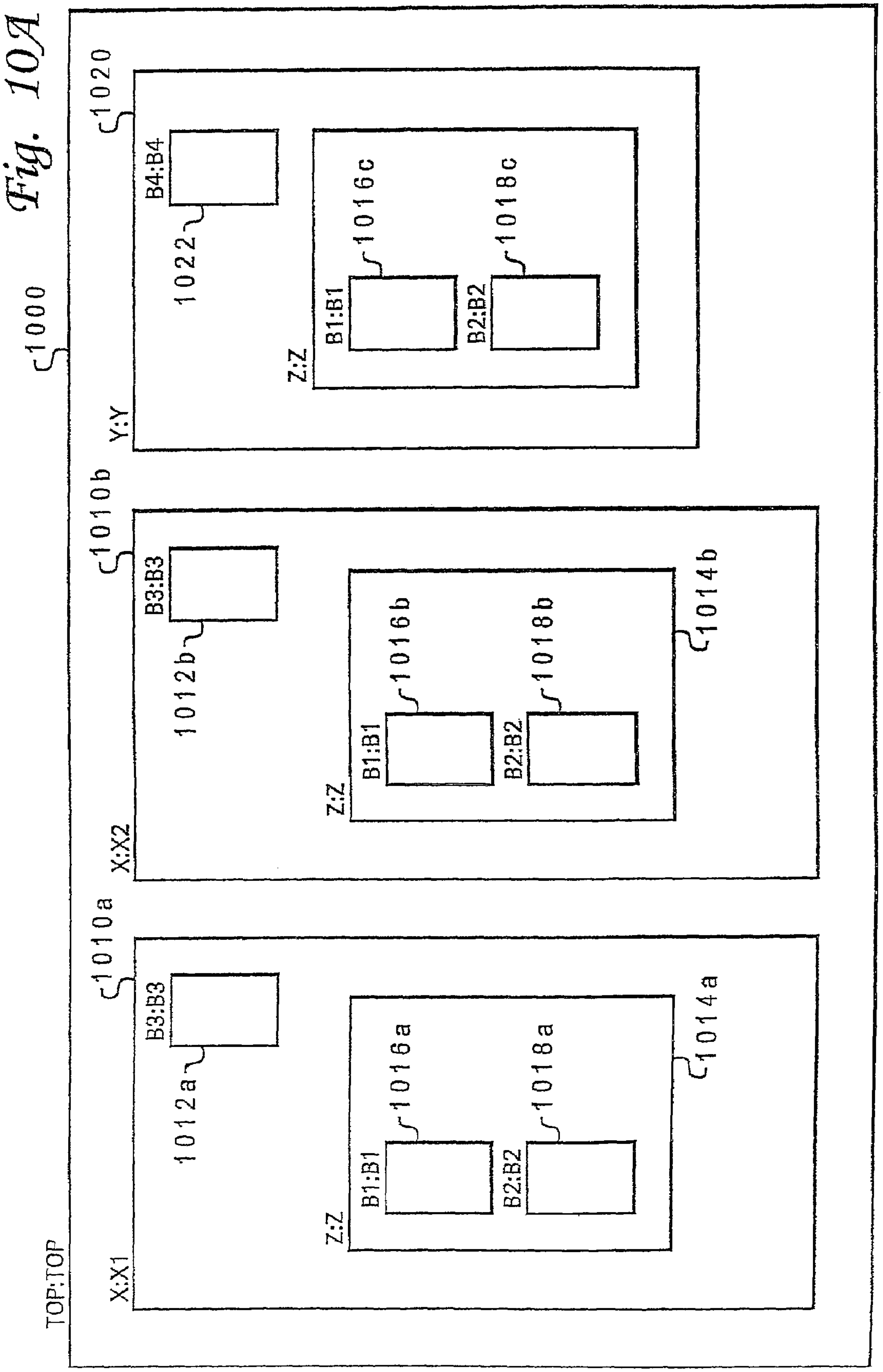
FIG. 10A is a block diagram illustrating a simulation model containing a number of design and instrumentation entities.

With reference to FIG. 1A, there is depicted a block diagram representation of simulation model 1000 containing a number of design and instrumentation entities. As illustrated in FIG. 10A, simulation model 1000 includes two instances of a design entity X, with instance names X1 and X2 respectively.

Within each of design entity instances X1 and X2 is instantiated an instance of an instrumentation entity B3, 1012*a* and 1012*b*. Design entity instances X1 and X2 further comprise instances, 1014*a* and 1014*b*, respectively, of design entity Z which further contains instances, 1016*a* and 1016*b*, of instrumentation entity B1 and instances, 1018*a* and 1018*b*, of instrumentation entity B2.

Finally, simulation model 1000 includes an instance of design entity Y, with instance name Y, containing an instance of instrumentation entity B4 1022. Design entity instance Y contains an instance, 1024, of design entity Z with further instances, 1016*c* and 1018*c*, of instrumentation entities B1 and B2 respectively.

In what follows the methods of the present invention for uniquely naming events will be considered in the context of exemplary model 1000. It will be assumed in the following description that each instrumentation entity (B1, B2, B3, and B4) has declared a single count event with event name "count1".

In accordance with the method and system of the present invention, the user must uniquely name each type of event (count, fail, or harvest) within a specific instrumentation entity, i.e., the user cannot declare any two events of the same type within the same instrumentation entity with the same event name. Such a constraint does not conflict with the stated goals of the present invention in that a given instrumentation entity is usually created by a specific person at a specific point in time, and maintaining unique names within such a limited circumstance presents only a moderate burden to the user. The data structure disclosed herein does, however, prevent all name collisions between events in different instrumentation entities, and allows for processing the events in a hierarchical and/or non-hierarchical manner.

As previously explained, an HDL naming convention must uniquely identify all the entities within a given design. This constraint is inherent to HDLs and applies to design entities as well as instrumentation entities. In accordance with conventional VHDL entity naming constructs, it is technically possible for two design entities to share the same entity name, entity_name. However, such identically named entities must be encapsulated within a VHDL library from which a valid VHDL model may be constructed. In such a circumstance, entity_name, as it is utilized herein, is equivalent to the VHDL library name concatenated by a period (".") to the entity name as declared in the entity declaration.

Pre-pending a distinct VHDL library name to the entity name disambiguates entities sharing the same entity name. Most HDLs include a mechanism such as this for uniquely naming each design entity. Design entities must be unambiguously named in order to determine which particular entity is called for in any given instance in a simulation model. The present invention employs the prevailing naming mechanism of the native HDL to assign unique entity names for design entities throughout a given model and leverages the uniqueness property of entity names and the uniqueness of each instance's instantiation identifier to create an "extended event identifier" for each event within the simulation model.

Figure 10B:
FIG. 10B depicts a data structure for declaring an event within a simulation model in accordance with one embodiment of the present invention.

With reference to FIG. 10B, there is illustrated a representation of the fields in an extended event identifier data structure, alternatively referred to herein as an "event list", in accordance with one embodiment of the present invention. The extended event identifier begins with instantiation identifier field 1030. This field, as described hereinbefore, consists of the instance identifiers, proceeding from the top level entity to the direct ancestor of the given instance within the simulation model separated by periods (“.”). This string is unique for each and every instance of the event within the model. The extended event identifier further includes an instrumentation entity field 1032, a design entity field 1034, and an eventname field 1036.

Instrumentation entity field 1032 contains the name of the instrumentation entity (or the name assigned to an embedded instrumentation entity) that generates the simulation event. Design entity field 1034 contains the entity name of the design entity in which the event occurs. Eventname field 1036 is the name given to the event in the instrumentation entity description comments of an instrumentation entity or the event name assigned to an event within an embedded instrumentation entity. These four namespace fields comprise a unique identifier for each event within a simulation model that allows for the re-use of components within other models without risk of name collisions and the consideration of events in a hierarchical or non-hierarchical sense.

Figure 10C:
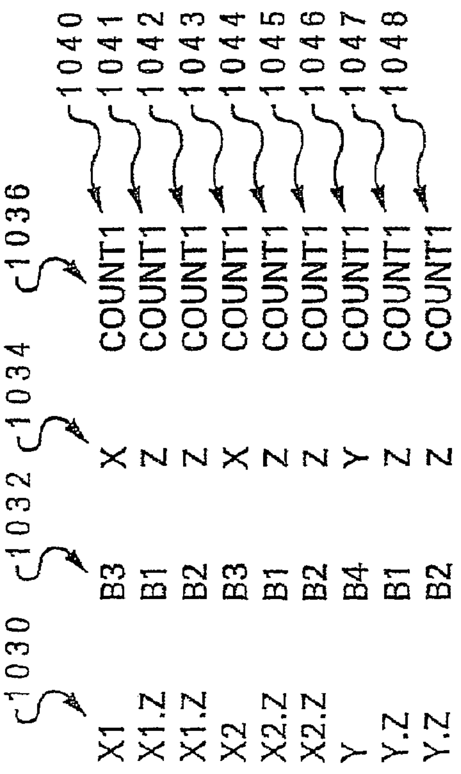
FIG. 10C illustrates a list of extended event data structures for the simulation model in FIG. 10A.

With reference now to FIG. 10C, there is shown a list of extended event identifiers for model 1000. Event identifiers 1040, 1041, 1042, 1043, 1044, 1045, 1046, 1047, and 1048 are declared within simulation model 1000 to designate count events having eventname “count1”. The extended event identification procedure of the present invention will be described in the context of these extended event identifiers.

The uniqueness of the names in design entity name field 1034 is a primary distinguishing factor between events. By including the design entity name in the extended event identifier, each design entity is, in effect, given a unique namespace for the events associated with that design entity, i.e., events within a given design entity cannot have name collisions with events associated with other design entities.

It is still possible however, to have name collisions between events defined by different instrumentation entities that are incorporated within a single design entity. Events 1041 and 1042, for example, if identified solely by the design entity name, have a name collision. Both are events with eventname “count1” within design entity Z, and if labeled as such, are indistinguishable. In order to alleviate a naming collision between events 1041 and 1042, the present invention employs instrumentation entity field 1032. By referencing the design entity and instrumentation entity names, both of which are unique with respect to themselves and each other, a unique event namespace is created for each instrumentation entity associated with any given design entity. For example, event identifier 1041 and 1042 would be in conflict (both named Z.count1), unless the respective instrumentation entity names are included within the extended event identifier to produce names B1.Z.count1 and B2.Z.count2 for these events.

It should be noted that it is possible to uniquely name each event by using instrumentation entity name field 1032 alone. Due to the uniqueness property of instrumentation entity names, event names that are only named by the instrumentation entity name and the event name field will be necessarily unique.

However, such a naming scheme is insufficient for associating events with a given design entity. In practice, it is desirable to associate events with the design entity in which they occur rather than associating them with the potentially numerous instrumentation entities that are utilized to track them. Moreover, referencing the appropriate design entity within the eventname allows all the events associated with a given design entity to be centrally referenced without the need to ascertain the names of all the instrumentation entities associated with the given design entity. The data structure of the present invention utilizes both the instrumentation entity and design entity names in naming events for ease of reference at the cost of moderate uniqueness redundancy in the event names.

Figure 10D:
FIG. 10D depicts a data structure for declaring an event within a simulation model in accordance with an alternate embodiment of the present invention.

In an alternative embodiment of the present invention, the instrumentation entity name is not included within the extended event identifier. Referring to FIG. 10D, such an alternative extended event identification data structure is depicted. As shown in FIG. 10D, events are named by instantiation identifier field 1030, design entity name field 1034, and event name field 1036.

Such a data structure provides name collision protection between design entities but not within design entities. That is, the user must ensure that events names for events associated with a given design entity do not collide. In case of user error in this regard, model build tools may be utilized to detect an event name collision condition during model compilation. The alternative data structure depicted in FIG. 10D provides for simpler naming and referencing of events at the expense of requiring the user to prevent name collisions for events associated with a given design entity.

Returning to FIG. 10B, the combination of instrumentation entity field 1032, design entity name field 1034, and eventname field 1036 for a given event, provides a unique identifier for any given event without regard to multiple instantiations of the event. In order to uniquely distinguish between multiple instantiations of an event, instantiation identifier field 1030 is included in the extended event identifier. Instantiation identifier field 1030 field, by its construction, provides a unique string for any instance of an entity within any simulation model.

When evaluating occurrences of an event in a non-hierarchical sense, instantiation identifier field 1030 is ignored while searching for matching events. As illustrated in FIG. 10C, for example, a non-hierarchical query for the number of time a “count1” event occurs within design entity Z as detected by instrumentation entity B1, utilizes the following list of count eventnames:

| | | | |
|---|---|---|---|
| X1.Z | B1 | Z | COUNT1 |
| X2.Z | B1 | Z | COUNT1 |
| Y.Z | B1 | Z | COUNT1. |

These count events are added together to form an aggregate count of the total number of time the specific event occurred within the simulation model.

A hierarchical query includes specific criteria to match against the hierarchy field to limit the counter or counters found to specific instances of the requested event. For example, a query to obtain the count1 event of instrumentation entity B1 within the X1.Z instance of design entity Z utilizes the following count eventname:

| | | | |
|---|---|---|---|
| X1.Z | B1 | Z | COUNT1, |

which represents the number of times the count1 event was counted by instrumentation entity B1 within design entity instance X1.Z for a particular simulation interval.

By providing matching model hierarchy criteria against instantiation identifier field 1030, it is possible to consider the events with respect to their particular instance or instances within the model, i.e., a hierarchical query. A non-hierarchical query merely ignores the hierarchy field and returns all the instances of the requested events within the model.

Figure 11A:
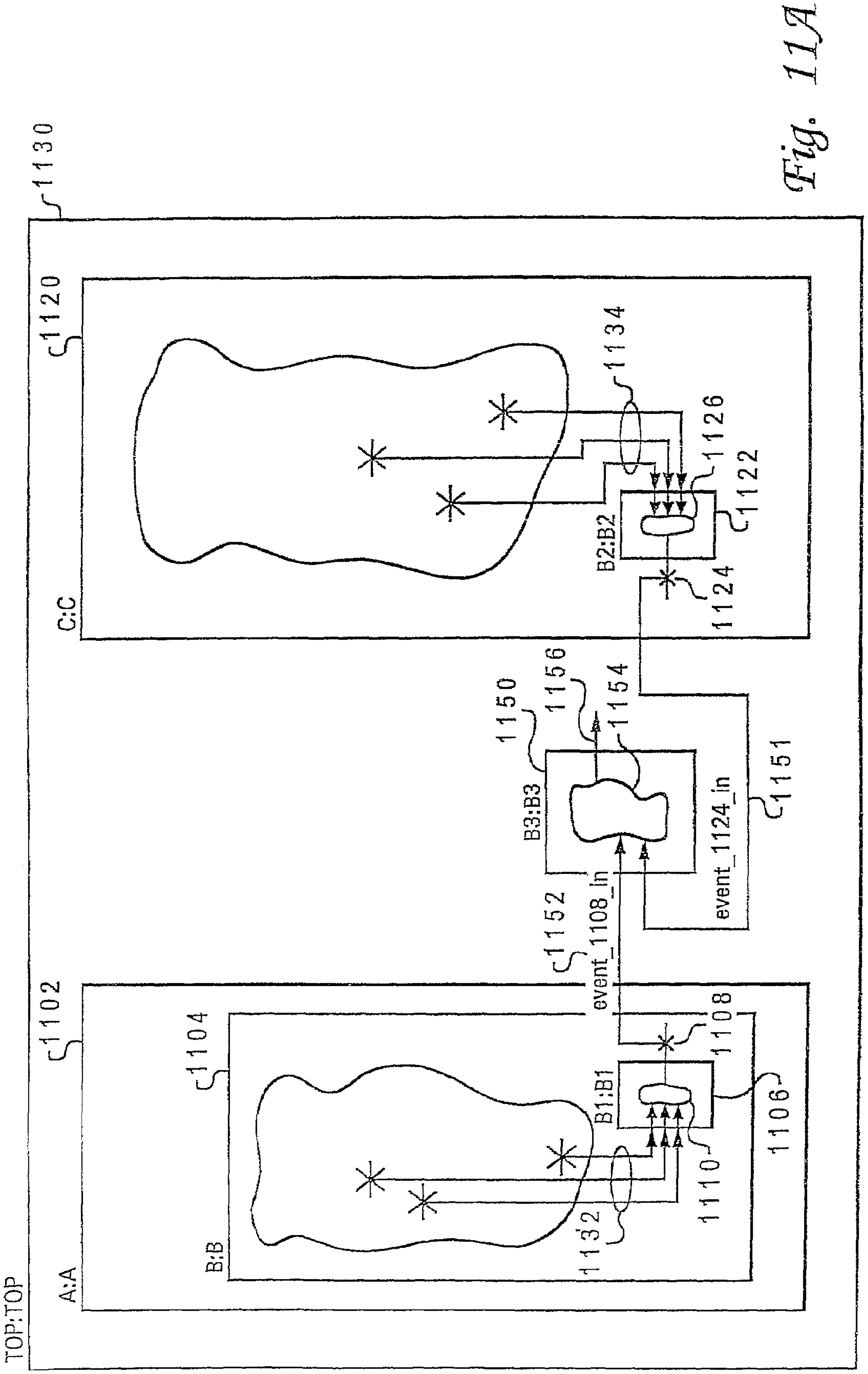
FIG. 11A is a block diagram illustrating a simulation model in which the hierarchical event processing of the present invention is applicable.

With reference to FIG. 11A, there is depicted a block diagram illustrating a simulation model 1100 in which the hierarchical event processing of the present invention is applicable. Simulation model 1100 comprises a top-level design entity 1130 in which a pair of lower-level design entities 1102 and 1120 is instantiated. A design entity 1104 containing instrumentation entity 1106 is included within design entity 1102. As illustrated in FIG. 11A, instrumentation entity 1106 includes logic 1110 for generating a simulation event 1108 from signal set 1132 from within design entity 1104. Design entity 1120 includes an instrumentation entity 1122 that generates a simulation event 1124 using signal set 1134.

Utilizing the techniques described hereinbefore, generating a hierarchical event that is some logical combination of events 1108 and 1124 requires the creation of an instrumentation entity associated with top level design entity 1130 that references signal sets 1132 and 1134. Conventionally, such an instrumentation entity would substantially reproduce instrumentation logic 1110 and 1126 to process signal sets 1132 and 1134, respectively, thus producing a copy of events 1108 and 1124. Such a procedure is inefficient and prone to error. If, for example, changes are made to any or all of signal sets 1132 and 1134, or instrumentation logic 1110 and 1126, these changes would have to be accurately repeated in the instrumentation entity logic for the combined event.

The present invention provides a mechanism whereby events, such as events 1108 and 1124, are directly referenced and utilized as inputs to cross-hierarchical instrumentation entities. In this manner, signal connections 1132 and 1134, as well as instrumentation logic 1110 and 1126, are directly re-utilized to produce the desired hierarchical event.

To facilitate direct referencing of events within simulation models, a specialized data structure is implemented within instrumentation entity input port map comment syntax. This data structure directly connects input ports of instrumentation entities to cross-hierarchical events within a simulation model.

For the embodiment depicted in FIG. 11A, an instrumentation entity 1150 is instantiated within top-level design entity 1130 to generate a hierarchical event 1156 that is some function of events 1108 and 1124. As illustrated in FIG. 11A, instrumentation entity 1150 includes a pair of inputs 1151 and 1152 that are directly connected to events 1124 and 1108, respectively, utilizing the augmented syntax described below. These input connections are logically combined using instrumentation logic 1154 to produce a cross-hierarchical event 1156.

With reference to FIG. 11B, there is depicted a set of input port mapping comments for performing cross-hierarchical processing of simulation model events in accordance with the teachings of the present invention. In what follows, it is assumed that events 1108 and 1124 are count events with event names event_1108 and event_1124, respectively, and that these events are connected to input ports event_1108_in and event_1124_in on instrumentation entity 1150. As depicted in FIG. 11B, a first input port mapping comment 1161 contains data for referencing event 1108 to input port event_1108_in. A second input port mapping comment 1162 contains data for referencing event 1124 to input port event_1124_in. It should be noted that each of input port mapping comments 1161 and 1162 includes a pre-pended non-conventional comment identifier, --!!, that is utilized by the HDL compiler (such as compiler 462 in FIG. 4D) to maintain the port mapping comments separate from the design.

To facilitate connection of a simulation event to an instrumentation entity input port, input port mapping comments 1161 and 1162 consist of two distinct parts: an instance identifier and an event identifier. The instance identifier is a string consisting of instance names (in descending hierarchical order) of all design entities between and including the design entity containing the instrumentation entity of the cross-hierarchical event being defined (i.e., the highest level design entity for the cross-hierarchical event), the design entity in which the event that is utilized in generating the cross-hierarchical event. If the design entity containing the hierarchical event is the same as the design entity containing the event to be connected to, the instance identifier is a null string. A pair of instance identifiers 1163 and 1164, within input port mapping comments 1161 and 1162, respectively, specify that events 1124 and 1108 originate from signals within design entity 1120 and 1104 respectively.

Input port mapping comments 1161 and 1162 further include event identifiers 1165 and 1166, that identify input simulation events in terms of local instrumentation entities 1106 and 1122, respectively. In accordance with the embodiment depicted in FIG. 11B, each event identifier consists of a string beginning with an open bracket ("[") character and ending with a closed bracket ("]") character. Between these brackets, three sub-strings, delineated by period (".") characters, comprise a data structure utilized to identify a specific event from which the cross-hierarchical event is defined. The first sub-string within an event identifier is the instance name of the instrumentation entity containing the event. The second sub-string is a string specifying the type of the event ("count", "fail", or "harvest"). Finally, the third sub-string is the event name of the given event as specified in the declaration comment for the event. Each event identifier string uniquely identifies a single event within a given design entity. As depicted in FIG. 11B, event identifier strings 1165 and 1166 identify events 1108 and 1124 respectively.

In accordance with an alternate embodiment of the present invention, the event identifier naming structure is modified slightly for events that are labeled in accordance with FIG. 10D (event names that do not include the instrumentation entity name). When an instrumentation identifier is absent from the extended event identifier, the event identifier string with an input port mapping comment consists of two sub-strings: a string denoting the type of event to connect to; and a string providing the name of the event separated by a period (".") character. The instrumentation entity name is not required in this case since all events of a given type associated with a given design entity will have unique names. The model build tools of the present invention will automatically search all instrumentation entities associated with the design entity called out by the instance identifier to determine which instrumentation entity generates an event having the name and type provided in the event identifier string.

Referring to FIG. 11C, there is illustrated a set of data structures for performing hierarchical processing of simulation model events in accordance with a second embodiment of the present invention. In the depicted embodiment, a pair of input port mapping comments 1171 and 1172 employs a syntax compatible with the event naming data structure depicted in FIG. 10D.

Input port mapping comment 1171 connects event 1108 to input port event_1108_in on instrumentation entity 1150. Likewise, input port mapping comment 1172 connects event 1124 to input port event_1124_in on instrumentation entity 1150. By utilizing the augmented syntax of FIG. 11B or FIG. 11C, it is possible to create hierarchical events by connecting the inputs of instrumentation entities to events within the simulation model.

The above described system and method provides for practical instrumentation of simulation models and allows for efficient implementation of instrumentation logic through embedded instrumentation entities. Embedded instrumentation entities, as described hereinabove, are however necessarily limited to task-specific implementations. As described with reference to FIGS. 12A and 12B, the present invention further provides for a more flexible implementation of instrumentation logic in a more unstructured manner.

Figure 12A:
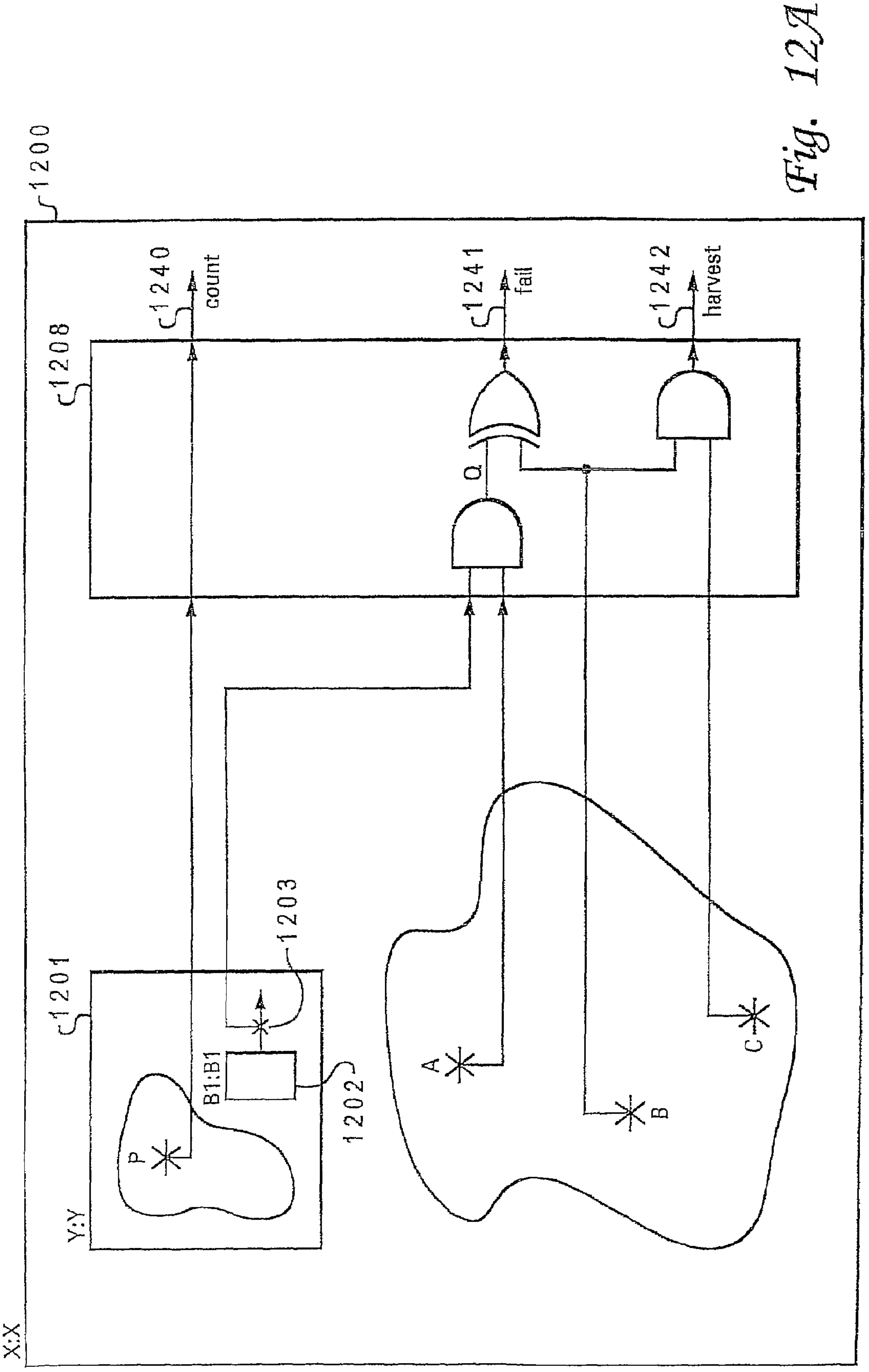
FIG. 12A depicts a representative target design entity with an instrumentation entity containing random instrumentation logic implemented in accordance with the teachings of the present invention.
Figure 12B:
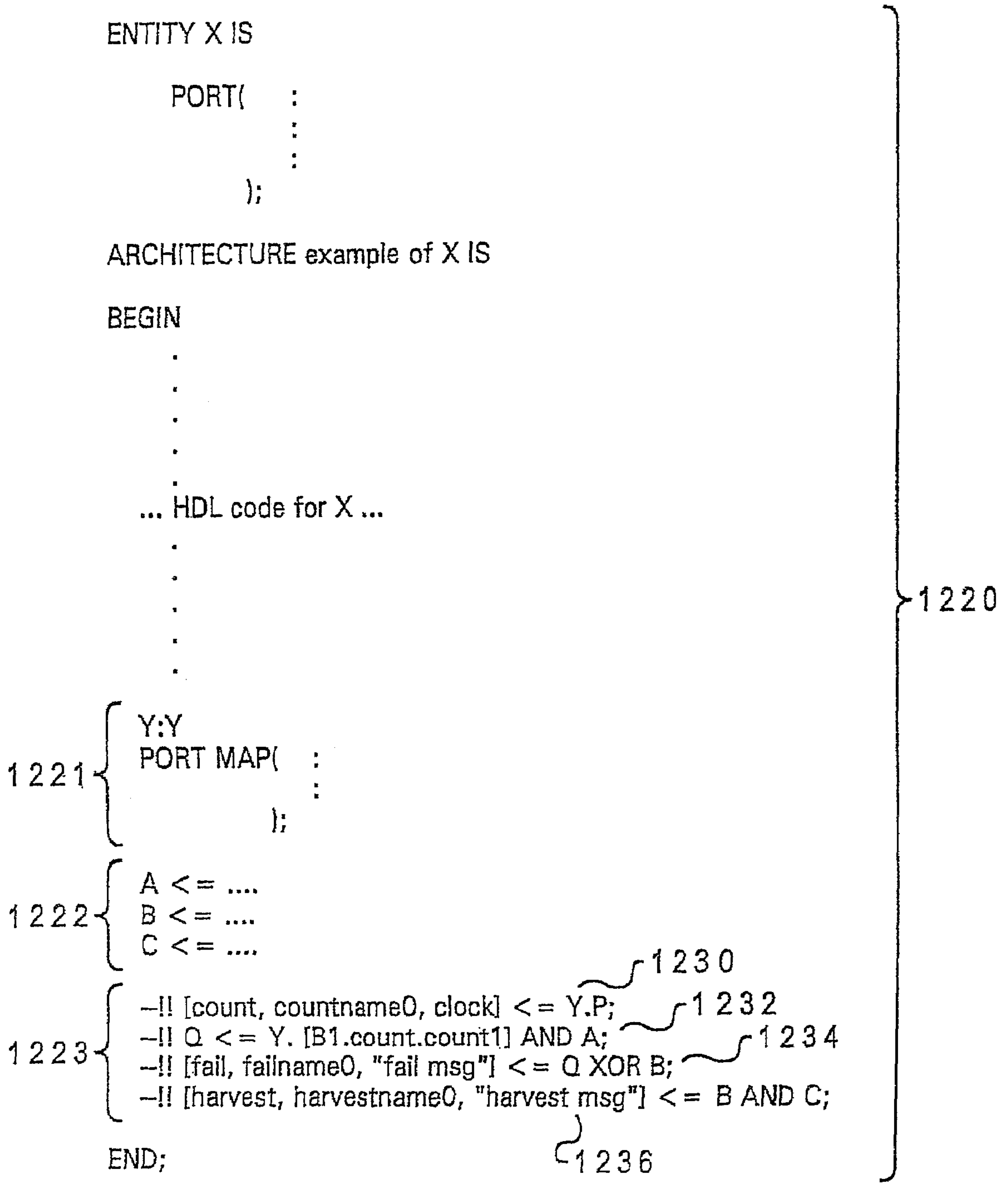
FIG. 12B illustrates an exemplary HDL file for implementing instrumentation logic within an HDL design entity in accordance with the teachings of the present invention.

It is often necessary to tailor instrumentation logic to address unique problems and circumstances. Instrumentation logic of a specific and yet non-predefined nature that is designed in accordance with the techniques disclosed herein with reference to FIGS. 12A and 12B is referred herein as "random instrumentation logic." A data construct consisting of general logic primitives (Boolean operators, storage elements, etc.) and an interconnection method for these primitives is utilized for implementing such random instrumentation logic.

For instrumenting a simulation model as described heretofore, an HDL such as VHDL or Verilog is utilized as a platform from which instrumentation logic is generated. Appropriate instrumentation entity descriptor comments within design entity source code files couple the resultant instrumentation entities to designated target design entities within a simulation model.

In addition to entity descriptor comments within a design entity source code file, the foregoing instrumentation technique requires a separate HDL file in which the instrumentation entity is described. As explained with reference to FIGS. 12A and 12B, the present invention provides a method, system, and data structure for instrumenting design entities within a simulation model while avoiding the design process overhead required for creating a separate instrumentation entity HDL file.

In accordance with the teachings of the present invention, random instrumentation logic is directly deployed within target design entities in terms of individualized and customizable instrumentation descriptor comments. Such instrumentation descriptor comments are encoded within the target design entity HDL source code file and provide a means for the describing random instrumentation logic, events, and interconnections between the created instrumentation logic and the target design entity. The random instrumentation logic is inserted into the simulation model in a manner similar to the techniques used for embedded instrumentation entities to produce an instrumentation entity without the need for the creation of an explicit HDL instrumentation entity file.

With reference to FIG. 12A, there is illustrated a representative target design entity 1200 wherein random instrumentation logic is implemented in accordance with a preferred embodiment of the present invention. Instantiated within target design entity 1200 is a design entity 1201. As further depicted in FIG. 12A, an instrumentation entity 1202 is instantiated within design entity 1201. Instrumentation entity 1202 is designed in accordance with the principles set forth hereinabove to generate a count event 1203 having an event name "count1." Target design entity 1200 further includes an instrumentation entity 1208 that is generated utilizing random instrumentation logic. As depicted in FIG. 12A, instrumentation entity 1208 receives as inputs signals P, A, B, and C along with count event 1203.

Instrumentation entity 1208 is constructed by a set of unconventional comments lines within the source code file for target design entity 1200. These comments may be incorporated at any point within the logic description section of the HDL source code file. HDL compiler 462 (FIG. 4B) recognizes the unconventional comments in addition to any comments utilized to instantiate embedded instrumentation entities within design entity 1200. During the post-compilation/model build phase, instrumentation load tool 464 processes these comments in a manner similar to that utilized for embedded instrumentation entities (described with reference to FIGS. 10A-10D) to generate instrumentation entity 1208.

A variety of possible syntaxes can be utilized to formulate the unconventional HDL comments required for generating random instrumentation logic within the source code file of a target design entity. As depicted in FIG. 12B, much of the syntax of these comments employs syntax similar to the concurrent subset of the VHDL language with the addition of syntactic and semantic enhancements that provide a means of connection between an instrumentation entity and its target design entity. In addition, minor syntactic and semantic enhancements are provided to declare events and intermediate signals.

With reference now to FIG. 12B, there is illustrated an exemplary HDL source code file 1220 that describes design entity 1200. Within HDL source code file 1220, an entity instantiation 1221 produces design entity 1201, and assignment statements 1222 are utilized to generate signals A, B, and C. A set of unconventional comments 1223 within HDL source code file 1220 is utilized to produce instrumentation entity 1208. Comments 1223 are formulated as left-hand side (l.h.s.)/right-hand side (r.h.s.) assignment statements of the form:

{l.h.s.}<={r.h.s.};

where {l.h.s.}, referred to herein after as lhs, is the assignment statement target and, {r.h.s}, referred to herein after as rhs is an expression denoting the logical value to be assigned to the statement lhs. A number of rules delineate the possible expressions for lhs and rhs in any legal statement in the instrumentation comments.

As employed within the instrumentation data structure of the present invention, an lhs statement may be either an event declaration or the name of a signal that is instantiated within an instrumentation entity. An event declaration is an expression within bracket characters ("[A, A]") that generates a new event. Within comments 1223, a statement 1230 produces a count event 1240 from instrumentation entity 1208 (FIG. 12A) having eventname "countname( )".

Within an lhs event declaration, a first field designates the event type (count, fail, harvest, etc.) and is followed by such other fields as are necessary to declare the event. As illustrated in lines 1230, 1234, and 1236, such event declaration fields follow the same format as the event declaration fields depicted in FIG. 4C.

Comments 1223 further include a line 1232 having an lhs that declares a signal Q within instrumentation entity 1208. To prevent ambiguity, any signal declared in this manner may not have a name corresponding to the name of any signal present on the top level of target design entity 1200. Conformance to this requirement is verified by instrumentation load tool 464 (FIG. 4D) during processing. Signals declared by an lhs expression may be incorporated within an rhs expression as shown in lines 1232 and 1234.

An rhs consists of logical connectivity expressions and/or functions that combine various signals. Signals within these connectivity expressions may originate from a number of possible sources including: signals declared on the lhs of a statement in the instrumentation comments; signals within the target design entity; or signals designating other events within the target design entity.

The absence of period (".") or bracket ("[", "]") characters within a signal value description in the rhs of a statement, designates the object signal as corresponding to either a signal within the top hierarchical level of the target design entity or to a signal declared on the lhs of a statement within the instrumentation language. Signals are named in a mutually exclusive manner by the rules governing creation of signals on the lhs of a statement in the instrumentation comments, thereby preventing any ambiguity in the determining the source of the given signal.

Signals in rhs connectivity expressions can also be connections to signals within entities instantiated within the target design entity. In such a circumstance, the instance names of the entity or entities in the hierarchy enclosing the desired signal are placed before the signal name in hierarchy order, delineated by period (".") characters. For example, the signal in statement 1230 ("Y.P") represents signal 1204 within design entity 1201. Signals at any level of the target design hierarchy are thus accessible to instrumentation logic generated by the instrumentation language comments.

Signals within the instrumentation comment expressions can also designate other events within the target entity. Event identifiers as described hereinbefore for hierarchical events are used to denote such "event" signals. For example, statement 1232 performs a logical AND of instrumentation event 1203 and signal A. The event identifier "Y[B1.count.count1]" connects instrumentation entity 1208 to instrumentation event 1203. This notation permits instrumentation events at any level of design hierarchy within target design entity 1200 to be directly accessed.

As further depicted in FIG. 12B, statement 1232 produces intermediate signal Q within instrumentation entity 1208. This is an example of an instrumentation comment statement declaring a new intermediate signal. These signals can be used in other statements to construct random instrumentation logic of any desired depth or complexity.

Statement 1234 utilizes intermediate signal Q along with signal 1206 to produce fail event 1241. The syntax for fail event declaration includes a field denoting the type of event ("fail"), a field giving the event name for the fail event ("failname( )"), and a final field denoting the message to associate with the fail. Finally, statement 1236 produces harvest event 1242.

In general, the rhs expression of any statement in the instrumentation data structure of the present invention can access any signal or instrumentation event signal within the target design entity utilizing these syntactic mechanisms. These signals can be combined to form new events or intermediate signals that can themselves be further combined to form instrumentation logic of any desired depth or complexity.

Instrumentation comments can be placed anywhere within the logic description section of the target entity source code file. All instrumentation comments within a file are considered as a whole and produce a single instrumentation entity within the target design entity.

It is often necessary to override signal values within a simulation model to test various functions and create certain conditions that would otherwise not be possible or simple to obtain. To provide an efficient and designer accessible means of overriding signal values within a simulation model, the present invention incorporates specialized signal override output ports and logic into instrumentation entities that permit bus signal overrides during model simulation. Such signal override output ports must have different names that the outputs for count, fail, and harvest events, and compliance with this condition is verified by instrumentation load tool 464 (FIG. 4D) during the model build process.

The signal override output ports may be declared explicitly as ports in the HDL source code file of an explicitly represented instrumentation entity. For an embedded instrumentation entity or instrumentation entities produced by random instrumentation logic comments within a target design entity, the signal override output ports are automatically generated by instrumentation load tool 464. The signal override output ports are described in output port map statements that declare an alternate value that overrides a given simulation signal. Such an output port map statement further declares the conditions under which the simulation signal will be overridden. For each simulation signal (single or multi-bit) to be overridden, two output signals are produced: one providing the override signal value and another in the form of a single bit signal that enables or disables overriding of the simulation signal.

Figure 13A:
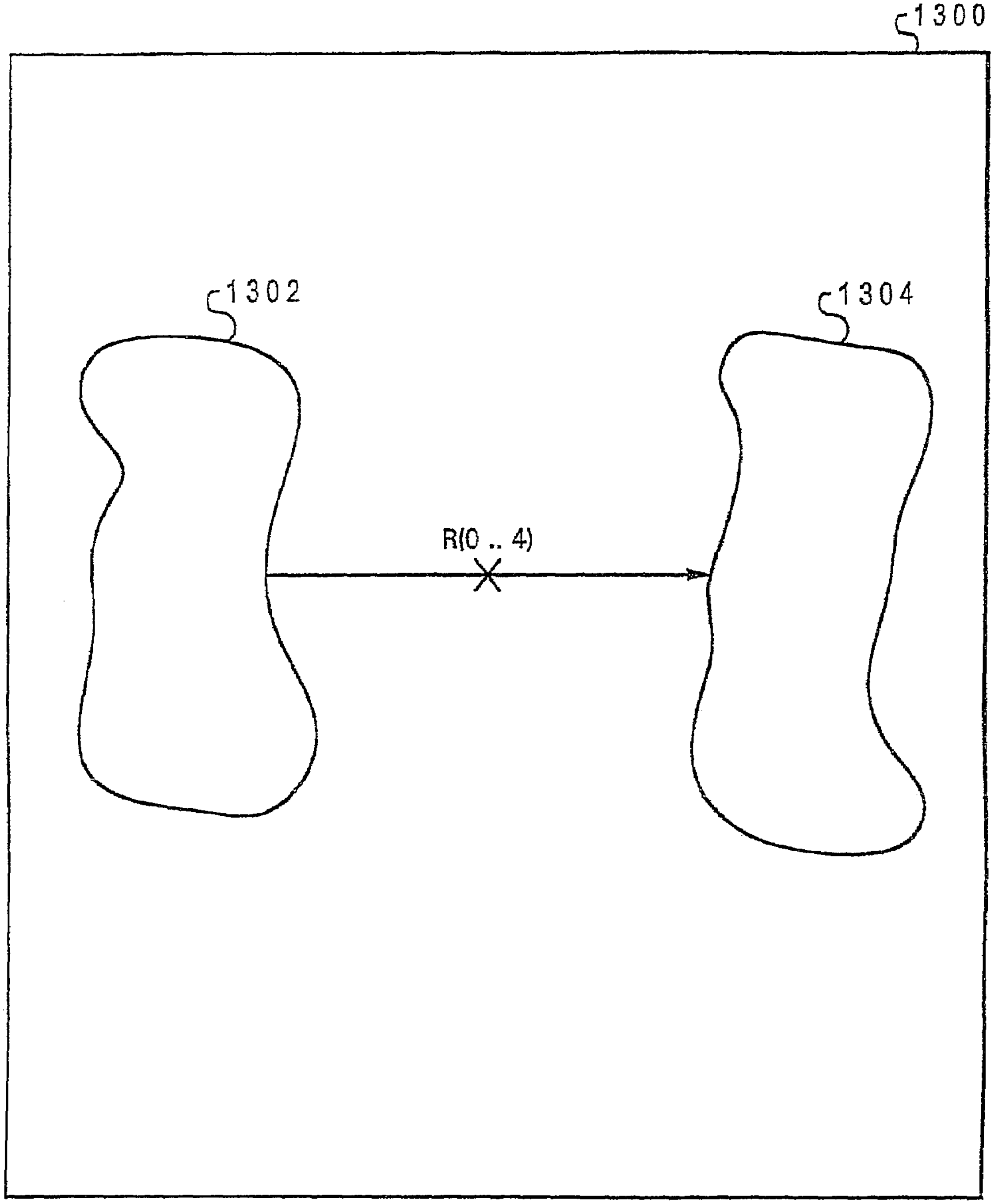
FIG. 13A depicts an exemplary design entity containing a multi-bit simulation signal.

With reference to FIG. 13A, there is depicted an exemplary HDL design entity 1300 containing a multi-bit simulation signal R. Simulation signal R is driven by one or more sources within a logic module 1302, and is received by one or more sinks within a logic module 1304. While the present invention will be described with respect to overriding signal R, one skilled in the art will understand and appreciate the extensions necessary to apply the principles set forth herein to overriding single bit signals or subsets of multi-bit signals.

Figure 13B:
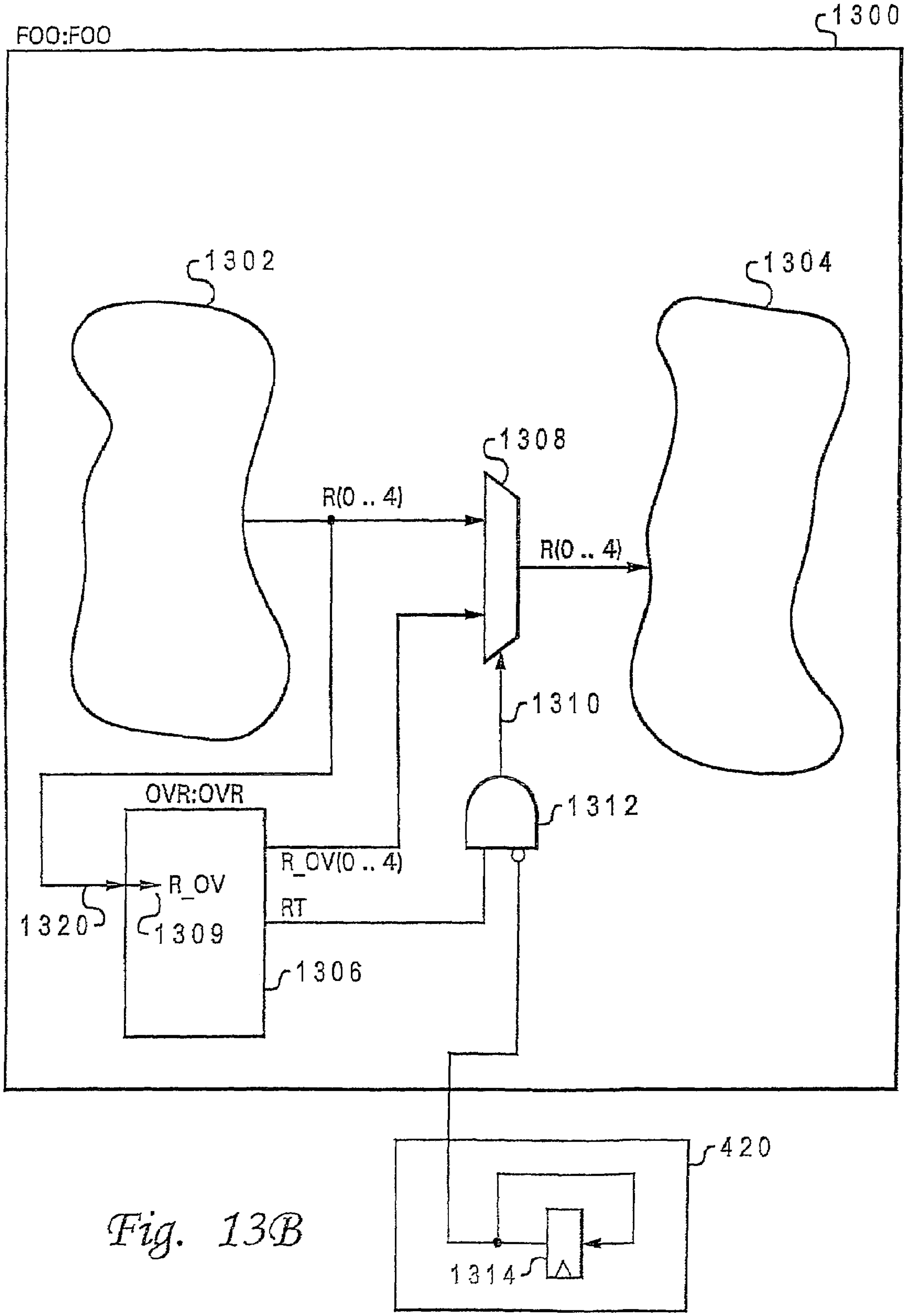
FIG. 13B illustrates a design entity wherein signal injection is implemented in accordance with the teachings of the present invention.

Referring to FIG. 13B, signal override functionality is incorporated within design entity 1300. As illustrated in FIG. 13B, design entity 1300 includes an instrumentation entity 1306 that is equipped to override signal R. In the depicted embodiment, instrumentation entity 1306 produces a signal R_OV(0 . . . 4) that is utilized within HDL design entity 1300 to selectively replace signal R as an input into logic module 1304. Instrumentation entity 1306 further produces a signal RT that enables an override of signal R with signal R_OV (0 . . . 4).

During a model build process, instrumentation load tool 464, instantiates a multiplexer (MUX) 1308 that breaks the path of the original signal R as depicted in FIG. 13A to produce signal R' that is input into logic module 1304. MUX 1308 is directly instantiated by instrumentation load tool 464 into the design proto data structure for instrumentation entity 1306 without the need to alter the HDL source code for HDL design entity 1300. MUX 1308 selects between override signal R_OV(0 . . . 4) and the original signal value R to determine the value of signal R'.

MUX 1308 is controlled by a select signal 1310 that is driven by logical AND gate 1312. Logical AND gate 1312 is driven by signal RT and a latch bit signal from a latch 1314. In a manner similar to that described in relation fail events in FIG. 5A, latch 1314, when loaded with a binary >1' value, forces MUX 1308 to select the original signal value R, thereby disabling overrides of signal R.

Instrumentation load tool 464 generates latch 1314 and logical AND gate 1312 for every overriddable signal within the simulation model. All signal overrides within a model can thus be selectively and individually disabled. For each overriddable signal, latch 1314 resides within instrumentation logic block 420 as depicted in FIG. 4B. In accordance with a preferred embodiment, only one instrumentation entity may override a given single bit signal or any signal or subset of signals within a multi-bit signal.

The signal override system of the present invention further provides a means by which instrumentation entities may access the original unaltered version of any given signal within the simulation model. As depicted in FIG. 13B, for example, instrumentation entity 1306 accesses the unaltered signal R by means of input signal 1320.

With reference to FIG. 13C, there is illustrated an exemplary HDL source code file 1340 that describes instrumentation entity 1306. HDL source code file 1340 includes entity descriptor comments 1351 and an architecture section 1358 comprising the functional logic within instrumentation entity 1306.

Within HDL source code file 1340, an input port map statement 1364 declares an input port 1309 at which instrumentation entity 1306 receives signal R from logic module 1302. A set of output port map statements 1362 and 1363 define the output ports from instrumentation entity 1306 for signals R_OV(0 . . . 4) and RT, respectively.

An input port map comment 1360 connects signal input 1320 to instrumentation entity 1306. Input port map comment 1360 employs an augmented syntax from that previously described for input port map comments. Signals that appear within brace ("{", "}") characters are defined to reference the original unaltered version of a signal within a particular target design entity. Hence the statement --!!R_IN(0 to 4)=>{R(0 to 4)} connects input port R_IN to signal R in the altered design proto data structure. The brace syntax may be used to enclose any signal within a port map comment or any signal referred to within a random instrumentation comment statement RHS. If a signal referenced within braces has no associated override mechanism in the model, the signal declaration within braces merely resolves to the unaltered signal itself.

An additional comment section, output declarations 1361, is further included within the descriptor comment syntax to declare signal overrides. Output declaration comment 1361 serves to generate the override logic shown in FIG. 13B and connect signals RT and R-OV(0 . . . 4) to the override logic. Output declarations such as output declaration comment 1361 are of the form:

--!!<name>:out_port=>target_signal [ctrl_port];

where name is a name associated with the specific signal override (R_OVRRIDE in FIG. 13C), outport is the output port providing the override value for the signal, target-signal is the name of the signal to be overridden, and ctrl_port is the single bit output port that determines when the target signal is overridden.

One such output declaration is required for every overriddable signal. Signals designated by out_port and ctrl_port must appear as outputs declared in the HDL port map for the entity. As it does for instrumentation entities, instrumentation load tool 464 parses the comments depicted in FIG. 13C and alters the proto data structures within the simulation model at model build time to produce a result such as that depicted in FIG. 13B.

Furthermore, each signal override is given a unique name based on the "name" field within the output declaration comment in a manner analogous to that described earlier for count events. In this manner, each signal override can be specifically referred to for such purposes as disabling the signal override by setting latch 1314 as shown in FIG. 13B.

While FIG. 13C illustrates only those constructs necessary for implementing a signal override, it should be noted that there is no limitation placed upon the creation of count, fail, and harvest events within the same instrumentation entity as a signal override, and furthermore, that multiple signal override entities may be incorporated within the same instrumentation entity.

Referring to FIG. 13D, there is depicted an HDL source code file for producing design entity 1300 wherein a set of random instrumentation comments 1380 implement the logic necessary for selectively overriding signal R. A comment 1381 connects the unaltered version of signal R (referred to within the braces ("{", "}") syntax) to an internal instrumentation signal R_IN. A pair of comments 1382 and 1383 assigns values for signals R_OV and RT (the exact expressions assigned to RT and R_OV are not depicted). An event declaration instrumentation comment 1384 produces a signal that enables signal R to be overridden. In accordance with the depicted embodiment, an event declaration comment is of the form:

[override,<name>,<target-signal>,<ctrl-signal>], where override is a fixed string denoting a signal override, "<name>" is the name assigned to the override, "<target_signal>" is the name of the signal in the target entity to be altered, and "<ctrl_signal>" is the name of the signal that determines when the signal override takes effect. By utilizing random instrumentation comments, a design engineer can efficiently create signal overrides.

Since in accordance with the teachings of the present invention, signal overrides are implemented directly using hardware constructs, it is possible to efficiently utilize signal overrides within a hardware simulator.

Simulation of a given model is typically controlled by a program, hereinafter referred to as RTX (Run Time eXecutive), that is written in a high-level language such as C or C++. To facilitate RTX control and execution of a simulation run, simulators typically provide a number of application program interface (API) functions that maybe called by the RTX. Such API functions employ routines, protocols, and tools that allow for polling of signals within the simulation model, alteration of signals within a simulation model, cycling a simulation model, etc.

The RTX is often required to monitor occurrences of significant events during model simulation. Such events typically consist of a signal or a set of signals that assume a prescribed sequence of values and will be referred to hereinafter as "model events." To monitor model signals, an RTX typically calls a specialized API function, hereinafter referred to as GETFAC, which allows for polling of signal values during model simulation.

Typically, an RTX must monitor a large number of signals, potentially on a cycle-by-cycle basis, within a simulation model and must subsequently process the signal values in order to detect the occurrence of model events. This approach to model event monitoring places a burden on the verification engineer in terms of re-writing RTX and communicating with design engineers when the signals or sequence of signal values that constitute a model event change.

To provide an efficient means for monitoring model events, so-called "detection events" are generated and are accessible by the RTX. Such detection events are generated by instrumentation entities. Detection events are implemented as output ports on an instrumentation entity. Furthermore, an enhanced API function is provided for directly accessing detection events within a given simulation model.

For each detection event, a first, potentially multi-bit, output is utilized as the value of a model event. An optional second single bit signal is utilized to indicate when the detection event occurs during model simulation. By their nature, certain model events occur at each and every cycle and therefore do not require a qualifying signal to track their occurrences.

Figure 14A:
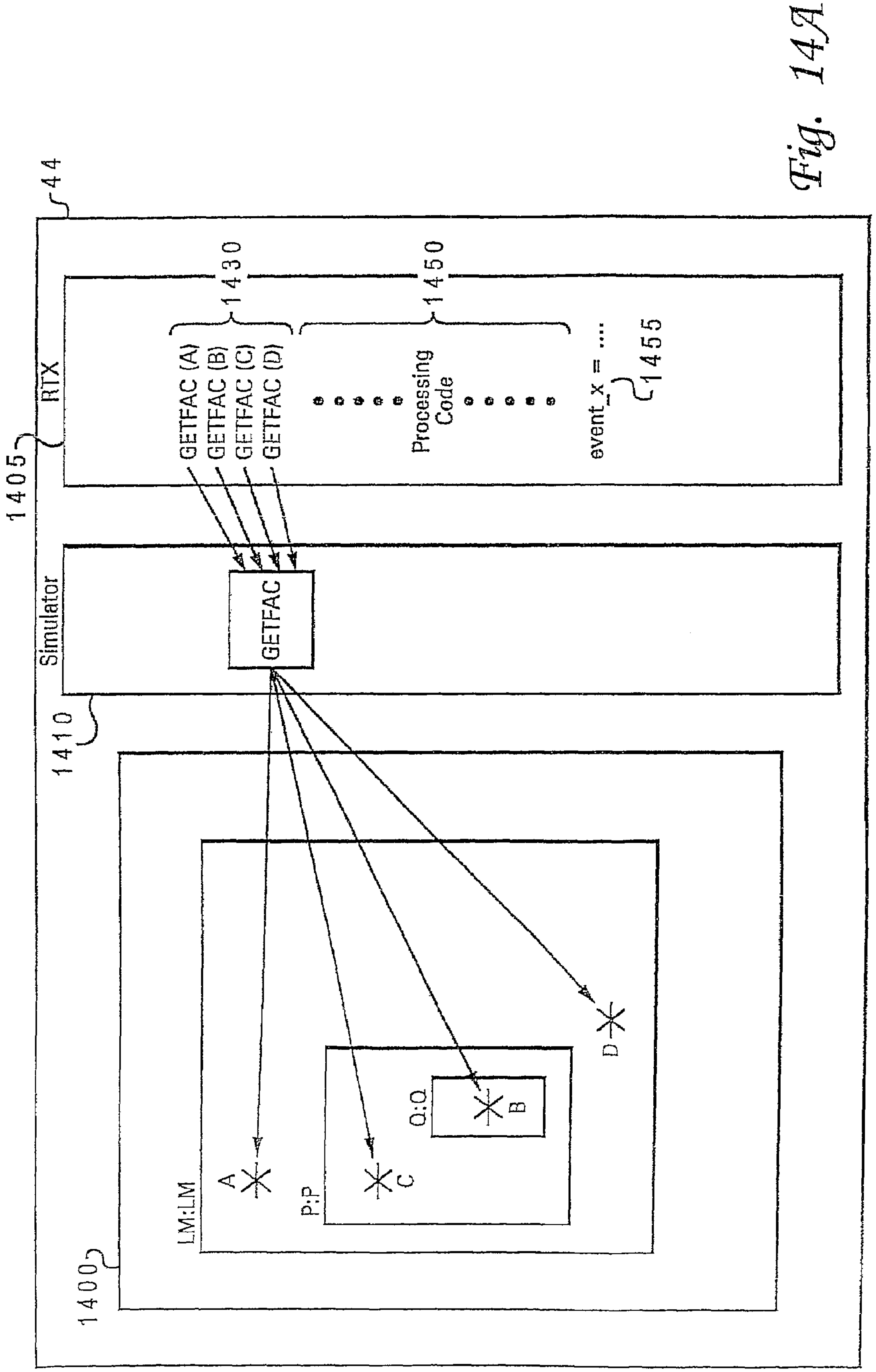
FIG. 14A is a block diagram depicting data content within a main memory during a simulation run of a simulation model.

With reference to FIG. 14A, there is illustrated a block diagram depicting data content within main memory 44 (FIG.

2) during a simulation run of a simulation model 1400. Main memory 44 includes the elements necessary for monitoring an exemplary model event including a software simulator 1410 that simulates simulation model 1400 under the control of an RTX 1405.

RTX 1405 delivers a set of API calls 1430 to API function GETFAC within simulator 1410 to obtain the values of signals A, B, C, and D within model 1400. Further processing of these signal events is performed utilizing an RTX code 1450 culminating in the assignment of the model event value to variable event_x at RTX code line 1455.

Figure 14B:
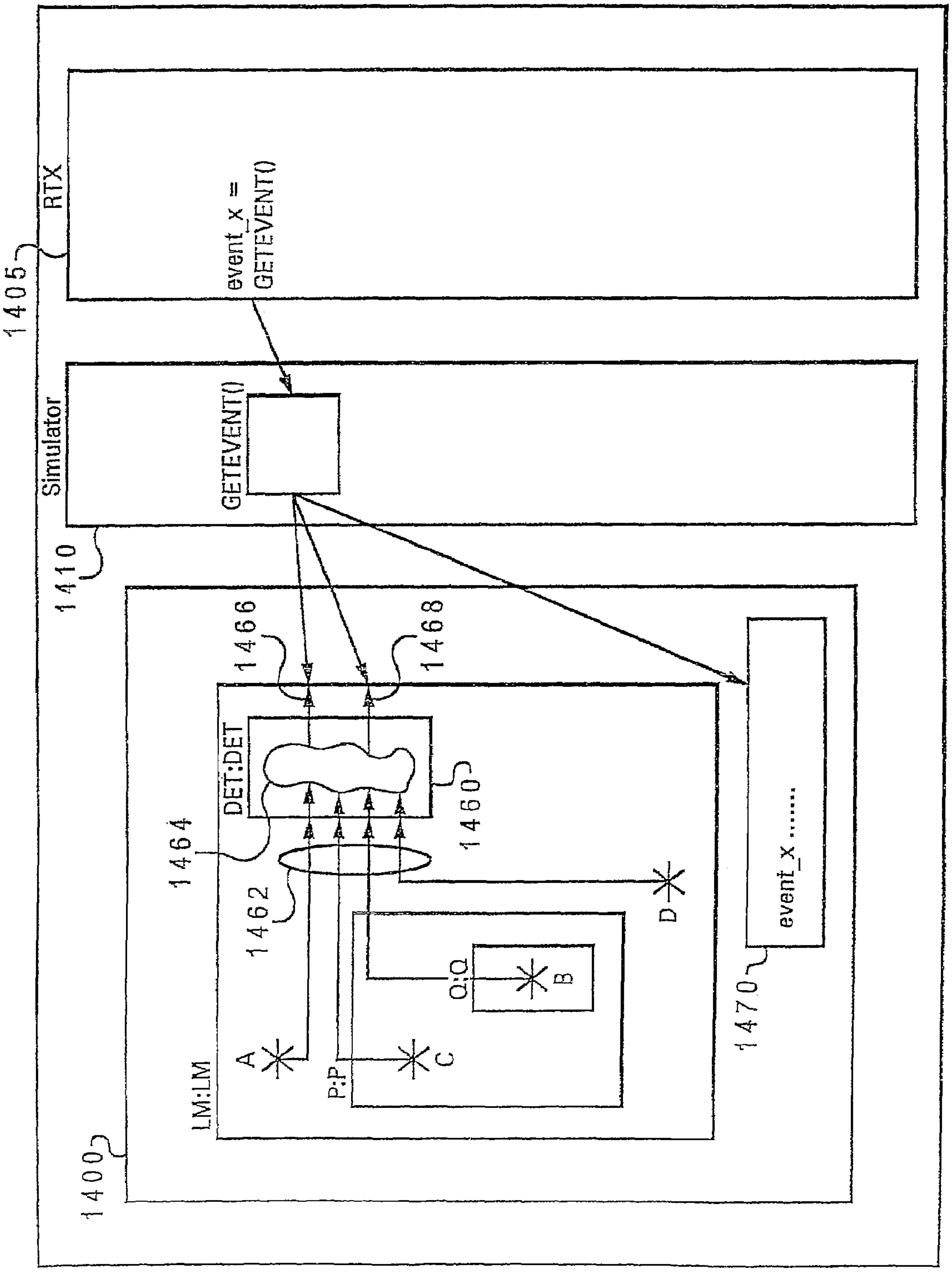
FIG. 14B is a block diagram illustrating data contents of a main memory during a simulation run in accordance with the teachings of the present invention.

Referring to FIG. 14B, there is illustrated a block diagram depicting contents of main memory 44 during a simulation run in accordance with a preferred embodiment of the present invention. In the depicted embodiment, an instrumentation entity 1460 is instantiated within simulation model 1400 using techniques described above. Instrumentation entity 1460 directly monitors signals A, B, C, and D by means of a set of signal connections 1462. Signal connections 1462 provide a more efficient means to monitor signals than GETFAC API function calls.

Within instrumentation entity 1460, instrumentation logic 1464 substantially recreates the function of RTX code 1450 of FIG. 14A and produces signals 1466 and 1468, which denote the value of a model event and when the model event occurs, respectively.

Each detection event within a given simulation model is assigned a unique name in a manner described below. During model build, instrumentation load tool 464 (FIG. 4D) generates a data structure in the form of a table within the simulation model that uniquely names all the detection events within a given simulation model and the corresponding instrumentation entity output signals. This table will be referred to hereinafter as the detection event translation table.

An API function GETEVENT( ) is provided within software simulator 1410 for accessing model detection events. API function GETEVENT references a detection event translation table 1470 to locate signals 1466 and 1468 in response to a call 1472 by RTX to obtain the value of model event event_x. RTX 1405 obtains the value of model event event_x without delivering a number of GETFAC API calls, and furthermore, without the need to process the signal values associated with the model event. The RTX code is thus insulated from potential changes to the signals and signal sequence values defining model event event_x. Any changes to the detailed definition of model event event_x are reflected within instrumentation entity 1460 and no changes to the RTX are necessary.

With reference to FIG. 14C, there is illustrated an exemplary HDL source code file 1480 that describes instrumentation entity 1460 in accordance with a preferred embodiment of the present invention. As shown in FIG. 14C, exemplary file 1480 consists of a number of entity descriptor comments 1491 and an architecture section 1492 comprising instrumentation logic 1464.

Within HDL file 1480, a set of input port map comments 1493 serve to generate connections 1462 of FIG. 14B. An additional comment section, detection declarations 1494 is incorporated within the entity descriptor comment syntax that allows for declaring detection events. A detection declaration comment 1495 serves to generate and uniquely name detection event event_x. Moreover, detection declaration comment 1495 associates signals 1466 and 1468 of FIG. 14B with event_x. Detection event declarations, such as detection event declaration 1495 are of the form:

```
--!!<name>:event_value_port[ctrl_signal];
```

where name is a name associated with the specific detection event (event_x in FIG. 14C), event_valueport is the output port providing the value for the detection event, and ctrl_signal is an optional single bit output port that flags an occurrence of the model event.

Each detection event is uniquely named in accordance with the name field within the output declaration comment in a manner analogous to that described earlier for count events. Such detection event names, together with the corresponding instrumentation entity output ports, are inserted into the detection event translation table data structure that is placed within the model by instrumentation load tool 464. API function GETEVENT receives the extended event identifier associated with a given event as an input and returns the model event value and, if applicable, an indication of whether the event occurred in the current cycle.

While FIG. 14C illustrates only those constructs necessary for implementing a detection event, the principles set forth herein place no limitation on the generation of count, fail, and harvest events or signal overrides within the same instrumentation entity as a detection event. Moreover, multiple detection events may be incorporated within the same instrumentation entity.

Within the spirit and scope of the present invention, detection events may be created within random instrumentation comments in a manner largely similar to that described with reference to signal overrides. Detection events can also be combined, in a manner similar to that shown earlier, as part of a hierarchical event.

Finally, it should be noted that the present invention may be practiced in conjunction with a hardware simulator. As for software simulators, hardware simulators are controlled by an RTX program. To adapt the principles set forth herein to a hardware simulator environment, the hardware simulator provides a GETEVENT API function and accepts models containing a detection event translation table.

By utilizing random instrumentation comments, a design engineer can efficiently create representations of model events accessible to RTX. Such representations need not change even if the detailed definition of the model event changes. Such stability reduces the complexity and burden of maintaining RTX and lowers the amount of communication required between design and verification engineers.

In order to provide for the control and monitoring of instrumentation events within simulation models executing on a batch simulation farm, one or more general-purpose computers, hereinafter referred to as "instrumentation servers", are added to batch simulation farms. An instrumentation server acts as a centralized repository for information used to control instrumentation events and for data gathered from instrumentation events during simulation runs. The exact nature and function of the control information and of the gathered data varies with the type of event (i.e., fail events vs. count events), as will be described below.

In order to allow for effective management of instrumentation events, a set of "eventlist" files (described with reference to FIGS. 10A-10D) contain information about the exact number and content of the instrumentation events in a given model. The eventlist files are created at model build time by instrumentation load tool 464. These files, one per class of events (fail, count, harvest, etc.), list the particular events in the given simulation model. Each simulation model has a unique set of corresponding eventlist files that are created at model build time.

When instrumentation events are created at model build time, they are constructed in a specific order, and a unique index is assigned within the eventlist file to each instrumentation event for a given event class. Accesses to instrumentation events by API routines make use of these index values. Furthermore, when an API routine communicates aggregate data with respect to all events within a given event class to the instrumentation server, this aggregate data is sequentially ordered according to these index values.

Each eventlist file contains a list of the instrumentation events for a given event class within the model. These events are named in accordance with the naming convention data structures described above in conjunction with FIGS. 10A-10C, which provides unique names for each of the instrumentation events. Referring back to FIG. 10A in conjunction with FIG. 15, there is shown an eventlist file 1660 for the count events of simulation model 1000 of FIG. 10A.

Eventlist file 1660 contains multiple count event class entries 1663. Each of count event class entries 1663 includes a unique, sequential index value 1661, and an extended event identifier 1662. Each of indices 1661 corresponds to the index of a particular event (in this case count event COUNT1) assigned at model build time. Extended event identifiers 1662 provide an event name associated with each individual event index. Eventlist file 1660 thus provides a mapping between the instrumentation event names and the instrumentation event indices as well as providing an ordering convention for aggregate data for a class of instrumentation events. Eventlist files, such as eventlist file 1660, are used by the instrumentation server to aid in the control and monitoring of instrumentation events in simulation models.

Figure 16A:
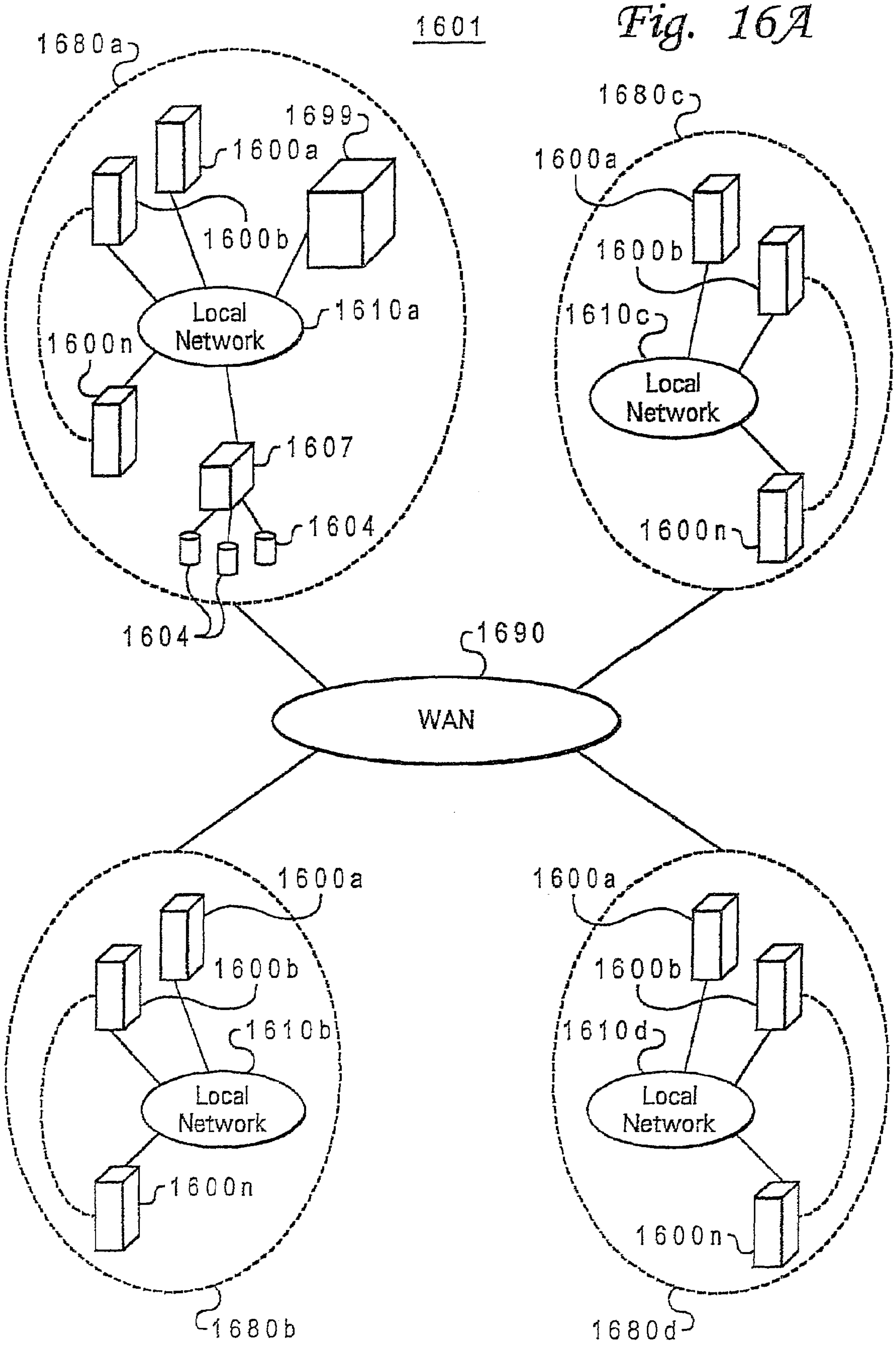
FIG. 16A depicts a batch simulation farm in which a preferred embodiment of the present invention may be implemented.

With reference now to FIG. 16A, there is illustrated a batch simulation farm 1601 in which a preferred embodiment of the present invention may be implemented. Batch simulation farm 1601 consists of geographically distant simulation farm nodes 1680*a-d*. Within these nodes, general-purpose computers 1600*a-n* are interconnected via local area networks (LANs) 1610*a*-1610*d*. LANs 1610*a*-1610*d* are further connected by means of a wide-area network (WAN) 1690, which provides communication among multiple simulation farm nodes 1680*a-d*. Those skilled in the art will recognize that many possible network topologies are possible for a batch simulation farm.

One such general-purpose computer 1607, together with a set of disk storage devices 1609 serve as a shared file system, which is accessible to all general-purpose computers within simulation farm nodes 1680*a-d*. Exemplary batch simulation farm 1601 has been shown with one shared file system server in a particular geographic node. Those skilled in the art will recognize that it is possible for the shared file system to be implemented as multiple general-purpose computers and disk devices across the different geographic nodes in the batch simulation farm. Further, it is possible for each distinct geographic node to have a unique shared file system. Such unique file systems are usually accessible to all nodes, but are most advantageously accessed within the local network node wherein the file system resides.

Within simulation farm node 1680*a*, a particular general-purpose computer serves as an instrumentation server 1699. Although a single instrumentation server is described with reference to the batch simulation farm environment shown in the figures, those skilled in the art will understand the extensions necessary to distribute the functionality of the instrumentation server across several physical general-purpose computers.

General-purpose computers 1600*a-n* within simulation farm nodes 1680*a-d* utilize software or hardware simulators to perform simulation tests on various digital design simulation models. In addition, certain designated general-purpose computers 1600 within batch simulation farm 1601 serve specific roles in the process of controlling and executing simulation tests as described below. Many of general-purpose computers 1600 may also be user machines that execute simulation tests as a secondary background function.

At any given time, a number of distinct versions of a simulation model for a given digital logic design may be undergoing simulation within batch simulation farm 1601. In addition, a number of different digital designs, each with their respective differing model versions, may be undergoing simulation. In such circumstances, each different model is typically given a name, hereinafter referred to as the "model name", which uniquely identifies both the particular digital design and the particular version of the simulation model for the given digital design.

One or more general-purpose computers 1600, hereinafter referred to as "model servers", are utilized to store the valid versions of simulation models currently available for execution within batch simulation farm 1601. Before simulation jobs can be executed within batch simulation farm 1601 with respect to a particular model, that model must be built, and a copy of the model placed on the model servers. In addition, the eventlist files for the model must be placed on instrumentation server 1699 to allow for the control and monitoring of the instrumentation events.

Within batch simulation farm 1601, one or more of general-purpose computers 1600*a-n*, referred to hereinafter as "testcase generators", are typically utilized to create simulation testcases for the various models under simulation. The testcase generators are responsible for generating tests to be executed and further packaging these tests into simulation jobs. A simulation job is an entity containing the simulation test and any controlling information and/or programs (such as RTX) that are necessary to execute the simulation test within batch simulation farm 1601.

Simulation jobs are passed from the testcase generators to one or more of general-purpose computers 1600*a-n* that are utilized as batch controllers, within batch simulation farm 1601. These batch controllers are responsible for dispatching simulation jobs to a general-purpose computer utilized as a simulation platform, herein after referred to as a "simulation client".

Once a simulation job arrives at a simulation client, the simulation client communicates with the model servers to obtain a copy of the simulation model corresponding to the particular simulation job. The model can be transferred to the simulation client by a number of means well known to those skilled in the art including, among others, a shared file system, File Transfer Protocol (FTP), or a custom file transport mechanism utilizing network communication protocols.

In addition, the simulation client communicates with instrumentation server 1699, the shared file system comprising general-purpose computer 1607 and disk storage devices 1609, or some combination thereof, in order to obtain the control information for the instrumentation events within the model. This control information is stored on a per model basis by model name on instrumentation server 1699. The exact contents and nature of the communication between the simulation client and instrumentation server 1699 varies with the type of events within the model as explained in further detail below. The instrumentation event control information is used by API routines called by RTX to control the behavior of the instrumentation events within the simulation model.

The simulation model is then loaded into either memory 44 or the hardware simulator within the simulation client. Model processing control is then passed to RTX for the execution of the simulation testcase. RTX executes the testcase until the successful completion of the test or an error condition (test fail) occurs.

Within batch simulation farm 1601, one or more of general-purpose computers 1600*a-n*, hereinafter referred to as "statistics servers", are utilized to store general statistics, such as cycles completed, number of passing tests executed, etc. concerning the execution of simulation jobs within batch simulation farm 1601. Likewise, one or more of general-purpose computers 1600*a-n*, hereinafter referred to as "failed testcase servers", are utilized to store simulation tests that have failed in order to facilitate the re-execution and debugging of these testcases.

At the conclusion of the execution of a testcase, whether due to successful execution or a failure, RTX communicates with the statistics server to record general statistics about the execution of the simulation job. Such communication can be accomplished in a number of ways well known to those skilled in the art including a shared file system, a direct network connection between RTX and the statistics server, a file transport mechanism, and others.

At the conclusion of a testcase, RTX also communicates the aggregate information concerning instrumentation events to instrumentation server 1699. This information is stored on instrumentation server 1699 for future analysis and in some cases is utilized to control instrumentation events in future simulation testcase runs for a given model. The exact nature of this communication varies for the different event classes as explained in further detail below.

If a testcase concludes due to a failure, RTX communicates with the failed testcase server to save those elements of the simulation job required to allow for the reproduction of the failed simulation testcase. The failed testcase server serves as a repository of failed tests that may be retrieved and re-executed in a foreground manner to allow for detailed investigation and problem resolution.

It is important to note that different simulation models typically require differing forms of testcases. What constitutes a testcase varies, often dramatically, between different simulation models. This is due to the varied techniques utilized in the present art for simulation of digital systems. In such circumstances, the failed testcase servers provide mechanisms capable of storing each of the various different forms of testcases.

In response to RTX communicating the general statistics for a simulation job to the statistics servers, communicating the aggregate statistics for the instrumentation events to instrumentation server 1699, and arranging for the storage of any failed simulation testcases on the failed testcase servers, RTX terminates and the simulation client is released. The batch controllers can then dispatch a new simulation job to the simulation client for execution. Those skilled in the art will recognize that many potential variations in the operation of a batch simulation farm are possible.

Figure 16B:
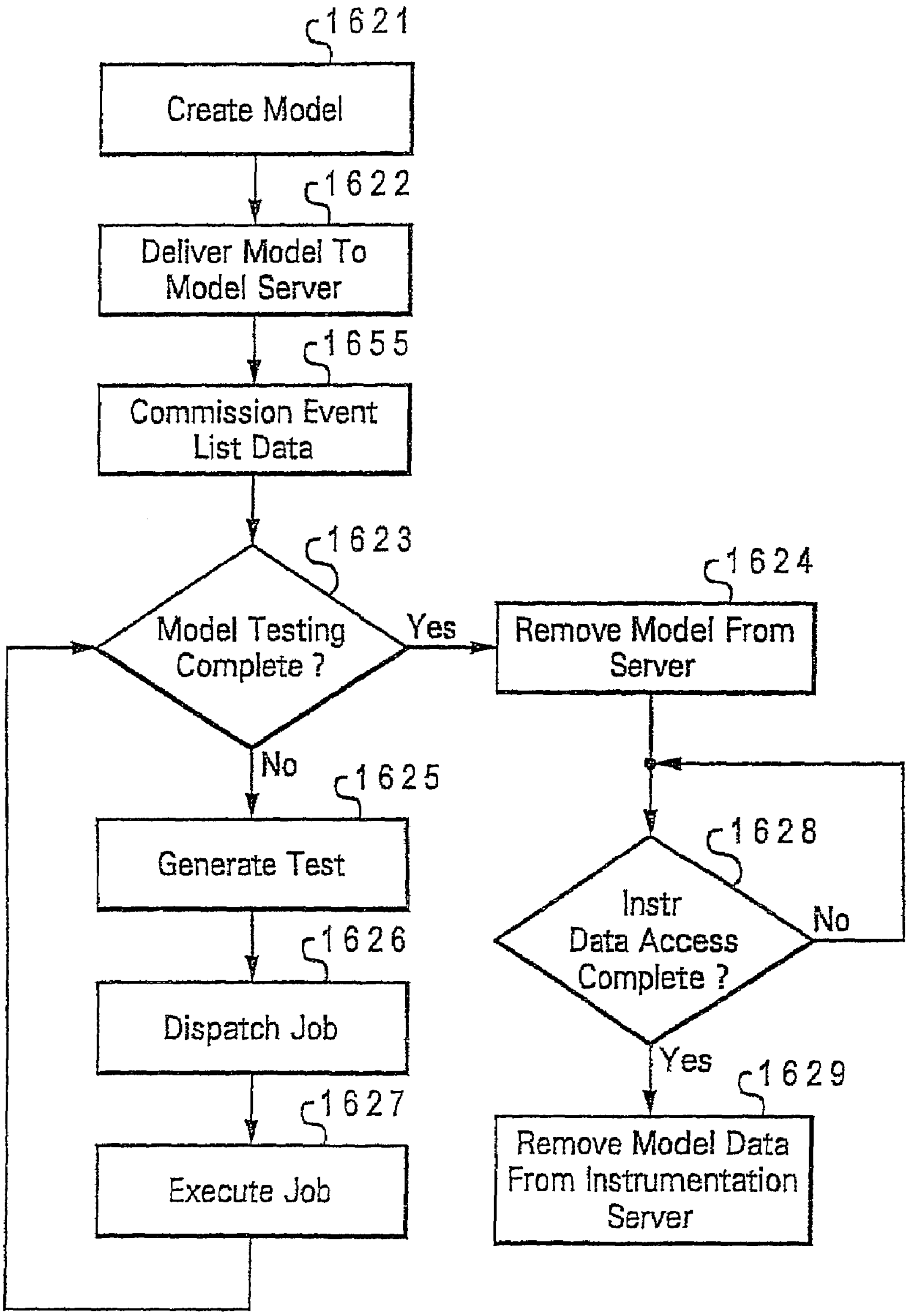
FIG. 16B is a flow diagram illustrating a progression of events from the creation of a specific simulation model to the removal of that model from batch simulation farm and instrumentation server in accordance with a preferred embodiment of the present invention.

With reference to the flowchart of FIG. 16B in conjunction with FIG. 15, there is depicted a progression of events from the creation of a specific simulation model to the removal of that model from batch simulation farm 1601 and instrumentation server 1699. The process begins at step 1621, which depicts the creation of the given simulation model. The simulation model is created in accordance with model build processes described hereinbefore.

Proceeding to step 1622, the model is placed on the model server to be available for simulation jobs executed within batch simulation farm 1601. Next, as illustrated at step 1655, the model eventlist files are placed on instrumentation server 1699. Once the eventlist files for a given model are placed on instrumentation server 1699, instrumentation server 1699 begins controlling instrumentation events and gathering instrumentation event data for the given model. Placing the eventlist files on instrumentation server 1699 will be referred to hereinafter as "commissioning" a model.

The process continues as depicted at step 1623, with a determination of whether all the desired testing for the given model has been completed. If, as illustrated at step 1625, not all testing for the given model is complete, a new testcase is generated by the testcase generators. Subsequent to generation of a new testcase, a batch controller dispatches the resultant simulation job to a simulation client for execution as shown at step 1626. The simulation job is then executed on the simulation client as depicted at step 1627. Finally, the process returns to step 1623 to repeat until model testing for the given model is complete and the model is removed from the batch simulation farm as illustrated at step 1624.

Those skilled in the art will recognize that it is possible for several concurrent simulation jobs for the same model to be executing contemporaneously within batch simulation farm 1601. That is to say, steps 1625-1627 may be executed with respect to the same model a number of times concurrently by batch controllers within batch simulation farm 1601. The given simulation model is not removed from batch simulation farm 1601 until all outstanding jobs, potentially executing concurrently, for the given simulation model have completed execution. Referring to step 1624, when all testing for the model has been completed, the model is removed from the model servers and therefore from batch simulation farm 1601.

It is often necessary to access particular elements of the instrumentation data for a particular model even after the model has been removed from batch simulation farm 1601. Process step 1628 depicts a determination of whether there still exists a need for access to the instrumentation data stored within instrumentation server 1699 for the given model. In response to a determination that all necessary access to instrumentation data for the model has been completed, the process continues as shown at step 1629, with the eventlist files, control information, and instrumentation data files for the given model all being removed from instrumentation server 1699, thereby removing the model in its entirety from instrumentation server 1699.

Figure 16C:
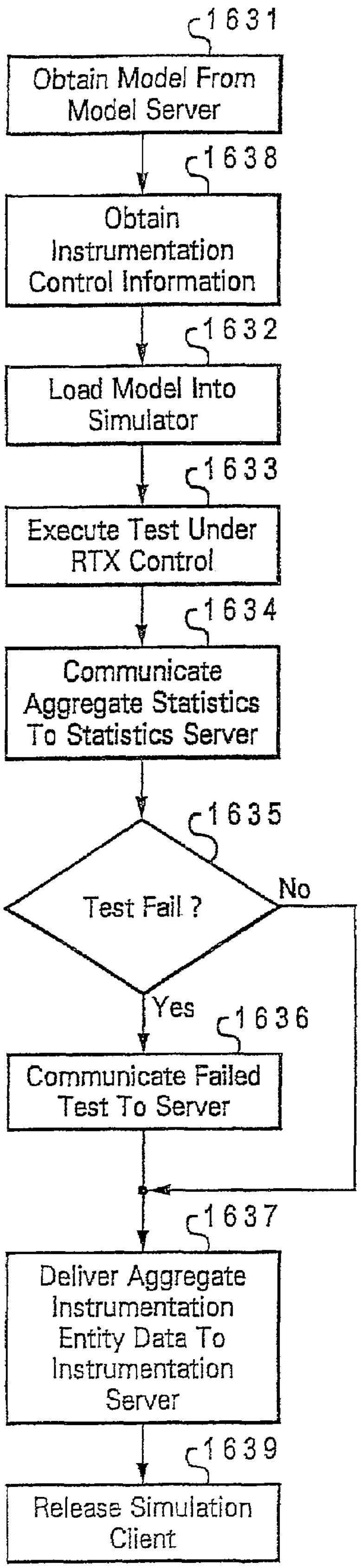
FIG. 16C is a flow diagram depicting steps performed during execution of a simulation job within a batch simulation farm in accordance with a preferred embodiment of the present invention.

With reference to the flowchart of FIG. 16C, the steps involved in simulation job execution step 1627 of FIG. 16C are depicted in greater detail. The process of executing a simulation job on a simulation client begins with step 1631, which depicts the simulation client obtaining a copy of the model corresponding to the given simulation job provided by the model servers. As illustrated at step 1638, the simulation client communicates with instrumentation server 1699 to obtain and process control information for the instrumentation events within the simulation model. Proceeding to step 1632, the simulation model is loaded into a hardware simulator or memory 44 of the simulation client.

The process then moves to step 1633, which depicts the execution of the simulation test under RTX control. Once the simulation test is complete, and as illustrated at step 1634, RTX delivers the aggregate statistical results data obtained from the simulation job to the statistics server wherein the data are logged. Next, as depicted at step 1635, a determination is made of whether or not the testcase failed. If the testcase has failed, and as shown at step 1636, the RTX communicates the failed testcase to the failed testcase servers. If it is determined at step 1635 that the testcase did not fail, the process continues at step 1637, which depicts RTX delivering various aggregate instrumentation event data to the instrumentation server 1699 as will be described below. The process concludes with step 1639, illustrating the simulation client being released to perform other simulation jobs.

In an environment such as batch simulation farm 1601, which contains a potentially large number of different versions of active simulation models, it is important to ensure the correctness of the aggregate instrumentation data communicated from the simulation clients to the instrumentation server for the various models. Each simulation model contains a unique set of instrumentation events that are ordered, per class of events, in a unique fashion. The nature and identity of these sets of events are delivered to instrumentation server 1699 when the eventlist files for each model are commissioned onto instrumentation server 1699.

Aggregate data about a group of instrumentation events delivered from a simulation client are identified by the model name within instrumentation server 1699. Once a particular simulation model is commissioned (i.e., the eventlist files for the model have been placed on instrumentation server 1699), it may be useful to enable instrumentation server 1699 to determine if the aggregate instrumentation data received under a given model name correctly corresponds to the instrumentation data for the model named in accordance with the model name originally commissioned on instrumentation server 1699.

Simulation clients 1600*a-n* may also be utilized to simulate a model directly in a foreground mode without using the batch simulation farm. Such a foreground simulation does not require the placement of a model on the model servers or the placement of the eventlist files on the instrumentation server. Such independent model processing is one possibility necessitating a method for ensuring consistency of eventlist model data within instrumentation server 1699. To provide a means to uniquely correlate aggregate instrumentation data to a specific simulation model, instrumentation load tool 464 places a number of so-called "digital signatures" within each simulation model. These signatures are computed for each instrumentation event class and are subsequently utilized by a cyclic-redundancy-check (CRC) check function to ensure an exact correspondence between models commissioned within instrumentation server 1699 and subsequently arriving model event information. As explained in further detail with reference to FIGS. 17A-C, a digital signature is generated that uniquely corresponds to the eventlist contents for each event class. The digital signature is computed from the eventlist data for a given set of events within a specific simulation model. Any alterations, additions, or deletions to an eventlist file will result in a differing digital signature.

The use of CRC values is well known to those skilled in the art and they are used in a variety of other circumstances to detect corruption of data during transmission or storage. As implemented herein, however, the CRC "digital signature" serves not to detect errors in the physical transmission or storage of data, but rather as a unique signature for the contents of an eventlist file for a simulation model. For example, if a model with a different set of instrumentation events is created, but given the same name as an earlier model, the contents of the eventlists are changed and therefore the value of the CRC digital signatures will differ from those of the original model.

Figure 17A:
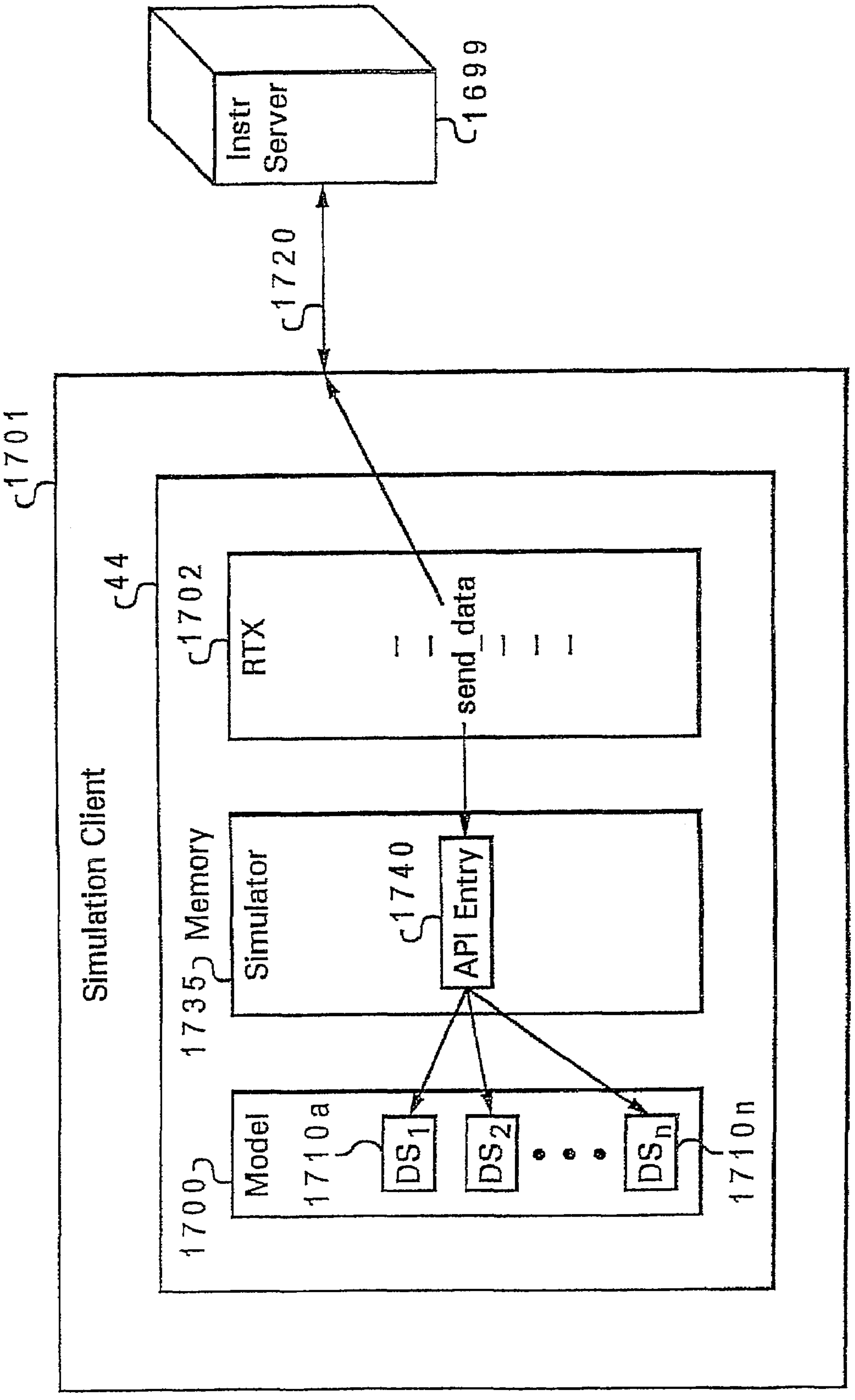
FIG. 17A is a block diagram illustrating the active data content within a main memory during a simulation run of a simulation model within a batch simulation farm environment in accordance with a preferred embodiment of the present invention.

Referring to FIG. 17A, there is illustrated a block diagram depicting data content within main memory 44 (FIG. 2), including a simulation client 1701, during a simulation run of a simulation model 1700 in accordance with a preferred embodiment of the present invention. Within simulation model 1700, digital signatures 1710*a-n* correspond to a CRC value calculated by instrumentation load tool 464 for the various eventlists describing all instrumentation events contained in simulation model 1700.

At the conclusion of a simulation run, an RTX 1702 communicates aggregate instrumentation event data to instrumentation server 1699, as depicted in step 1637 of FIG. 16C. To communicate the aggregate event instrumentation data, RTX 1702 calls API entry point 1740 within a simulator 1735. API entry point routine 1740 collects the instrumentation event data into an "aggregate data packet" (depicted in FIG. 17B), which is delivered to instrumentation server 1699 through a network interface 1720. Distinct API entry points are provided for each class of instrumentation events that must communicate aggregate data with instrumentation server 1699.

Figure 17B:
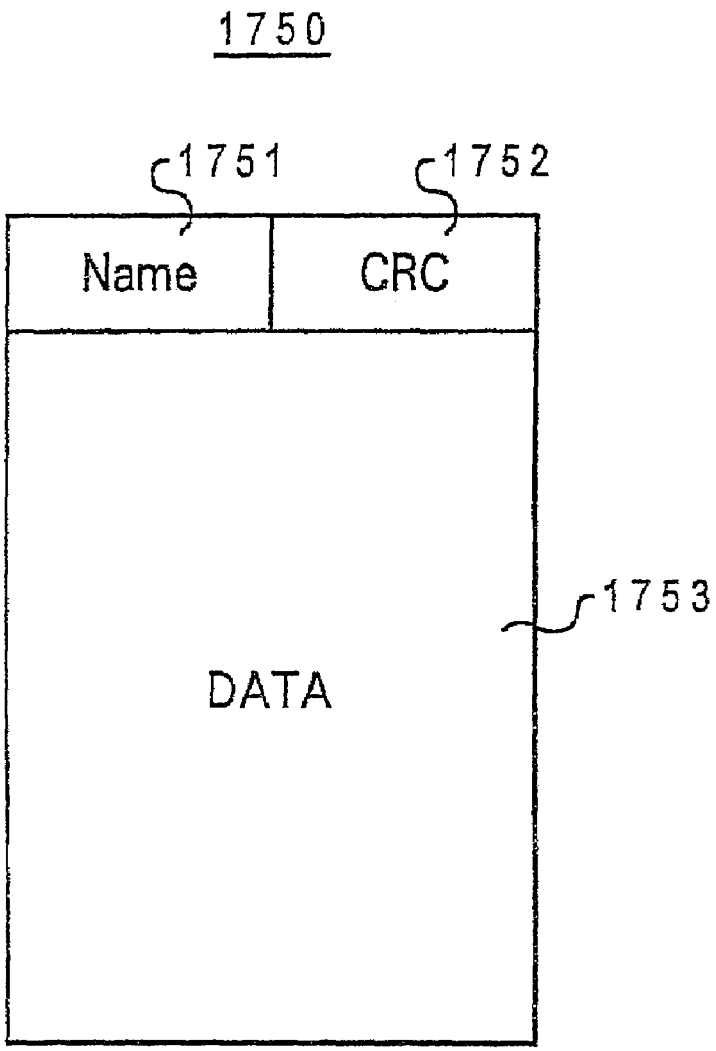
FIG. 17B depicts an aggregate data packet delivered by an API entry point routine to an instrumentation server in accordance with a preferred embodiment of the present invention.

With reference to FIG. 17B, an aggregate data packet 1750, such as that delivered by API entry point routine 1740 to instrumentation server 1699, is depicted. Aggregate data packet 1750 contains a model name field 1751, a CRC digital signature value 1752, and a data field 1753. Model name field 1751 consists of the name of simulation model 1700. CRC digital signature value 1752 contains the digital signature value for the class of events communicated in aggregate data packet 1750. Data field 1753 contains the aggregate instrumentation event data for model 1700. The nature and contents of this data varies for each class of instrumentation events.

Figure 17C:
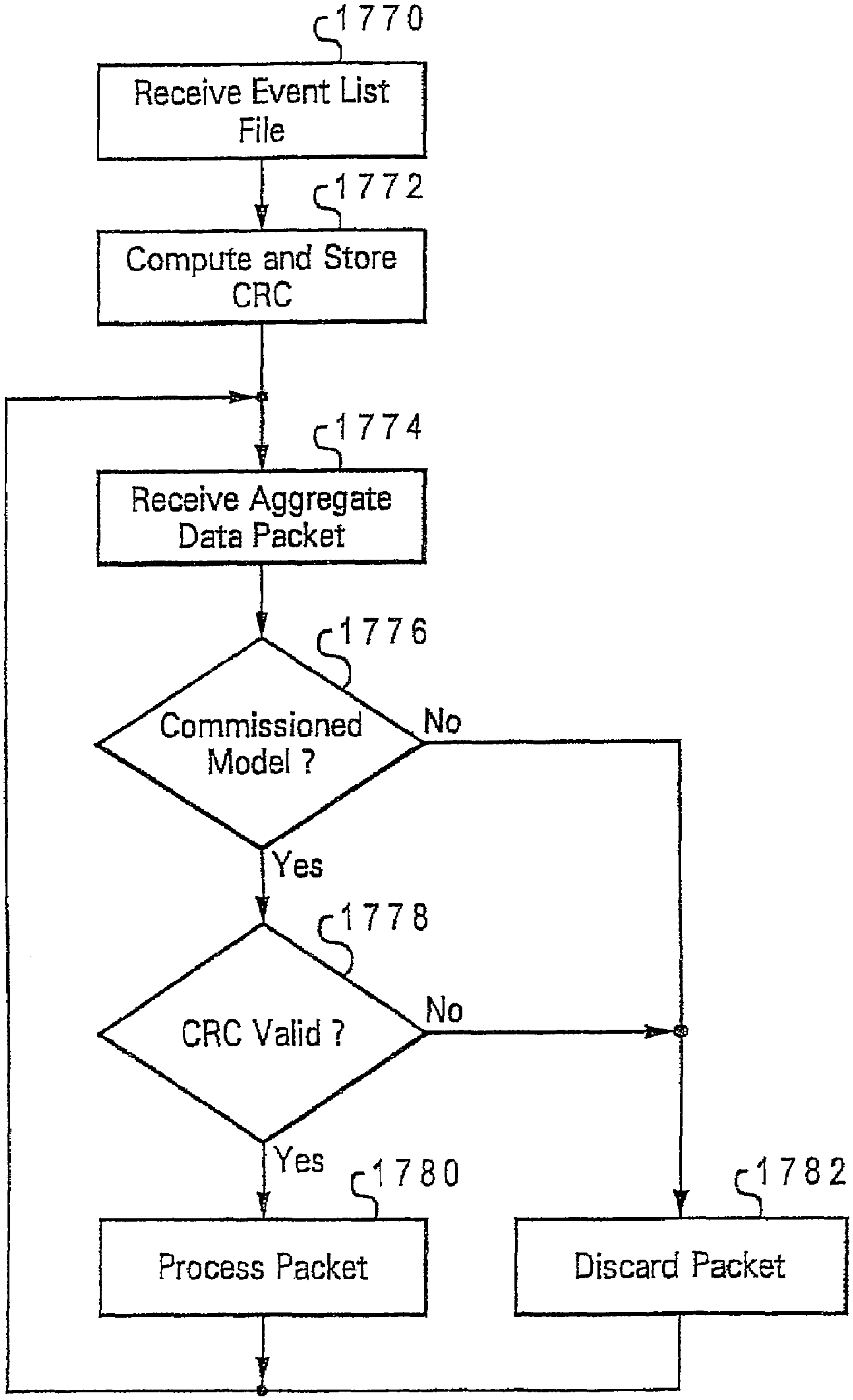
FIG. 17C is a flow diagram illustrating a process by which the correctness of aggregate data packets received by an batch simulation farm instrumentation server is validated in accordance with a preferred embodiment of the present invention.

Referring to FIG. 17C, there is shown a process by which model event data for aggregate data packets received by instrumentation server 1699 is validated in accordance with a preferred embodiment of the present invention. The process begins at step 1770 with instrumentation server 1699 receiving an eventlist for a specific model during model commissioning. Next, as illustrated at step 1772, instrumentation server 1699 computes and stores a CRC digital signature uniquely characterized by the contents of the eventlist. Instrumentation server 1699 employs the same CRC computation function as that utilized by instrumentation load tool 464 to generate the CRC digital signature value such as CRC value 1752.

Proceeding to step 1774, instrumentation server 1699 receives an aggregate data packet structured as depicted in FIG. 17B from simulation client 1701. It should be noted that the CRC value contained with the aggregate packet received at step 1174 was previously computed and stored by instrumentation load tool 464. The process continues as depicted at step 1776, with a determination of whether or not the aggregate data packet corresponds to a model and event class that has previously been commissioned with instrumentation server 1699. If not, and as illustrated at step 1782, the packet is discarded. If, however, the aggregate data packet corresponds to a class of event for a model name commissioned on instrumentation server 1699, the process proceeds to step 1778.

Step 1778 depicts a determination of whether or not the CRC digital signature contained within aggregate data packet 1750 matches the CRC value computed and stored at step 1772. If the CRC check values match, and as illustrated at step 1780, the packet is processed. The exact nature of the processing varies with the type of packet as explained in further detail below. If the CRC check values do not match, the packet is discarded as depicted at step 1782. Following either packet processing (step 1780) or packet discard (step 1782), the process returns to step 1774 at which a next arriving aggregate data packet is received.

By calculating and storing a CRC digital signature value for each eventlist received when models are commissioned, instrumentation server 1699 can verify that each aggregate data packet received for a given model name matches the data contents of the model having that name when originally commissioned on the instrumentation server. In this manner, instrumentation server 1699 can ensure that the data received corresponds to the model (as defined by the model name) as that model was defined at the time it was commissioned.

In the context of a batch simulation farm, it is advantageous to provide a means to centrally disable instrumentation events without the need to recompile or redistribute simulation models. Such a mechanism is particularly useful for centrally disabling a faulty or undesired fail instrumentation event within a simulation model that may be simulated within any number of simulation clients within the batch simulation farm.

Faulty fail instrumentation events may result in a large number of testcases being erroneously reported as failing and subsequently being erroneously stored for analysis. Although the following description of centralized instrumentation event disablement is explained only for fail events, one skilled in the art will appreciate that similar techniques could be applied to instrumentation event types other than fail events.

Figure 18A:
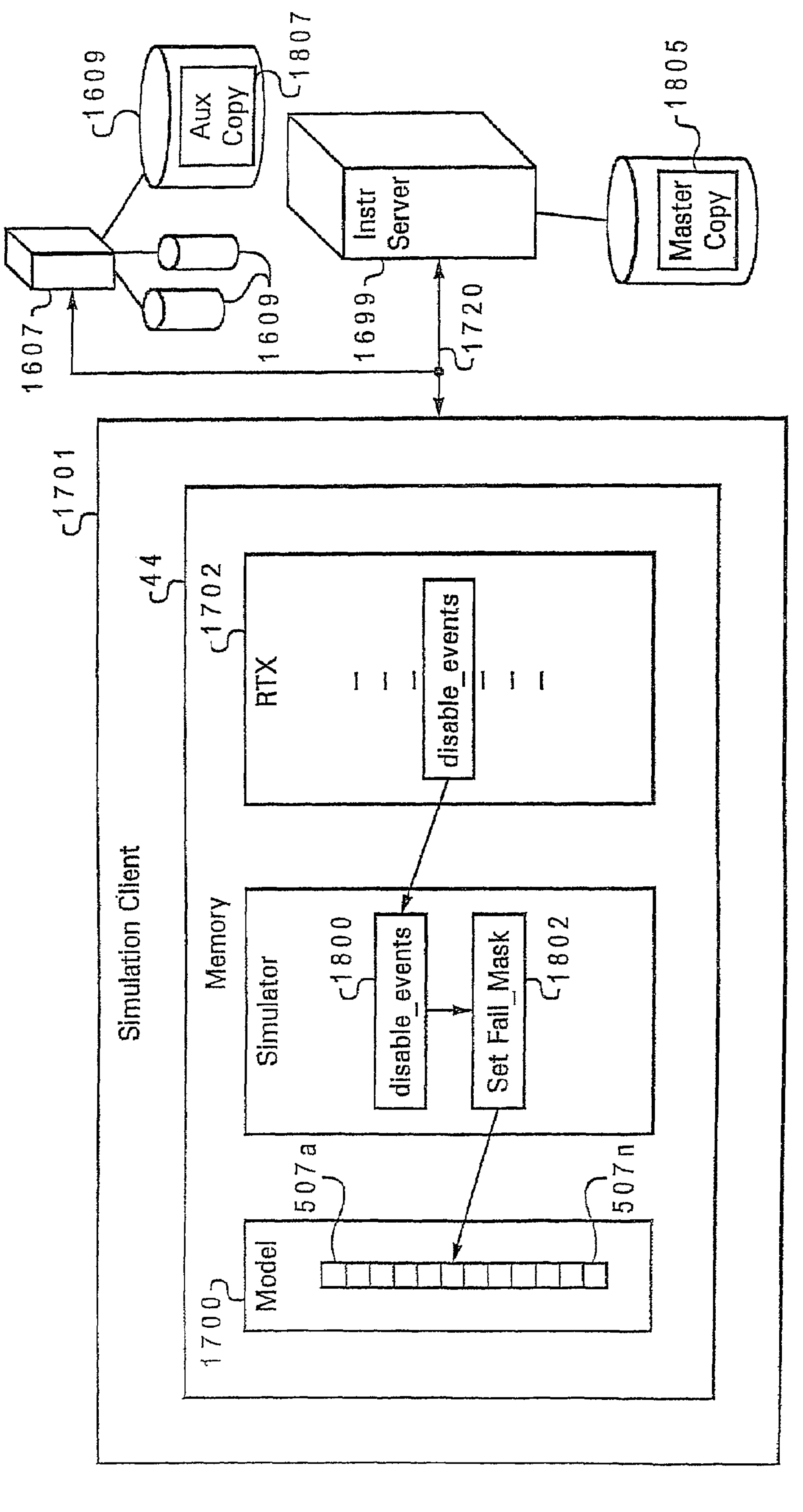
FIG. 18A illustrates memory contents of a simulation client during execution of a simulation job in accordance with a preferred embodiment of the present invention.

FIG. 18A illustrates contents of memory 44 within simulation client 1701 during execution of a simulation job. Prior to execution of the simulation job, RTX 1702, as part of step 1638 of FIG. 16C, calls API entry point 1800, disable_events( ). API entry point 1800 is a routine that communicates with instrumentation server 1699 and/or shared file system 1609 to obtain a list of events to be disabled, hereafter referred to as a "fail disable list". Separate, initially empty fail disable lists are stored for each active model within batch simulation farm 1601.

Once the fail disable list is obtained by RTX 1702, API entry point 1800 further calls API entry point 1802, set_fail_mask( ), to disable the specific failure events listed in the retrieved fail disable list. To disable, or mask, the fail events specified in the fail disable list, API entry point 1802 sets appropriate fail mask registers 507*a-n* as described with reference to FIG. 5A.

API entry point 1800 obtains the fail disable list from one of two sources. The first source is a master file 1805 stored on disk in instrumentation server 1699. The second possible source is from an auxiliary file 1807 stored in association with general purpose computer 1607 in shared file system 1609. Master file 1805 serves as the primary copy of the fail disable list. At regular intervals, instrumentation server 1699 copies the contents of master file 1805 into auxiliary file 1807, which serves as a backup copy of the fail disable list.

The two-file system depicted in FIG. 18A is used to maintain the fail disable list in a flexible and robust manner within geographically distributed simulation farm 1601. Simulation clients that obtain the fail disable list from shared file system 1609 can potentially receive a "stale" copy of the disable fail list. In practice, this may not pose a problem since master file 1805 is copied onto auxiliary file 1807 on a regular interval, and any discrepancies between master file 1805 and auxiliary file 1807 are quickly reconciled.

In one implementation, simulation clients within the same local area network as instrumentation server 1699 are configured to primarily obtain the fail disable list by direct communication with instrumentation server 1699. In response to a communication failure with instrumentation server 1699, the simulation clients would attempt to obtain the fail disable list from shared file system 1609, which may reside within or outside the requestor's local area.

A direct network connection with a geographically remote instrumentation server can potentially be more error prone and have lower performance than a local connection to a geographically local shared file system. Therefore, simulation clients that are geographically remote (i.e., not in the same local area network) with respect to instrumentation server 1699, may be configured to initially attempt to obtain the disable fail list from a local shared file system. In alternate implementations, simulation clients may be configured to obtain the fail disable list from shared file system 1609 in order to reduce network traffic to instrumentation server 1699. By having two separate sources for the fail disable list, the simulation clients can be configured to balance the traffic between instrumentation server 1699 and shared file systems 1609.

Figure 18B:
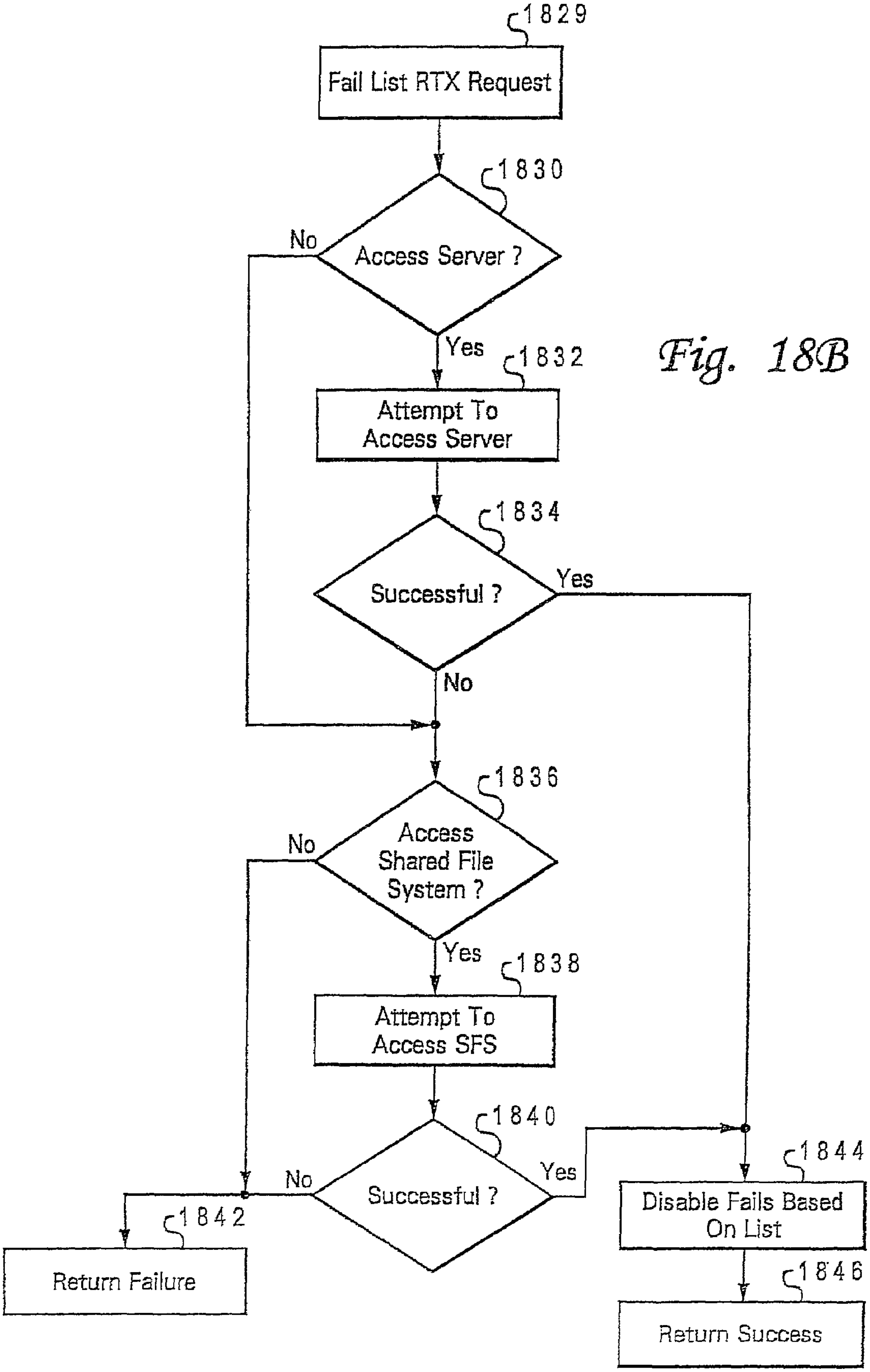
FIG. 18B is a flow diagram depicting steps performed by an API entry point in accessing a batch simulation farm instrumentation server to obtain a disable failure list in accordance with a preferred embodiment of the present invention.

Referring to the flowchart of FIG. 18B, wherein is depicted the processes performed with respect to API entry point 1800 in greater detail. As shown in FIG. 18B, the process begins with a fail list request by RTX 1702 as depicted at step 1829. In response to the RTX request, and as illustrated at step 1830, a determination is made of whether or not an attempt should be made to access instrumentation server 1699 to obtain the disable failure list. If a determination is made not to attempt to access the fail disable list from instrumentation server 1699, the process continues at step 1836, with a further determination of whether or not to access shared file system 1609. Otherwise, as illustrated at step 1832, simulation client 1701 attempts to obtain the fail disable list from instrumentation server 1699.

Proceeding to step 1834, if the attempt to access instrumentation server 1699 was successful, the fail events specified in the fail disable list are disabled via API entry points 1800 and 1802 as illustrated at step 1844. In the case of an unsuccessful attempt to access instrumentation server 1699, and as depicted at step 1836, a further determination is made of whether to attempt to access shared file system 1609 in an alternative attempt to obtain the fail disable list. As depicted at steps 1838, 1840, and 1844, the fail events specified in the fail disable list are disabled (i.e., API entry point 1800 calls API entry point 1802 to disable the designated failure events) in response to simulation client 1701 successfully accessing shared file system 1609. The failure event disablement process concludes step 1846, depicting API entry point returning a successful disablement indication to RTX 1702. If the attempt to access shared file system 1609 is unsuccessful, the process concludes with step 1842, illustrating API call 1800 returning an indication to RTX 1702 that the attempt to mask the failure events failed.

To initiate disablement of one or more fail events for a given simulation model, a user adds an entry to a fail disable list associated with the simulation model within master file 1805. Subsequently, simulation clients utilizing the fail disable list within master file 1805 will disable the fail event(s) for the particular simulation model in accordance with the process illustrated in FIG. 18B. At a pre-determined interval, the fail disable list within master file 1805 is delivered to replace the failure disable list within auxiliary file 1807, and the currently active simulation clients will disable the failure event(s) specified in the updated list for the specified model.

Within a fail disable list file, fail events are specified by entries corresponding in structure to the event identifiers for failure events with possible wildcard extensions in the various eventname fields. Such wildcard extensions permit, for example, the automatic disablement of all the replicated instances of a given failure event without having to explicitly list all the instances of the failure event. However, by utilizing entries without wildcards within the failure disable file, the failure disable list provides the ability to selectively disable specific individual failure event instances as well.

FIGS. 18A and 18B illustrate a user-initiated mechanism for centrally disabling fail events within a batch simulation farm environment. Typically, batch simulation farms run continuously and cannot be directly monitored at all times. As will be explained with reference to FIGS. 19A and 19B, the present invention provides an autonomous means of disabling failure events that does not require active user intervention.

Figure 19A:
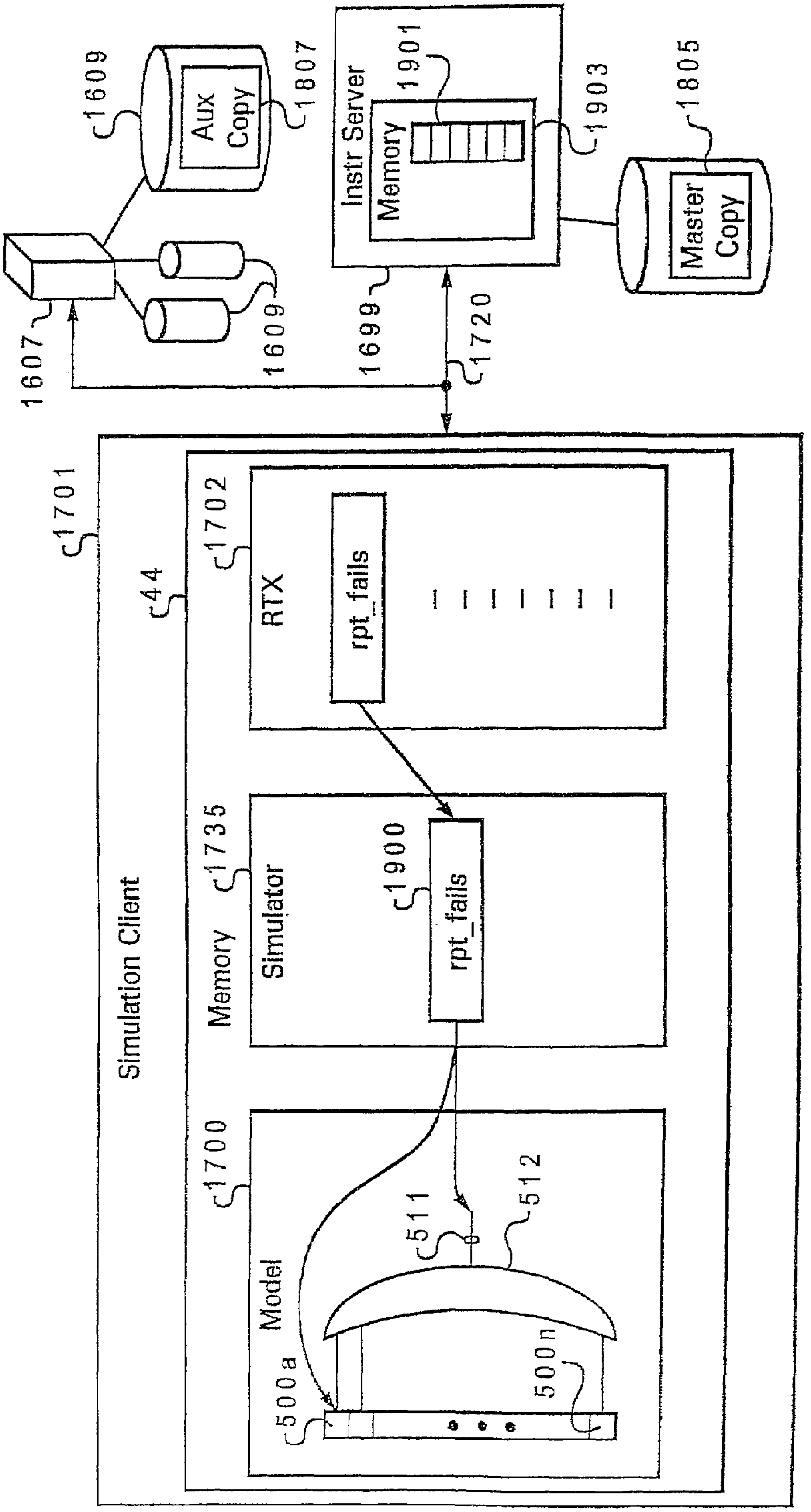
FIG. 19A is a block diagram illustrating memory contents of a simulation client at the conclusion of a simulation job in accordance with a preferred embodiment of the present invention.

With reference to FIG. 19A, there are depicted contents of memory 44 within simulation client 1701 at the conclusion of a simulation job in accordance with a preferred embodiment of the present invention. Simulation model 1700 contains fail events identified within fail event flag registers 500*a-n* as described hereinbefore in conjunction with FIG. 5A. Signal 511, driven by logical OR gate 512, indicates the occurrence of a failure event during a simulation job.

As part of step 1637 of FIG. 16C, RTX 1702 calls an API entry point 1900, report_fails( ). API entry point 1900 first examines signal 511 to determine if any of the fail events specified within flag registers 500*a-n* have occurred during a simulation run. If none of the specified failure events has occurred, API entry point 1900 terminates further action.

However, if one or more of the specified failure events have occurred during the simulation run, API entry point 1900 generates and delivers a corresponding aggregate data packet for the occurring failure events via network interface 1720 to instrumentation server 1699. The contents of registers 500*a-n* are contained, for example, in the data field of the aggregate data packet delivered to instrumentation server 1699. In this manner, instrumentation server 1699 receives information for every failure event that occurs within batch simulation farm 1601. In accordance with the depicted embodiment, instrumentation server 1699 maintains a set of counters 1901, one set per commissioned model, to monitor the rate of occurrence for individual failure events.

After verifying the correctness of the fail event aggregate data packet, in accordance with the process described above with reference to FIG. 17C, instrumentation server 1699 increments counters 1901 to record the occurrence of the failure events in model 1700. Contemporaneously with processing aggregate failure event data packets, instrumentation server 1699 decrements counters 1901 at a regular interval. In this manner, counters 1901 indicate the number of times a failure event has occurred within a given time interval rather than the total number of times a failure event has occurred. The interval at which counters 1901 are decremented is a predetermined value that can be adjusted.

Within counters 1901, only one counter is provided per specific fail event without regard to the differing instances of the specific fail event. That is to say, failure events are considered in a non-hierarchical sense as described above. Occurrences of fail events from all instances of a given fail event are added into a single counter. Each of counters 1901 therefore represents the rate at which a given failure event occurs, irrespective of which instance or instances of the failure event occur. In practice, it is preferable to consider failure events in a non-hierarchical sense, since, in general, the significance of a given failure event does not depend on where in simulation model 1700 the failure occurs.

Figure 19B:
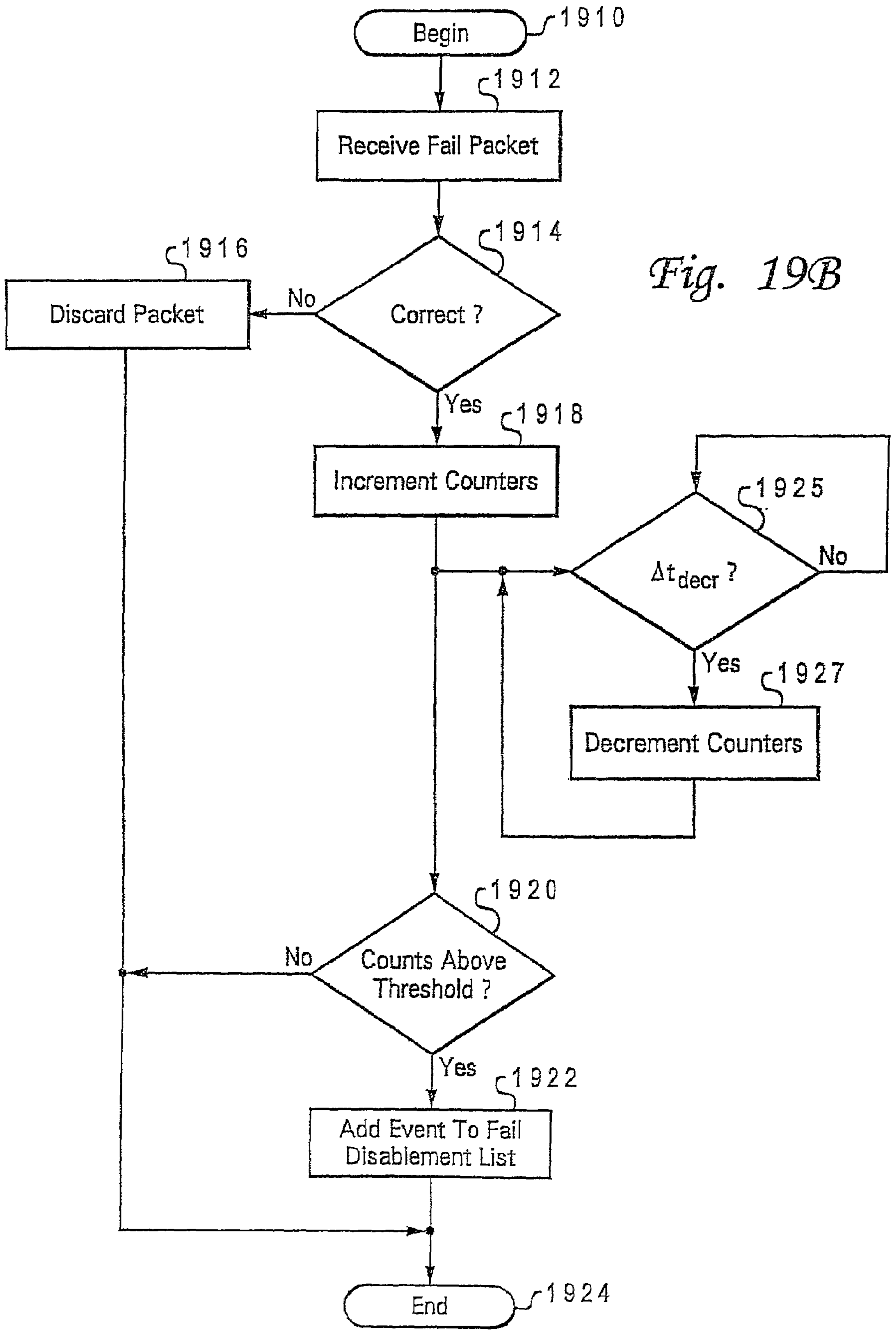
FIG. 19B is a flow diagram depicted a process by which a batch simulation farm instrumentation server processes fail event aggregate data packets in accordance with a preferred embodiment of the present invention.

Referring to FIG. 19B, there is depicted a flow diagram of a process by which instrumentation server 1699 processes fail event aggregate data packets in accordance with a preferred embodiment of the present invention. The process begins at step 1910 and proceeds to step 1912, which depicts instrumentation server 1699 receiving a fail event aggregate data packet. The process continues with step 1914, illustrating a determination of whether or not the aggregate data packet corresponds to a model commissioned within instrumentation server 1699 in accordance with the digital signature verification method explained with reference to FIGS. 17A-C. If the aggregate data packet cannot be verified, it is discarded as illustrated at step 1916.

Otherwise, if the aggregate data packet has been verified as corresponding to a commissioned model, counters 1901 are incremented in accordance with packet data content within instrumentation server 1699 as depicted at step 1918. The fail threshold process of the depicted embodiment is based on rates of occurrences of fail events rather than a cumulative evaluation. To this end, and as depicted at steps 1925 and 1927, all of counters 1901 are decremented at a predetermined time interval during processing of received aggregate fail event packets.

Following counter incrementation, and as illustrated at step 1920, a determination is made of whether or not any of counters 1901 has exceeded a predetermined threshold. Any counter having exceeded this threshold indicates that a given fail event is occurring at too frequently (i.e., at an excessive rate). Responsive to a determination that any of counters 1901 has exceeded its threshold, the process continues as illustrated at step 1922, with instrumentation server 1699 adding an entry for the excessively occurring fail event into the fail disable list within master file 1805. This entry disables all instances of the problematic failure event within simulation model 1700, and with respect to the disabled failure event, the process terminates as shown at step 1924.

If, as determined at step 1920, no counters have exceeded the threshold, the fail threshold process terminates as shown at step 1924 with respect to the packet received at step 1912. Instrumentation server 1699 repeats the steps depicted in FIG. 19B for each fail event aggregate data packet received from API entry point 1900, report_fails( ).

The process illustrated in FIG. 19B provides a means by which instrumentation server 1699 monitors the occurrence of failure events within simulation models executed on batch simulation farm 1601. When a given failure event occurs faster than a certain threshold, instrumentation server 1699 automatically disables the failure event. This process occurs without the need for user intervention.

In an environment such as batch simulation farm 1601, it is common for a given design entity to be utilized in a number of different models of varying complexity and size. A given design entity may appear in different models ranging in complexity from a model containing a subset of the integrated circuit in which the entity resides to a model containing an entire system with potentially multiple instances of the physical chip in which the design entity resides. Furthermore, there may be several versions of each of these different models active within batch simulation farm 1601 at any given time.

In such an environment, it advantageous to provide a means that allows an HDL circuit designer to access count event data for a given design entity without requiring specific knowledge of which active models in the batch simulation farm contain that design entity. In practice, designers are generally not aware of the specifics of the models active in a batch simulation farm at any given time.

In addition, once a designer registers a request for count event data, it is useful if this request can be repeated without user intervention at specified intervals, and that the counter data are returned automatically to the designer's workstation for on-going evaluation. In the following description, a request (from an HDL designer, for example) for counter data submitted within a batch simulation farm environment will be referred to as a "counter query". Counter queries are delivered from one of general-purpose computers 1600 to instrumentation server 1699 for storage and processing. In accordance with the embodiments described herein, a separate list of counter queries is maintained for each individual user.

Figure 20A:
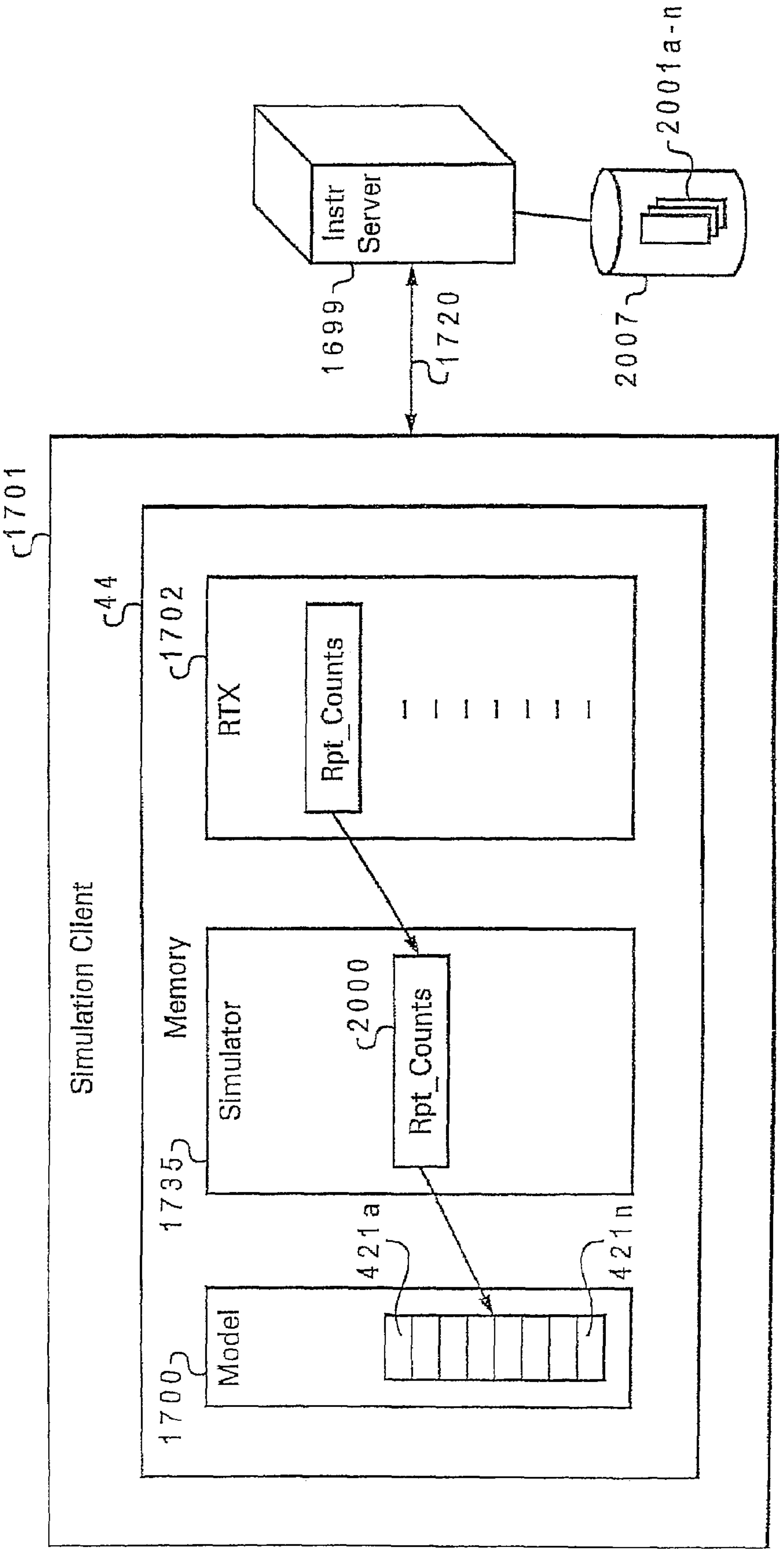
FIG. 20A is a block diagram illustrating the active memory content of a simulation client during simulation model testing in which count event data delivered to an instrumentation server within a batch simulation farm environment in accordance with a preferred embodiment of the present invention.

With reference to FIG. 20A, there is depicted the contents of memory 44 at the conclusion of a simulation processing job performed with respect to simulation model 1700 within simulation client 1701. Simulation model 1700 contains count event registers 421*a*-421*n* as described hereinbefore with reference to FIG. 4B. Each of count event registers 421*a*-421*n* maintains a count representing the number of times a particular instrumentation count event has occurred during the simulation of simulation model 1700.

As part of step 1637 of FIG. 16C, RTX 1702 calls an API entry point rpt_counts( ) 2000. API entry point 2000 generates and delivers an aggregate data packet containing the results registered in count event registers 421*a*-421*n* to instrumentation server 1699 via network 1720. Upon receipt of the aggregate count event data packet, instrumentation server 1699 confirms that the packet information corresponds to a commissioned simulation model utilizing a CRC digital signature as described with reference to FIGS. 17A-17C. If the aggregate data packet corresponds to a commissioned model, instrumentation server 1699 stores the count data within the aggregate count event packet in a set of count data storage files 2001*a*-2001*n*.

Figure 20B:
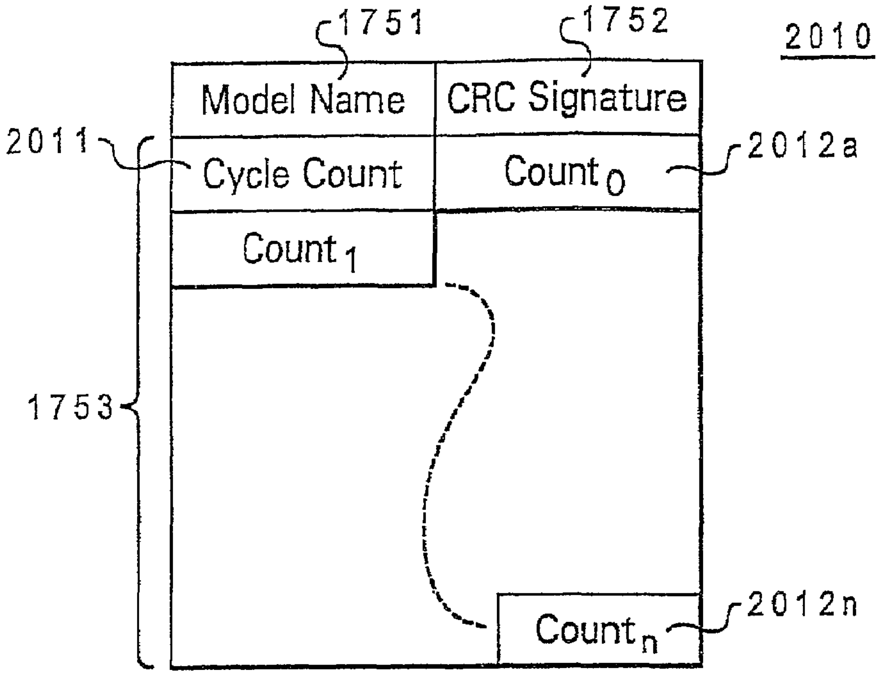
FIG. 20B depicts an aggregate count event packet delivered by an API entry point routine to an instrumentation server in accordance with a preferred embodiment of the present invention.

FIG. 20B depicts an exemplary aggregate count event packet 2010 in accordance with a preferred embodiment of the present invention. Similar to aggregate data packet 1750 of FIG. 17B, aggregate count event packet 2010, includes model name field 1751, CRC digital signature field 1752, and data field 1753. Within data field 1753, a cycle count field 2011 contains a count value representing the number of cycles executed during the simulation run from which aggregate count event packet 2010 was generated. A set of count value fields 2012*a-n* contain the count values for each of the count events instantiated within simulation model 1700 in the order set forth by the count eventlist file created at model build time.

Within instrumentation server 1699 depicted in FIG. 20A, the count event data contained in the count value fields for one or more aggregate count event packets is stored in count data storage files 2001*a-n*. Each of count data storage files 2001*a-n* therefore contains all recorded counts for a given predetermined time interval (typically a day) for a specified simulation model. When instrumentation server 1699 receives and confirms the commissioned status of aggregate count event packet 2010, one of count data storage files 2001*a-n* is either created or updated as necessary to store the contents of the received aggregate count event packet 2010.

Figure 20C:
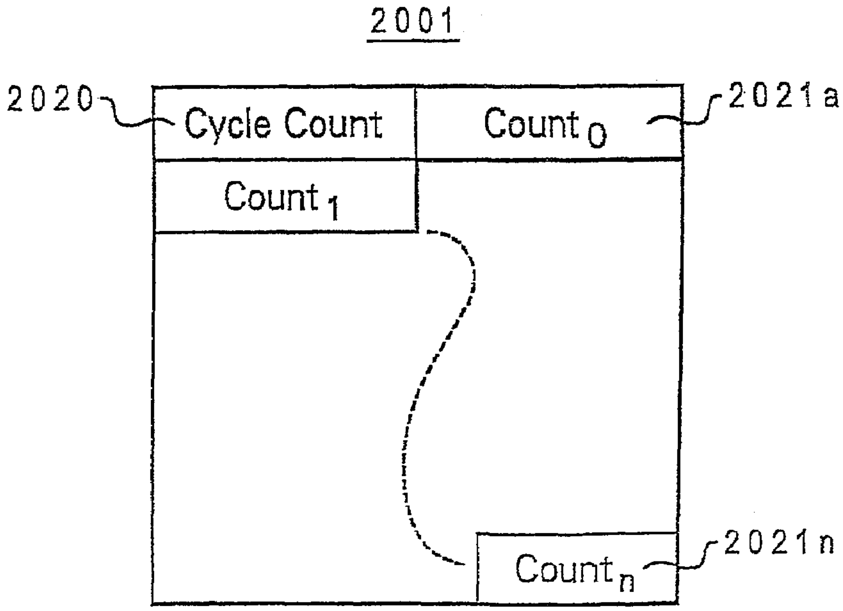
FIG. 20C illustrates a count storage file maintained within a batch simulation farm instrumentation server in accordance with a preferred embodiment of the present invention.

Referring to FIG. 20C there is illustrated the contents of an exemplary count data storage file 2001 among count data storage files 2001*a-n*. Within count data storage file 2001, a cumulative cycle count field 2020 represents the cumulative number of cycles simulated during every simulation run for which count data is added into count data storage file 2001 over the aforementioned predetermined time interval. A set of cumulative count fields 2021*a*-2021*n* contain the cumulative number of occurrences of each corresponding count event included within count value fields 2012*a*-2012*n* for each aggregate count event packet received by instrumentation server 1699. In summary, when aggregate count event packet 2010 is received and verified by instrumentation server 1699, cycle count field 2011 is added to cumulative cycle count field 2020 and likewise, count value fields 2012*a*-2012*n* are added to corresponding cumulative count value fields 2021*a*-2021*n*. Count data storage file 2001 therefore contains a cumulative total of the number of cycles executed on the given simulation model and the number of times each count event has occurred over a pre-designated time interval which in the depicted embodiment is a day.

Figure 20D:
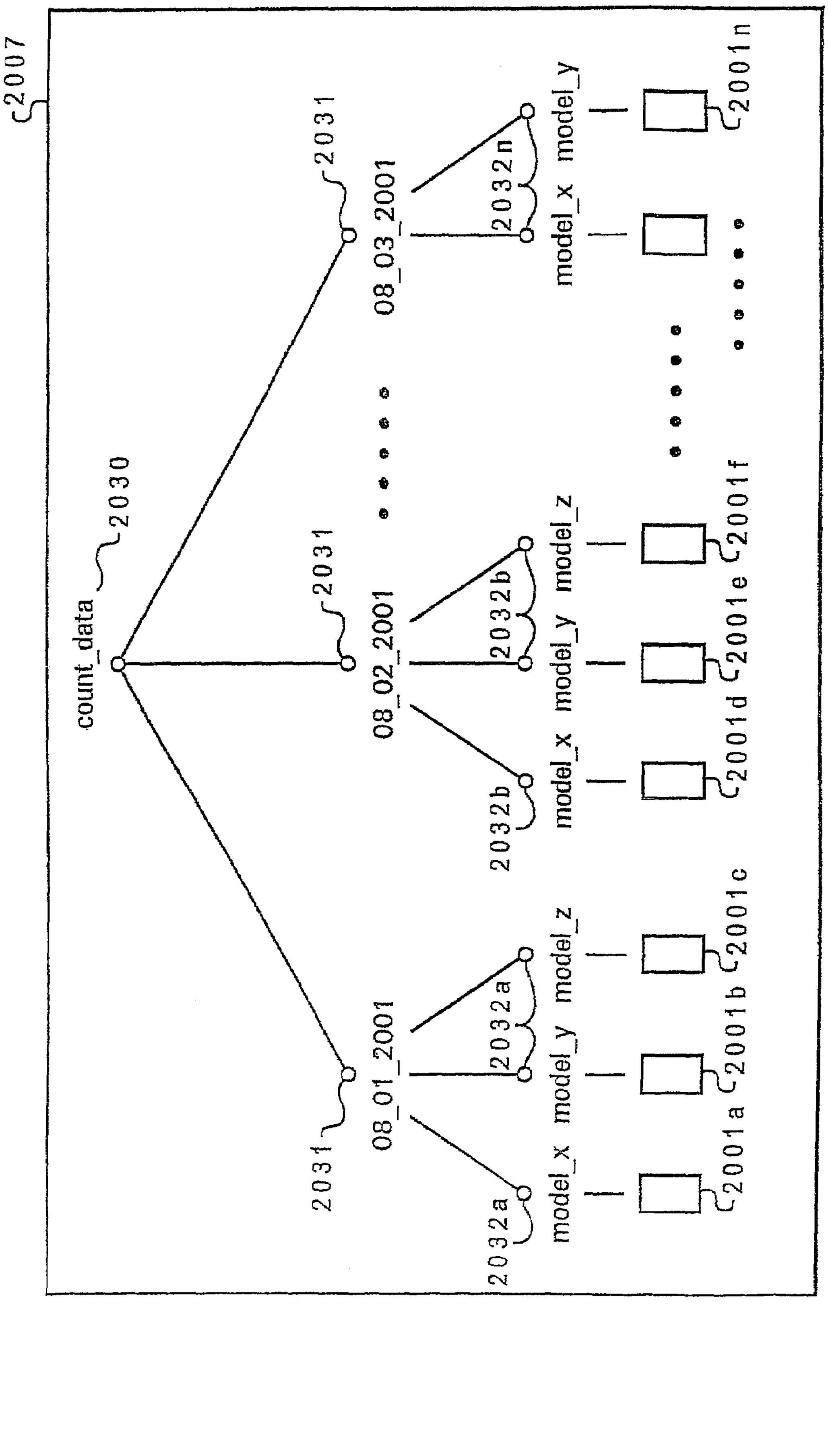
FIG. 20D depicts a counter directory/subdirectory structure maintained within a batch simulation farm instrumentation server in accordance with a preferred embodiment of the present invention.

FIG. 20D illustrates a directory structure implemented within instrumentation server 1699 for storing count data storage files 2001*a*-2001*n*. All count data is stored under a counter storage directory 2030 on a disk storage unit 2007 within instrumentation server 1699. As depicted in FIG. 20D, counter storage directory 2030 is further divided into a two-tier subdirectory structure.

A first tier of subdirectories 2031 is utilized to associate count data contained within a received aggregate count event packet with a particular time period (e.g. a specific date) in accordance with a pre-designated time increment. In the embodiment depicted in FIG. 20D, this pre-designated time increment is a day (i.e., one 24-hour period). Each of subdirectories 2031 therefore contains the count data for all simulation models received on a particular date. Each of subdirectories 2031 is named in a fixed manner that is derived from the date on which the subdirectory was created. In association with each of subdirectories 2031, a second tier of subdirectories 2032 is utilized to divide the count data received by instrumentation server 1699 on a given day into directories indexed on a per-model basis. Therefore, each of subdirectories 2032 includes all count data collected for a particular simulation model on a particular date. As shown in FIG. 20D, each of subdirectories 2032 is named in a fixed manner that is derived from the model name of the given model.

As further illustrated in FIG. 20D, each of subdirectories 2032 contains a corresponding one of count data storage files 2001*a*-2001*n*, containing the count data for a specified simulation model collected on a given date. The directory/subdirectory structure contained within disk storage unit 2007 provides an efficient directory path for locating count event data for any given simulation model generated on a particular date. For example, sorting count data first by day and then by simulation model, simplifies removal of stale data from instrumentation server 1699. Data for all active simulations models that is obtained during an expired past time interval can be removed simply by removing the appropriate subdirectory 2031 and its contents.

As a further improvement in processing counter queries, and in accordance with an important feature of the present invention, instrumentation server 1699 generates and maintains a "count event entity translation table" that is indexed on a per-design-entity basis such that all design entities contained within simulation models for which aggregate count event data has been received are listed, and are furthermore associated with a list of all of the simulation models in which they are instantiated.

To allow for the construction of the entity translation table within instrumentation server 1699, instrumentation load tool 464 is further augmented to produce an "entitylist file" as a part of the model build process for each simulation model. The entity list file lists every design entity within a given model in which instrumentation count events are instantiated. Similar to the processing of event list files, entity list files are commissioned within instrumentation server 1699 as a part of step 1655 of FIG. 16B. Upon receiving an entity list file, instrumentation server 1699, adds the simulation model and design entity identification contents of the entitylist file to the entity translation table.

Figure 20E:
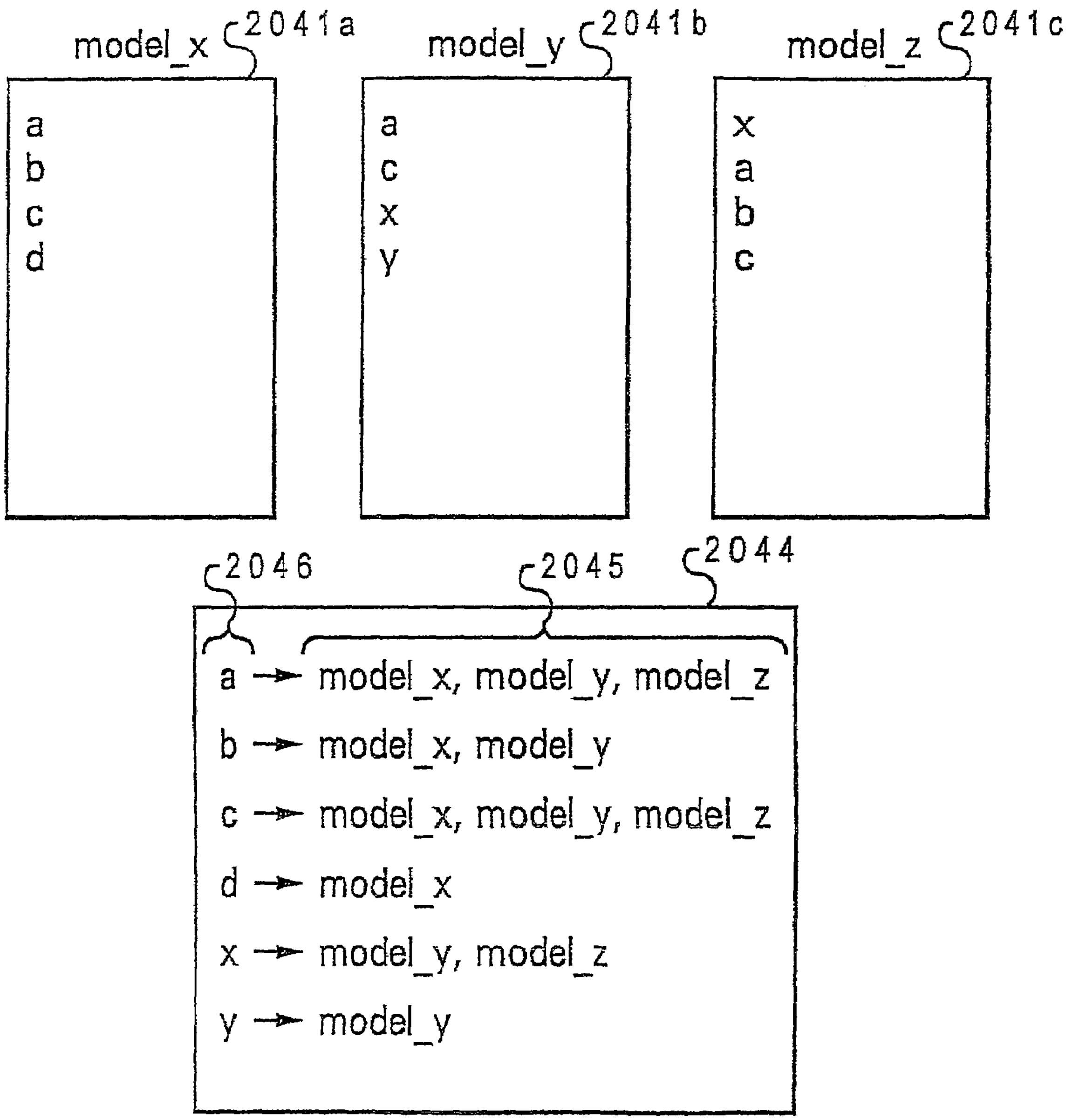
FIG. 20E illustrates a count event entity translation table derived from multiple entity list files in accordance with a preferred embodiment of the present invention.

FIG. 20E illustrates a set of exemplary entity list files 2041*a*-2041*c* that are incorporated within a count event entity translation table 2044 in accordance with a preferred embodiment of the present invention. Each of the entity list files 2041*a*-2041*c* includes a list of design entity identifiers corresponding to every design entity within a respective simulation model (models X, Y, and Z) that include instantiated instrumentation count events.

Count event entity translation table 2044 maintains an index list 2046 of the design entities (a, b, c, d, x, and y) having instantiated instrumentation count events and that are included within simulation models, including models X, Y, and Z, which have been commissioned on instrumentation server 1699. A model list 2045 includes entries corresponding to each design entity index within index list 2046 denoting those simulation models that contain the design entity designated by the design entity index entry. The steps necessary to generate count event entity translation table 2044 from entitylist files 2041*a*-2041*c* are readily conceivable by one skilled in the art and are therefore not described herein. When a simulation model is decommissioned (i.e., records and data removed from instrumentation server 1699), its corresponding entries within model list 2045 are removed (potentially including removal of a design entity index when the last model containing that design entity is removed) from count event entity translation table 2044. Instrumentation server 1699, utilizes count event entity translation table 2044 to ascertain which subset of count data storage files 2001*a*-2001*n* must be searched in response to a user count query for a given design entity or entities.

Figure 20F:
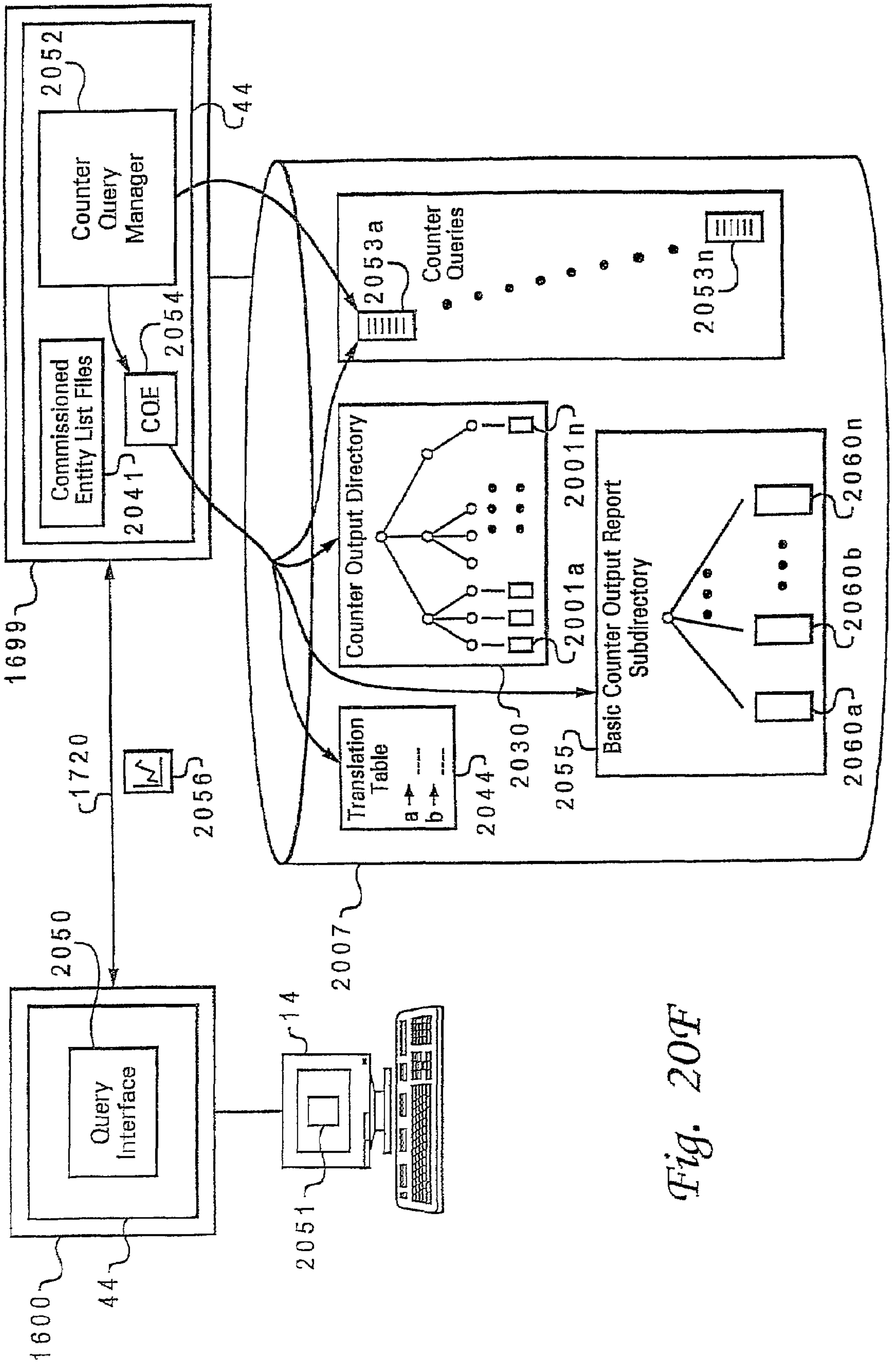
FIG. 20F depicts a system applicable within a batch simulation farm for storing and accessing count event data in accordance with a preferred embodiment of the present invention.

Elements within instrumentation server 1699 utilized for storing, managing, and executing user counter queries as depicted in FIG. 20F. To create, delete, or modify counter queries, a user executes a counter query interface program 2050 on general-purpose computer 1600. Counter query interface program 2050 utilizes a graphical user interface (GUI) 2051 on display 14 to allow the user to display, create, remove, or edit counter queries delivered to and stored within instrumentation server 1699. A set of such counter queries 2053*a*-2053*n* is stored on disk storage device 2007 within instrumentation server 1699. Each of counter queries 2053*a*-2053*n* is stored in a separate file and contains information, described below with reference to FIG. 20H, denoting the time at which the query is to be executed, the count data being requested, and the means by which to return the counter query data to the user.

A counter query manager program 2052, residing within memory 44 of instrumentation server 1699, executes counter queries 2053*a*-2053*n* and also returns the final output count data to the user. At regular intervals, counter query manager 2052 examines counter queries 2053*a*-2053*n* to determine which of these queries should be run at any given interval. A determination to run a particular counter query is made by examining information within the query itself, which indicates a time at which the query is to execute within instrumentation server 1699.

Upon determining that a specific query among counter queries 2053*a*-2053*n* is to be executed, counter query manager 2052 spawns an instance of a counter query engine (CQE) program 2054 to process the query. Counter query manager 2052 can spawn multiple instances of counter query engine program 2054 simultaneously if multiple counter queries are to be executed over the same interval.

Counter query engine program 2054 utilizes information within the counter query and count event entity translation table 2044 in order to search appropriate count data storage files 2001*a*-2001*n* for the counter information specified in counter query 2053. At the end of this search, counter query program 2054 produces a query report hereinafter called a "basic counter output report".

Figure 20G:
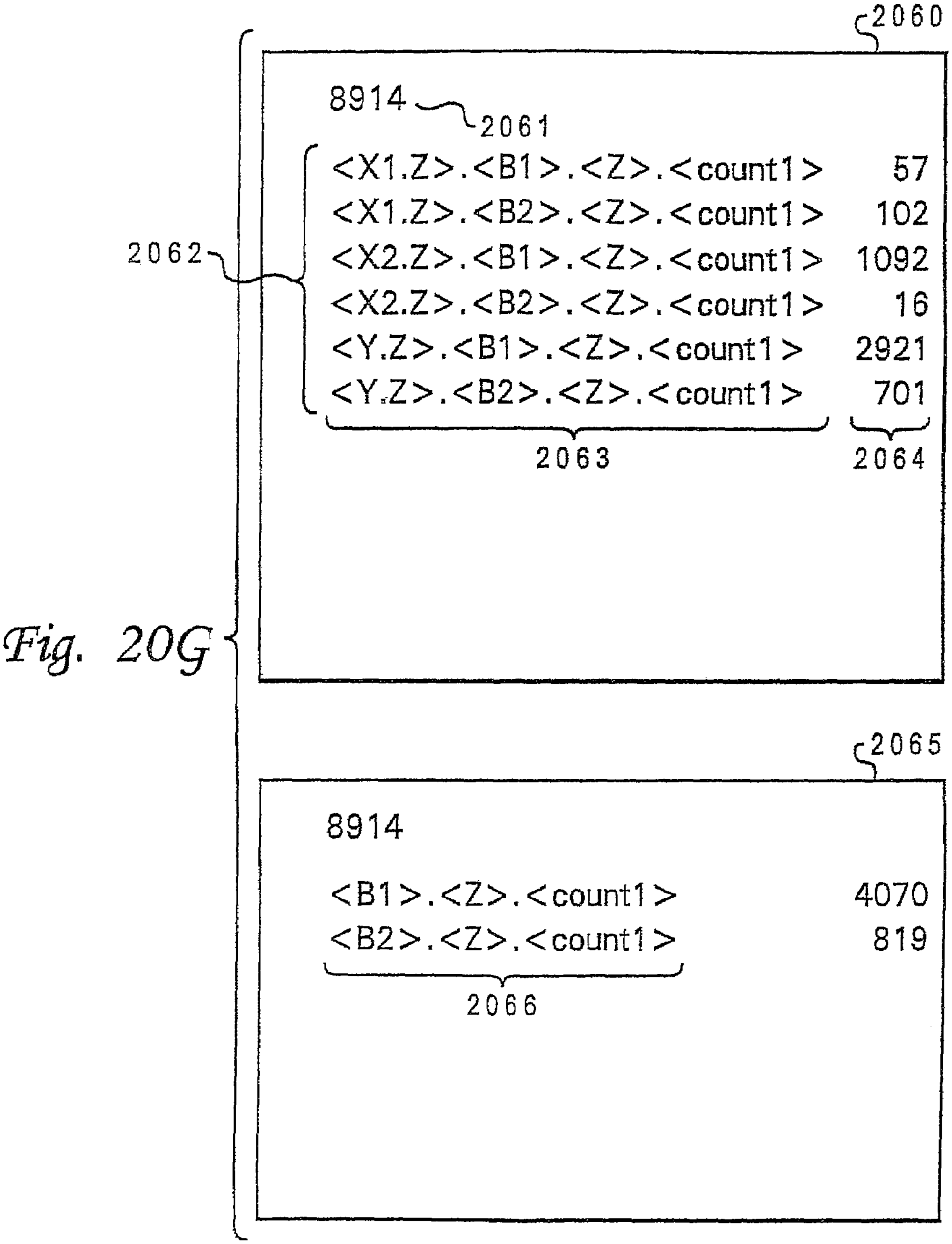
FIG. 20G illustrates a hierarchical and a non-hierarchical basic counter output report in accordance with the teachings of the present invention.

Referring to FIG. 20G, there is illustrated an exemplary basic counter output report 2060. Within basic counter output report 2060, a first integer field 2061 denotes the number of simulator cycles accumulated during simulation runs on simulation models containing the count events for which a count has been requested in the counter query. The value stored within first integer field 2061 is derived by summing count fields 2020 (FIG. 20C) for each of the counter data storage files 2001*a*-2001*n* that contain the count events identified in the counter query. Basic counter output report 2060 further contains a report list 2062 including entries for each count event specified in the counter query. Entries within list 2062 consist of count event identifier fields 2063 and integer fields 2064 which denote the number of occurrences of a corresponding count event in accordance with information obtained from counter data storage files 2001*a-n*.

Counter queries can specify either a hierarchical or non-hierarchical query. In a hierarchical query, each replicated instance of any given count event is queried independently. As such, the basic counter query report lists individual entries within list 2062 for each replicated instance of a given count event. In such a circumstance, each of count event identifier fields 2063 corresponds to the extended event identifier described earlier in conjunction with FIG. 10B. Exemplary basic counter output report 2060 represents a hierarchical report for event "count1" within design entity "Z" within simulation model 1000 described earlier with reference to FIG. 10A.

Counter queries may alternatively be non-hierarchical, wherein all replicated instances of a given count event are grouped as a single event for reporting purposes. The counts for the individual instances of the count event are summed to form an overall count of the number of times the individual count event occurred in all instances.

FIG. 20G further illustrates a basic counter output report 2065 that results from a non-hierarchical counter query. Non-hierarchical basic counter output report 2065 includes an event identifier 2066 corresponding to the event identifier for the count events with the instance identifier field removed. Since the various instances of a given count event are combined into a single reported event, the instance identifier has no meaning and is not included in the non-hierarchical report.

Returning to FIG. 20F, after being produced by counter query engine 2054, a set of basic counter output reports 2060*a*-2060*n* is stored within instrumentation server 1699 in a subdirectory 2055. Each report within subdirectory 2055 is named such that the date on which it was created and the particular user counter query which created the report can be determined. Basic counter output reports are stored by instrumentation server 1699 to enable on-going analysis of longer term trends of the counter data as described below.

Counter query engine 2054 may optionally be utilized for post-processing of basic counter output report 2060 in order to produce a graphical representation of the counter data such as a line plot, histogram or other such representation as a final counter query report 2056. Each of counter queries 2053*a*-2053*n* specifies what, if any, additional post-processing to apply to basic counter report 2060 to create final counter query report 2056.

Final counter query report 2056 is returned to the user at general-purpose 1600 over network interface 1720 by one of a number of means that could include e-mail attachments, a specific file transfer protocol between instrumentation server 1699 and general-purpose computer 1600, or copying the file to a shared file system among others. Each of counter queries 2053*a*-2053*n* specifies which mechanism(s) to use in returning the data to the user (it is possible to utilize multiple methods to deliver multiple copies of final counter query report 2056).

Figure 20H:
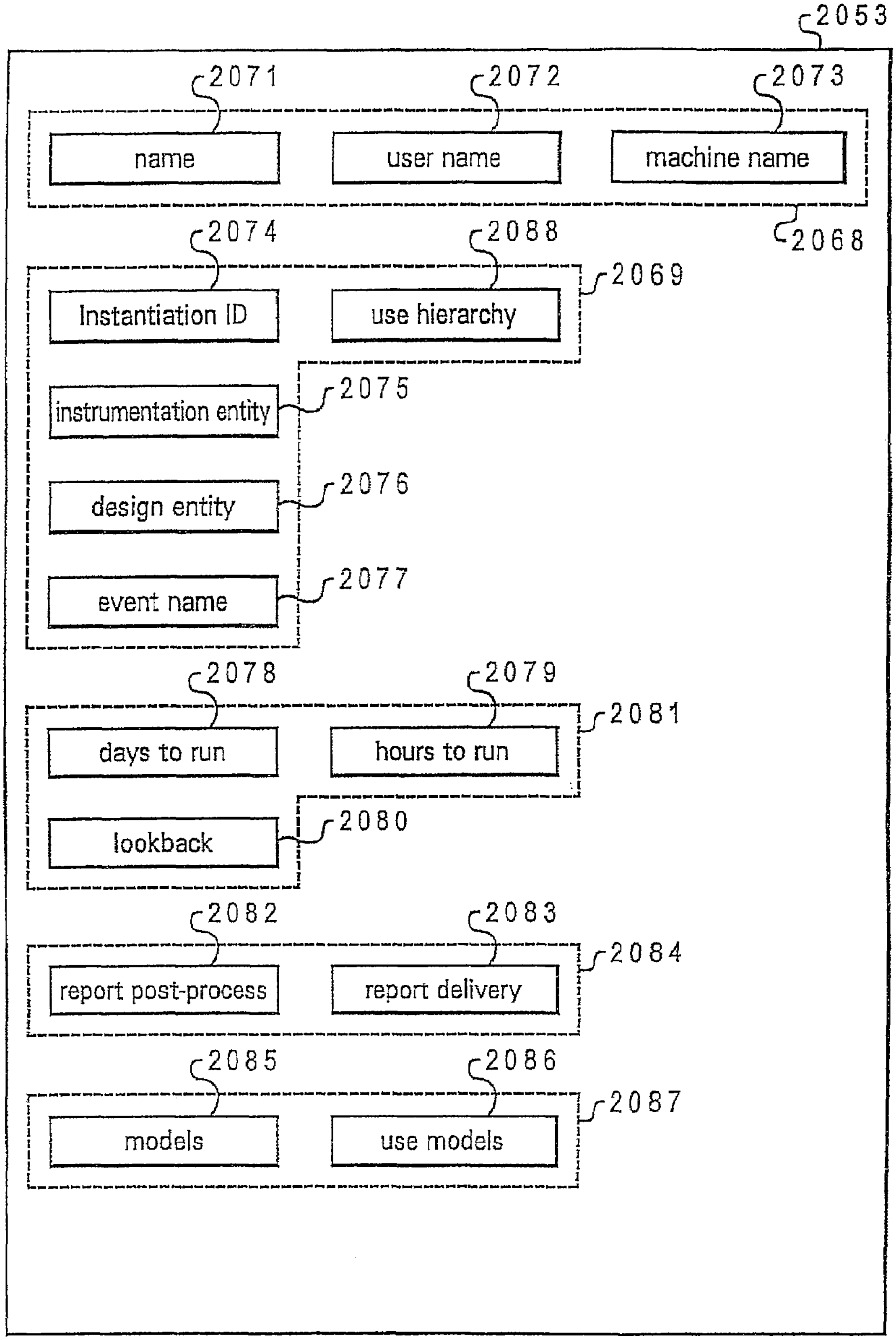
FIG. 20H depicts a user-modifiable counter query data structure applicable to the counter storage and access system shown in FIG. 20F.

With reference to FIG. 20H, there is depicted a representation of the query fields within an exemplary counter query 2053. For illustrative purposes, the fields within counter query 2053 are divided into five field groups 2068, 2069, 2081, 2084, and 2087. Field group 2068 provides general information regarding the identity of the query and the identity of the user that initiated it. Within field group 2068, a field 2071 contains the name of the query. Query name field 2071 provides a useful mechanism for referring to and specifying user counter queries. Also within field group 2068, a username field 2072 contains the username identity of the user that initiated the query and field 2073 contains the name of the user machine from which the query was initiated. This information is utilized to allow counter query engine 2054 to return finished counter report 2056 to the user.

Field group 2069 generally specifies the identity of the count events to be queried in accordance with the remaining fields within counter query 2053. Fields 2074, 2075, 2076, and 2077 correspond to the instantiation, instrumentation entity, design entity, and eventname fields in the count event extended identifiers as described hereinbefore with reference to FIG. 10B. These fields, which can contain wildcard entries, are utilized to specify which instrumentation count events within a simulation model are being requested. These fields are matched by counter query engine 2054 against the count event eventlist files stored on instrumentation server 1699 to locate the desired count events within the simulation models searched during the query.

Field 2088 is an enable field (i.e., a flag) that determines whether counter query 2053 is hierarchical or non-hierarchical. If the user decides to perform a hierarchical query, instantiation identifier field 2074 is used to locate count events during the query. If, however, the query is non-hierarchical as specified by field 2088, field 2074 is ignored in searching for count events. The extended event identifier for different instances of a given count event differ only in their instantiation identifier fields (field 1030 in FIG. 10B). By ignoring the instantiation identifier field when searching for count events, differing instances of a given count event will appear as the same count event and be merged in reporting.

Field group 2081 generally specifies the times at which to run the query and how far back in time the query should span. In a preferred embodiment, instrumentation server 1699 allows user counter queries to specify days of the week a query is to run and also to specify a particular set of hours on those days the query is run. A day field 2078 is a set of seven flags specifying which days of a week a query is to run, while an hours field 2079 is a set of 24 flags indicating the hours on those days a query is to run. Field group 2081 further includes a lookback field 2080 that specifies the how far back in time a query is to examine data. When a query is run, it searches stored counter data for the day it is run and for a number of preceding days. The number of preceding days to search is specified by field 2080.

Field group 2084 generally specifies what, if any, report post processing is to be performed and the report delivery mechanism. A report post-process field 2082 specifies the report processing, if any to apply to produce final counter report 2056. A report delivery field 2083 specifies which delivery mechanism(s) to utilize in returning the finished counter report to the user.

Field group 2087 generally specifies an optional restriction that limits the search of the counter data to specific models. This feature is useful to simulation teams that generally, in contrast to designers, prefer to query counter data with respect to a specific model or models, rather than querying count data at the design entity level. A simulation model search enable field 2086 holds a flag indicating whether or not counter data searches are to be limited to specific models or not. Field group 2087 also includes a models field 2085, which may contain wildcard expressions, specifying which models the search will be conducted with respect to.

Figure 20I:
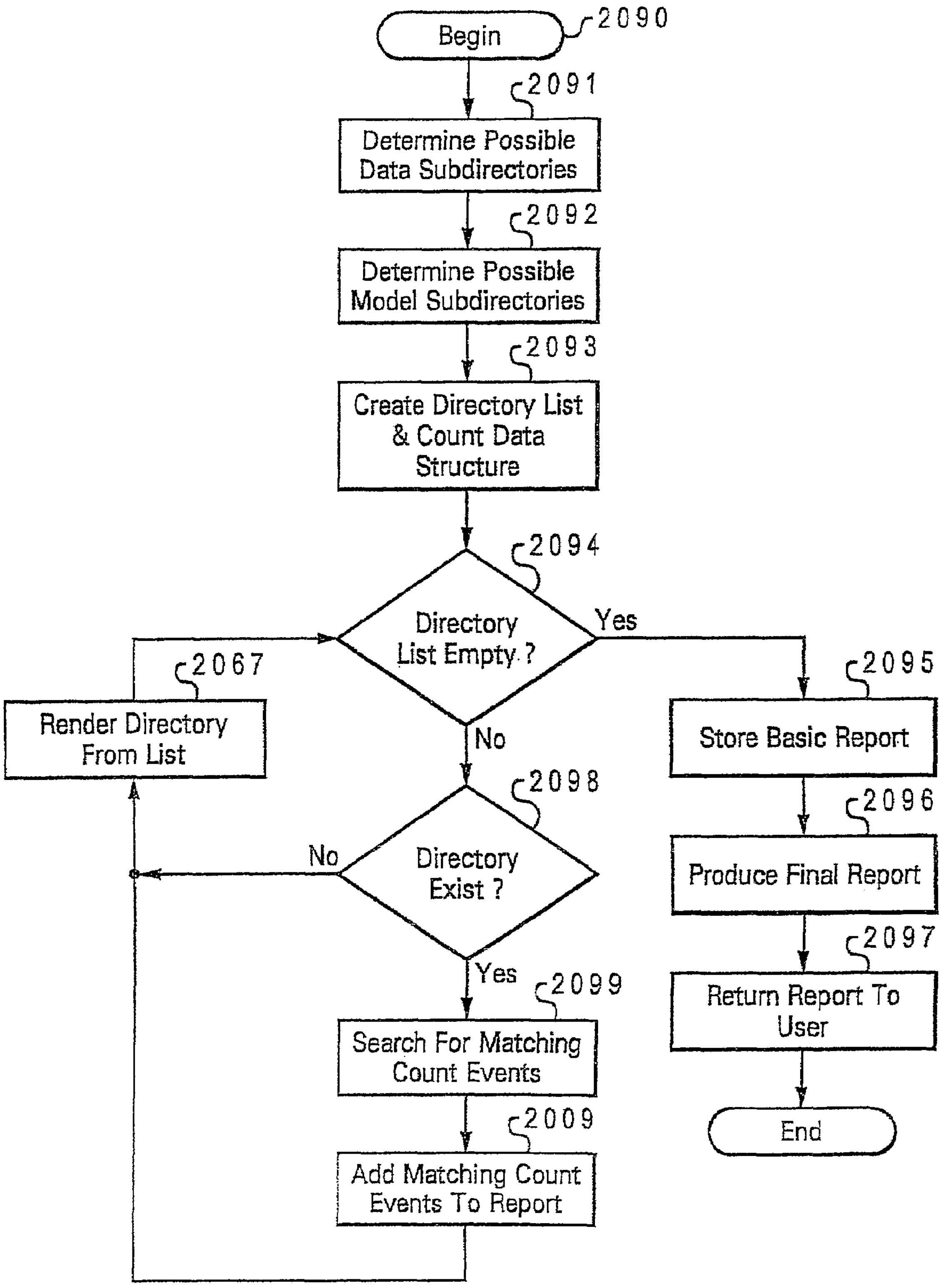
FIG. 20I is a flow diagram illustrating steps performed by a counter query engine program to produce a basic counter output report from a user query in accordance with a preferred embodiment of the present invention.

Referring to FIG. 20I in conjunction with FIG. 20H, there is shown a flowchart of the process by which counter query engine 2054 produces basic counter output report 2060 from user query 2053. The process begins at step 2090 corresponding to counter query manager 2052 determining that query 2053 is ready to be run and spawning counter query engine 2054 to process the query.

The process continues with step 2091 depicting a determination of the possible date subdirectories 2031 (FIG. 20D) that may need to be searched. To determine these directories, counter query engine 2054 examines and compares the current date with the content of lookback field 2080 in counter query 2053. Using this information and standard date processing techniques well known to those skilled in the art, counter query engine 2054 produces a list of directory names corresponding to the current date and the number of days before the current date specified by lookback field 2080. These directory names correspond to date subdirectories 2031 that must be searched in accordance with counter query 2053.

Proceeding to step 2092, a determination is made of the model subdirectories among subdirectories 2032*a*-2032*n* within date directories 2031 that are to be searched. Counter query engine 2054 creates a list of possible model directories by matching design entity field 2076 against index list 2046 of entity list translation table 2044 (FIG. 20E) and creating a directory list data structure (not depicted), removing duplications, of those models that correspond to matching design entities. This list represents the set of active models on instrumentation server 1699 that contain the design entity or entities specified by design entity field 2076. In this manner, counter query engine 2054 creates a list of simulation models within the directory list data structure that are to be searched based solely on the design entity name without user intervention. The designer need not know which active models on instrumentation server 1699 contain the desired design entity or entities.

If simulation model search enable field 2086 of user query 2053 is asserted (i.e., search only with respect to designated models), the list of model subdirectories is further matched against models field 2085. Those model subdirectories that do not match the content of model field 2085 are removed from the list generated in response to step 2092. In this manner, the counter query is further restricted to the specific set of model names specified by field 2085.

Next, as illustrated at step 2093, data structures necessary to process counter query 2053 are generated. The first data structure created is a list of directory paths relative to counter storage directory 2030 (FIG. 20F) that will be searched. These directory paths are created by forming all possible combinations of the directory names obtained in steps 2091 and 2092. It should be noted that some of the directory paths generated in this manner might not actually exist within counter storage directory 2030. The process that generates the directory paths generates all the paths that need to be searched whether or not count event data has actually been received and stored for those models or days.

It is also possible that no directory paths match the criteria specified by query 2053. In such a circumstance, an empty directory list data structure is generated. The second data structure generated is a basic count report data structure which is utilized to hold count events and count values found during processing. The basic count report data structure is initially empty.

The process continues at step 2094 with a determination of whether or not the directory list data structure is empty. If the directory list data structure is currently empty, the process continues at steps 2095-2097 where the results of the counter query are reported to the user and stored. In such a circumstance, an empty report is generated because no counter data matches the criteria specified in counter query 2053.

If the directory list data structure is not empty, and as illustrated at step 2098, a determination is made of whether or not the current directory in the directory list data structure exists within counter storage directory 2030. If the directory does not exist, the process continues as depicted at step 2067 with the removal of the current directory from the directory list data structure generated at step 2092. Processing then returns to step 2094 wherein subsequent directories in the directory list data structure are processing accordingly.

If, as determined at step 2098, the subdirectory exists among subdirectories 2032*a*-2032*n*, query processing continues as depicted at step 2099 with a search of the simulation model for count events corresponding to those specified by counter query 2053. To locate count events corresponding to counter query 2053, counter query engine 2054 matches fields 2074, 2075, 2076, and 2077 against the extended event identifiers in the count eventlist file for the simulation model whose data is stored in the identified one of subdirectories 2032*a*-2032*n*. The names and indices of matching count events are determined to allow for subsequent retrieval of the counter value from a corresponding one of counter data storage files 2001*a*-2001*n*.

Proceeding to step 2009, matching count events are used to update the basic count report data structure. If a matching count event discovered in step 2099 is not present in the basic count data structure, the count event is added to basic count data structure using the count value found in the corresponding one of count data storage files 2001*a*-2001*n*. Otherwise, the count value found in count data storage file 2001 is added to the count event entry already present in the basic count report data structure. This produces a cumulative total for the number of times the count event has occurred in the simulation models specified by counter query 2053.

The counter query process continues at steps 2067 and 2094 wherein the directory is removed from the directory list data structure and a determination is made whether or not any further subdirectories remain to be searched. If no unsearched subdirectories remain, the process continues at step 2095, which depicts storing the basic counter report in directory 2055 on instrumentation server 1699 as previously described.

Next, as illustrated at step 2096, final counter report 2056 is generated utilizing the post-processing mechanism selected by field 2082 of counter query 2053. The process is completed as depicted at step 2097 with final counter report 2056 being delivered to the user by the means selected by field 2083 of counter query 2053.

The mechanisms described above provide a means of creating, managing and executing counter queries that allows a designer to access counter data without specific knowledge of which hardware simulation models within batch simulation farm 1601 contain the desired design entity or entities. Furthermore, by accessing and storing count data by a parameter known to the designers, namely the design entities containing the count event, the above described mechanisms provide a simple interface to access count data based solely on items known to designers as part of the creation of count events. In addition, the means described above provides for counter queries to be repeated and count data to be returned at regular intervals without specific intervention from designers. In this manner, designers can provide on-going evaluation of count data without the burden of specific intervention to maintain the execution of queries.

In addition to obtaining design entity centric counter results, it would further be advantageous to provide a means of determining trends in counter instrumentation data within a batch simulation farm environment. In particular, it would be useful to determine differences in rates of occurrence of count events, scaling appropriately for the number of simulation cycles executed, as simulation of one or more simulation models, including instantiated instances of the count events, progresses over time.

To this end, and in accordance with an important feature of the present invention, instrumentation server 1699 implements a reporting mechanism that compares independently collected sets of count event data for count events specified by a given user query and produces a report showing differences with respect to a predetermined threshold level, among the independently collected sets. This reporting mechanism will hereinafter be referred to as a "count difference analyzer".

As implemented in accordance with the embodiments depicted herein, the count difference analyzer accepts as processing inputs either two basic counter output reports, similar in structure to basic counter output report 2060, or two count data storage files among count data storage files 2001*a*-2001*n*, and returns a count difference report. By comparing basic counter output reports, the count difference analyzer of the present invention determines changes in count results for instrumentation count events present within the basic counter reports. The count difference analyzer described herein is particularly useful to circuit designers to monitor instrumentation count event trends for count events specified within a particular design entity or simulation model.

When performing relative comparisons between count data within count data storage files 2001*a*-2001*n*, the count difference analyzer of the present invention provides an efficient means of count trend analysis for all count events instantiated within an entire simulation model. This feature is particularly useful to simulation users whose primary interest is directed toward simulation results for simulation models as a whole.

Figure 21A:
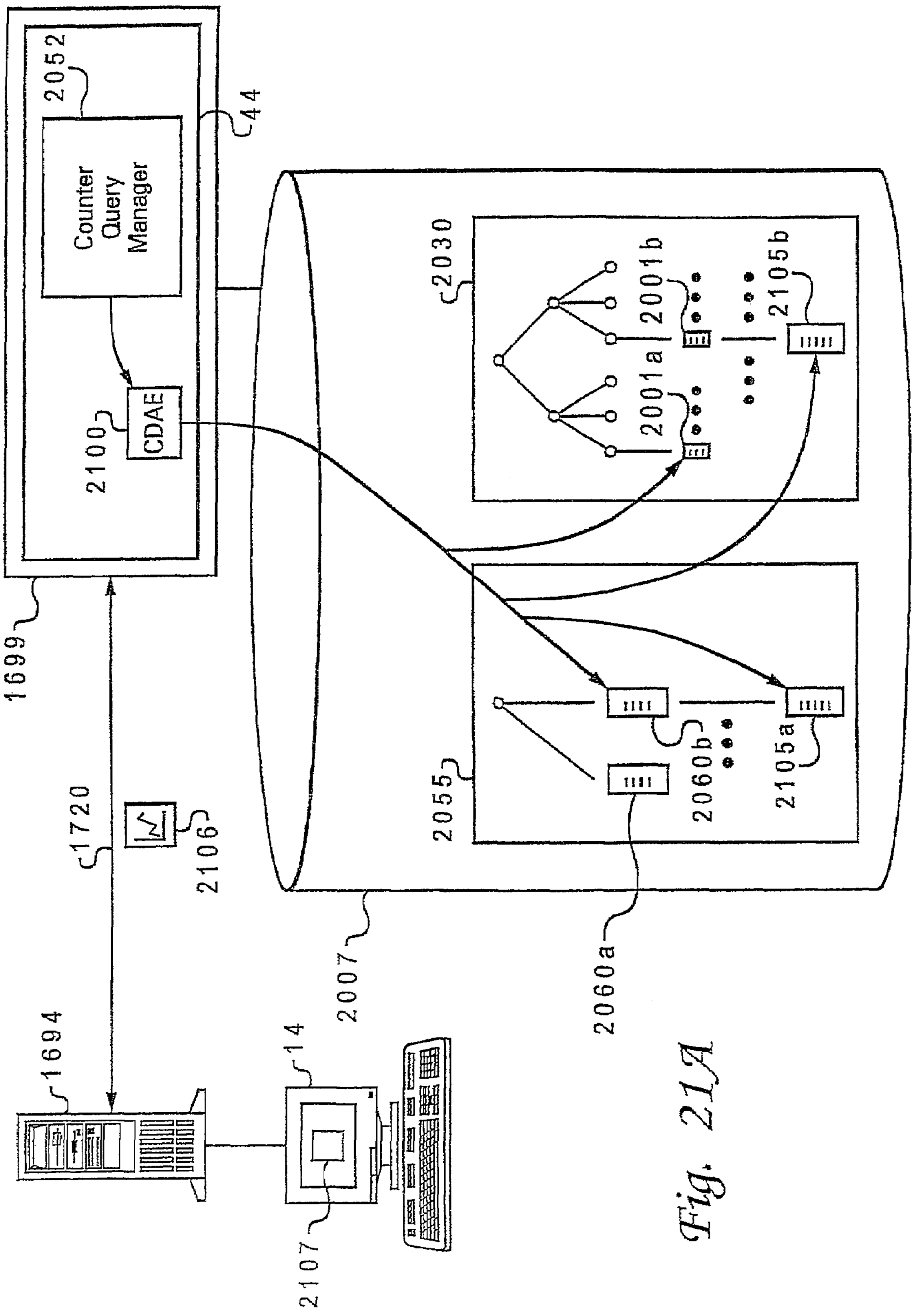
FIG. 21A depicts a system applicable within a batch simulation farm for storing and accessing trends in count event data in accordance with a preferred embodiment of the present invention.
Figure 21B:
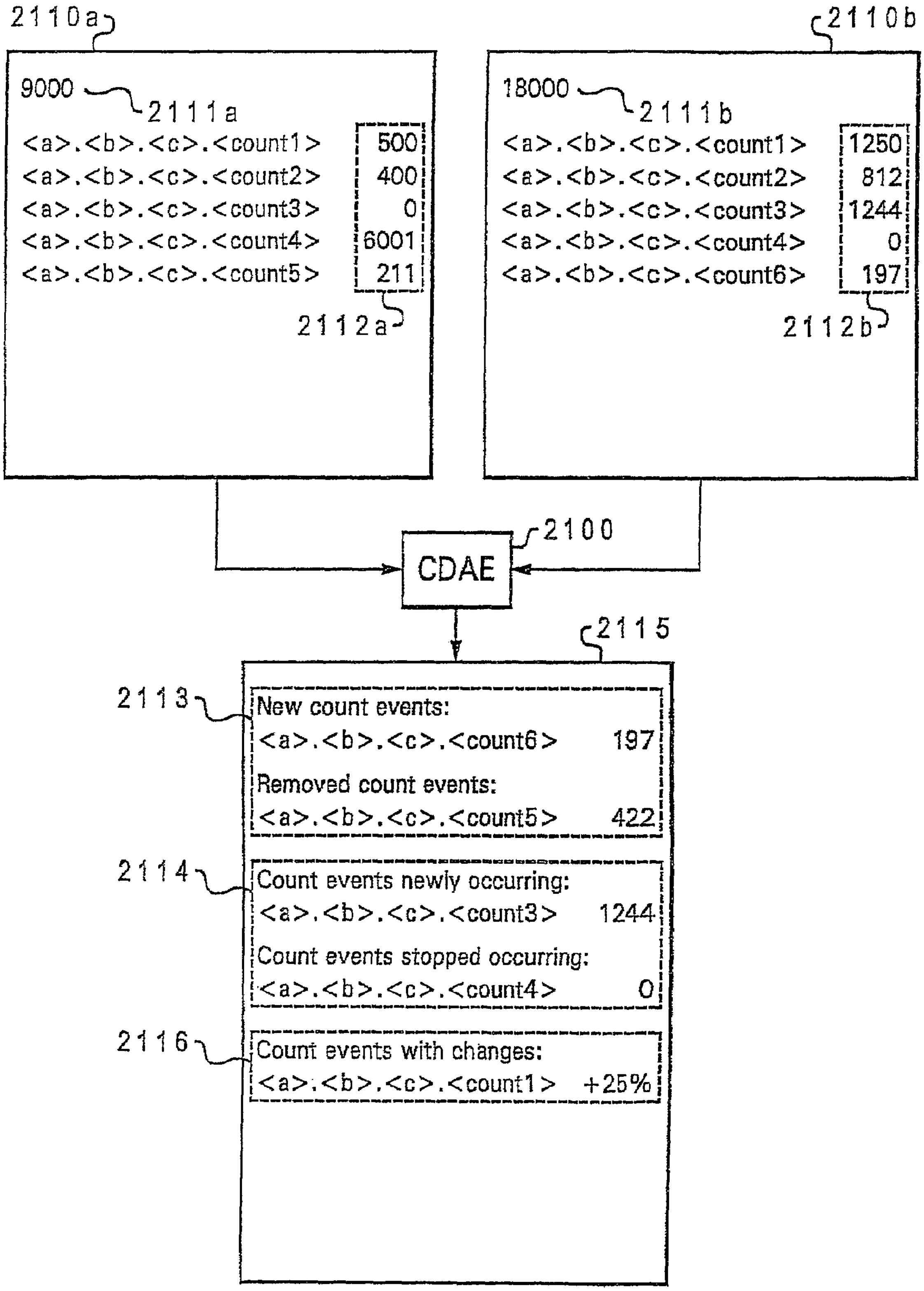
FIG. 21B illustrates file and instruction means required for count difference analysis in accordance with a preferred embodiment of the present invention.
Figure 21C:
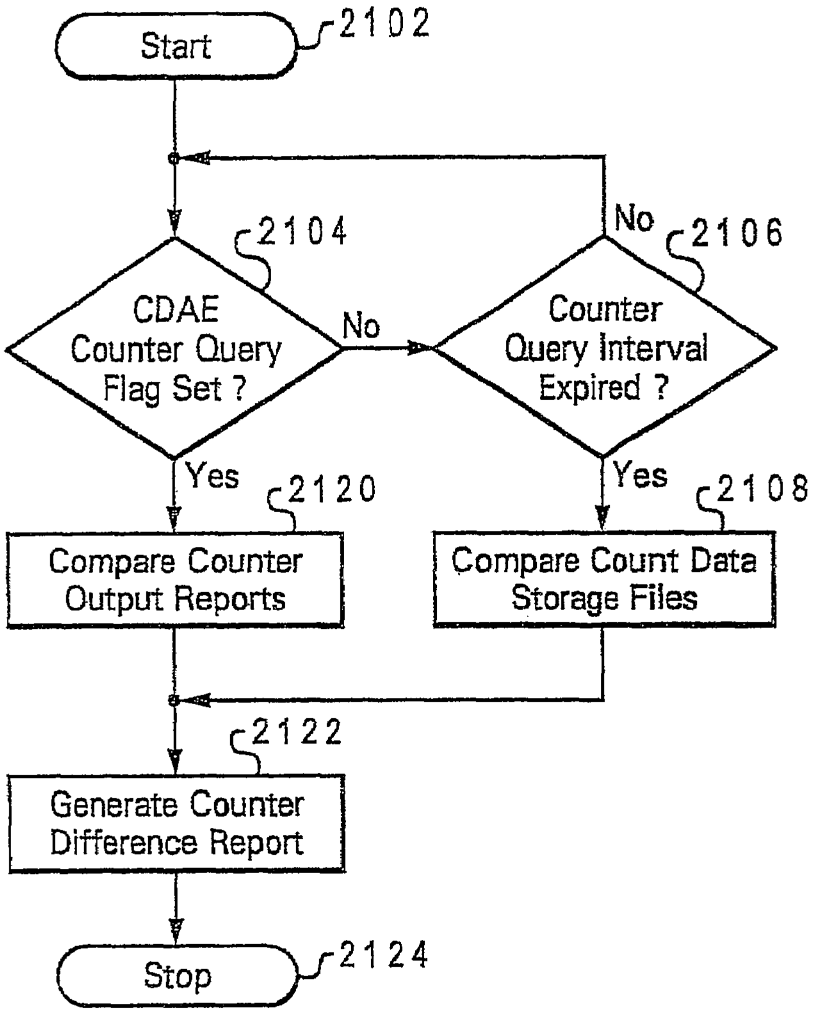
FIG. 21C is a high-level flow diagram depicting steps performed within a batch simulation farm instrumentation server during count difference analysis processing in accordance with a preferred embodiment of the present invention.

Elements and processing steps required to implement a count difference analyzer within instrumentation server 1699 are depicted in FIGS. 21A-21D. FIG. 21A depicts a system applicable within a batch simulation farm for storing and accessing trends in count event data in accordance with a preferred embodiment of the present invention and FIG. 21C is a high-level flow diagram depicting steps performed within a batch simulation farm instrumentation server during count difference analysis performed within the system shown in FIG. 21A. The count difference analysis process within the system depicted in FIG. 21A begins as illustrated at step 2102 of FIG. 21C.

In accordance with the system illustrated in FIG. 21A, counter query manager 2052 includes program instructions (not depicted) to spawn instances of a count difference analyzer engine (CDAE) 2100. CDAE 2100 is a set of program instructions resident within memory 44 of instrumentation server 1699 that is spawned under two general conditions. The first of these conditions occurs, as depicted at step 2104 of FIG. 21C, in accordance with the status of an additional flag field that is added to counter query 2053 (not depicted in FIG. 20H), which if asserted, initiates a count difference analysis to be performed in conjunction with counter query 2053. When this enable flag is asserted, counter query manager 2052 spawns CDAE 2100 at the conclusion of counter query processing as described hereinabove with reference to FIGS. 20A-201.

As depicted at step 2120, CDAE 2100 compares the current most recently created basic counter output report 2060*b* with the basic counter output report 2060*a* resulting from the previously most recently executed version the same counter query to produce a counter difference report 2105*a* (step 2122). As explained in further detail with reference to FIG. 21D, counter difference report 2105*a* contains information indicating any relative changes in occurrences of one or more queried count events in accordance with disparities between basic counter output reports 2060*a* and 2060*b*. A final counter difference report 2106 is delivered to the user by the same means as those selected within report delivery field 2083 of query counter 2053 (FIG. 20H) for final query counter report 2056 (FIG. 20F).

As illustrated at step 2106 of FIG. 21C, a second condition under which counter query manager 2052 spawns an instance of CDAE 2100 is at the expiration of the predetermined counter query interval (e.g., at the end of each day) for every simulation model that has received counter data for that day. As shown at step 2108 at a pre-specified counter query interval, CDAE 2100 compares counter data storage files 2001*a* and 2001*b* (possibly after conversion of the respective count data storage files into basic output counter report format) to produce a counter difference report 2105*b* (step 2122). In accordance with the embodiment depicted in FIG. 21A, counter data storage files 2001*a* and 2001*b* constitute the counter data for a particular simulation model over sequential time intervals (current and previous day, for example). Counter difference report 2105*b* therefore includes data relating to the relative changes in count event occurrences for all count events in the given simulation model between the two days.

Counter difference reports for commissioned simulation models are stored by instrumentation server 1699 and are accessible by users via a graphical user interface 2107 that communicates with counter query manager 2052. It should be noted that counter difference reports not initiated by a counter query (i.e., those initiated in accordance with step 2106) do not have a specified return destination. However, instrumentation server 1699 also provides a means, not described here in detail, that allows interested users to obtain counter difference reports for a certain model or models delivered in a manner similar to that used to deliver final counter reports. The count difference analysis process terminates as depicted at step 2124 of FIG. 21C.

Figure 21D:
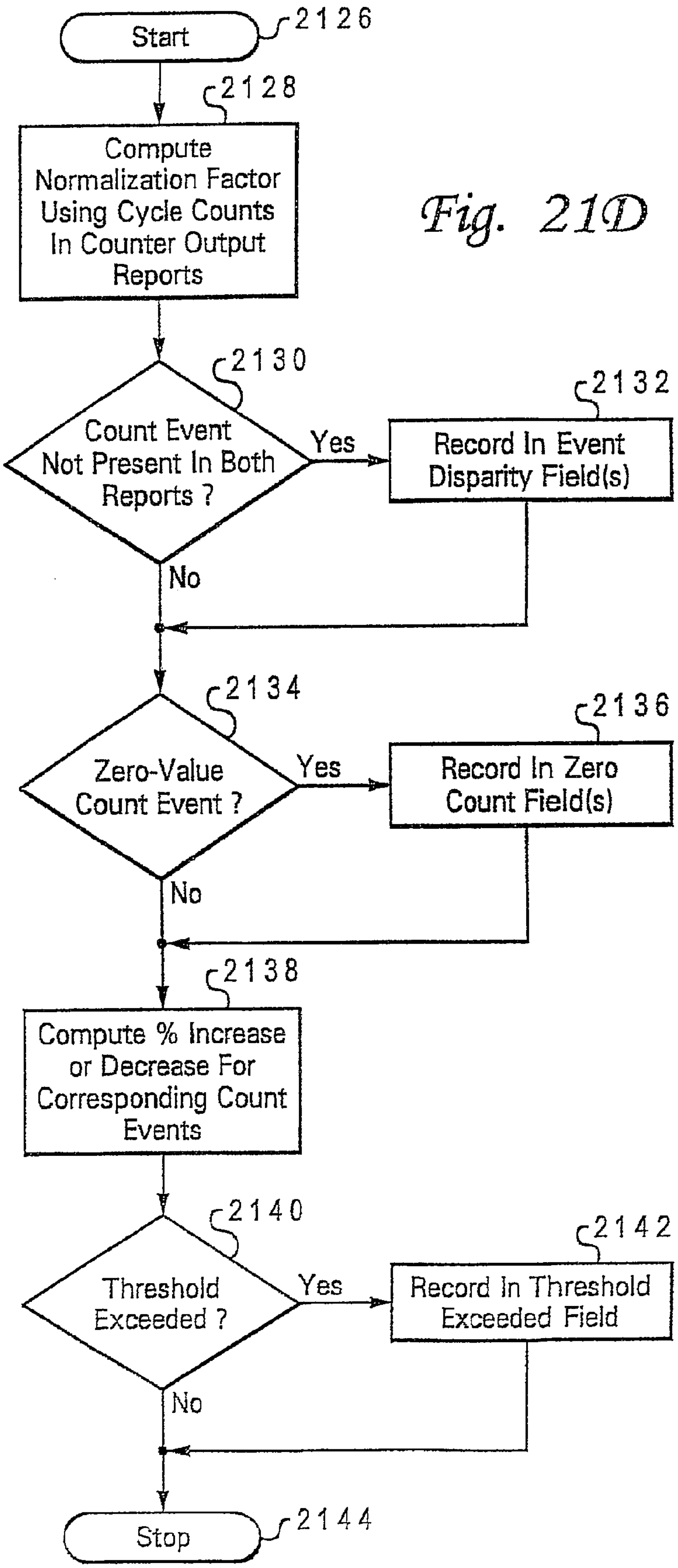
FIG. 21D is a flow diagram illustrating steps performed within a batch simulation farm instrumentation server during counter output report comparison processing in accordance with a preferred embodiment of the present invention.

With reference to FIG. 21B in conjunction with FIG. 21D, there are illustrated a system and a process for performing count difference analysis in accordance with a preferred embodiment of the present invention. The steps depicted in FIG. 21D provide a more detailed description of comparison and report generation steps 2120, 2108, and 2122 of FIG. 21C.

The count difference analysis system illustrated in FIG. 21B includes CDAE 2100 receiving inputs from a pair of basic counter output reports 2110*a* and 2110*b* for a given non-hierarchical counter query. A resultant count difference report 2115 is generated by CDAE 2100 in accordance with the process step described herein. As further depicted in FIG. 21B, basic counter output reports 2110*a* and 2110*b* include individual row-wise entries corresponding uniquely to a particular instrumentation count event. Basic counter output report 2110*a* provides count totals within count fields 2112*a* for count events count1, count2, count3, count4, and count5, for simulation testcases performed over 9000 simulation cycles as indicated within a cycle count field 2111*a*. Likewise, basic count report 2110*b* provides count totals within count fields 2112*b* for count events count1, count2, count3, count4, and count6, for simulation testcases performed over 18000 simulation cycles as indicated within a cycle count field 2111*b*.

The count difference analysis depicted in FIG. 21D begins at step 2126 and continues with a normalization factor computation as shown at step 2128. The normalization factor computation depicted at step 2128 is performed by CDAE 2100 to normalize the count event count values within count fields 2112*a* and 2112*b* to account for any difference in the respective number of simulation cycles (9000 and 18000, respectively) over which the results of basic counter output reports 2110*a* and 2110*b* were obtained.

To normalize the count event values within count fields 2112*a* and 2112*b*, CDAE 2100 computes a ratio between cycle count fields 2111*b* and 2111*a* and then multiplies the count values within count fields 2112*a* by this ratio. In the depicted embodiment, such normalization entails multiplying each of the count values constituting count fields 2112*a* by the ratio (18000/9000) before further processing.

Once the count values are normalized, CDAE 2100 determines the differences between the normalized count values. To this end, and as illustrated at step 2130 of FIG. 21D, CDAE 2100 first determines those count events that have either been added or removed in their entirety to or from basic count report 2110*a* and 2110*b* (i.e., appear in only one of basic counter reports 2110*a* or 2110*b*). Such added or removed count events are reported in an event disparity report field 2113 of count difference report 2115 (step 2132) and are removed from further counter difference analysis processing.

Following the removal of data for count events that have been newly added or removed and for which a trend analysis is thus currently impracticable, CDAE 2100 identifies which of the remaining count events that have a count value of zero as reported in either of basic counter output reports 2110*a* or 2210*b* (step 2134). Such zero-value count events correspond to counts events that were present (i.e., not removed or added) within the design entities targeted by the counter queries from which both basic counter output reports 2110*a* and 2110*b* were produced, but which have either just started occurring as reported in basic counter output report 2110*b*, or have occurred as reported in basic counter output report 2110*a* but not over the reporting interval of basic counter output report 2110*b*. Such zero-value count events are reported in a zero count event field 2114 of counter difference report 2115 as depicted at step 2136 of FIG. 21D. As with the added or removed count events recorded in event disparity field 2114, the identified zero-value count events are immaterial to trend analysis and are not further considered in the present counter difference analysis.

For remaining count events, which have non-zero count values and are not newly added or removed, CDAE 2100 computes the percentage increase or decrease in occurrence between corresponding count events results contained in basic counter output reports 2110*b* and 2110*a* as illustrated at step 2138. As depicted at steps 2140 and 2142, those count events whose percentage change exceeds a predetermined threshold value (for example, plus or minus 20 percent in counter difference report 2115), are reported in a threshold exceeded field 2116 within counter difference report 2115 and are not further considered by CDAE 2100. The percentage change threshold value can be specified by the user for each query.

The remaining count events in count reports 2110*a* and 2110*b*, which have neither been added/removed nor exceeded the percentage change threshold value constitute those count events whose count values, after scaling, are within the specified percentage change threshold and are not reported in counter difference report 2115.

In the foregoing description of FIGS. 21A and 21B, the functionality of CDAE 2100 has been described with respect to basic counter query output reports. For cases in which CDAE 2100 must process counter data storage files 2001*a*-2001*n* (as when comparing count data for an entire simulation model) these counter data storage files are first converted to basic counter reports prior to commencing processing by CDAE 2100.

In accordance with a preferred embodiment of the present invention, a counter data storage file is converted to a basic counter report by placing its cycle count field 2020 (FIG. 20C) value into cycle count integer field 2061 (FIG. 20G) of the basic counter output report. Furthermore the count event list file for the object simulation model is utilized to generate count event identifier fields 2063 (FIG. 20G) of the basic count report. Finally, cumulative count values fields 2021*a*-2021*n* (FIG. 20C) of the counter data storage file are utilized to generate corresponding count value fields 2064 (FIG. 20G) within the resultant basic counter output report. In this manner, count data storage files 2001*a*-2001*n* can be converted to basic counter reports of the form depicted in FIG. 20G suitable for processing by CDAE 2100.

With respect to FIGS. 21A-21D, the functionality of CDAE 2100 was described in terms of comparing count data storage files that contained count data obtained on consecutive days or comparing basic counter output reports obtained from sequential executions of a given user counter query. The extensions necessary for CDAE 2100 to compare count data storage files obtained on non-consecutive days (separated by a week, for example) or to compare basic counter output reports obtained from non-sequential executions of a given counter query would be obvious to one skilled in the art and are included within the scope and spirit of the present invention. Furthermore, the present inventive concept encompasses situations in which count data storage files containing count data obtained over time intervals other than days (weeks, for example), which could similarly be combined into two count data storage files and compared by CDAE 2001. Similar techniques could be applied to combine basic count reports 2060 to produce reports spanning longer periods of time that can be compared. In this manner, different time periods can be analyzed by CDAE 2100 to determine longer-term trends in counter instrumentation data. The above-described process provides a means to analyze and report on longer term trends in counter instrumentation data. This technique provides for automatic on-going analysis of counter instrumentation data for both user counter query reports and for simulation models as a whole.

In a batch simulation farm environment, it would further be advantageous to provide a means to collect and store, with minimal redundancy, those testcases in which harvest events, occur. In accordance with the embodiments depicted herein, testcases in which harvest events occur are stored on a per simulation model basis, thus providing a collection of testcases for the given simulation model that trigger the harvest events incorporated within the instrumentation associated with the simulation model. Each collection of such harvest event triggering testcases are referred to herein as a “harvest testcase bucket” and are stored on a designated “harvest testcase server”. Similar to a failed testcase server, the harvest testcase server serves as a repository for testcases collected in response to the occurrence of a harvest instrumentation event during execution of said testcases during simulation of said simulation model.

The foregoing description of count and fail event processing did not account for multiple testcases being executed within a given simulation run. In practice, however, multiple testcases are executed during a given simulation job in order to amortize the overhead of processing a simulation job over multiple testcases. When processing multiple testcases during a simulation job, the simulation model is reset at the conclusion of a testcase before the execution of the subsequent testcase.

For count and fail events, resetting the simulation model includes a mere reset of the event result registers between testcases. Therefore, between each testcase within a simulation job, counters 421 (FIG. 4B) are reset to a value of zero and fail flags 424 (FIG. 4B) are cleared. The simple resetting of count and fail event results following each testcase is permissible as a consequence of the fact that the practical significance of count and fail events may attach to, but does not extend beyond, the particular testcase in which they occur. This is in contrast to harvest events, whose significance lies simply in the conditions arising during any testcase that triggers the harvest event during simulation of a given simulation model.

Due to this singularity of significance of harvest events, it is desirable to minimize redundancy in the collection of testcases in which a given harvest event occurs during multi-testcase processing of a simulation model. The present invention provides a mechanism by which the processing of subsequent harvest-event-triggering testcases is influenced by previously recorded harvest events that have occurred in previous testcases to prevent potentially extensive redundant harvest testcase collection in the harvest testcase bucket.

Figure 22A:
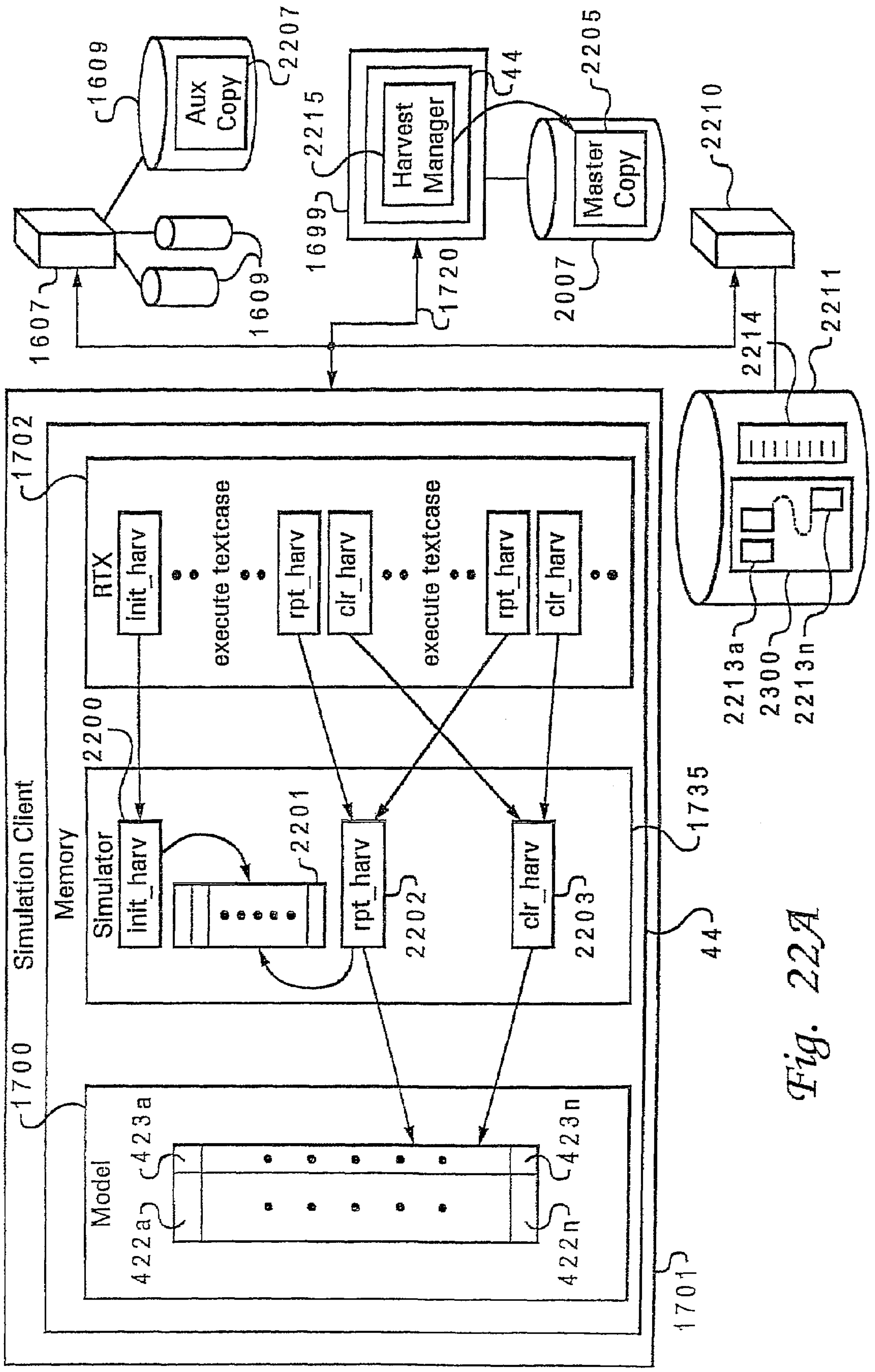
FIG. 22A illustrates elements within a batch simulation farm utilized in collecting harvest event testcases in accordance with a preferred embodiment of the present invention.

FIG. 22A illustrates elements within batch simulation farm 1601 utilized in collecting harvest event testcases in accordance with a preferred embodiment of the present invention. FIG. 22A illustrates the contents of memory 44 within simulation client 1701 during the execution of the testcases within a simulation job. Prior to execution of the first testcase within a simulation job, RTX 1702, as part of step 1638 of FIG. 16C, calls an API entry point init_harv( ) 2200. API entry point 2200 is a routine that communicates with instrumentation server 1699 and/or shared file system 1609 to obtain a list of harvest events from a “harvest hit table”, which have already occurred during simulation testing of simulation model 1700. A separate, initially empty harvest hit table is stored for each commissioned simulation model within instrumentation server 1699.

In response to obtaining a network copy of the harvest hit table for the current model, API entry point 2200 initializes a local harvest table 2201 within simulator 1735. Local harvest hit table 2201 initially includes a list of harvest event names that, as evidenced by their inclusion within the harvest hit table referenced by API entry point 2200, have already occurred during simulation testing of simulation model 1700.

In a manner analogous to that described with respect to API entry point disable_events( ) 1800 in FIG. 18B, API entry point init_harv( ) 2200 obtains a copy of the harvest hit table from one of two network sources. The first source is a master harvest hit table 2205 stored on disk within instrumentation server 1699. The second possible source is an auxiliary harvest hit table 2207 that is stored in association with general-purpose computer 1607 in shared file system 1609. Master harvest hit table 2205 serves as the primary (i.e., most currently updated) version of the harvest hit table. At regular intervals, instrumentation server 1699 copies the contents of master harvest hit table 2205 into auxiliary harvest hit table 2207, which serves as a backup copy of the harvest hit table.

The two-file system depicted in FIG. 22A is used to maintain the harvest hit table in a flexible and robust manner within geographically distributed batch simulation farm 1601 for reasons similar to those discussed above in connection with FIG. 18A. Simulation clients that obtain the harvest hit table from shared file system 1609 can potentially receive a "stale" copy of the harvest hit table. Although this problem may be minimized by copying master file 2205 onto auxiliary file 2207 on a regular interval to quickly resolve any discrepancies between master file 2205 and auxiliary file 2207, harvest testcase processing based on a stale harvest hit table may result in redundancy within the harvest testcase bucket. The undesirability of such redundancy may, however, be outweighed by the additional robustness gained by storing the harvest hit table at different network locations. The present invention includes techniques for removing redundant testcases stored as a result of a stale harvest hit table, along with other sources of inconsistency, as described in further detail below.

After calling API entry point 2200, RTX 1702 executes the first testcase within the simulation job. Once the testcase completes execution, and as part of step 1637 of FIG. 16C, RTX 1702 calls an API entry point rpt_harv( ) 2202, which first examines harvest flags 423*a*-423*n* (FIG. 4B) to determine which harvest events, if any, have been triggered by the testcase. API entry point 2202 then compares the harvest event occurrences as recorded by the status of harvest flags 423*a*-423*n* with the content of local harvest hit table 2201 to determine if any preliminarily non-redundant harvest events (i.e., harvest events triggered during the testcase that do not match those recorded in local harvest hit table 2201) have occurred. In the absence of any preliminarily non-redundant harvest events (i.e., all harvest events triggered during the testcase match those recorded in local harvest hit table 2201), API entry point 2202 terminates processing and returns to RTX 1702 an indication directing RTX 1702 not to copy the current testcase into a harvest testcase bucket 2300. By referring to local harvest hit table 2201, API entry point 2202 prevents unnecessary communication with instrumentation server 1699 in those cases in which the harvest events that were triggered by the current testcase have already been collected during previous simulations of simulation model 1700 within batch simulation farm 1601.

If, however, one or more preliminarily non-redundant harvest events have occurred (i.e., at least one harvest event triggered by the testcase does not match any harvest event recorded in local harvest hit table 2201), API entry point 2202 continues operation in one of two alternative modes (described in further detail below) to potentially further validate the non-redundant status of the harvest event(s) in question. As explained in further detail below, a "direct mode" or an "indirect mode" of further non-redundant status inquiry may be pursued by API entry point 2202. The direct non-redundant status inquiry is designed to ensure that only one testcase per harvest event is delivered from a given simulation client for storage within harvest testcase bucket 2300. The indirect mode of non-redundant status inquiry results in the possibility that some redundant testcases (i.e., testcases triggering the same harvest event) will be delivered from simulation client 1701 to harvest testcase bucket 2300.

It should be noted that a preliminarily non-redundant harvest event, as recorded within local harvest hit table 2201, may in fact be redundant with respect to interim testcase activity within batch simulation farm 1601. In the time interval between the initialization of local harvest hit table 2201 and the completion of the object testcase, another simulation client may detect and record the occurrence of one or more of the preliminarily non-redundant harvest events detected by simulator 1735. In this case, harvest events appearing to be new in accordance with local harvest hit table 2201, have actually already occurred during another testcase. In accordance with a preferred embodiment of the present invention, API entry point rpt_hrv( ) 2202 may undertake additional processing steps to ensure that an apparently newly occurring harvest event has not actually occurred elsewhere within batch simulation farm 1601.

In the direct mode of non-redundancy status inquiry, API entry point 2202 opens a direct network connection (e.g. Unix socket connection) on network 1720 to a harvest manager program 2215, which executes on instrumentation server 1699. Over this direct network connection, API entry point rpt_hrv( ) 2202 delivers an aggregate instrumentation data packet consisting of the contents of harvest cycle counters 422*a*-422*n*, harvest flags 423*a*-423*n*, and the name of the current testcase.

Harvest manager program 2215 first verifies that the aggregate instrumentation data packet is associated with a simulation model commissioned within instrumentation server 1699 in accordance with the means described with respect to FIGS. 17A-17C. Following packet commissioning verification, harvest manager program 2215 then compares the contents of master harvest hit table 2205 with the contents of the received aggregate instrumentation data packet to determine if any preliminarily non-redundant harvest event occurrences are recorded in the master harvest hit table 2205.

Any of the apparently new harvest events that are not currently recorded in master harvest hit table 2205, are recorded by harvest manager program 2215 in master harvest hit table 2205 in association with the name of the current testcase. If multiple new harvest events have occurred in the current testcase, each of these events is recorded as having been triggered by the current testcase. In this manner, it is possible to determine which specific harvest events have been triggered by each testcase within harvest testcase bucket 2300. Subsequent to detecting and recording newly occurring harvest events in master harvest hit table 2205, harvest manager program 2215 returns an indication, over the direct network connection on network 1720, to API entry point 2202 to deliver a copy of the current testcase to harvest testcase bucket 2300.

In the case that all of the apparently new harvest events (i.e., all harvest events triggered during the current testcase having no corresponding entry in local harvest hit table 2201) are currently recorded in master harvest hit table 2205, harvest manager program 2215 returns an indication to API entry point 2202 over the direct network connection on network 1720, directing API entry point 2202 not to deliver a copy of the current testcase.

In accordance with an important feature of the depicted embodiment, only one simulation client may have an active network connection with harvest manager 2215 at any given time. Prior to obtaining a communicative connection with harvest manager program 2215, other simulation clients attempting to validate the redundancy status of harvest events must wait until harvest manager program 2215 has first completed processing a current connection, and second has performed any necessary updates to master harvest hit table 2205.

In this manner, updates to master harvest hit table 2205 are serialized, thereby preventing the collection of redundant testcases for any given harvest event. Therefore, in direct non-redundancy verification mode, once a testcase is collected within harvest testcase bucket 2300 in association with the recordation of a given harvest event in master harvest hit table 2205, no further testcases will be collected in association with the same harvest event.

While direct non-redundancy verification mode prevents the collection of multiple, effectively redundant testcases for a given harvest event, it can potentially be error prone and costly in practice. The direct network connection between simulation client 1701 and instrumentation server 1699 may be costly to establish, subject to errors in high network traffic conditions, and serves only one simulation client at a time. These issues are especially relevant for simulation clients residing in geographically distant nodes. In such circumstances, it may be preferable to permit a certain level of redundancy in harvest testcase bucket 2300 in order to reduce the processing and communication overhead required for direct non-redundancy inquiries.

To this end, an indirect non-redundancy verification inquiry is utilized wherein API entry point 2202 uses only local harvest hit table 2201 in determining whether or not to collect a testcase. In indirect non-redundancy verification, API entry point rpt_hrv( ) 2202 bypasses the step of further validating an apparently new harvest event with harvest manager 2215. Communication overhead associated with a direct network connection with harvest manager program 2215 is thus reduced at the cost of potential redundancy in harvest testcase bucket 2300.

In indirect harvest mode, when, in accordance with the content of local harvest hit table 2201, an apparently new harvest event has been triggered by a current testcase, API entry point 2202 prepares an aggregate instrumentation data packet containing the contents of harvest cycle counters 422*a*-422*n*, harvest flags 423*a*-423*n*, and the name of the current testcase.

This aggregate instrumentation data packet is delivered to instrumentation server 1699 over network 1720 utilizing a non-direct network connection. Such a non-direct network connection may be established via several well-known communications mechanisms such as custom file transfer or messaging protocols. This communication mechanism accepts the aggregate instrumentation data packet for delivery and subsequently returns control to API entry point 2202. The aggregate instrumentation data packet is then delivered to harvest manager program 2215 at a later time independent of the subsequent execution of API entry point 2202 or RTX 1702. This communication mechanism allows multiple simulation clients to be served simultaneously in a batch fashion, and does not require a direct network connection per simulation client to be established for harvest manager program 2215.

This is in contrast to the communication means utilized during a direct non-redundancy verification inquiry, wherein API entry point 2202 cannot return control to RTX 1702 until the aggregate instrumentation packet has been delivered to instrumentation server 1699, processing of the packet has been completed, and an indication has been returned by harvest manager program 2215 of whether or not to copy the current testcase to harvest testcase bucket 2300. Simulation clients must sequentially execute these collective steps to gain access to instrumentation server 1699. This can lead to bottlenecks in performance in heavy network load situations, especially in large geographically distributed batch simulation farms.

When harvest manager program 2215 receives an aggregate instrumentation data packet from a simulation client operating in indirect non-redundancy verification mode, the commissioning status of the aggregate data packet is first validated according to the means described above in conjunction with FIGS. 17A-17C. The contents of the aggregate data packet are compared to master harvest hit table 2205 in a manner analogous to that utilized in direct harvest mode. Any harvest events recorded in the aggregate instrumentation data packet that are not currently included within master harvest hit table 2205 are identified and recorded in master harvest hit table 2205. If all harvest events present in the aggregate instrumentation data packet are already recorded in master harvest hit table 2205, the aggregate instrumentation data packet is discarded.

As in direct non-redundancy verification mode, in indirect harvest mode, harvest manager program 2215 must processes aggregate instrumentation data packets received from clients in a serial fashion. In this manner, accesses to master harvest hit table 2205 for simulation clients utilizing indirect non-redundancy verification mode are also serialized and only one testcase is recorded in master harvest hit table 2205 as having triggered each harvest event.

However, in indirect non-redundancy verification mode, it is possible for multiple testcases to be delivered from simulation clients to harvest testcase bucket 2300 for the same harvest event. As one example, two simulation clients may receive the same harvest hit table content from the init_harv( ) call by API entry point 2200. These simulation clients then independently execute differing testcases that both trigger the same, preliminarily non-redundant (in accordance with their respective local harvest hit tables) harvest event. In both simulation clients, API entry point rpt_hrv( ) 2202 will instruct RTX 1702 to harvest their respective testcases.

Furthermore, aggregate instrumentation data packets for both testcases will be delivered to harvest data manager program 2215. The aggregate instrumentation data packet received first will be recorded in master harvest hit table 2205. The subsequently received aggregate instrumentation data packet will be ignored due to the fact that the object harvest event has already been recorded in master harvest hit table 2205. In this situation, the testcase reported by the simulation client producing the second aggregate instrumentation data packet is redundantly stored within harvest testcase bucket 2300. As explained in further detail with reference to FIGS. 23A-23C, the present invention provides techniques for removing these redundant testcases from the harvest testcase bucket 2300.

In a preferred embodiment, harvest manager program 2215 is configured to simultaneously process aggregate instrumentation data packets from simulation clients operating in either direct or indirect non-redundancy verification mode. Therefore, simulation clients within a batch simulation farm may operate in either direct or indirect harvest mode, according to which mode is most advantageous.

As a next step in processing in either direct or indirect mode, API entry point 2202 updates local harvest hit table 2201 to record those harvest events that were triggered by the current testcase. In this manner, subsequent testcases within the simulation job will be prevented from potentially erroneously harvesting another testcase for a harvest event that has already occurred.

As an additional optional additional processing step available in either direct or indirect harvest mode, API entry point 2202 may also communicate with instrumentation server 1699 and/or shared file system 1609 to obtain an updated copy of the harvest hit table. Typically, this data is obtained from shared file system 1609 to reduce the communication load on instrumentation server 1699.

The harvest hit table information is used to further update local harvest hit table 2201 with a more current image of those harvest events that have been detected and recorded during simulation jobs executing on other simulation clients. In this manner, the processing of harvest events by simulation client 1701 is influenced by harvest events already harvested by other simulation clients since the last update of local harvest hit table 2201, and unnecessary network communication is avoided while processing subsequent testcases that hit harvest events captured by other simulation clients. This additional processing step is most advantageous in circumstances in which testcases take a long period of time to complete, and therefore many additional harvest events may have been detected and recorded in parallel on other simulation clients.

Following data packet processing by harvest manager program 2215, API routine 2202 returns an indication, received either directly from harvest manager program 2215 in direct mode or by an examination of data structure 2201 in indirect mode, to RTX 1702 of whether or not the current testcase is to be copied to harvest testcase bucket 2300. Upon receiving an indication to save the current testcase from API entry point 2202, RTX 1702 delivers a copy of current testcase to harvest testcase server 2210.

Each of a set of harvested testcases 2213*a*-2213*n* is stored in association with a particular simulation model on a disk storage device 2211 associated with harvest testcase server 2210. Harvest testcase server 2210 also maintains a harvested testcase list 2214 that includes the name of each testcase within harvest testcase bucket 2300. Harvested testcase list 2214 is updated whenever a new testcase is stored to provide an up-to-date list of the testcase names for the harvest testcases stored for the given simulation model.

It should be noted that certain errors can occur that prevent RTX 1702 from successfully storing the current testcase on harvest testcase server 2210. However, when such an error occurs in direct non-redundancy verification mode, master harvest hit table 2205 has already been updated to indicate that the current testcase has been collected. Similarly, in indirect mode, master harvest hit table 2205 has been or will be similarly updated (barring errors in processing the aggregate instrumentation data packet sent to instrumentation server 1699 during step 2256 of FIG. 22B). Such failures to store the testcase can cause an inconsistency between master harvest hit table 2205 and harvest testcase bucket 2300 stored on instrumentation server 2210.

After the testcase has been harvested if necessary, RTX 1702 calls API entry point clr_harv( ) 2203. API entry point 2203 clears harvest flags 423*a*-423*n* in preparation to run a subsequent testcase. RTX 1702 then executes the next testcase within the simulation job, repeating the harvest testcase verification and collection process until all testcases within the simulation job have been completed.

Figure 22B:
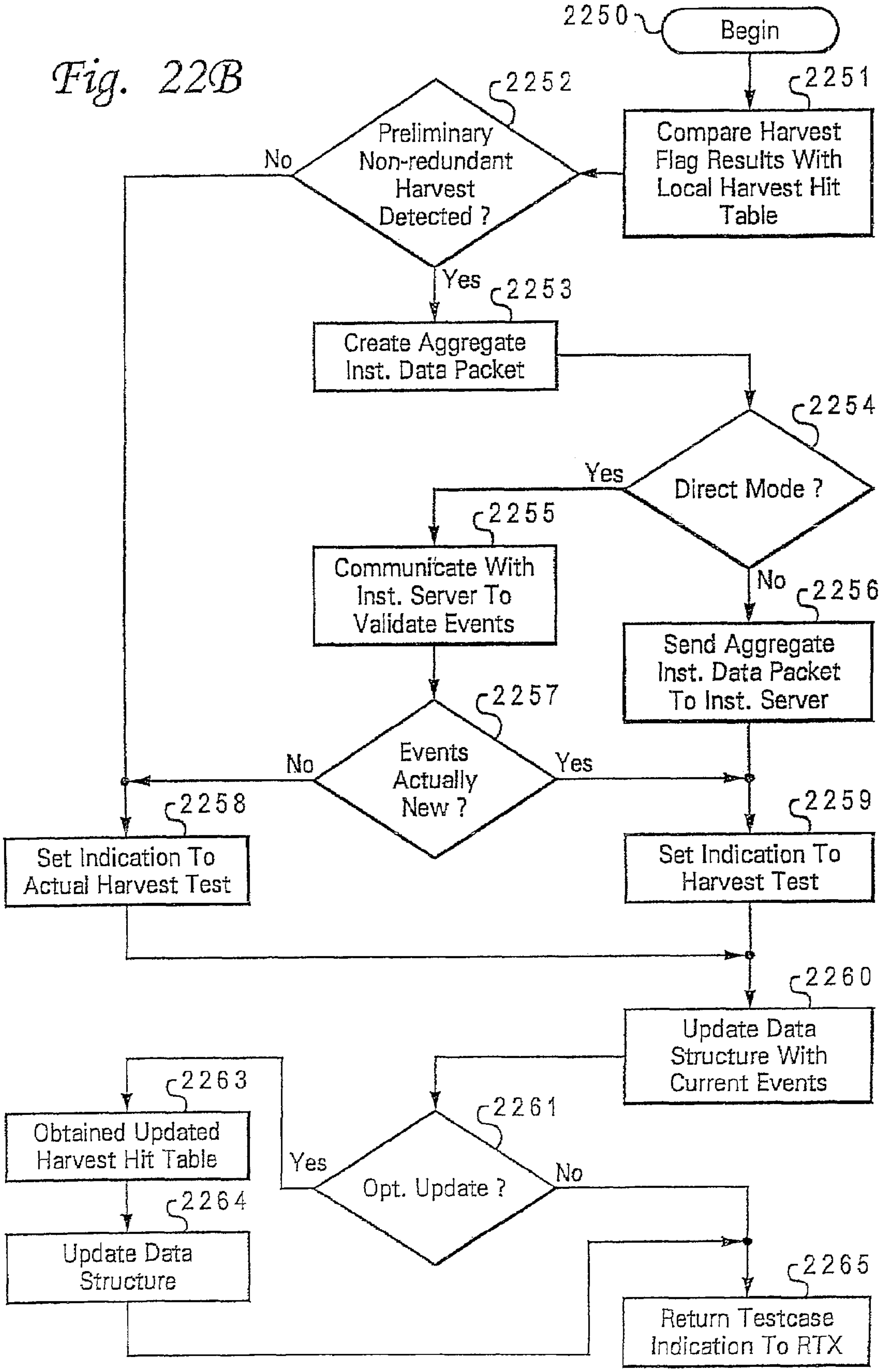
FIG. 22B is a flow diagram depicting steps performed in collecting harvest event testcases in accordance with a preferred embodiment of the present invention.

FIG. 22B is a flow diagram depicting in greater detail the operation of API entry point 2202 in accordance with a preferred embodiment of the present invention. API entry point 2202 begins execution at step 2250 upon being called by RTX 1702. The process continues at step 2251 which depicts a comparison between the contents of harvest flags 423*a*-423*n* with the content of local harvest hit table 2201 to determine if any apparently new harvest events have been triggered by the current testcase (step 2252).

If, in accordance with the comparison shown at step 2251, no apparently new harvest events have occurred, the process continues as illustrated at step 2258, with the setting of an internal indication instructing RTX 1702 not to harvest the current testcase. Otherwise, as depicted at step 2253, an aggregate instrumentation data packet is generated containing the contents of harvest cycle counters 422*a*-422*n*, harvest flags 423*a*-423*n*, and the name of the current testcase.

Proceeding to step 2254, wherein is depicted a determination of whether non-redundancy verification is to be performed in direct or indirect mode. If indirect mode is selected, and as illustrated at step 2256, the aggregate instrumentation packet generated in step 2253 is scheduled for a later delivery to harvest manager program 2215. If direct non-redundancy verification processing is selected by the simulation client, API routine rpt_hrv( ) 2202 continues as shown at step 2255, by delivering the aggregate instrumentation data packet to harvest manager program 2215 via a direct network connection over network 1720 to validate the first occurrence status of the apparently new harvest events (step 2257).

As part of step 2257 a determination is returned to API entry point 2202 from harvest manager program 2215 of whether the harvest events are actually new. If the harvest events are not new (i.e., are recorded in the current network harvest hit table), the process continues as depicted at step 2258, with API entry point 2202 setting an internal indication instructing RTX 1702 not to copy the current testcase to harvest testcase bucket 2300. If, as determined by the comparison of aggregate instrumentation packet data with the network harvest hit table, the harvest events are actually new, API entry point 2202 sets an internal indication instructing RTX 1702 to copy and deliver the current testcase to harvest testcase bucket 2300 (step 2259).

API entry point 2202 processing continues at step 2260, with an update of local harvest hit table 2201 to include those harvest events that have occurred in the current testcase. Continuing at step 2261, a determination is made of whether or not local harvest hit table 2201 should be updated to reflect those harvest events captured by other simulation clients. If the optional update is selected, API routine 2202 requests an updated image of the harvest hit table from either instrumentation server 1699 and/or shared file system 1609 as illustrated at step 2263. Next, as depicted at step 2264 local harvest hit table 2201 is further updated to reflect those additional harvest events obtained at step 2263. Processing terminates at step 2265, depicting the return of the internal indication of whether or not to harvest the current testcase set by API entry point 2202 at either steps 2255 or 2256 to RTX 1702.

Figure 22C:
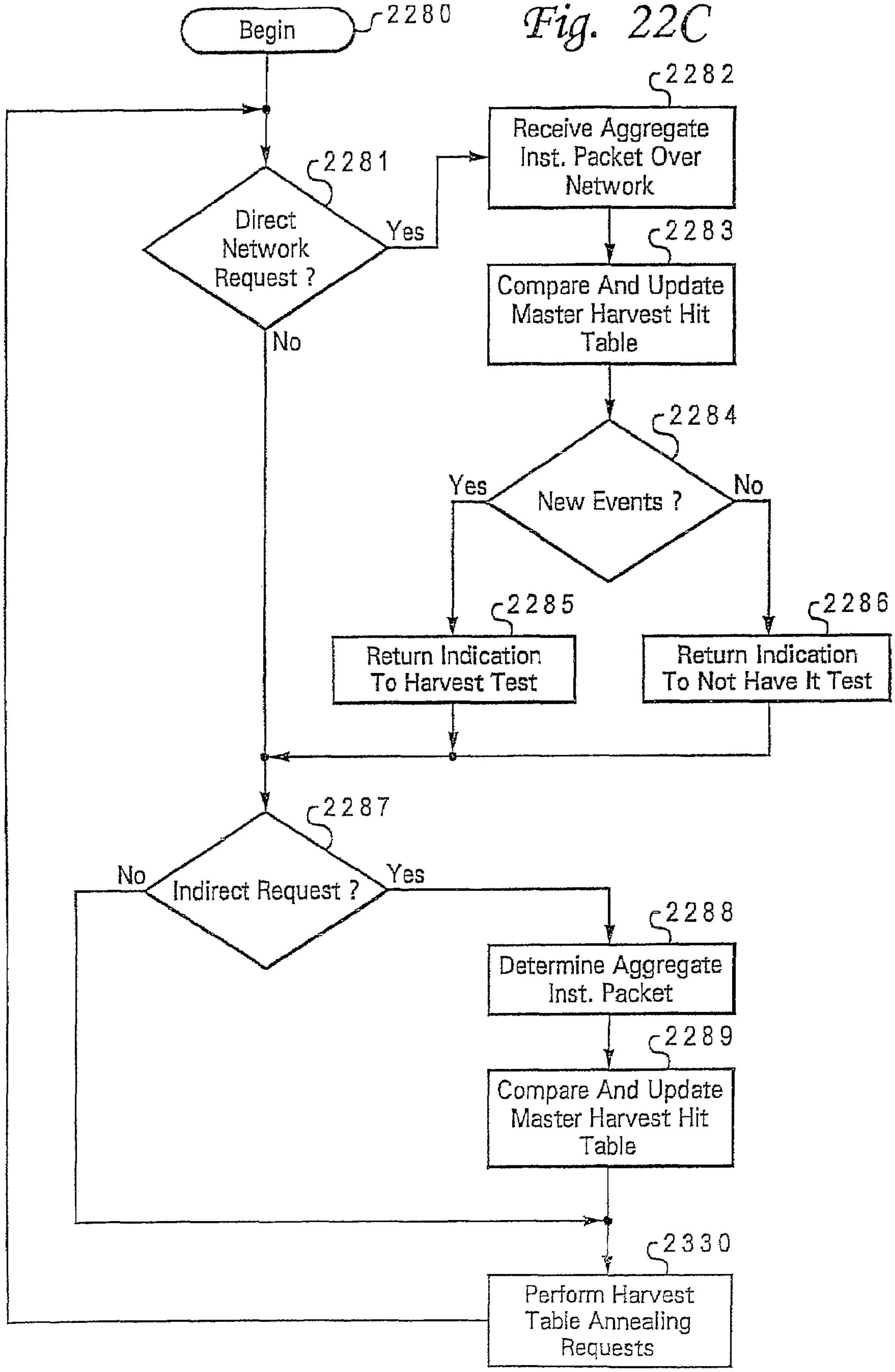
FIG. 22C is a flow diagram illustrating the operation of a harvest manager program during harvest event testcase collection in accordance with a preferred embodiment of the present invention.

With reference to FIG. 22C, there is depicted a flow diagram illustrating in greater detail the operation of harvest manager program 2215 in accordance with a preferred embodiment of the present invention. Harvest manager program 2215 begins processing at step 2280 and continues as illustrated at step 2281, with a determination of whether a request for a direct network connection over network 1720 from a simulation client operating in direct non-redundancy verification mode is present.

If so, and as illustrated at step 2282, harvest manager program 2215 receives the aggregate instrumentation data packet transmitted over the direct network connection on network 1720 as a part of step 2255 of FIG. 22B. The process continues at step 2283, with harvest manager program 2215 comparing the contents of the aggregate instrumentation data packet to master harvest hit table 2205 to determine if any actually new harvest events have occurred and updating, as necessary, master harvest hit table 2205 to record these new events (step 2283).

Proceeding to step 2284, harvest manager program 2215 determines if any new harvest events have been recorded at step 2283. If new harvest events have been recorded at step 2283, harvest manager program 2215 returns an indication through the direct network connection on network 1720 instructing the simulation client to copy the current testcase into harvest testcase bucket 2300 as depicted at step 2285. If no new harvest events are recorded at step 2283, an indication is delivered from harvest manager program 2215 through the direct network connection on network 1720 instructing the simulation client not to collect the current testcase within harvest testcase bucket 2300 as depicted at step 2286.

The process continues at step 2287, which illustrates a determination of whether an aggregate instrumentation data packet from a simulation client operating in indirect non-redundancy verification mode has been delivered from simulation client 1701. If an aggregate instrumentation data packet has been delivered, the process continues as illustrated at step 2288, with harvest manager program 2215 receiving the aggregate instrumentation data packet delivered to harvest manager program 2215 as a part of step 2256 of FIG. 22B. Continuing at step 2289, harvest manager program 2215 compares the contents of the aggregate instrumentation data packet to master harvest hit table 2205 to determine if any actually new harvest events have occurred and updating, as necessary, master harvest hit table 2205 to record these new events.

Next, as depicted at step 2330 harvest manager program 2215 undertakes processing steps required to resolve inconsistencies between the testcases collected within harvest testcase bucket 2300 and the testcases recorded within master harvest hit table 2215. The particular processing steps performed during step 2330 are explained in further detail with reference to FIGS. 23A-23C. In this manner, harvest manager program 2215 processes aggregate instrumentation data packets received from simulation clients in both direct and indirect harvest mode. The process returns to step 2281 to repeat for each direct or indirect non-redundancy inquiry delivered by the simulation client. The above described mechanism for harvesting testcases provides for a robust and efficient means to collect testcases, minimizing duplication where possible, that exercise harvest events in batch simulation farm 1601.

The mechanism for harvesting testcases described with reference to FIGS. 22A-22C has two main sources of inconsistency between the entries within master harvest hit table 2205 and the testcases recorded in harvest testcase bucket 2300. The first of these inconsistencies, referred to hereafter as a "lost harvest testcase", occurs when a harvest event is recorded in master harvest hit table 2205 in association with a particular testcase, but RTX 1702 fails to successfully store the testcase on harvest testcase server 2210. In such a circumstance, master harvest hit table 2205 includes a harvest event entry for a testcase that is not actually stored within harvest testcase bucket 2300. As such, subsequent testcases that trigger the object harvest event will not be collected within harvest testcase bucket 2300. Left uncorrected, this condition prevents any future collection of testcases that trigger harvest events whose recordation within master harvest hit table 2205 has become effectively erroneous.

The second source of inconsistency between the entries within master harvest hit table 2205 and the testcases recorded in harvest testcase bucket 2300, referred to hereafter as an "extraneous harvest testcase", may occur as a result of the nature of the previously described indirect redundancy verification mode optionally undertaken by API entry point rpt_hrv( ) 2202. As previously explained with reference to FIGS. 21A-21C, an indirect non-redundancy status inquiry results in the possibility that testcases which are redundant with respect to a given harvest event maybe collected in association with a given simulation model within harvest testcase bucket 2300. This is despite the fact that only one testcase is recorded per harvest event in master harvest hit table 2205. The collection of potentially thousands of extraneous testcases within harvest testcase bucket 2300 is inherently undesirable. Furthermore, it is not possible to definitively determine from master harvest hit table 2205 which harvest events are triggered by these extraneous testcases.

Figure 23A:
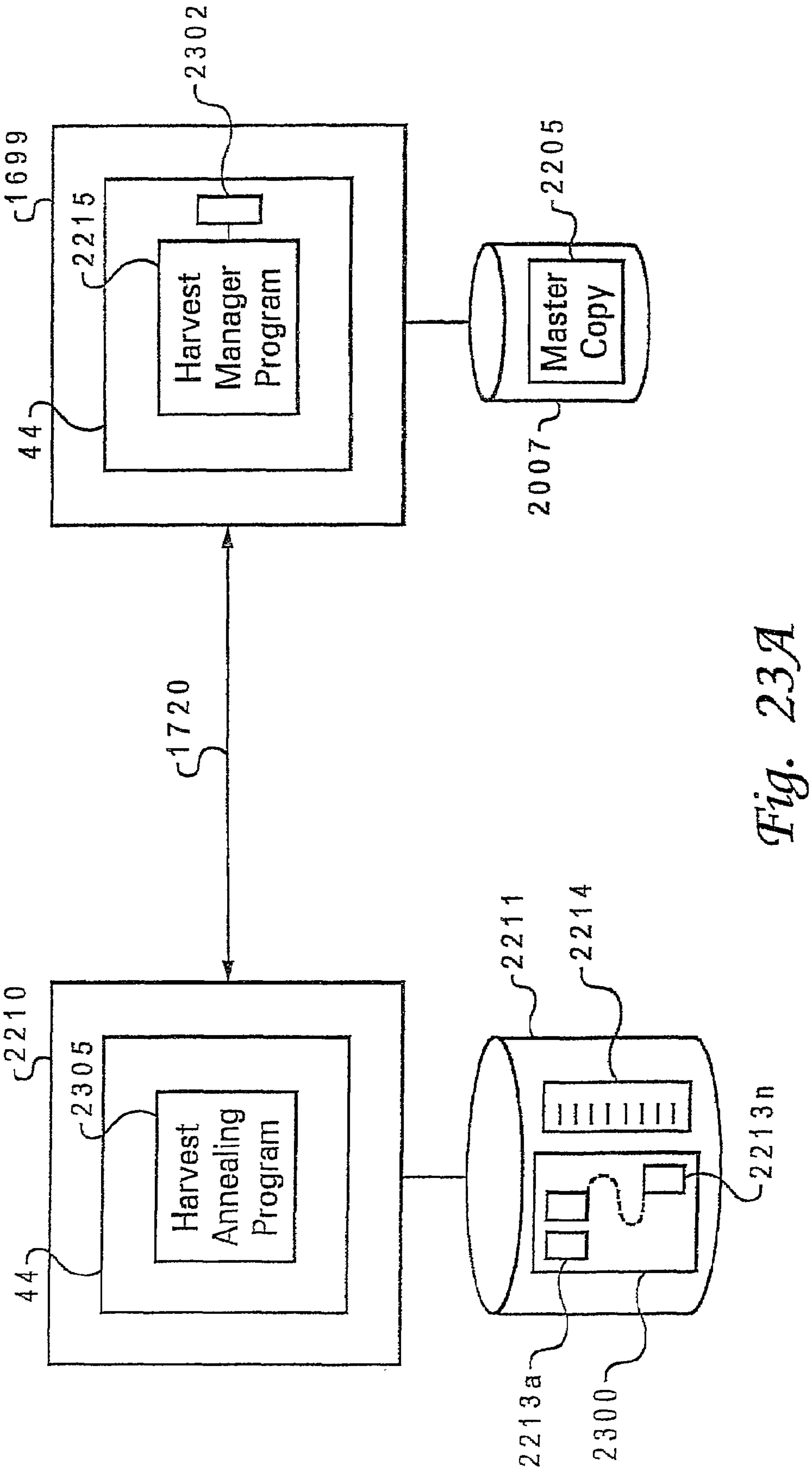
FIG. 23A depicts additional elements within an instrumentation server and a harvest testcase server that are utilized in resolving inconsistencies between a master harvest hit table and a harvest testcase bucket in accordance with a preferred embodiment of the present invention.

It would therefore be advantageous to provide a means, hereafter referred to as "harvest annealing", to resolve these inconsistencies. Referring to FIG. 23A, there are depicted additional elements within instrumentation server 1699 and harvest testcase server 2210 that are utilized in resolving inconsistencies between master harvest hit table 2205 and harvest testcase bucket 2300.

As illustrated in FIG. 23A, the contents of memory 44 within harvest testcase server 2210 and instrumentation server 1699 utilized to implement harvest annealing include a harvest annealing program 2305 and harvest manager program 2215, respectively. At proscribed intervals, harvest testcase server 2210 initiates harvest annealing program 2305 for a given simulation model. Harvest annealing program 2305 first opens a direct network connection on network 1720 to harvest manager program 2215 executing on instrumentation server 1699. Harvest annealing program 2305 delivers harvest testcase list 2214, which contains a list of the names of all testcases stored on harvest testcase server 2210 for the given model, to harvest manager program 2215.

Harvest manager program 2215 compares the testcase name fields within master harvest hit table 2205 to the entries of testcase list 2214. Any entry in master harvest hit table 2215 whose testcase field does not correspond to any testcase name entry within harvest testcase list 2214 indicates a lost harvest testcase that is not present in harvest testcase bucket 2300. Detection of such lost harvest testcases results in the removal of the corresponding harvest event entries from master harvest hit table 2205. Removal of these harvest event entries from master harvest hit table 2205 enables collection of testcases triggering the object harvest events during future simulation jobs.

As a further step in the comparison, harvest manager program 2215 produces a list of each testcase recorded in harvest testcase list 2214 which cannot be correlated with the testcase field of an entry in master harvest hit table 2205. These testcases correspond to the extraneous harvest testcases described above. This list of extraneous testcases 2302 is returned to harvest annealing program 2305 over the direct network connection on network 1720. Harvest annealing program 2305 removes the extraneous testcases indicated in the extraneous testcase list from harvest testcase bucket 2300.

Figure 23B:
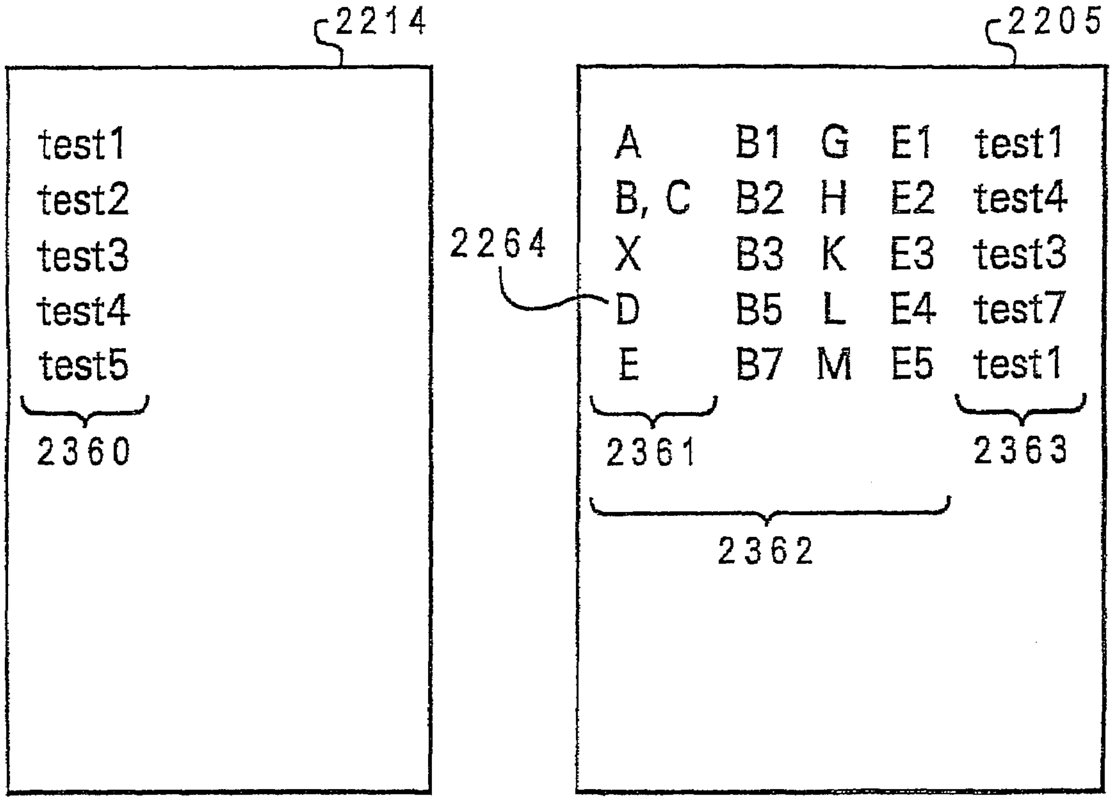
FIG. 23B illustrates the data structure and content of a harvest testcase list and a master harvest hit table as they exist prior to the harvest annealing process of the present invention.

FIG. 23B provides a more detailed illustration of the data structure and content of harvest testcase list 2214 and master harvest hit table 2205 as they exist prior to the harvest annealing process of the present invention. Within harvest testcase list 2214, a name field 2360 includes data field entries containing the names of testcases, test1, test2, test3, test4, and test5, which are stored on harvest testcase server 2010 in association with simulation model 1700.

Master harvest hit table 2205 includes row-wise entries for harvest events that have been recorded by simulation clients in the course of simulation on batch simulation farm 1601. Each harvest event entry within master harvest hit table 2205 includes an extended event identifier field 2362 that contains the name of the harvest event. Each entry also includes a testcase name field 2363 that contains the name of the testcase that triggered the corresponding harvest event. An instance identifier field 2361 is also included within each entry to provide an indication of the specific instance of the harvest event that was triggered. Harvest events may be collected in either a hierarchical or non-hierarchical mode. In a hierarchical mode, each instance of a given harvest event is processed independently, and a separate testcase exercising each instance of the harvest event may be collected accordingly. In such a case, when determining if a reported harvest event is new, harvest manager program 2215 considers instance identifier field 2361.

In non-hierarchical mode, harvest events are collected in harvest testcase bucket 2300 without regard to each specific instance of a given harvest event. Once a testcase exercising a particular instance of a harvest event is detected and recorded, no further testcases are collected for that event. To this end, instance identifier field 2361 is ignored by harvest manager program 2215 when operating in non-hierarchical harvest mode.

Regardless of the harvest annealing mode selected by harvest manager program 2215, instance identifier field 2361 is present in master harvest hit table 2205. In either mode, instance identifier field 2361 maintains the potential utility in determining which specific instance of the harvest event has been triggered by a given testcase.

In comparing the exemplary entries within harvest testcase list 2214 with the entries in master harvest hit table 2205, a "lost testcase" entry 2264 contains a harvest event entry (i.e., D B5 L E4) corresponding to a testcase (i.e., test7) that is not included among the testcase names contained in harvest testcase list 2214. Responsive to the harvest annealing file comparison for the exemplary files depicted FIG. 23B, entry 2264 is removed from master harvest hit table 2205.

As further depicted in FIG. 23B, harvest testcase list 2214 includes two entries, test2 and test5, which are not included within any entry within test case name field 2363 of master harvest hit table 2205. As previously explained with reference to FIG. 23A, such extraneous testcase entries will be removed from harvest testcase bucket 2300 and harvest testcase list 2214 within harvest testcase server 2210.

Figure 23C:
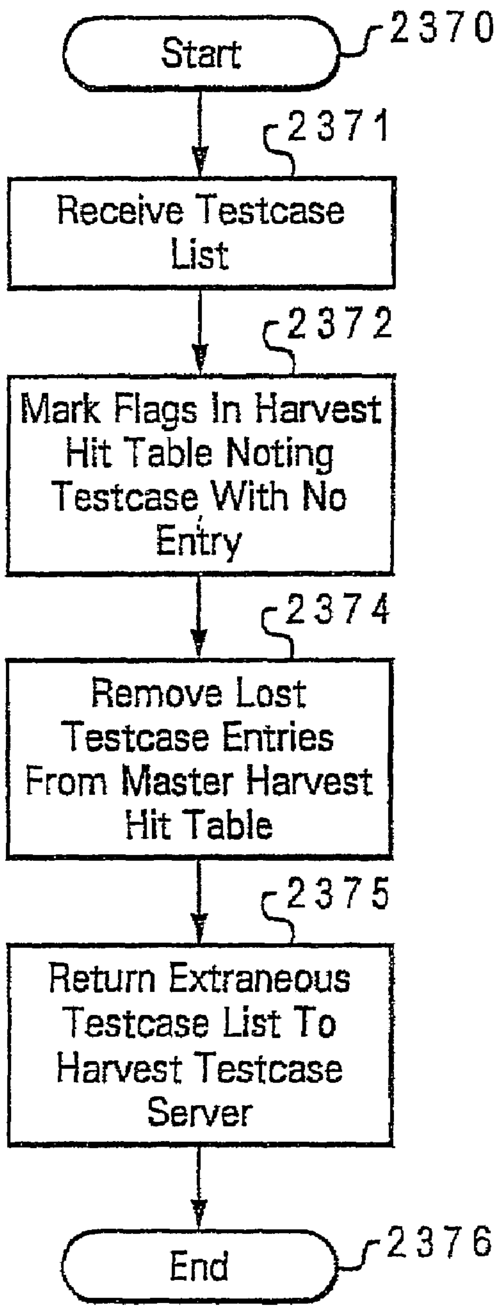
FIG. 23C is a flow diagram illustrating in further detail the steps performed by a harvest manager program to process annealing requests from a harvest testcase server in accordance with a preferred embodiment of the present invention.

Referring to FIG. 23C, there is depicted a flow diagram illustrating in further detail the steps performed by harvest manager program 2215 during step 2330 of FIG. 22C to process annealing requests from harvest testcase server 2210. The process begins at step 2370 and proceeds to step 2371, which depicts harvest manager program 2215 receiving harvest testcase list 2214 from harvest testcase server 2210. Next, as illustrated at step 2372, harvest manager program 2215 sequentially examines the entries within harvest testcase list 2214 and marks an internal flag (not depicted in FIG. 23B) in master harvest hit table 2205 for each entry whose testcase name field 2363 corresponds to an entry in harvest testcase list 2214.

At the conclusion of the examination of testcase list 2214, any unmarked entries in master harvest hit table 2205 correspond to the set of lost testcase inconsistencies. In addition, while sequencing through harvest testcase list 2214, harvest manager program 2215 creates an extraneous testcase list containing testcase names that have no corresponding entry in master harvest hit table 2205.

The process continues as illustrated at step 2734, which depicts master harvest program 2215 removing the unmarked entries from master harvest hit table 2205. Proceeding as depicted at step 2375, harvest manager program 2215 returns the extraneous testcase list to harvest testcase server 2210 over the direct network connection on network 1720. Harvest testcase server 2010 will, at a later time, remove these extraneous testcases from harvest testcase bucket 2300 and harvest testcase list 2214. The harvest annealing process then terminates as depicted at step 2376. The above-described process provides a means by which to resolve inconsistencies arising in the process of harvesting testcases in a geographically distributed batch simulation farm 1601.

hi the means described above for creating and managing instrumentation events in a batch simulation farm, instrumentation events are generated from HDL code or, as described above in conjunction with FIGS. 12A and 12B, from unconventional comments. The HDL code and/or unconventional comments are compiled into instrumentation entities within the simulation model by instrumentation load tool 464. In the following descriptions of FIGS. 24A-24C, a logic function that detects the occurrence of an instrumentation event (represented by logic 402 in FIG. 4A as one example) will be referred to as "instrumentation logic", and instrumentation events created from HDL code or unconventional comments will be referred to as "HDL instrumentation events".

As described above, instrumentation server 1699 controls HDL instrumentation events utilizing a number of API entry points called by RTX 1702 during execution of testcases. Furthermore, instrumentation server 1699 retrieves data from HDL instrumentation events for storage and processing utilizing additional API entry points called by RTX 1702. These mechanisms provide an efficient means by which an HDL circuit designer can generate HDL instrumentation events that are managed and recorded in a largely automatic fashion by instrumentation server 1699. Under some circumstances, however, utilizing HDL code and/or unconventional comments to produce instrumentation logic can prove to be inefficient.

In particular, it is often the case that complex instrumentation events occur over many cycles and are composed of temporally complex interactions of a large number of signals within the given simulation model. Detecting such instrumentation events typically requires a complex functionality that necessitates a correspondingly complex modeling data structure. In such a circumstance, using HDL code or unconventional comments to create the necessary instrumentation logic can be difficult and inefficient.

In general, the instrumentation functionality required to detect such complex instrumentation events is usually more effectively created utilizing a high-level programming language such as C or C++. High-level programming languages typically provide more direct support for complex data structures and provide features such as dynamic memory allocation, among others, that allow for the more efficient generation of functionality suited to the detection of complex instrumentation events. Furthermore, simulation engineers are often not primarily conversant in HDLs, but instead rely on high-level programming languages such as C or C++.

It would therefore be advantageous to provide a means by which to generate and process instrumentation events, hereafter referred to as RTX instrumentation events, under RTX control utilizing a high-level language such as C or C++. Such a means would enable simulation engineers to more efficiently generate complex instrumentation events with the additional flexibility inherent in high-level programming languages.

As explained in further detail hereinbelow, RTX instrumentation events, unlike HDL instrumentation events, can be used to track the occurrence of events that are not composed of sequences of signals within a given simulation model. As an example, conventional RTXs typically receive as inputs a number of control parameters that guide the subsequent behavior of the RTX during execution of a given simulation model. It is often useful to be able to determine the number of testcases that have been executed with a particular control parameter set to a particular one of its possible legal values. In this way, it is possible to determine how often the simulation model has been exercised in each of the possible modes controlled by the given control parameter. Likewise it is possible to extend this notion in order to collect statistics on combinations of control parameters and their respective values for different simulation runs.

Such RTX control parameters are outside the scope of the simulation model and therefore are not directly accessible by HDL instrumentation events that must ultimately take as inputs signals within the simulation model itself. In accordance with the principles set forth herein, an RTX, such as RTX 1702, may generate a number of RTX count instrumentation events to collect statistics related to the RTX input parameter values for each executed testcase. Specifically, at the beginning of each testcase, the RTX triggers count events corresponding to the values assigned to the input RTX control parameter values. At the conclusion of the testcase, the resultant counts for the triggered count events are communicated to the instrumentation server for storage and analysis.

The present invention specifies additional API entry points that allow an RTX, utilizing a high-level programming language such as C or C++, to generate and process RTX instrumentation events. In what follows, the high-level language programming code formulated to detect the occurrence of an RTX instrumentation event will be referred to as "instrumentation code" to distinguish it from instrumentation logic for HDL instrumentation events that is specified by HDL code or unconventional comments. Instrumentation code for RTX instrumentation events that are related to signals within a given simulation model typically consists of a number of calls to API entry point GETFAC( ) to obtain signal values within the model, and also includes program instructions that operate on the obtained signal values in order to detect the object instrumentation event.

In accordance with the system of the present invention, RTX instrumentation events and HDL instrumentation events are respectively maintained as distinct groups with separate namespaces. This namespace separation prevents name collisions between HDL and RTX instrumentation events, and provides a barrier between the activities and goals of HDL chip designers creating HDL instrumentation events and simulation engineers creating RTX instrumentation events.

To support RTX instrumentation events, API entry points that interact with individual instrumentation events, such as API entry point 1802, set_fail_mask( ), are augmented with an additional parameter that specifies whether the routine will process an RTX instrumentation event or an HDL instrumentation event. API entry points, such as rpt_fails( ), rpt_ counts( ), rpt_harv( ), disable_events( ), etc., which facilitate control of an entire class of HDL instrumentation events, or which record data from an entire class of HDL instrumentation events simultaneously, are similarly enhanced to concurrently support RTX instrumentation events. Specifically, these API entry points are augmented to generate and deliver aggregate instrumentation data packets for the RTX instrumentation events, and to receive from instrumentation server 1699, separate control information utilized to control the RTX instrumentation events. For example, API entry point 1900, rpt_fails( ), is enhanced to enable delivery of two aggregate instrumentation data packets to instrumentation server 1699: one containing fail event information for any HDL instrumentation events present in the simulation model; and one containing fail information for any generated RTX instrumentation events.

FIG. 24A depicts data structure representations of API entry points designed to support the generation and operation of RTX instrumentation events in accordance with a preferred embodiment of the present invention. Specifically, an API entry point 2400, create_event( ), when called by RTX 1702, initiates generation and naming of RTX instrumentation events. FIG. 24A further illustrates an API entry point 2401, trigger_event( ), which is called by RTX 1702 to indicate the occurrence of the RTX instrumentation event generated in response to API entry point 2400. API entry point 2400 returns a pointer 2402 to the generated RTX instrumentation event. Pointer 2402 is subsequently used as an input parameter to API entry point 2401. When API entry point 2401 is called with a particular pointer parameter 2403, the corresponding RTX instrumentation event generated in reference to that pointer is triggered as described in further detail with reference to FIG. 24D.

Within API entry point 2400, a type parameter 2409 specifies the RTX instrumentation event type (e.g. fail, count, harvest, etc.). Additional naming specification parameters 2410, 2411, 2412, and 2413, specify the name of the RTX instrumentation event in accordance with HDL instrumentation event naming convention. Each RTX instrumentation event is therefore typically identified by an extended event identifier consisting of the four fields explained with reference to FIG. 10B.

As further explained with reference to FIG. 10, extended event identifiers for HDL instrumentation events are derived at model build time directly in accordance with the structure of the simulation model and the names assigned by unconventional comments to the HDL instrumentation events. For RTX instrumentation events, in contrast, RTX 1702 directly sets the extended event identifier fields at runtime utilizing API entry point 2400, and furthermore ensures that each RTX instrumentation event within a given class (fail, count, harvest, etc.) is generated with a unique name. Fields 1030, 1032, 1034, and 1036 (described with reference to FIG. 10B) of the extended event identifier for an HDL instrumentation event are specified for an RTX instrumentation event by naming specification parameters 2410, 2411, 2412, and 2413, respectively.

The extended event identifiers for RTX instrumentation events serve functions analogous to those served by extended event identifiers for HDL instrumentation events. For example, extended event identifiers for RTX instrumentation events are used to form eventlist files for the RTX instrumentation events. These eventlist files are created during each simulation model test run and are commissioned on instrumentation server 1699 in the same manner as the eventlist files associated with HDL instrumentation events. Furthermore, RTX instrumentation events which share the same values for type parameter 2409, instrument code parameter 2411, design entity parameter 2412, and instrumentation event parameter 2413, while having differing values for instance parameter 2410, are processed by instrumentation server 1699 as differing instances of the same instrumentation event (analogous to the treatment by instrumentation server 1699 of instrumentation events that are replicated instances of a given HDL instrumentation event).

When commissioning eventlist files, instrumentation server 1699 generally does not distinguish between eventlist files for HDL instrumentation events generated during model build, and eventlist files for RTX instrumentation events generated by RTX 1702. Instrumentation server 1699 can therefore support and process RTX instrumentation events utilizing aforementioned instrumentation event processing mechanisms, (i.e., as if the RTX instrumentation events were HDL instrumentation events associated with another simulation model).

To enable instrumentation server 1699 to reuse the same processing means employed for HDL instrumentation events for processing RTX instrumentation events, it is necessary to provide a means to assign the equivalent of a simulation model name. As utilized herein, this equivalent to the simulation model name is referred to as the "rtx name", which is specified for a group of RTX instrumentation events. As further illustrated in FIG. 24A, an API entry point 2405, set_rtx-name( ), receives an input string parameter 2406, which specifies the rtx name to be associated with the RTX instrumentation events generated in accordance with API entry point 2400. The rtx name associated with a group of RTX instrumentation events serves an analogous role as the simulation model name for HDL instrumentation events. For example, the model name field 1751 (FIG. 17B) for an aggregate instrumentation data packet corresponding to a set of RTX instrumentation events, contains the rtx name specified by API entry point 2405 for the corresponding RTX instrumentation events.

The set of HDL instrumentation events associated with a given simulation model is fixed at model build time, allowing instrumentation server 1699 to validate aggregate instrumentation data packets according to the means described above in conjunction with FIGS. 17A-17C. Likewise, the set of RTX instrumentation events associated with a given RTX name is also fixed. To this end, RTX 1702 must ensure that for a given rtx name, the same set of RTX instrumentation events are generated by each simulation run performed by RTX 1702.

If RTX instrumentation events must be added or removed from RTX 1702, a new version of RTX 1702 is produced and tested in a series of foreground simulation runs. Once debugged, a new RTX name is assigned to the new version of RTX 1702, which is run once to create eventlist files corresponding to the new rtx name and the new set of RTX instrumentation events. These new eventlist files are commissioned on instrumentation server 1699 to inform instrumentation server 1699 of the new RTX version. Instrumentation server 1699 may then process data associated with the RTX instrumentation events present in the new version of RTX. In essence, each generation of a different set of RTX instrumentation events that constitute a different version of the RTX, is analogous to new versions of a simulation model being produced to alter the set of HDL instrumentation events within that model.

An additional API entry point 2407, write_eventlists( ), is called by RTX 1702 to produce the eventlist files for the RTX instrumentation event generated by API entry point 2400. Typically, API entry point 2407 is not called on every execution of RTX 1702, but rather is called only in response to the generation of a new version of RTX 1702. The generated eventlist files are then commissioned on instrumentation server 1699.

Figure 24B:
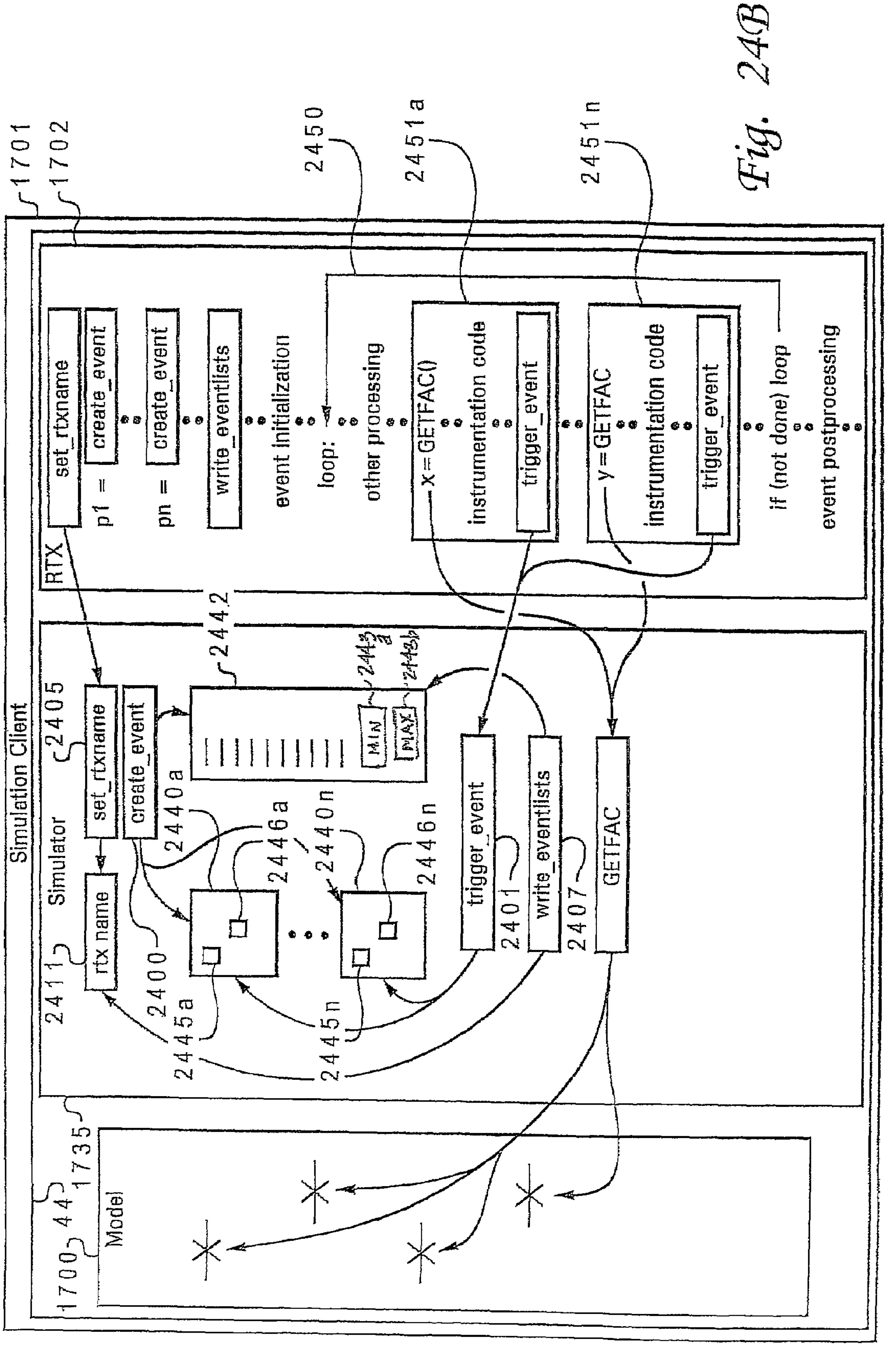
FIG. 24B is a block diagram illustrating memory contents utilized during processing of a simulation job that employs RTX instrumentation events performed with respect to an HDL simulation model.

Referring now to FIG. 24B, there is depicted the contents of memory 44 utilized during processing of a simulation job that employs RTX instrumentation events performed with respect to simulation model 1700 within simulation client 1701. For clarity of explanation of the depicted embodiment, it is assumed that the simulation job includes only a single testcase. The extensions necessary to support multiple testcases within the simulation job are readily apparent to one skilled in the art.

In the depicted embodiment, RTX 1702 begins the process of generating RTX instrumentation events by calling API entry point 2405 to assign an rtx name to the set of RTX instrumentation events that will be generated. API entry point 2405 produces an rtx name data structure 2441, which is utilized by API entry point 2407 to name the created eventlists. Rtx name data structure 2441 is also used by those API entry points, such as rtp_harv( ) for example, that create aggregate instrumentation data packets, to specify the value of model name field 1751 within the aggregate instrumentation data packets.

RTX 1702 subsequently makes a series of calls to API entry point 2400, create_event( ), to generate the desired RTX instrumentation events. For each RTX instrumentation event, API entry point 2400 creates an event data structure 2440. Event data structure 2440 consists of two primary elements: a disable flag 2445 that serves to disable the RTX instrumentation event in a manner similar to latch 507 of FIG. 5A, and data element 2446 that stores the contents of the RTX instrumentation event (i.e., a count field for a count event, a flag and a cycle count field for a harvest event, and a flag for a fail event). As a further step in generating RTX instrumentation events, API entry point 2400 creates an RTX instrumentation eventlist data structure 2442, which lists the extended event identifiers and event types for each of the object RTX instrumentation events. RTX instrumentation eventlist data structure 2442 is utilized by API entry point 2407, write_eventlists( ), to create the RTX instrumentation eventlist files. If necessary, RTX 1702 then calls API entry point 2407, write_eventlists( ), to create the eventlist files for the created RTX instrumentation events. As previously explained, API entry point 2407 is typically only called for a single, initial execution of RTX 1702 to create the RTX instrumentation event eventlist files. Once the RTX instrumentation event eventlist files are created and subsequently commissioned with instrumentation server 1699, API entry point 2407 is no longer called for the newly defined version of RTX 1702.

RTX instrumentation event processing continues with RTX 1702 calling those event initialization API entry points, such as init_harv( ), disable_events( ), etc., utilized to initialize processing for HDL and RTX instrumentation events. As explained with reference to the foregoing figures, these API entry point routines are augmented to operate on event data structures, such as event data structure 2440*a*-2440*n*, when processing RTX instrumentation events. These routines further utilize rtx model name data structure 2441 in order to determine, by rtx name, the proper set of control files stored on instrumentation server 1699 associated with the given RTX instrumentation events.

After calling the appropriate event initialization API entry points, RTX 1702 typically enters a main processing loop 2450, which serves to progress simulation model 1700 through simulation cycles during execution of the testcase. Main processing loop 2450 begins with initialization processing steps required for the execution of a simulation cycle. After completing this initialization processing, main processing loop 2450 proceeds with execution of a number of instrumentation code blocks 2451*a*-2451*n*, wherein each of instrumentation code blocks 2451*a*-2451*n* corresponds to a single RTX instrumentation event. Each of instrumentation code blocks 2451*a*-2451*n* typically consists of a number of calls to an API entry point GETFAC, which retrieves the value of signals within simulation model 1700. Program instructions within an instrumentation code block 2451 then process these signal values to determine if the corresponding RTX instrumentation event has occurred. If so, API entry point 2401, trigger_event( ), is called to record the occurrence of the RTX instrumentation event. Within main loop 2450, RTX 1702 then calls an API entry point cycle( ) (not shown in FIG. 24B), which advances simulation model 1700 a single simulation cycle. Main loop 2450 continues in this fashion until the testcase has completed.

Upon completed execution of the testcase, RTX 1702 calls those event post-processing API entry points, such as rpt_harv( ), rpt_count( ), etc., which then report information collected for HDL and RTX instrumentation events. As previously explained, these post-processing routines are augmented to operate on event data structures, such as event data structures 2440*a*-2440*n*, as part of processing RTX instrumentation events. Furthermore, these post-processing routines forward rtx model name data structure 2441 to set model name field 1751 in aggregate instrumentation data packets delivered to instrumentation server 1699 for the RTX instrumentation events.

Figure 24C:
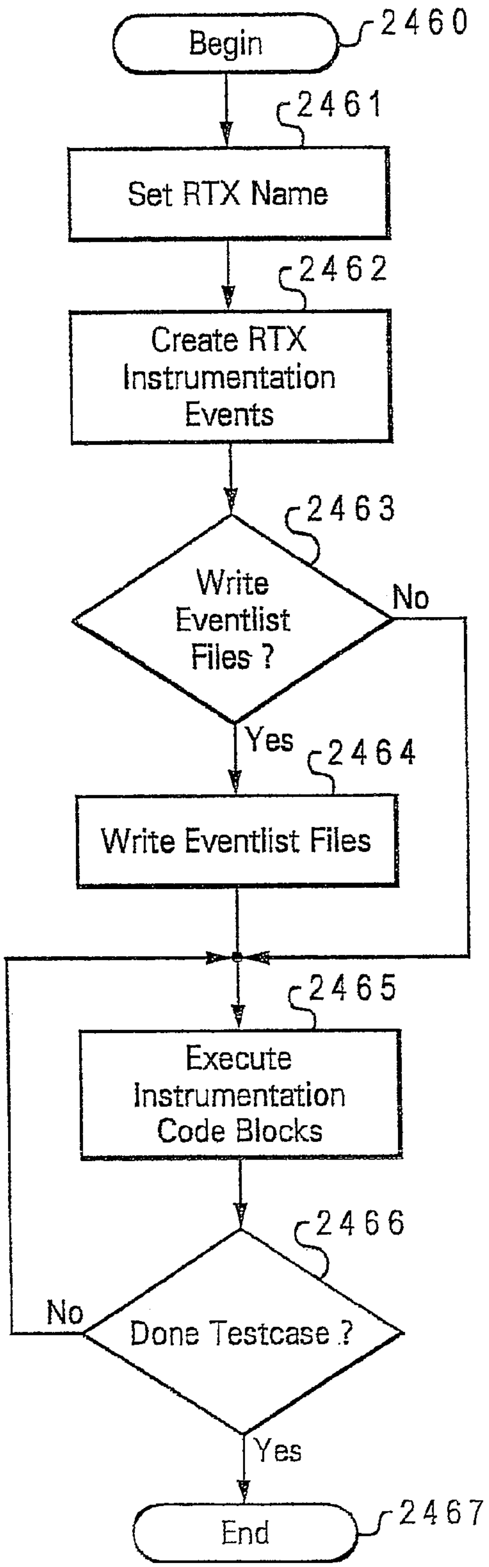
FIG. 24C is a flow diagram depicting steps performed by an RTX during the generation and processing of RTX instrumentation events in accordance with a preferred embodiment of the present invention.

With reference to FIG. 24C, there is shown a flow diagram depicting steps performed by RTX 1702 during the generation and processing of RTX instrumentation events in accordance with a preferred embodiment of the present invention. The process beings at step 2460 and proceeds to step 2461, which depicts RTX 1702 setting the rtx name by calling API entry point 2405. The process continues as illustrated at step 2462, with the generation of the RTX instrumentation events by a series of calls to API entry point 2400, create_event( ).

Next, a determination is made of whether or not to write the RTX instrumentation event eventlist files, as depicted at step 2463. If the eventlist files are to be written, processing continues as illustrated at step 2464, with the eventlist files being written in response to a call to API entry point 2407, write_eventlists( ). Otherwise processing continues at step 2464, which depicts the execution of instrumentation code blocks 2451*a*-2451*n*. Proceeding to step 2465, a determination is made of whether the testcase has completed. If the testcase has not completed, the process returns to step 2464 for continued execution of instrumentation code blocks 2451*a*-2451*n* for the subsequent simulation cycle. Otherwise processing terminates as illustrated at step 2466.

Figure 24D:
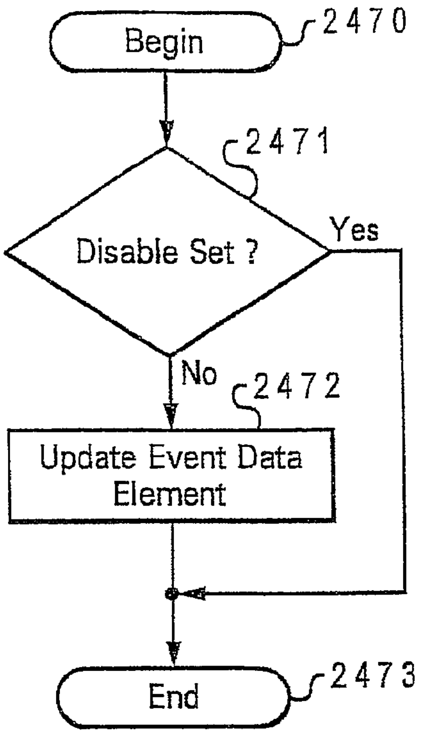
FIG. 24D is a flow diagram illustrating in greater detail the operation of a trigger event API entry point in accordance with a preferred embodiment of the present invention.

In accordance with the RTX instrumentation event processing disclosed herein, API entry point 2401, trigger_event( ), must undertake certain processing steps in order to allow for the selective disabling of RTX instrumentation events. FIG. 24D illustrates a flow diagram of steps depicting in greater detail the operation of API entry point 2401.

As depicted in FIG. 24D, API entry point 2401 begins processing at step 2470 upon being called by RTX 1702. Next, as illustrated at step 2471, a determination is made of whether or not disable flag 2445 for the given RTX instrumentation event is set. If disable flag 2445 is set, the process terminates as depicted at step 2473. Otherwise, the processing continues as illustrated at step 2472, with API entry point 2401 updating data element 2446. The exact nature of the update to data element 2446 varies with the RTX instrumentation event type. For example, for an RTX counter instrumentation event, the counter within data element 2446 is incremented. Following the update to data element 2446, the process terminates at step 2473.

It should be noted that disable flag 2445 serves to prevent API entry point 2401 from operating the corresponding RTX instrumentation event. In accordance with the present invention, selective disablement of RTX instrumentation events is enabled by augmenting API entry point 1800 to call an enhanced version of API entry point 1802, set_fail_mask( ). This enhanced API entry point 1802 is constructed to set disable flag 2445 when processing RTX instrumentation events. In this manner, RTX 1702 can initiate selective disablement of RTX instrumentation events.

The above-described mechanisms enable the creation and operation of instrumentation events under RTX control in a high-level programming language such as C or C++. In this manner, simulation engineers in particular are able to create instrumentation events utilizing a more robust programming language with greater efficiency for complex instrumentation events. Furthermore, RTX instrumentation events, as described herein, provide the capability of detecting occurrences of events which reside outside the scope of a simulation model.

The means described above allows for the creation of RTX instrumentation events by simulation engineers utilizing high level programming languages such as C or C++. It would be further advantageous to provide a means for detecting RTX instrumentation events associated with an HDL design entity that is replicated as multiple instantiations within a simulation model. As described above, the HDL-based instrumentation logic utilized to detect an HDL instrumentation event is automatically replicated for each instance of an HDL design entity. As explained with reference to FIGS. 4A-4E, this is accomplished at model build time by creating a separate instance of the instrumentation code for each instance of the design entity. In this manner, the instrumentation logic for an HDL instrumentation event is generated without concern or regard for the number or location of the instances of the given design entity.

However, in the means described above, no means for replication of instrumentation code for RTX instrumentation events based on the number and location of the replicated instances of the monitored design entity is provided. The means described above enables creation of specified RTX instrumentation events, but is unaware of the internal structure of the simulation model on which it is operating.

Without such simulation model structure awareness on the part of the RTX, an RTX is required to be cognizant of the internal structure, including the number and location of replicated instances, of design entities for which RTX instrumentation events are desired for all the different simulation models containing these entities. Such a requirement places a considerable bookkeeping burden on the simulation engineer. The present invention alleviates this problem by associating one or more "instrumentation code modules" with HDL design entities in a simulation model. As explained in further detail below, the instrumentation code modules are dynamically loaded and processed by the RTX to provide a centralized mechanism for automatically instrumenting each instance of the given HDL design entity within any given simulation model in which the design entity is incorporated.

Discovery of the instances of relevant design entities for which automatically replicated RTX instrumentation events are desired is enabled by determining the internal structure of each simulation model. To this end, model build tool 446 (depicted in FIG. 4D) includes further processing and program instruction means for inserting a "design entitylist data structure" into each simulation model 480 at model build time. The design entitylist data structure contains information identifying all design entities instantiated within the simulation model. The identification of all constituent design entities, including those containing no instantiated HDL instrumentation events, on a per-simulation model basis enable a subsequent identification of design entity instances for which it is desired to associate an automatically replicated RTX instrumentation event. Since the method of the present invention does not permit the association of RTX instrumentation events with HDL instrumentation entities, instrumentation entities within a simulation model are excluded from the design entitylist data structure.

Figure 25A:
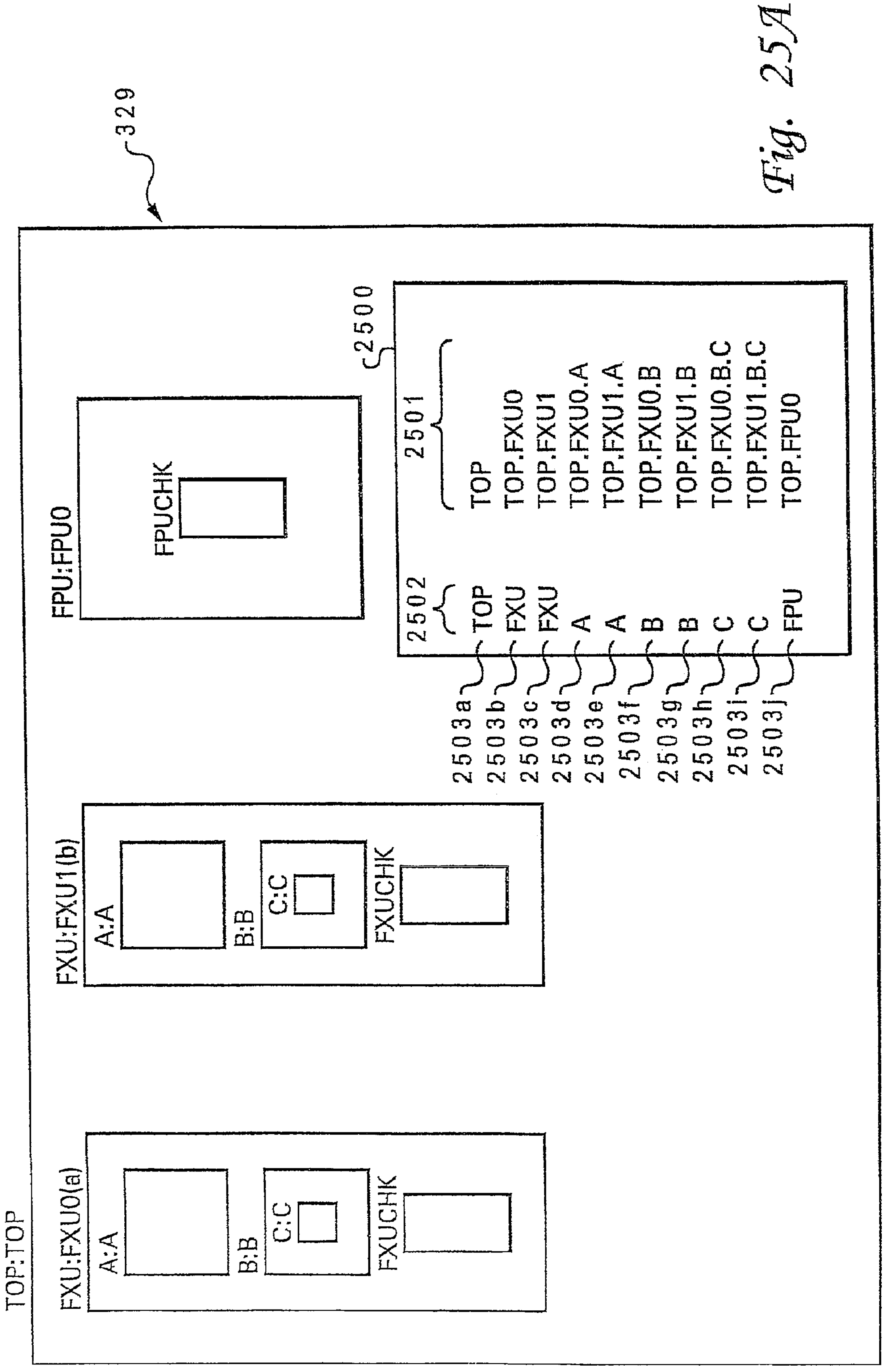
FIG. 25A depicts a high-level block diagram representation of an HDL simulation model augmented with a design entitylist data structure in accordance with a preferred embodiment of the present invention.

FIG. 25A depicts a high-level block diagram representation of simulation model 329 of FIG. 4B augmented with a design entitylist data structure 2500. Design entitylist data structure 2500 includes entries 2503*a*-2503*i* each representing one instance of a design entity within simulation model 329. Each of entries 2503*a*-2503*i* further includes an instantiation identifier field 2501 and a design entity name field 2502. The data structure of entries 2503*a*-2503*i* thus identifies each instance of any given design entity within the given simulation model.

Automatic replication of RTX instrumentation events for a given repeated design entity within a simulation model is enabled by the generation and processing of dynamically loaded "instrumentation code modules". These modules consist of high level program language instruction code with distinct entry points, fixed by convention, that generate and process RTX instrumentation events associated with the instances of a given design entity within a simulation model. API routines described above in conjunction with FIGS. 24A-24D are utilized by the instrumentation code modules to generate and process RTX instrumentation events.

In accordance with a preferred embodiment of the present invention, instrumentation code modules are dynamically loaded and bound to an RTX at runtime using a technique well known to those skilled in the art referred to as "dynamic loading". Essentially all modem operating systems, including but not limited to Microsoft Windows®, UNIX®, and Linux®, provide dynamic loading. In dynamic loading, a module containing program code and certain defined entry points is loaded into memory 44 of a general purpose computer and linked to a currently running program, such as an RTX. The program that is dynamically loading a module can then call entry points within the dynamically loaded module and thereby execute programming instructions contained within the dynamically loaded module. Likewise, subject to certain constraints in the way the dynamically loaded module is bound, the dynamically loaded module can call certain entry points, such as GETFAC( ), CREATE_EVENT( ), TRIGGER_EVENT( ), etc. within the currently running program and its environment.

Utilizing the teachings of the present invention, one or more instrumentation code modules are created for each HDL design entity that is to be instrumented using RTX instrumentation events. Each of these modules contains fixed entrypoints described below and serves to create and monitor a set of RTX instrumentation events associated with the instances of the given HDL design entity. However, conventional dynamic loading permits only one copy of a given instrumentation code module to be bound to a running program (i.e., RTX). Therefore, it is not possible to bind a separate instance of the instrumentation code module to each instance of a given HDL design entity to achieve an analogous result as with automatically replicated HDL instrumentation modules. Consequently, an instrumentation code module utilizes a single set of program instructions and dynamically created data structures to monitor the different instances of the given design entity within the simulation model.

Figure 25B:
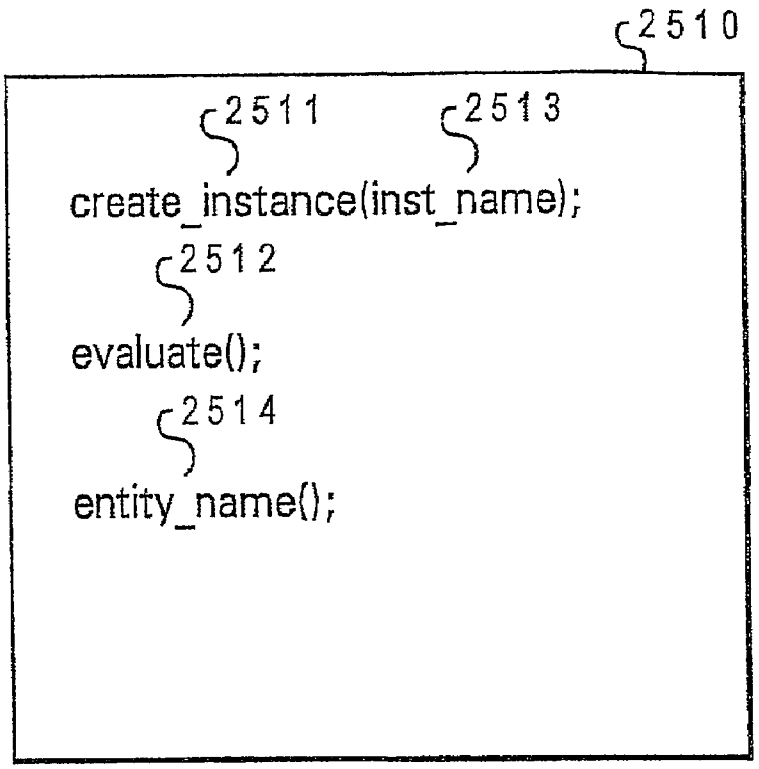
FIG. 25B illustrates an instrumentation code module having designated program entrypoints.

With reference now to FIG. 25B, there is shown a representation of instrumentation code module 2510 having program entrypoints 2511, 2512, and 2514. Entrypoint 2511, create_instance( ), is called to prompt program code within instrumentation code module 2510 to create the data structures necessary for a given instance of a design entity. A separate call to entrypoint 2511 is made for each instance of the given design entity within the simulation model. An instance name input parameter 2513 is a string parameter consisting of the hierarchical instance identifier for the given instance of the design entity.

After all of the instances of the given design entity have been registered with instrumentation code module 2510 by means of calls to entry point 2511, entrypoint 2512, evaluate( ), may be called to execute program instruction steps within instrumentation code module 2510 which monitor the simulation model to detect occurrences of the desired RTX instrumentation events. These program instruction steps utilize the API entry points described above in conjunction with FIG. 24A to trigger RTX instrumentation events.

Instrumentation code modules having entrypoints 2511, 2512, and 2514 are designed to facilitate monitoring of the RTX instrumentation events within a given design entity. Additional API entrypoint routines, load_modules( ) and execute_modules( ), provided by the present invention and described later, are utilized to manage dynamically loading instrumentation code modules and calling entrypoints 2511, 2512, and 2514. Entrypoint load_modules( ) utilizes API entry point 2514, entity_name( ), to determine the name of the design entity that instrumentation code module 2510 is to be associated with. Entrypoint 2514 returns a pointer (not shown in FIG. 25B) to a string containing the name of the given design entity.

Figure 25C:
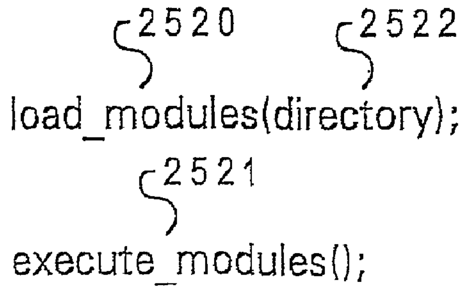
FIG. 25C depicts data structure representations of API entry points designed to manage dynamically loading and calling instrumentation code modules in accordance with a preferred embodiment of the present invention.

Referring to FIG. 25C, there is depicted data structure representations of API entry points designed to manage dynamically loading and calling instrumentation code modules. An API entry point 2520, load_modules( ), is utilized to load and initialize those dynamic instrumentation code modules required by the current simulation model. An input parameter 2522 is utilized to indicate the location on a disk storage system where the instrumentation code modules are stored. An entrypoint 2521, execute_modules( ), is utilized to call entrypoint 2512 of the instrumentation code modules during each cycle of simulation to allow the instrumentation code modules to monitor their respective design entities for the occurrence of RTX instrumentation events.

Figure 25D:
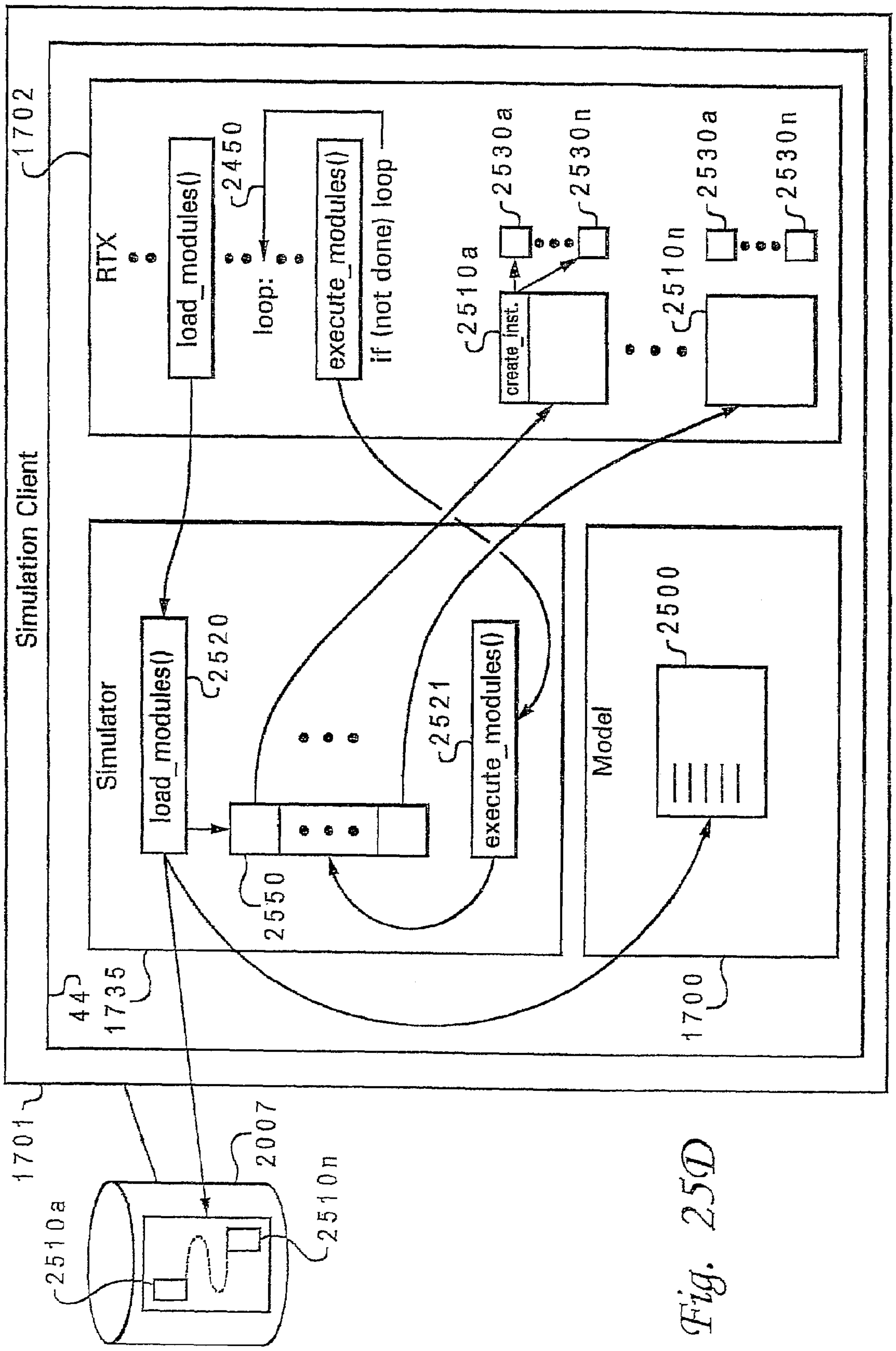
FIG. 25D is a block diagram illustrating memory contents utilized during processing of a simulation job that employs instrumentation code modules processed with respect to an HDL simulation model in accordance with a preferred embodiment of the present invention.

With reference to FIG. 25D, there is depicted the contents of memory 44 utilized during processing of a simulation job that employs instrumentation code modules processed with respect to simulation model 1700 within simulation client 1701. For clarity of explanation of the depicted embodiment, it is assumed that the simulation job includes only a single testcase. The extensions necessary to support multiple testcases within the simulation job are readily apparent to one skilled in the art. In the depicted embodiment, RTX 1702 begins the process of processing instrumentation code modules by first calling API entry point 2520 to load and initialize instrumentation code modules 2510*a*-2510*n*. API entry point 2520, under control of input parameter 2522, searches disk storage unit 2007 to locate instrumentation code modules 2510*a*-2510*n*.

API entrypoint 2520 processes each instrumentation code module 2510 according to a series of steps. First, entrypoint 2520 dynamically loads an instrumentation code module 2510 into memory 44 of simulation client 1701. API entry point 2520 then calls entrypoint 2514, entity_name( ), of each instrumentation code module 2510 to determine, by design entity name, which HDL design entity each instrumentation code module 2510 is to be associated with. API entry point 2520 then searches design entity data structure 2500 to determine if the HDL design entity identified in the preceding step is instantiated within simulation model 1700. If the desired design entity is not instantiated within simulation model 1700, API entry point 2520 removes the object instrumentation code module from memory 44 of simulation client 1701 and continues processing with the next instrumentation code module on disk storage unit 2007.

If, however, one or more instances of the desired design entity are present within simulation model 1700, API entrypoint routine 2520 responds by calling entrypoint 2511 in instrumentation module 2510. Entrypoint 2511 is called by API entrypoint 2520 once for each instantiation of the desired design entity, and is passed the hierarchical instance identifier for the instance of the design entity. In this manner, instrumentation code module 2510 is made aware of the location of every instance of the desired design entity. Instrumentation code module 2510 responds to the instance calls to 2511 by generating instance data structures 2530*a*-2530*n*. The instance data structures 2530*a*-2530*n* contain the information, among other things the hierarchical instance identifier, necessary to monitor RTX instrumentation events in each instantiation of the object design entity. Furthermore, upon successful binding and initialization of instrumentation code module 2510, API entry point 2520 adds an entry to an instrumentation code module table 2550. Instrumentation code module table 2550 consists of a list of pointers to the successfully bound instrumentation code modules 2510. This process is repeated for all instrumentation code modules found on disk storage unit 2007.

After processing each of instrumentation code modules 2510*a*-2510*n*, RTX 1702 enters a main processing loop 2450, which processes simulation model 1700 through simulation clock cycles during execution of the testcase. At the conclusion of each sequence through main processing loop 2450, RTX 1702 calls API entry point 2521 to execute instrumentation code modules 2510*a*-2510*n*. Entrypoint 2521 utilizes instrumentation code module table 2550 to call entry point 2512, evaluate( ), within each instrumentation code module 2510. The program instructions within instrumentation code modules 2510*a*-2510*n* utilize corresponding instance data structures 2530*a*-2530*n* to determine the locations of the design entity instances and any state information associated with the desired RTX instrumentation events. Further, these program instructions utilize the means described above in conjunction with FIGS. 24A-24D to monitor and record the occurrence of RTX instrumentation events.

Figure 25E:
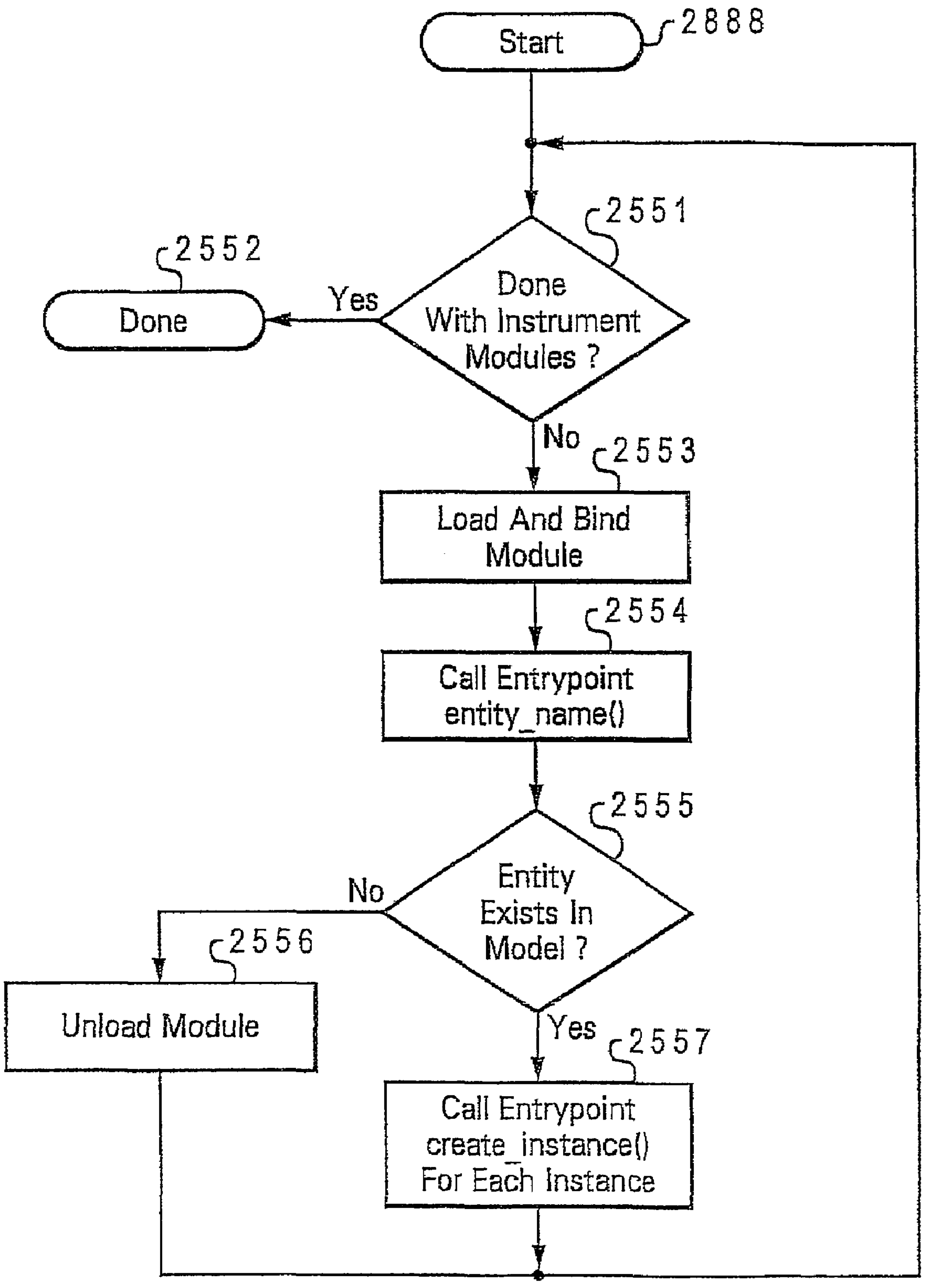
FIG. 25E is a flow diagram depicting steps performed by an API entry point during loading and initialization of instrumentation code modules.

FIG. 25E is a flow diagram depicting steps performed by API entry point 2520 during loading and initialization of instrumentation code modules 2510*a*-2510*n*. The process begins at step 2888 and proceeds to step 2551, which depicts API entrypoint 2520 determining whether or not any instrumentation code modules on disk storage unit 2007 remain unprocessed for a simulation job. If all instrumentation code modules have been processed or none are present, the process terminates as illustrated at step 2552. API entrypoint 2520 can therefore be called even if no instrumentation code modules are present on disk storage unit 2007. If, however, an instrumentation code module 2510 remains to be processed, the process continues at step 2553 which depicts API entrypoint 2520 loading and the given instrumentation module into memory 44 of simulation client 1701. Continuing with step 2554, API entrypoint 2520 calls entrypoint 2514 to determine the name of the design entity the loaded instrumentation code modules is to be associated with.

Next, as illustrated at step 2555, API entrypoint 2520 searches instrumentation code module table 2550 to determine if any instances of the design entity identified at step 2554 exist in the current simulation model. If no such instances exist, the process continues at step 2556, which depicts API entrypoint 2520 removing the instrumentation module from memory 44. Otherwise, the process moves to step 2557, which depicts API entrypoint 2520 calling entrypoint 2511 in instrumentation code module 2510 for each instance of the desired design entity listed in instrumentation code table 2550. In this manner, instrumentation code module 2510 is made aware of the instances of the design entity present in the simulation model and can create instance data structures 2530*a*-2530*n*. The process then moves back to step 2551 to repeat the process for each of the instrumentation code modules 2510*a*-2510*n* present on disk storage unit 2007.

Figure 25F:
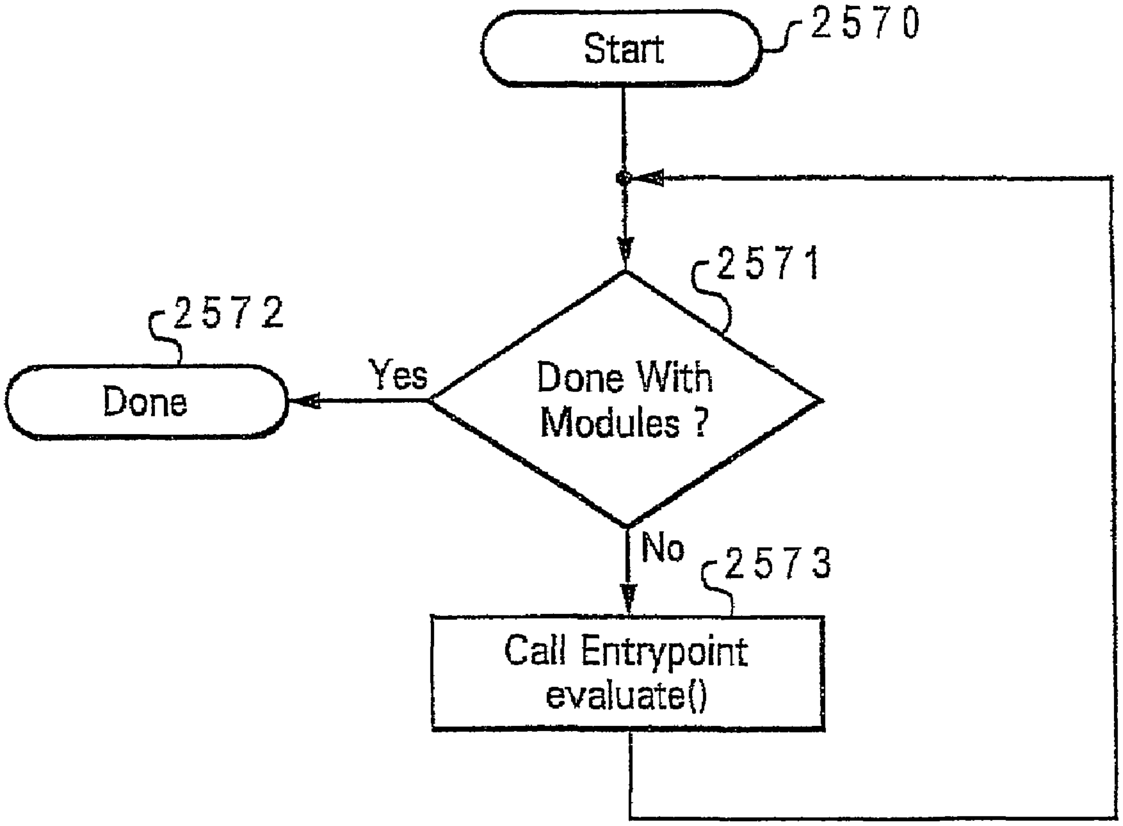
FIG. 25F is a flow diagram illustrating steps performed by an API entry point to execute instrumentation code modules during each sequence of a main simulation processing loop.

With reference to FIG. 25F, there is shown a flow diagram depicting steps performed by API entry point 2521 in executing instrumentation code modules 2510*a*-2510*n* during each sequence through main processing loop 2450. The process begins at step 2570 and proceeds to step 2571, which depicts API entrypoint 2520 determining whether or not any instrumentation modules have been successfully loaded by examining instrumentation code module table 2550. If all instrumentation code modules have been processed or none are present, the process terminates as illustrated at step 2572. API entrypoint 2520 is therefore called even if no instrumentation code modules were successfully bound by API entrypoint 2520. If, however, there is at least one instrumentation code module remaining to be processed, the process continues at step 2573 which depicts entrypoint 2521 utilizing the corresponding pointer in instrumentation code module table 2550 to call entrypoint 2512, evaluate( ), in instrumentation code module 2510. As illustrated at step 2571, the process is repeated for each of the instrumentation code modules 2510*a*-2510*n* present in memory 44 of simulation client 1701.

The embodiments described with reference to FIGS. 25A-25F provide a mechanism for the efficient creation and management of instrumentation code modules that monitor RTX instrumentation for all instances of a given design entity within a simulation model. An RTX programmer need only insert calls to API entrypoints 2520 and 2521 to enable this mechanism, resulting in a significant reduction in effort for the overall RTX coder. In addition, the simulation engineer creating the instrumentation code module need no longer be aware of the various number and locations of the design entity for the various simulation models. The present invention automatically determines the model configuration and passes this information to the instrumentation code module, resulting in increased efficiency and portability of the instrumentation code modules.

Referring again briefly to FIGS. 20A-20C, it has heretofore been assumed that following each simulation run, an aggregate count event packet 2010 containing count data pertaining to the simulation run is reported back to instrumentation server 1699. When aggregate count event packet 2010 is received and verified by instrumentation server 1699, cycle count field 2011 is added to cumulative cycle count field 2020 and likewise, count value fields 2012*a*-2012*n* are added to corresponding cumulative count value fields 2021*a*-2021*n* within a count data storage file 2001. The count data storage file 2001 as hereinbefore described therefore contains a cumulative total of the number of cycles executed on the given simulation model and the number of times each count event has occurred over a pre-designated time interval, for example, a calendar day.

The present invention recognizes that it would often be advantageous for a simulation engineer or designer to know not only cumulative count event totals, but also the maximum and/or minimum count event values for a count event over the pre-determined time interval. In accordance with one embodiment of the present invention, this additional functionality is supported by identifying, in the instrumentation descriptor comments utilized to instrument an HDL design entity, one or more count events as either a MAX (maximum) or MIN (minimum). Then the count event values generated by the instrumentation logic are appropriately processed by the instrumentation server 1699 to maintain maximum and/or minimum count event values for the specified count event(s) over the predetermined time interval represented by the count data storage file 2001.

Referring now to FIG. 26A, there is depicted an exemplary HDL file 440' containing instrumentation descriptor comments identifying count events as MAX and MIN count events in accordance with one embodiment of the present invention. As indicated by prime notation ('), HDL file 440' is substantially similar to HDL file 440 of FIG. 4B, which as noted above, utilizes the syntax of the VHDL hardware description language to describe the instrumentation entity FXUCHK.

To identify a count event of instrumentation entity FXUCHK as a MAX or MIN count event, the format of counter declaration comments 455 is augmented to include a keyword to identify the corresponding count event as a MAX or MIN count event. Thus, a counter declaration comment 455 can generally be given as:

--!!n:<varname>qualifying_signal[+/−]keyword;

where n is an integer denoting which counter event in the instrumentation module is to be associated with a variable name varname, qualifying_signal is the name of a signal within a target design entity utilized to determine when to sample the count event pulse, +/− denotes either a rising or falling edge of the qualifying_signal, and keyword has a value of either MAX or MIN. In the exemplary embodiment shown in FIG. 26A, event( ) is identified as a MIN count event, and event1 is identified as a MAX count event. Optionally, as further depicted in FIG. 26B, a count event such as countname( ) can be identified as a MIN or MAX count event within an instrumentation descriptor comment 1230' embedded within an HDL file 1220' defining a design entity (e.g., entity X) of a simulation model.

As described above with respect to FIG. 4D, instrumentation load tool 464 processes the instrumentation entity HDL file 440' of FIG. 26A or the embedded instrumentation descriptor comments in the design entity HDL file 1220' of FIG. 26B to instrument design entities and to create an instrumentation logic block 420 for the simulation model. In a preferred embodiment, instrumentation load tool 464 is configured to order the count event counters 421 in which count event values are maintained during a simulation run according to type. For example, instrumentation load tool 464 may first instantiated MIN count event counters, then MAX count event counters, and then "regular" count event counters. As described further below, the use of a predetermined counter ordering by instrumentation load tool 464 in the instantiation of counters 421 facilitates subsequent processing of simulation results.

As described with reference to FIGS. 10A-10D, in order to promote effective management of instrumentation events, instrumentation load tool 464 creates, at model build time, a set of eventlist files containing information about the exact number and content of the instrumentation events in a given model. These files, one per class of events (fail, count, harvest, etc.), list the particular events in the given simulation model. Each simulation model has a unique set of corresponding eventlist files that are created at model build time. As described above with respect to FIG. 15, eventlist files are used by an instrumentation server (e.g., instrumentation server 1699 of FIG. 16A) to aid in the control, monitoring and analysis of instrumentation events in simulation models.

Figure 26C:
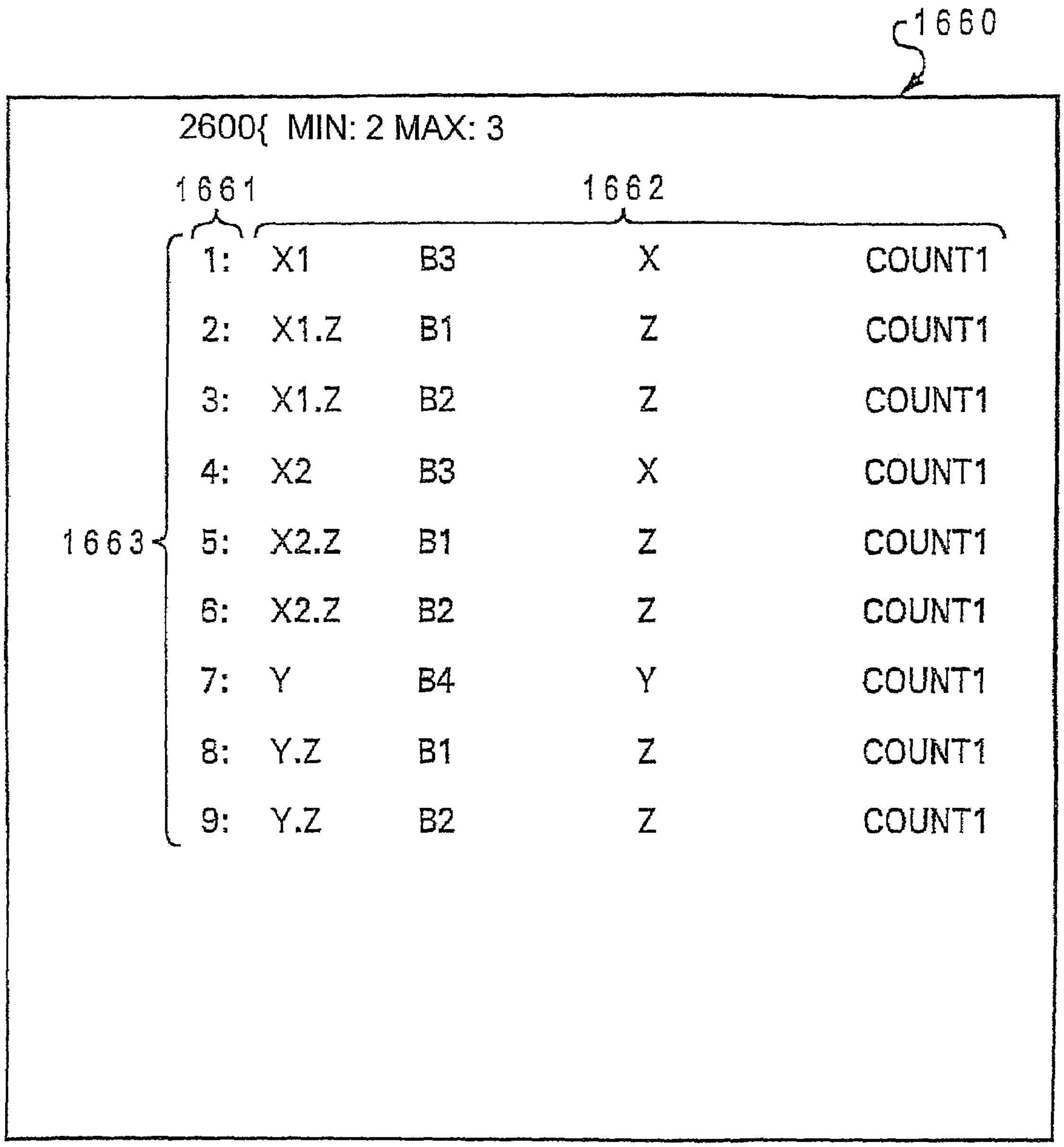
FIG. 26C depicts an exemplary eventlist file for minimum and maximum count events of a simulation model in accordance with the present invention.

With reference now to FIG. 26C, there is illustrated an count event eventlist file 1660' that supports the reporting of MAX and MIN count events in accordance with the present invention. As described above with respect to FIG. 15, eventlist file 1660' contains multiple count event class entries 1663, each including a unique, sequential index value 1661, and an extended event identifier 1662. Each of indices 1661 corresponds to the index of a particular event (in this case count event COUNT1) assigned at model build time. Extended event identifiers 1662 provide an event name associated with each individual event index. Eventlist file 1660' thus provides a mapping between the instrumentation event names and the instrumentation event indices as well as providing an ordering convention for aggregate data for a class of instrumentation events.

As further shown in FIG. 26C, eventlist file 1660' includes a MIN/MAX header 2600 that employs an arbitrarily defined syntax to identify MIN and MAX count events within the count event class entries 1663. In the depicted example, MIN/MAX header 2600 employs the syntax "keyword: integer", where keyword has a value of MAX or MIN and integer indicates the number of count events of the type specified by the keyword. Thus, in the example shown in eventlist file 1660', MIN/MAX header 2600 indicates, following the count event type ordering established by instrumentation load tool 464 (e.g., MIN, MAX, "regular") that the count events associated with index values 1 and 2 are MIN count events and the count events associated with index values 3, 4 and 5 are MAX count events. The count events associated is index values 6-9 are neither MIN nor MAX count events (i.e., are "regular" count event).

By distinguishing MIN and MAX count events from "regular" count events in eventlist file 1660' in this manner, subsequent processing of count event values can be properly confined to the count event types for which the analysis would be meaningful. For example, the post-processing of simulation results by CDAE 2100 described above with respect to FIG. 21A, which is intended only for "regular" count event values, will exclude the processing of MAX and MIN count events based upon the identification of MIN and MAX count events in the MIN/MAX header 2600 of the respective eventlist file 1660' characterizing the count events of each simulation model.

Figure 26D:
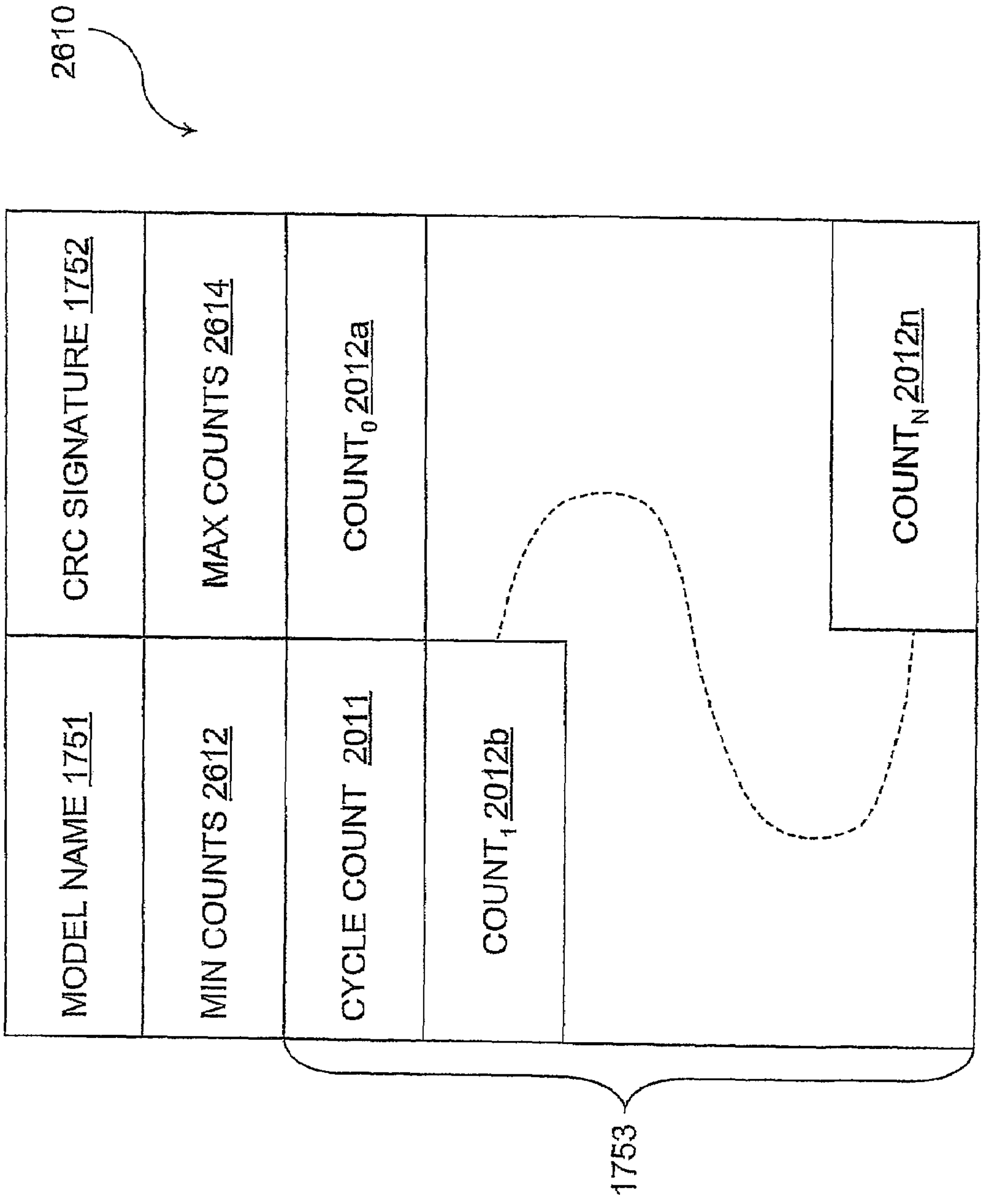
FIG. 26D illustrates a count event packet including minimum and maximum count event values delivered by an API entry point routine to an instrumentation server in accordance with the present invention.

Referring now to FIG. 26D, there is depicted an exemplary count event packet 2610 by which a simulation client may report count event values (including MAX and MIN count events values) of a simulation run to an instrumentation server 1699 in accordance with the present invention. Similar to aggregate data packet 2010 of FIG. 20B, count event packet 2610 includes a model name field 1751, a CRC digital signature field 1752, and a data field 1753. Within data field 1753, a cycle count field 2011 contains a value representing the number of cycles executed during the simulation run from which count event packet 2610 was generated. A set of count value fields 2012*a*-*n* contain the count values for each of the count events instantiated within simulation model 1700 in the order set forth by the count eventlist file 1660' created at model build time.

It is possible for an instrumentation server 1699 to determine which count events within count event packet 2610 are MIN and MAX count events and to thus correctly process count event packet 2610 by reference to count eventlist file 1660' or another similar listing of count events. However, in order to expedite processing of count event packets 2610 (which may be numerous) by instrumentation server 1699, each count event packet 2610 preferably includes an indication of which count values represent MAX and MIN count event values. In the depicted embodiment, this indication is provided by a combination of a predetermined ordering of count value fields by type and the inclusion of MIN COUNT field 2612 and MAX COUNT field 2614 within count event packet 2610. That is, the numbers of MIN and MAX count value fields 2012 are indicated by MIN COUNT and MAX COUNT fields 2612 and 2614, respectively, and count value fields 2012*a-n* are preferably ordered in the same arbitrary, predetermined order established by instrumentation load tool 464 in the ordering of counters 421, for example, first MIN count values, then MAX count values and finally "regular" count values.

Figure 26E:
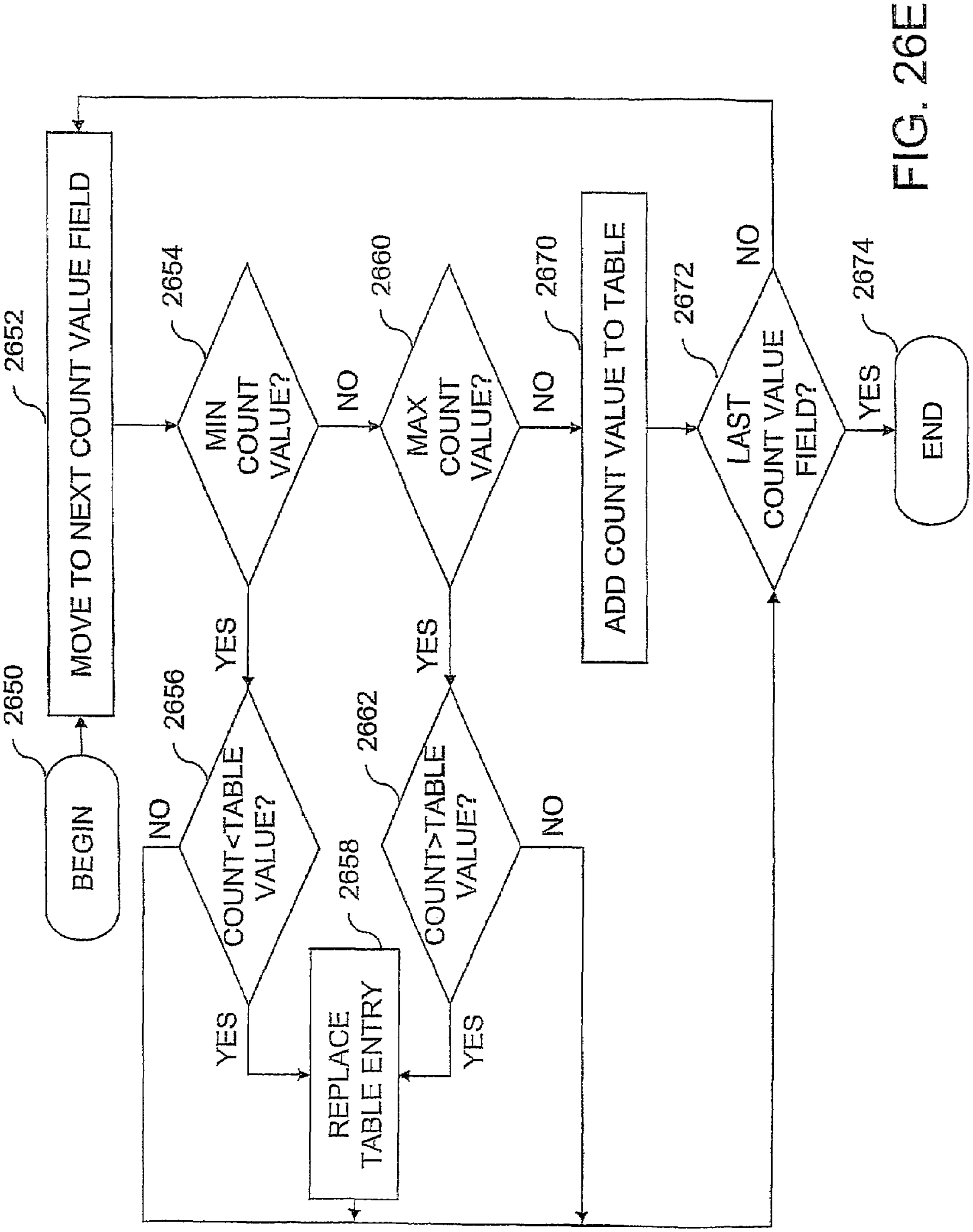
FIG. 26E depicts a high level logical flowchart of an exemplary process by which a count event packet containing maximum and minimum count event values is processed by an instrumentation server in accordance with the present invention.

With reference now to FIG. 26E, there is illustrated a high level logical flowchart of an exemplary process by which instrumentation server 1699 processes a count event packet 2610 containing MAX and MIN count values in accordance with the present invention. The illustrated process is performed, for example, at block 1780 of FIG. 17C following validation of the count event packet 2610 by instrumentation server 1699 in accordance with the process of FIG. 17C.

As shown, the process of FIG. 26E begins at block 2650 and then proceeds to block 2652, which shows instrumentation server 1699 accessing the next (or first) count value field 2012 in the validated count event packet 2610. Instrumentation server 1699 then determines at block 2654 whether or not the count value field 2012 contains a MIN count value. As noted above with reference to FIG. 26D, this determination can be made by reference to MIN COUNT and MAX COUNT fields 2612 and 2614 and the predetermined ordering of count value fields 2012. If instrumentation server 1699 determines that the present count value field 2012 does not contain a MIN count value, the process proceeds from block 2654 to block 2660, which is described below. If, however, a determination is made at block 2654 that the count value field 2012 under consideration contains a MIN count value, instrumentation server 1699 determines at block 2656 whether or not the MIN count value is less than the corresponding value currently stored in the count data storage files 2001 for the current time period. If so, instrumentation server 1699 replaces the value within the count data storage file 2001 with the MIN count value in the current count value field 2012, as shown at block 2658. If not, no replacement is performed.

Referring now to block 2660, instrumentation server 1699 determines whether or not the current count value field 2012 contains a MAX count value. Again, this determination can be made by reference to MIN COUNT and MAX COUNT fields 2612 and 2614 in the count event file 2610 and the predetermined ordering of count value fields 2012. If instrumentation server 1699 determines at block 2660 that the present count value field 2012 does not contain a MAX count value, the process proceeds from block 2660 to block 2670, which is described below. If, however, a determination is made that the current count value field 2012 under consideration contains a MAX count value, instrumentation server 1699 determines at block 2662 whether or not the MAX count value is greater than the corresponding value currently stored in the count data storage files 2001 for the current time period. If so, instrumentation server 1699 replaces the value within the count data storage file 2001 with the MAX count value in the current count value field 2012, as shown at block 2658. If not, no replacement is performed.

Referring now to block 2670, if the current count value field 2012 within count event file 2610 is a "regular" count value rather than a MAX or MIN count value, instrumentation server 1699 simply adds the count value in the current count value field 2012 to the current count event value in the count data storage file 2001 to update the corresponding count data storage file 2001. Following block 2670 or following a negative determination at either of blocks 2656 or 2662, instrumentation server 1699 determines at block 2672 whether or not the count event file 2610 contains an additional count value field 2012 to be processed or if the last count value field 2012 has been reached. If all count value fields 2012 in the count event file 2610 have been processed, the process terminates at block 2674. If, however, fewer than all count value fields 2012 have been processed, the process shown in FIG. 26E returns to block 2652, which has been described.

As described in detail above with respect to FIGS. 24A-24D, RTX count instrumentation events may also be created in a high level language (e.g., C or C++) in order to count occurrences of count events that are not easily detected by HDL-based instrumentation logic. By applying the principles of the present invention described above with respect to HDL count instrumentation events, a second embodiment of the present invention supports the definition and recording of MIN and MAX RTX count instrumentation events. As noted above, such RTX count instrumentation events are particularly useful in collecting statistics related to the RTX input parameter values for each executed testcase in a simulation run.

MIN and MAX RTX count instrumentation events may advantageously be created utilizing the same syntax described above with respect to FIG. 24A. Specifically, the set of legal values for type parameter 2409 is defined to include, in addition to count, fail and harvest, two additional types, namely, MIN count and MAX count. As implied by these type identifiers, specifying MIN count for type parameter 2409 will cause the creation of a MIN RTX count instrumentation event, and specifying MAX count for type parameter 2409 will cause the creation of a MAX RTX count instrumentation event.

As described above, in response to the definition of RTX instrumentation events including MIN and MAX RTX count instrumentation events utilizing the syntax of FIG. 24A, API entry point create_event 2400 (FIG. 24B) creates an RTX instrumentation eventlist data structure 2442, which lists the extended event identifiers and event types for each of the object RTX instrumentation events. API entry point create_event 2400 preferably includes within RTX instrumentation eventlist data structure 2442 an indication 2443*a* of a number of MIN RTX count instrumentation events and an indication 2443*b* of a number of MAX RTX count instrumentation events. When API entry point write_eventlists( ) 2407 creates the RTX instrumentation eventlist files from RTX instrumentation eventlist data structure 2442 as shown at block 2464 of FIG. 24C, write_eventlists( ) 2407 includes in the RTX instrumentation eventlist files the number of MIN RTX count instrumentation events and MAX RTX count instrumentation events, as described above with respect to FIG. 26C.

As noted above, when commissioning eventlist files, instrumentation server 1699 generally does not distinguish between eventlist files for HDL instrumentation events generated during model build and eventlist files for RTX instrumentation events generated by RTX 1702. Instrumentation server 1699 can therefore support and process RTX instrumentation events, including MIN and MAX RTX count instrumentation events, utilizing the same process described above with respect to FIGS. 17C and 26C.

As has been described, the present invention provides a method, system and program product for defining maximum and minimum count events in HDL instrumentation logic and rtx instrumentation code of a simulation model and for recording maximum and minimum count event values of simulation runs. By recording maximum and minimum count values in the manner herein described for subsequent examination and analysis, simulation engineers and designers are able to better understand the characteristics and operation of the simulation model of a design.

Although the present invention has been described specifically with respect to MAX and MIN count events, such count events, for which values are not accumulated with previously obtained count event values, may more generally be referred to as "outlying count events," which term should be understood to encompass both MAX and MIN count events.

While the invention has been particularly shown as described with reference to a preferred embodiment, it will be understood by those skilled in the art that various changes in form and detail may be made therein without departing from the spirit and scope of the invention. For example, one of the embodiments of the invention can be implemented as sets of instructions resident in random access memory 28 of one or more computer systems configured generally as described in FIG. 1 and FIG. 2. Until required by computer system 10, the set of instructions may be stored in another computer readable storage device, such as disk drive 33 or in a removable storage device such as an optical disk for eventual use in a CD-ROM drive or a floppy disk for eventual use in a floppy disk drive. The set of instructions may be referred to as a computer program product. Further, the set of instructions can be stored in the memory of another computer and transmitted over a local area network or a wide area network, such as the Internet, when desired by the user.

What is claimed is:

1. A simulation processing system, said simulation processing system comprising:

means for receiving, within instrumentation code, one or more statements describing a plurality of count events each corresponding to a respective sequence of signal values within a design entity of an HDL simulation model representing a design to be simulated, the plurality of count events including a first count event and a second count event, wherein the instrumentation code identifies said first count event as an outlying count event that is one of a set consisting of a minimum count event and a maximum count event and the second count event is not identified as an outlying count event in the instrumentation code;

means for simulating the design utilizing the HDL simulation model, wherein the means for simulating includes means for separately counting occurrences of each of said plurality of count events to obtain a respective count event value for each of said plurality of count events;

means for reporting simulation result data obtained from said simulating, wherein said simulation result data includes said count event values of said plurality of count events, and wherein said simulation result data indicates that the count event value of the outlying count event is associated with one of the set consisting of a minimum count event and a maximum count event; and means, responsive to receipt of said simulation result data, for recording said count event value within a data storage subsystem, wherein said means for recording includes:

means, responsive to the simulation result data indicating the count event value of the outlying count event is associated with one of the set consisting of a minimum count event and a maximum count event, for determining whether said count event value of said outlying count event exceeds a previously reported count event value for said outlying count event; and means, responsive to a determination of whether said count event value of said outlying count event exceeds the previously reported count event value of the outlying count event, for replacing said previously reported count event value of the outlying count event with said count event value of the outlying count event reported in the simulation result data.

2. The simulation processing system of claim 1, wherein said means for recording comprises means for recording said count event value of the outlying count event only if said count event value exceeds said previously reported count event value.

3. The simulation processing system of claim 1, wherein said means for recording comprises means for recording said count event value of the outlying count event only if said count event value does not exceed said previously reported count event value.

4. The simulation processing system of claim 1, wherein:

said outlying count event comprises a first outlying count event;

said means for reporting simulation result data comprises:

means for reporting a plurality of count event values of a plurality of outlying count events including said first outlying count event and receiving at least another count event value of another count event; and means for reporting an indication of a number of said count event values of said plurality of outlying count events.

5. The simulation processing system of claim 1, said means for recording further comprising means for accumulating a count event value of said second count event with a previously reported count event value of said second count event.

6. A program product, comprising a computer readable medium including:

means for receiving, within instrumentation code, one or more statements describing a plurality of count events each corresponding to a respective sequence of signal values within a design entity of an HDL simulation model representing a design to be simulated, the plurality of count events including a first count event and a second count event, wherein the instrumentation code identifies said first count event as an outlying count event that is one of a set consisting of a minimum count event and a maximum count event and the second count event of said plurality of count events is not identified as an outlying count event in the instrumentation code;

means for simulating the design utilizing the HDL simulation model, wherein the means for simulating includes means for separately counting occurrences of each of said plurality of count events to obtain a respective count event value for each of said plurality of count events;

means for reporting simulation result data obtained from said simulating, wherein said simulation result data includes said count event values of said plurality of count events, and wherein said simulation result data indicates that the count event value of the outlying count event is associated with one of the set consisting of a minimum count event and a maximum count event; and means, responsive to receipt of said simulation result data, for recording said count event value within a data storage subsystem, wherein said means for recording includes:

means, responsive to the simulation result data indicating the count event value of the outlying count event is associated with one of the set consisting of a minimum count event and a maximum count event, for determining whether said count event value of said outlying count event exceeds a previously reported count event value for said outlying count event; and means, responsive to a determination of whether said count event value of said outlying count event exceeds the previously reported count event value of the outlying count event, for replacing said previously reported count event value of the outlying count event with said count event value of the outlying count event reported in the simulation result data.

7. The program product of claim 6, wherein said means for recording comprises means for recording said count event value of the outlying count event only if said count event value exceeds said previously reported count event value.

8. The program product of claim 6, wherein said means for recording comprises means for recording said count event value of the outlying count event only if said count event value does not exceed said previously reported count event value.

9. The program product of claim 6, wherein:

said outlying count event comprises a first outlying count event;

said means for reporting simulation result data comprises: means for reporting a plurality of count event values of a plurality of outlying count events including said first outlying count event and receiving at least another count event value of another count event; and means for reporting an indication of a number of said count event values of said plurality of outlying count events.

10. The program product of claim 6 said means for recording further comprising means for accumulating a count event value of said second count event with a previously reported count event value of said second count event.

* * * * *